United States Patent
Or-Bach et al.

(10) Patent No.: US 12,178,055 B2
(45) Date of Patent: Dec. 24, 2024

(54) 3D SEMICONDUCTOR MEMORY DEVICES AND STRUCTURES

(71) Applicant: Monolithic 3D Inc., Klamath Falls, OR (US)

(72) Inventors: Zvi Or-Bach, Haifa (IL); Jin-Woo Han, San Jose, CA (US)

(73) Assignee: Monolithic 3D Inc., Klamath Falls, OR (US)

(*) Notice: Subject to any disclaimer, the term of this patent is extended or adjusted under 35 U.S.C. 154(b) by 0 days.

(21) Appl. No.: 18/592,383

(22) Filed: Feb. 29, 2024

(65) Prior Publication Data

US 2024/0251572 A1 Jul. 25, 2024

Related U.S. Application Data

(63) Continuation-in-part of application No. 18/385,383, filed on Oct. 31, 2023, which is a continuation-in-part
(Continued)

(51) Int. Cl.
*H10B 80/00* (2023.01)
*H01L 23/00* (2006.01)
(Continued)

(52) U.S. Cl.
CPC ........... *H10B 80/00* (2023.02); *H01L 24/08* (2013.01); *H01L 24/80* (2013.01);
(Continued)

(58) Field of Classification Search
None
See application file for complete search history.

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Colinge, J. P., et al., "Nanowire transistors without Junctions", Nature Nanotechnology, Feb. 21, 2010, pp. 1-5.
(Continued)

*Primary Examiner* — Sarah K Salerno
(74) *Attorney, Agent, or Firm* — PatentPC/PowerPatent; Bao Tran

(57) ABSTRACT

A 3D semiconductor device, the device including: a first level including a first single crystal layer and a memory control circuit, the memory control circuit including a plurality of first transistors; a first metal layer overlaying the first single crystal layer; a second metal layer overlaying the first metal layer; a plurality of second transistors disposed atop the second metal layer; a third metal layer disposed atop the plurality of third transistors; and a memory array including word-lines and memory cells, where the memory array includes at least four memory mini arrays, where at least one of the plurality of second transistors includes a metal gate, where each of the memory cells includes at least one of the plurality of second transistors, where the memory control circuit includes at least one digital to analog converter circuit, and where the device includes a hybrid bonding layer.

18 Claims, 108 Drawing Sheets

Related U.S. Application Data of application No. 17/367,385, filed on Jul. 4, 2021, now Pat. No. 11,937,422, which is a continuation-in-part of application No. 16/786,060, filed on Feb. 10, 2020, now Pat. No. 11,114,427, which is a continuation-in-part of application No. 16/377,238, filed on Apr. 7, 2019, now Pat. No. 10,622,365, which is a continuation-in-part of application No. 15/911,071, filed on Mar. 2, 2018, now Pat. No. 10,297,599, which is a continuation-in-part of application No. 15/344,562, filed on Nov. 6, 2016, now Pat. No. 9,953,994, application No. 18/592,383, filed on Feb. 29, 2024 is a continuation-in-part of application No. 16/797,231, filed on Feb. 21, 2020, now Pat. No. 11,978,731, which is a continuation-in-part of application No. 16/224,674, filed on Dec. 18, 2018, now abandoned, which is a continuation-in-part of application No. 15/761,426, filed as application No. PCT/US2016/052726 on Sep. 21, 2016, now Pat. No. 10,515,981.

(60) Provisional application No. 62/297,857, filed on Feb. 20, 2016, provisional application No. 62/269,950, filed on Dec. 19, 2015, provisional application No. 62/258,433, filed on Nov. 21, 2015, provisional application No. 62/252,448, filed on Nov. 7, 2015, provisional application No. 62/221,618, filed on Sep. 21, 2015.

(51) Int. Cl.
*H01L 25/00* (2006.01)
*H01L 25/065* (2023.01)
*H01L 25/18* (2023.01)

(52) U.S. Cl.
CPC .......... *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |

(56) References Cited

U.S. PATENT DOCUMENTS

| | | | |
|---|---|---|---|
| 6,020,252 | A | 2/2000 | Aspar et al. |
| 6,020,263 | A | 2/2000 | Shih et al. |
| 6,027,958 | A | 2/2000 | Vu et al. |
| 6,030,700 | A | 2/2000 | Forrest et al. |
| 6,052,498 | A | 4/2000 | Paniccia |
| 6,054,370 | A | 4/2000 | Doyle |
| 6,057,212 | A | 5/2000 | Chan et al. |
| 6,071,795 | A | 6/2000 | Cheung et al. |
| 6,075,268 | A | 6/2000 | Gardner et al. |
| 6,103,597 | A | 8/2000 | Aspar et al. |
| 6,111,260 | A | 8/2000 | Dawson et al. |
| 6,125,217 | A | 9/2000 | Paniccia et al. |
| 6,153,495 | A | 11/2000 | Kub et al. |
| 6,191,007 | B1 | 2/2001 | Matsui et al. |
| 6,200,878 | B1 | 3/2001 | Yamagata |
| 6,222,203 | B1 | 4/2001 | Ishibashi et al. |
| 6,226,197 | B1 | 5/2001 | Nishimura |
| 6,229,161 | B1 | 5/2001 | Nemati et al. |
| 6,242,324 | B1 | 6/2001 | Kub et al. |
| 6,242,778 | B1 | 6/2001 | Marmillion et al. |
| 6,252,465 | B1 | 6/2001 | Katoh |
| 6,259,623 | B1 | 7/2001 | Takahashi |
| 6,261,935 | B1 | 7/2001 | See et al. |
| 6,264,805 | B1 | 7/2001 | Forrest et al. |
| 6,281,102 | B1 | 8/2001 | Cao et al. |
| 6,294,018 | B1 | 9/2001 | Hamm et al. |
| 6,306,705 | B1 | 10/2001 | Parekh et al. |
| 6,321,134 | B1 | 11/2001 | Henley et al. |
| 6,322,903 | B1 | 11/2001 | Siniaguine et al. |
| 6,331,468 | B1 | 12/2001 | Aronowitz et al. |
| 6,331,790 | B1 | 12/2001 | Or-Bach et al. |
| 6,331,943 | B1 | 12/2001 | Naji et al. |
| 6,353,492 | B2 | 3/2002 | McClelland et al. |
| 6,355,501 | B1 | 3/2002 | Fung et al. |
| 6,355,976 | B1 | 3/2002 | Faris |
| 6,358,631 | B1 | 3/2002 | Forrest et al. |
| 6,365,270 | B2 | 4/2002 | Forrest et al. |
| 6,376,337 | B1 | 4/2002 | Wang et al. |
| 6,377,504 | B1 | 4/2002 | Hilbert |
| 6,380,046 | B1 | 4/2002 | Yamazaki |
| 6,392,253 | B1 | 5/2002 | Saxena |
| 6,404,043 | B1 | 6/2002 | Isaak |
| 6,417,108 | B1 | 7/2002 | Akino et al. |
| 6,420,215 | B1 | 7/2002 | Knall et al. |
| 6,423,614 | B1 | 7/2002 | Doyle |
| 6,429,481 | B1 | 8/2002 | Mo et al. |
| 6,429,484 | B1 | 8/2002 | Yu |
| 6,430,734 | B1 | 8/2002 | Zahar |
| 6,448,615 | B1 | 9/2002 | Forbes |
| 6,475,869 | B1 | 11/2002 | Yu |
| 6,476,493 | B2 | 11/2002 | Or-Bach et al. |
| 6,479,821 | B1 | 11/2002 | Hawryluk et al. |
| 6,483,707 | B1 | 11/2002 | Freuler et al. |
| 6,507,115 | B2 | 1/2003 | Hofstee |
| 6,515,334 | B2 | 2/2003 | Yamazaki et al. |
| 6,515,511 | B2 | 2/2003 | Sugibayashi et al. |
| 6,526,559 | B2 | 2/2003 | Schiefele et al. |
| 6,528,391 | B1 | 3/2003 | Henley et al. |
| 6,534,352 | B1 | 3/2003 | Kim |
| 6,534,382 | B1 | 3/2003 | Sakaguchi et al. |
| 6,544,837 | B1 | 4/2003 | Divakauni et al. |
| 6,545,314 | B2 | 4/2003 | Forbes et al. |
| 6,555,901 | B1 | 4/2003 | Yoshihara et al. |
| 6,563,139 | B2 | 5/2003 | Hen |
| 6,580,124 | B1 | 6/2003 | Cleeves |
| 6,580,289 | B2 | 6/2003 | Cox |
| 6,600,173 | B2 | 7/2003 | Tiwari |
| 6,617,694 | B2 | 9/2003 | Kodaira et al. |
| 6,620,659 | B2 | 9/2003 | Emmma et al. |
| 6,624,046 | B1 | 9/2003 | Zavracky et al. |
| 6,627,518 | B1 | 9/2003 | Inoue et al. |
| 6,627,985 | B2 | 9/2003 | Huppenthal et al. |
| 6,630,713 | B2 | 10/2003 | Geusic |
| 6,635,552 | B1 | 10/2003 | Gonzalez |
| 6,635,588 | B1 | 10/2003 | Hawryluk et al. |
| 6,638,834 | B2 | 10/2003 | Gonzalez |
| 6,642,744 | B2 | 11/2003 | Or-Bach et al. |
| 6,653,209 | B1 | 11/2003 | Yamagata |
| 6,653,712 | B2 | 11/2003 | Knall et al. |
| 6,661,085 | B2 | 12/2003 | Kellar et al. |
| 6,677,204 | B2 | 1/2004 | Cleeves et al. |
| 6,686,253 | B2 | 2/2004 | Or-Bach |
| 6,689,660 | B1 | 2/2004 | Noble |
| 6,701,071 | B2 | 3/2004 | Wada et al. |
| 6,703,328 | B2 | 3/2004 | Tanaka et al. |
| 6,756,633 | B2 | 6/2004 | Wang et al. |
| 6,756,811 | B2 | 6/2004 | Or-Bach |
| 6,759,282 | B2 | 7/2004 | Campbell et al. |
| 6,762,076 | B2 | 7/2004 | Kim et al. |
| 6,774,010 | B2 | 8/2004 | Chu et al. |
| 6,805,979 | B2 | 10/2004 | Ogura et al. |
| 6,806,171 | B1 | 10/2004 | Ulyashin et al. |
| 6,809,009 | B2 | 10/2004 | Aspar et al. |
| 6,815,781 | B2 | 11/2004 | Vyvoda et al. |
| 6,819,136 | B2 | 11/2004 | Or-Bach |
| 6,821,826 | B1 | 11/2004 | Chan et al. |
| 6,841,813 | B2 | 1/2005 | Walker et al. |
| 6,844,243 | B1 | 1/2005 | Gonzalez |
| 6,864,534 | B2 | 3/2005 | Ipposhi et al. |
| 6,875,671 | B2 | 4/2005 | Faris |
| 6,882,572 | B2 | 4/2005 | Wang et al. |
| 6,888,375 | B2 | 5/2005 | Feng et al. |
| 6,917,219 | B2 | 7/2005 | New |
| 6,927,431 | B2 | 8/2005 | Gonzalez |
| 6,930,511 | B2 | 8/2005 | Or-Bach |
| 6,943,067 | B2 | 9/2005 | Greenlaw |
| 6,943,407 | B2 | 9/2005 | Ouyang et al. |
| 6,949,421 | B1 | 9/2005 | Padmanabhan et al. |
| 6,953,956 | B2 | 10/2005 | Or-Bach et al. |
| 6,967,149 | B2 | 11/2005 | Meyer et al. |
| 6,985,012 | B2 | 1/2006 | Or-Bach |
| 6,989,687 | B2 | 1/2006 | Or-Bach |
| 6,995,430 | B2 | 2/2006 | Langdo et al. |
| 6,995,456 | B2 | 2/2006 | Nowak |
| 7,015,719 | B1 | 3/2006 | Feng et al. |
| 7,016,569 | B2 | 3/2006 | Mule et al. |
| 7,018,875 | B2 | 3/2006 | Madurawe |
| 7,019,557 | B2 | 3/2006 | Madurawe |
| 7,043,106 | B2 | 5/2006 | West et al. |
| 7,052,941 | B2 | 5/2006 | Lee |
| 7,064,579 | B2 | 6/2006 | Madurawe |
| 7,067,396 | B2 | 6/2006 | Aspar et al. |
| 7,067,909 | B2 | 6/2006 | Reif et al. |
| 7,068,070 | B2 | 6/2006 | Or-Bach |
| 7,068,072 | B2 | 6/2006 | New et al. |
| 7,078,739 | B1 | 7/2006 | Nemati et al. |
| 7,094,667 | B1 | 8/2006 | Bower |
| 7,098,691 | B2 | 8/2006 | Or-Bach et al. |
| 7,105,390 | B2 | 9/2006 | Brask et al. |
| 7,105,871 | B2 | 9/2006 | Or-Bach et al. |
| 7,109,092 | B2 | 9/2006 | Tong |
| 7,110,629 | B2 | 9/2006 | Bjorkman et al. |
| 7,111,149 | B2 | 9/2006 | Eilert |
| 7,112,815 | B2 | 9/2006 | Prall |
| 7,115,945 | B2 | 10/2006 | Lee et al. |
| 7,115,966 | B2 | 10/2006 | Ido et al. |
| 7,141,853 | B2 | 11/2006 | Campbell et al. |
| 7,148,119 | B1 | 12/2006 | Sakaguchi et al. |
| 7,157,787 | B2 | 1/2007 | Kim et al. |
| 7,157,937 | B2 | 1/2007 | Apostol et al. |
| 7,166,520 | B1 | 1/2007 | Henley |
| 7,170,807 | B2 | 1/2007 | Fazan et al. |
| 7,173,369 | B2 | 2/2007 | Forrest et al. |
| 7,180,091 | B2 | 2/2007 | Yamazaki et al. |
| 7,180,379 | B1 | 2/2007 | Hopper et al. |
| 7,183,611 | B2 | 2/2007 | Bhattacharyya |
| 7,189,489 | B2 | 3/2007 | Kunimoto et al. |
| 7,205,204 | B2 | 4/2007 | Ogawa et al. |
| 7,209,384 | B1 | 4/2007 | Kim |
| 7,217,636 | B1 | 5/2007 | Atanackovic |
| 7,223,612 | B2 | 5/2007 | Sarma |
| 7,242,012 | B2 | 7/2007 | Leedy |
| 7,245,002 | B2 | 7/2007 | Akino et al. |
| 7,256,104 | B2 | 8/2007 | Ito et al. |

(56) References Cited

U.S. PATENT DOCUMENTS

| | | |
|---|---|---|
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |

(56) References Cited

U.S. PATENT DOCUMENTS

| | | |
|---|---|---|
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonell et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |

(56) References Cited

U.S. PATENT DOCUMENTS

| | | |
|---|---|---|
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0146233 A1 | 7/2006 | Park |
| 2006/0150137 A1* | 7/2006 | Madurawe ....... H03K 19/17724 716/110 |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0108529 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |

(56) References Cited

U.S. PATENT DOCUMENTS

| | | |
|---|---|---|
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |

(56) References Cited

U.S. PATENT DOCUMENTS

| | | |
|---|---|---|
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker et al. |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 A) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et.al., "NiSi Salicide Technology for Scaled CMOS," Microelectronic Engineering, 60 (2002), pp. 157-169.

Froment, B., et.al., "Nickel vs. Cobalt Silicide integration for sub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to -2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

(56) References Cited

OTHER PUBLICATIONS

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.

(56) References Cited

OTHER PUBLICATIONS

Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging - Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.
Meindl, J. D., "Beyond Moore's Law: the Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS Mantech Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of lon Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced Dss Mosfet Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with

(56) References Cited

OTHER PUBLICATIONS

Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, A., et al., "Efficient production of silicon-on-insulator films by co-implantation of He+ with H+'" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process": A New SOI wafer fabrication method, Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Applied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol. No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al., "Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

(56) References Cited

OTHER PUBLICATIONS

Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol. No., pp. 14-15, Jun. 12-14, 2007.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Kim, W., et al., "Multi-layered Vertical Gate NAND Flash overcoming stacking limit for terabit density storage", Symposium on VLSI Technology Digest of Technical Papers, 2009, pp. 188-189.
Dicioccio, L., et al., "Direct bonding for wafer level 3D integration", ICICDT 2010, pp. 110-113.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (φFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density Sram," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T Sram Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, Impact 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320 Microwave Dopant Activation", IEDM 2010, pp. 1-4.

(56) References Cited

OTHER PUBLICATIONS

Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360 ○C by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si ) Peripheral CMOS SSTFT and SRAM Cell Technology for 512M bit density Sram", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PHD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration", www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (Cubic) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P.-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.

(56) References Cited

OTHER PUBLICATIONS

Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D Cmos Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.

Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol. no., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Physics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al., "Monolithic 3D BEOL FinFET switch arrays using location-controlled-grain technique in voltage regulator with better FOM than 2D regulators", IEDM paper 3.1, pp. IEDM19-46 to -49.
Then, Han Wui, et al., "3D heterogeneous integration of high performance high-K metal gate GaN NMOS and Si PMOS transistors on 300mm high resistivity Si substrate for energy-efficient and compact power delivery, Rf (5G and beyond) and SoC applications", IEDM 2019, paper 17.3, pp. IEDM19-402 to IEDM19-405.
Rachmady, W., et al., "300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.

* cited by examiner

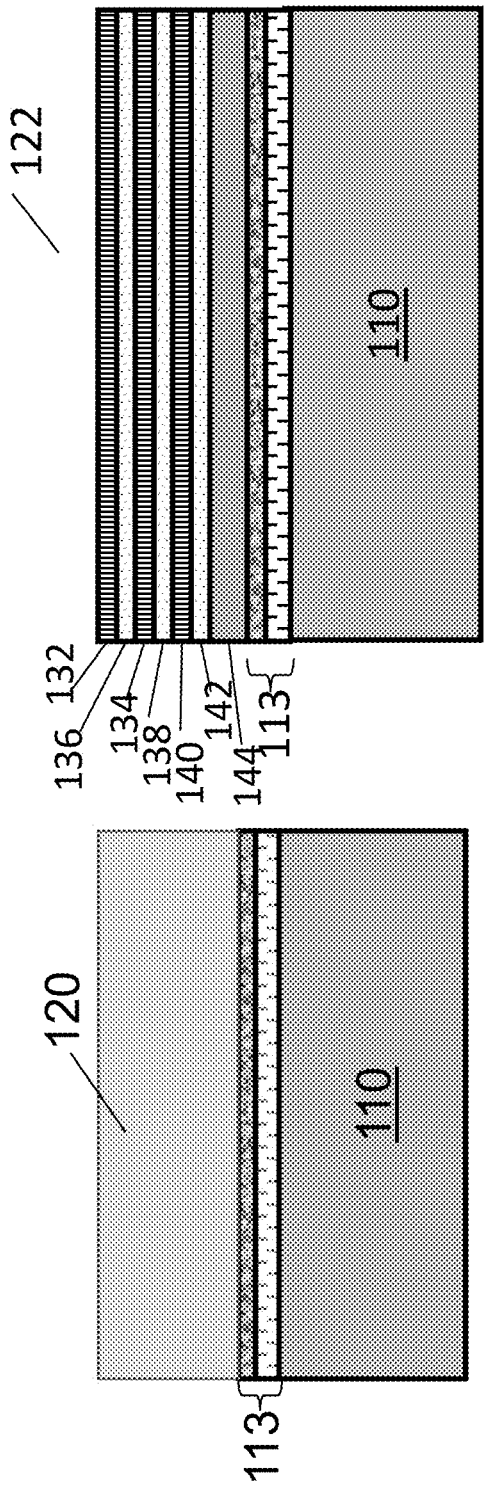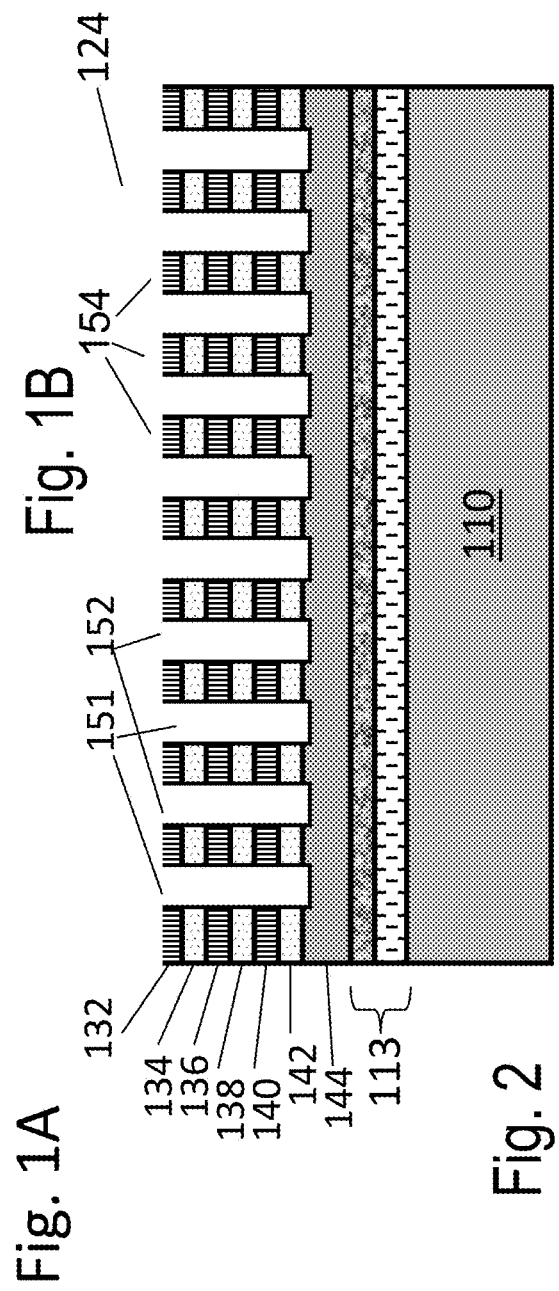

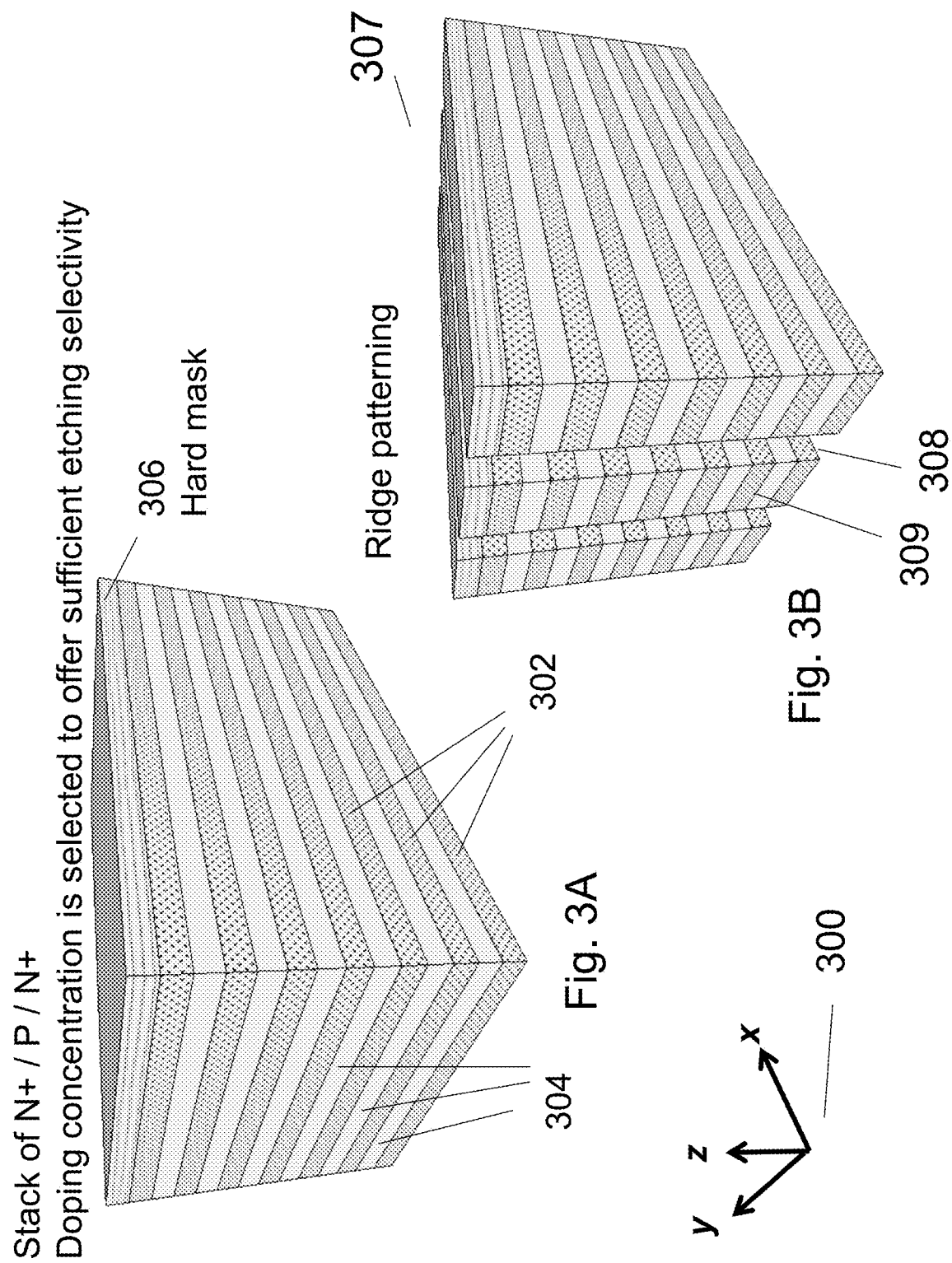

Selective etching channel (P) region to form undercut

Tunneling oxide layer, charge storage layer, control oxide layer stack deposition. Gate such as W or polysilicon deposition Anisotropic etching the gate material to form the horizontal gate Tunneling oxide layer, 312 charge storage layer, control oxide layer stack Gate 314

Pattern the Ridge to form vertical string;
Two step etching; anisotropic etch followed by isotropic etch.
The etching may be stop before the most bottom N+ layer that will be serve as common ground.
(see the sidewall view in next page)

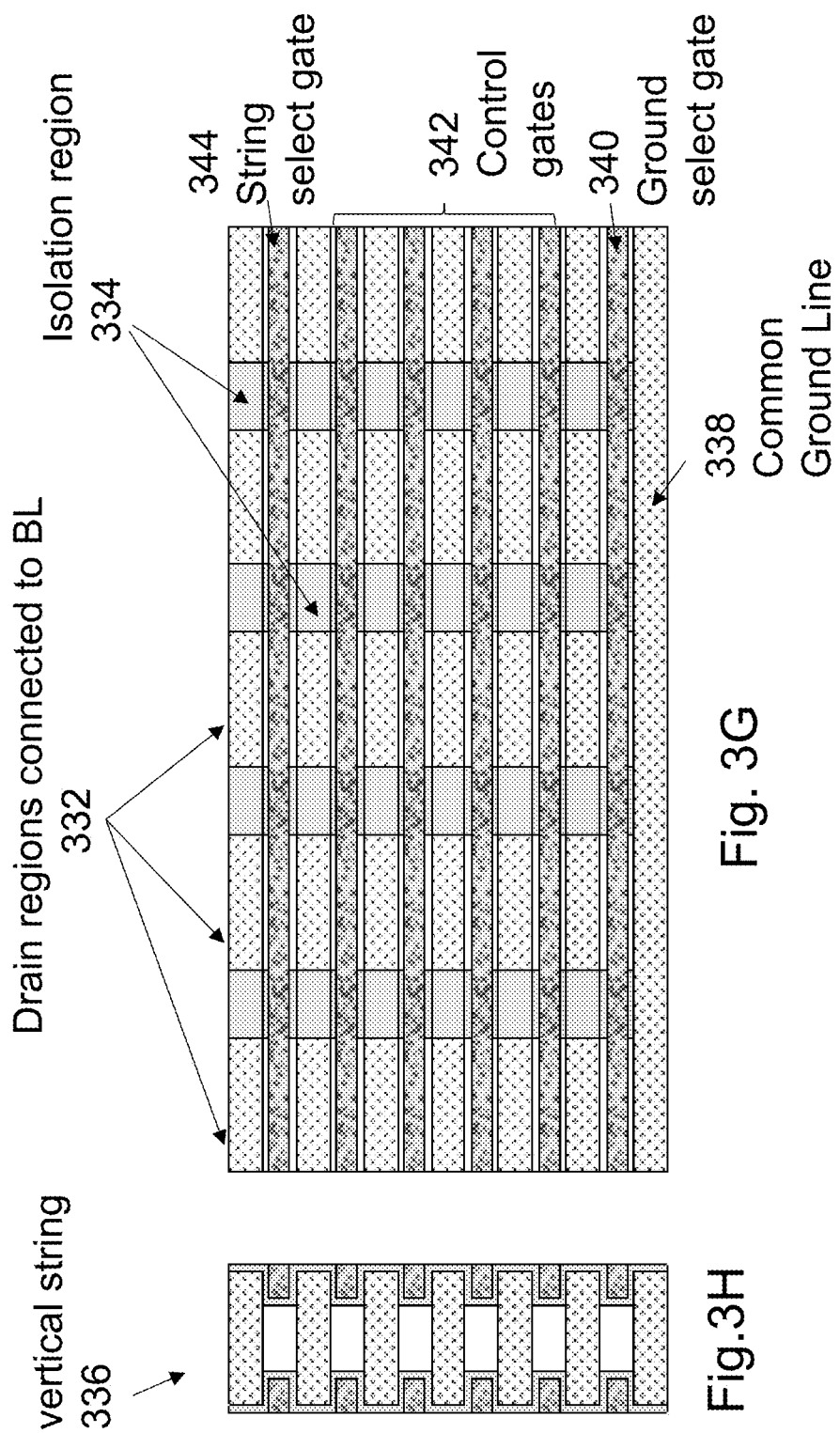

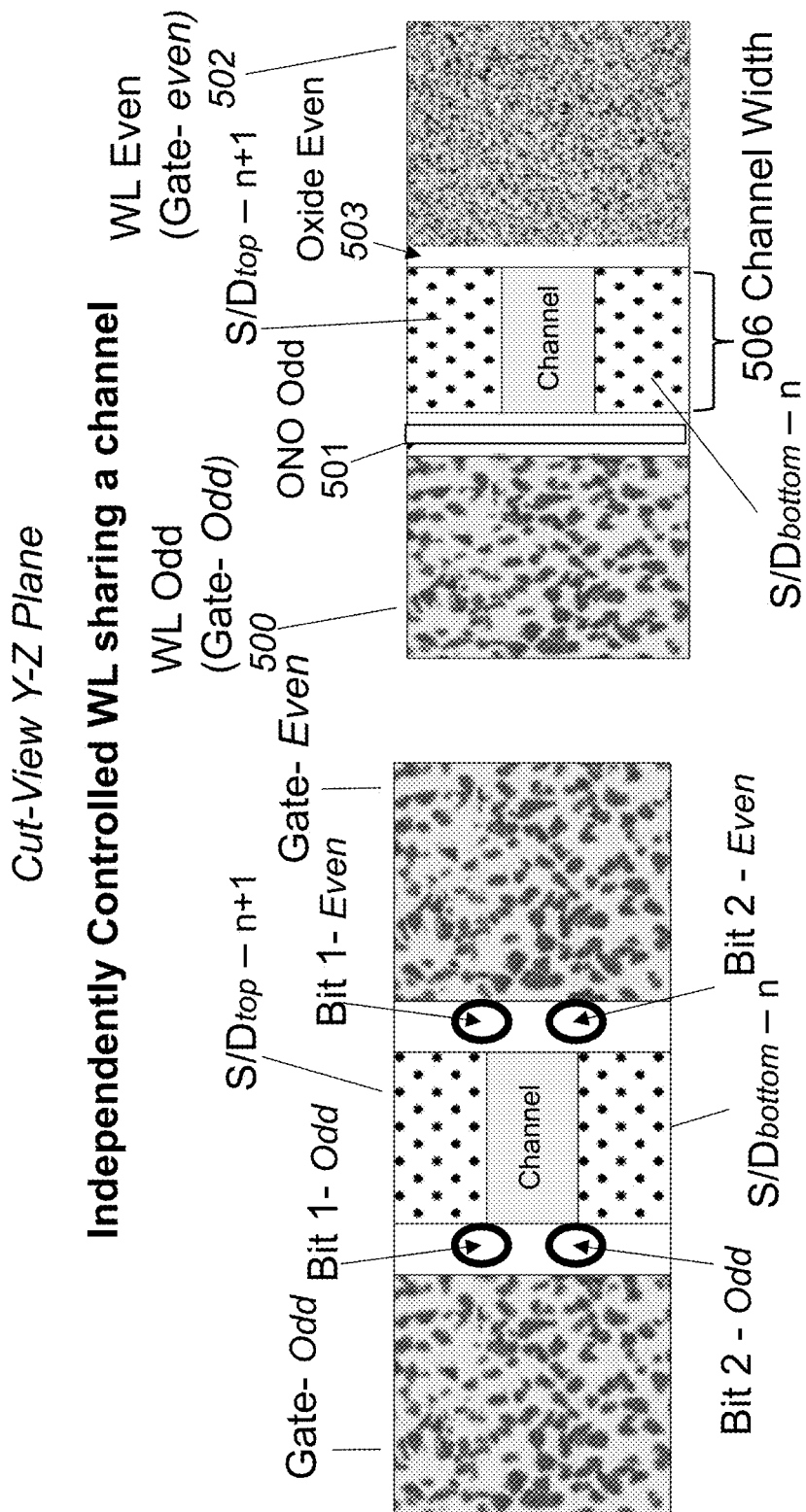

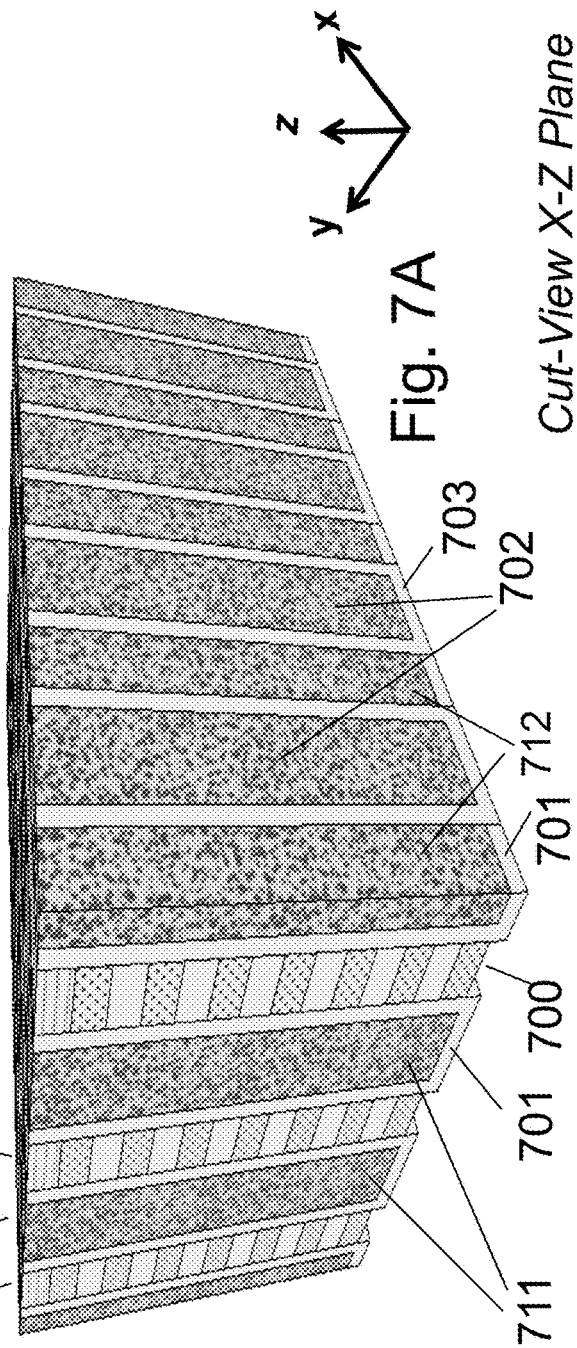
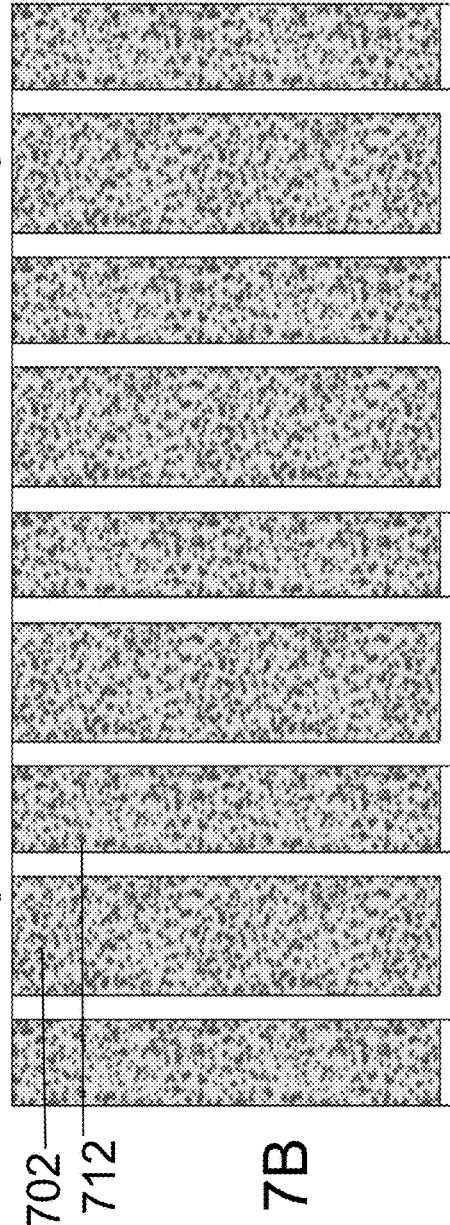
Fig. 7A
Fig. 7B

Curved Channel

*Cut-View Y-Z Plane* effective channel length becomes longer to be more distinctive charge trapping sites at given height

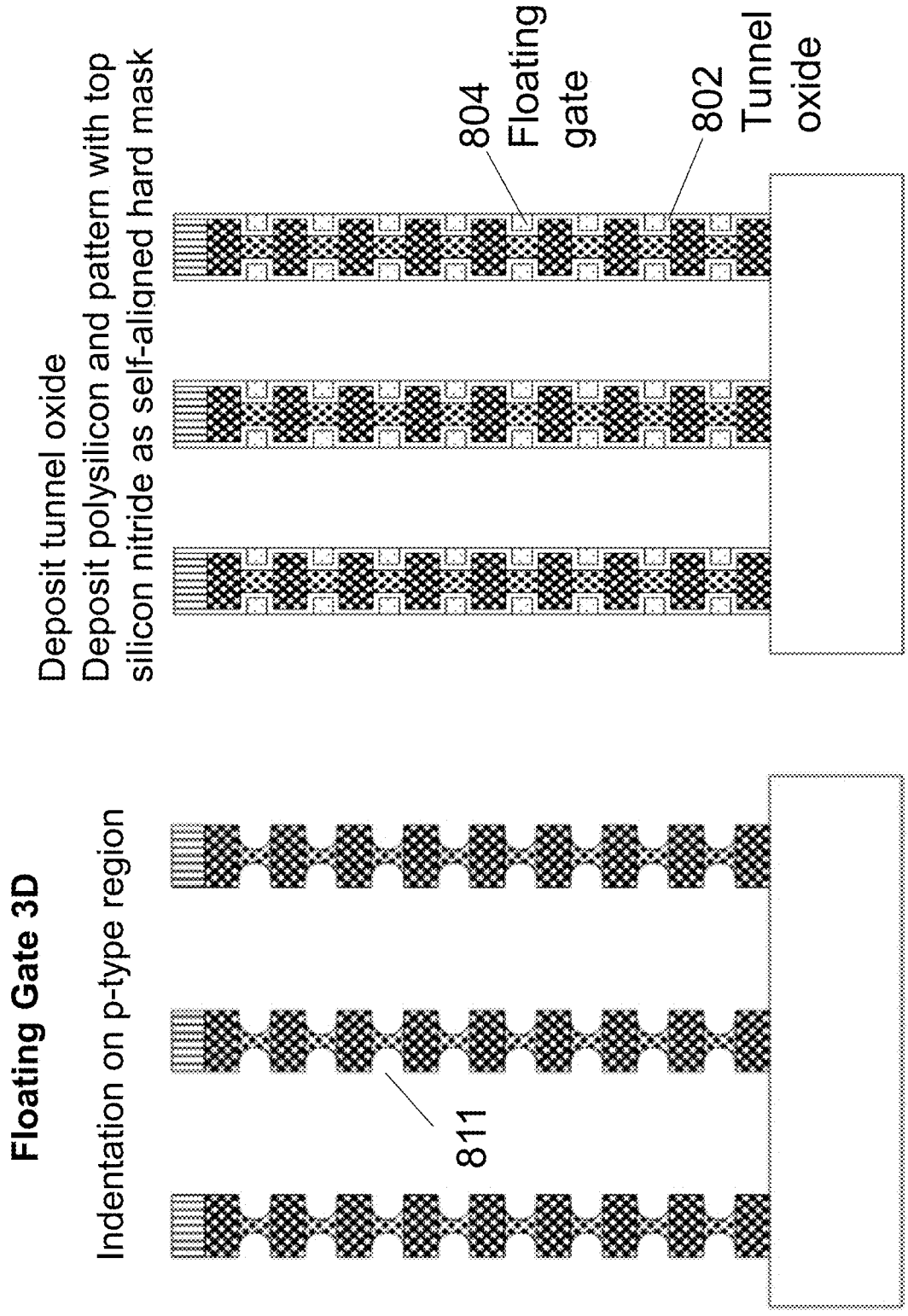

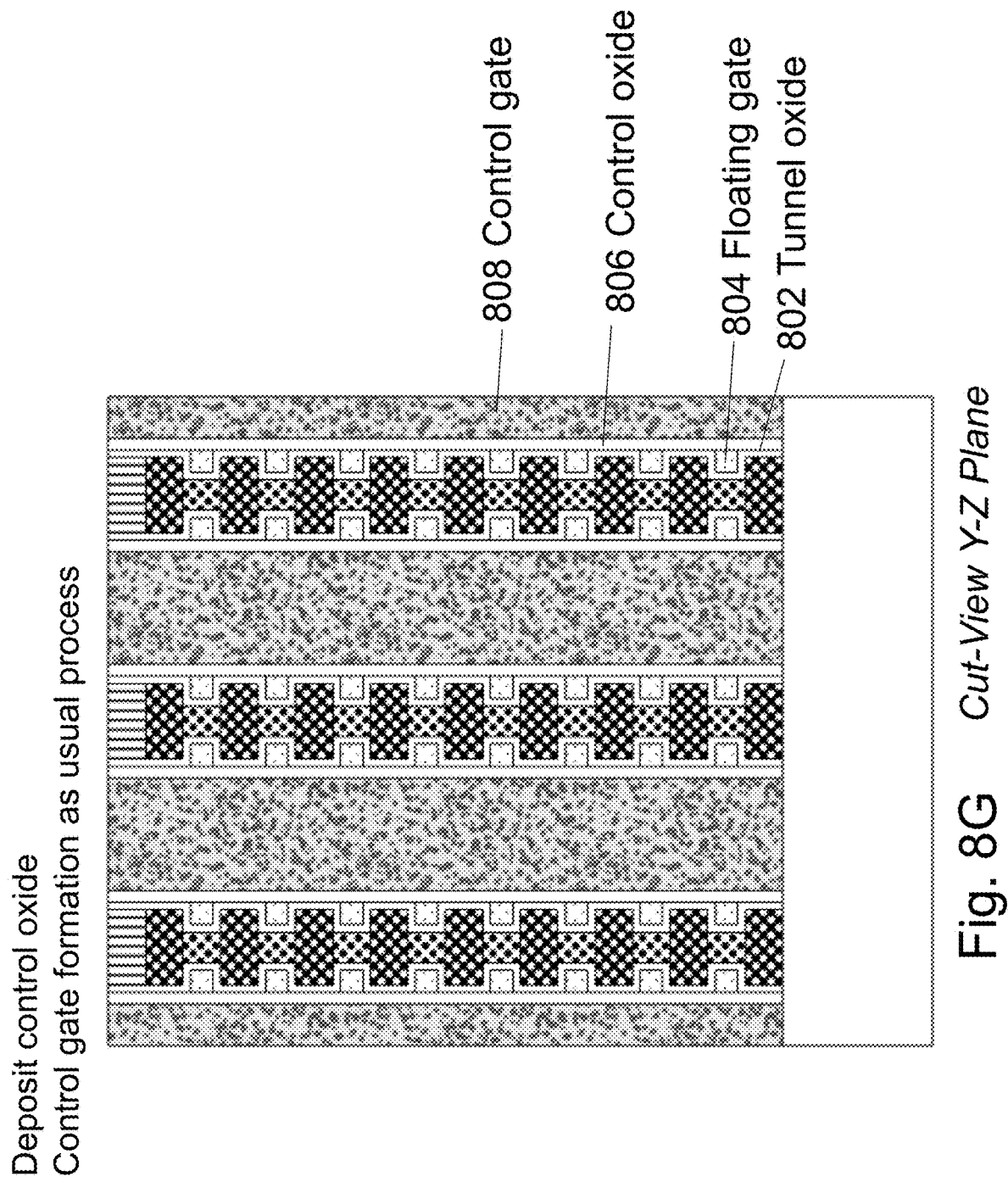
Fig. 8G  Cut-View Y-Z Plane

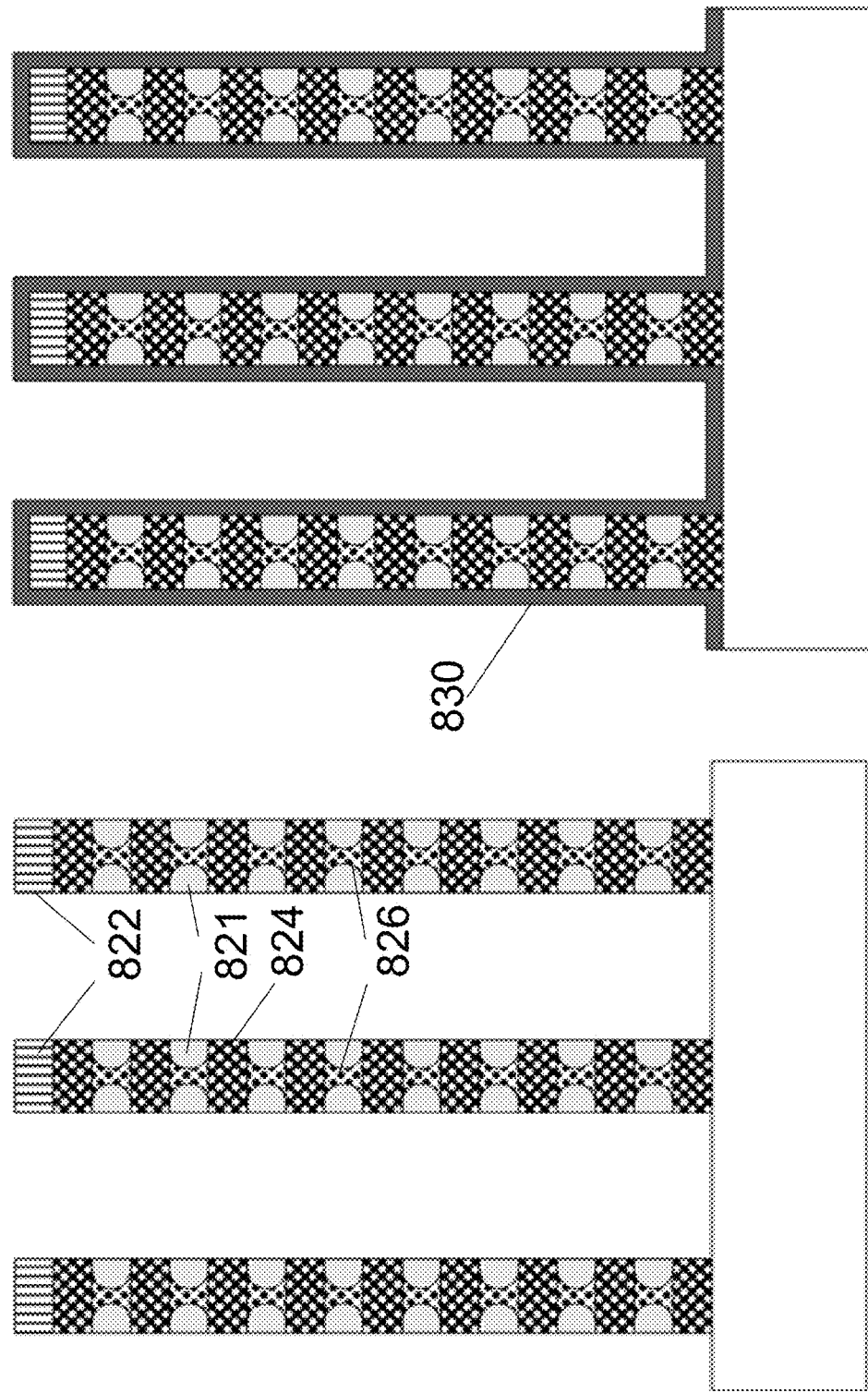
Fig. 8H  Cut-View Y-Z Plane
Fig. 8I  Cut-View Y-Z Plane

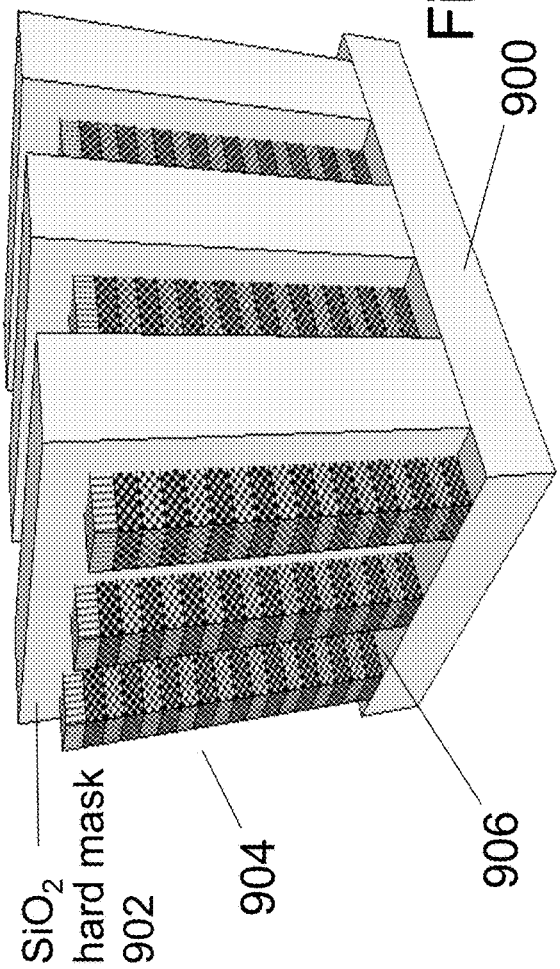
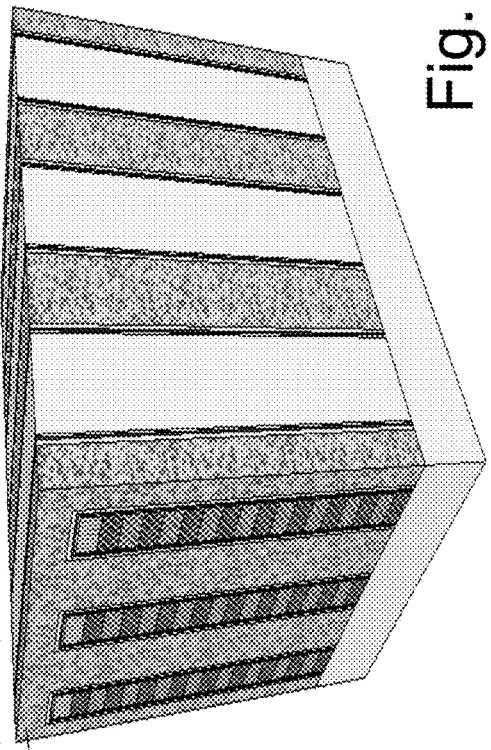
Fig. 9A
Fig. 9B

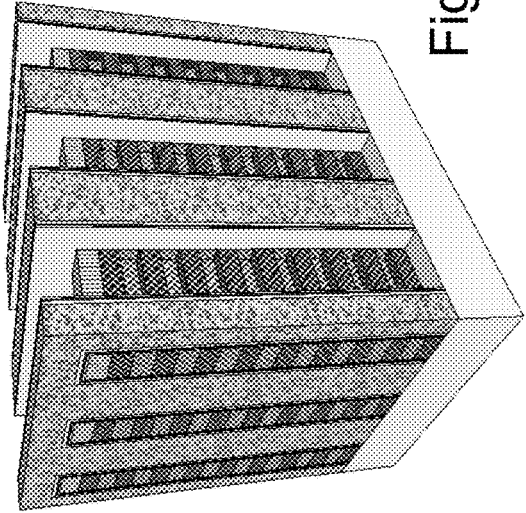
Fig. 9C
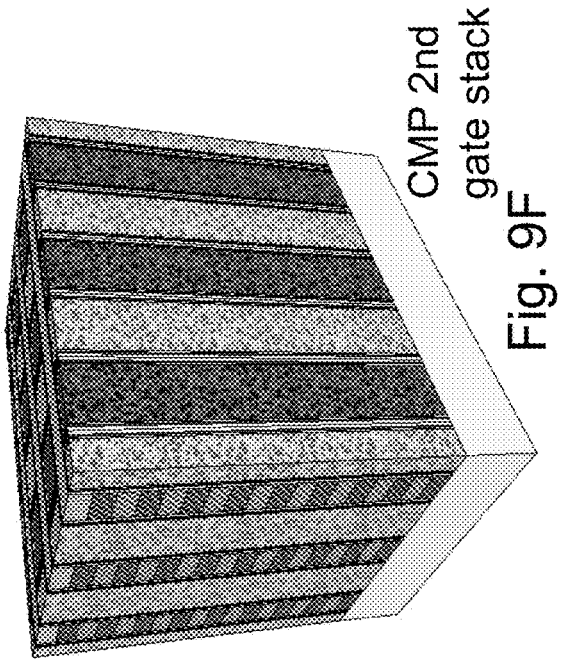
Fig. 9D
hard mask removal
Optional: P region indentation
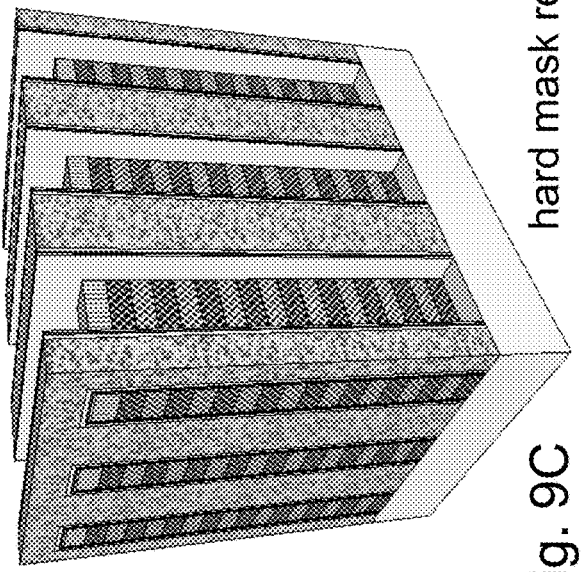
Fig. 9E
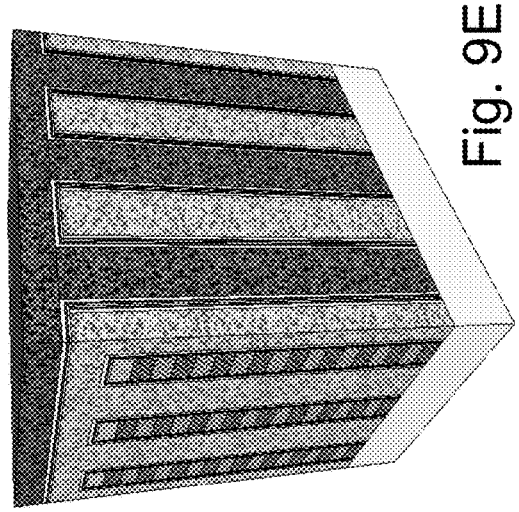
Fig. 9F
CMP 2nd gate stack
2nd gate stack with charge trap layer or normal oxide such as $SiO_2$

XY cut view along P layer with optional indentation

XY cut view along P layer

XY cut view along N+ layer with optional indentation

XY cut view along N+ layer

Cut-View X-Z Plane

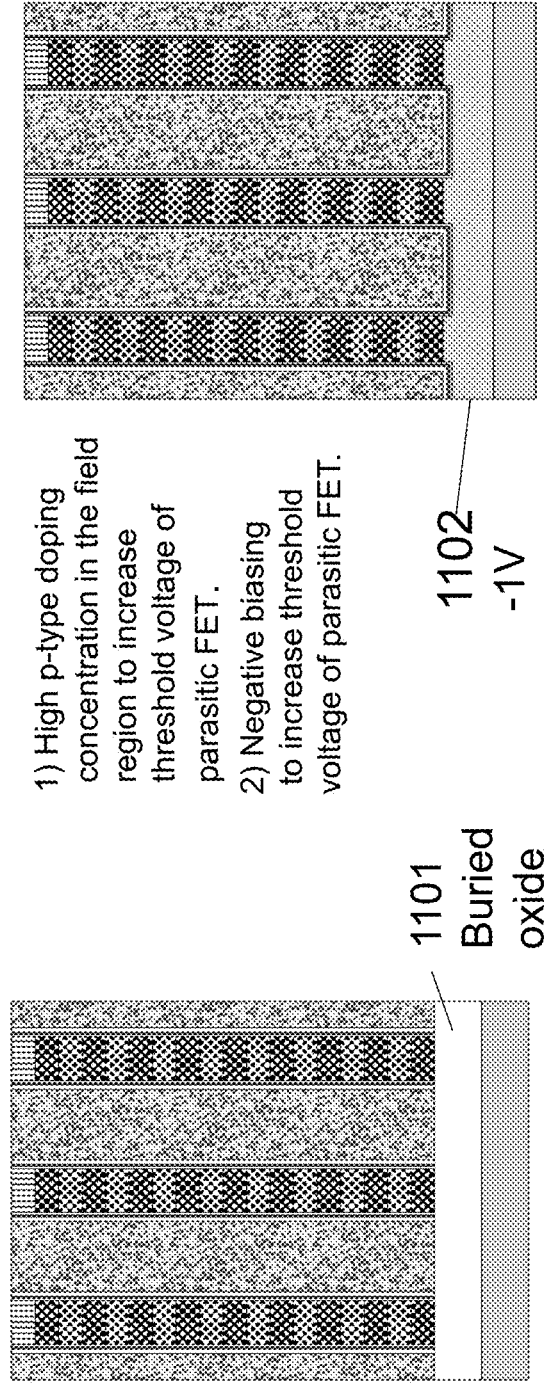
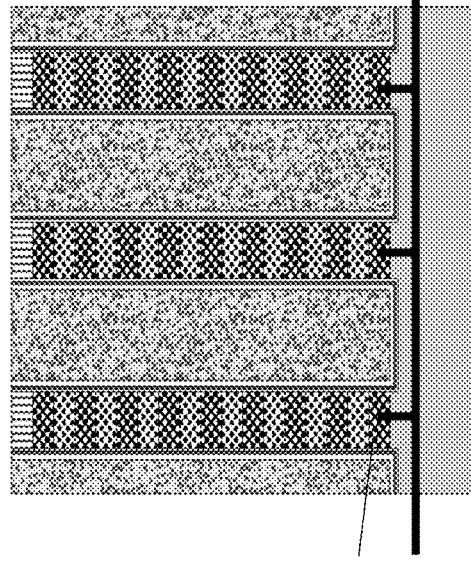

Fig. 11A
If the substrate is silicon on insulator (SOI) wafer, the buried oxide isolates adjacent ridge 1101 Buried oxide 1) High p-type doping concentration in the field region to increase threshold voltage of parasitic FET.
2) Negative biasing to increase threshold voltage of parasitic FET.
3) At the beginning to use the chip, electrically program (store electrons) in the charge trap region on the field region to increase threshold voltage of parasitic FET.

Fig. 11C
Cut-Views Y-Z Plane

Source line connect the most bottom N+ regions and use them as common source line

1104

*Cut-Views X-Y Plane*

Type B gate connection from top view

Type A gate connection from top view (fine pitch)

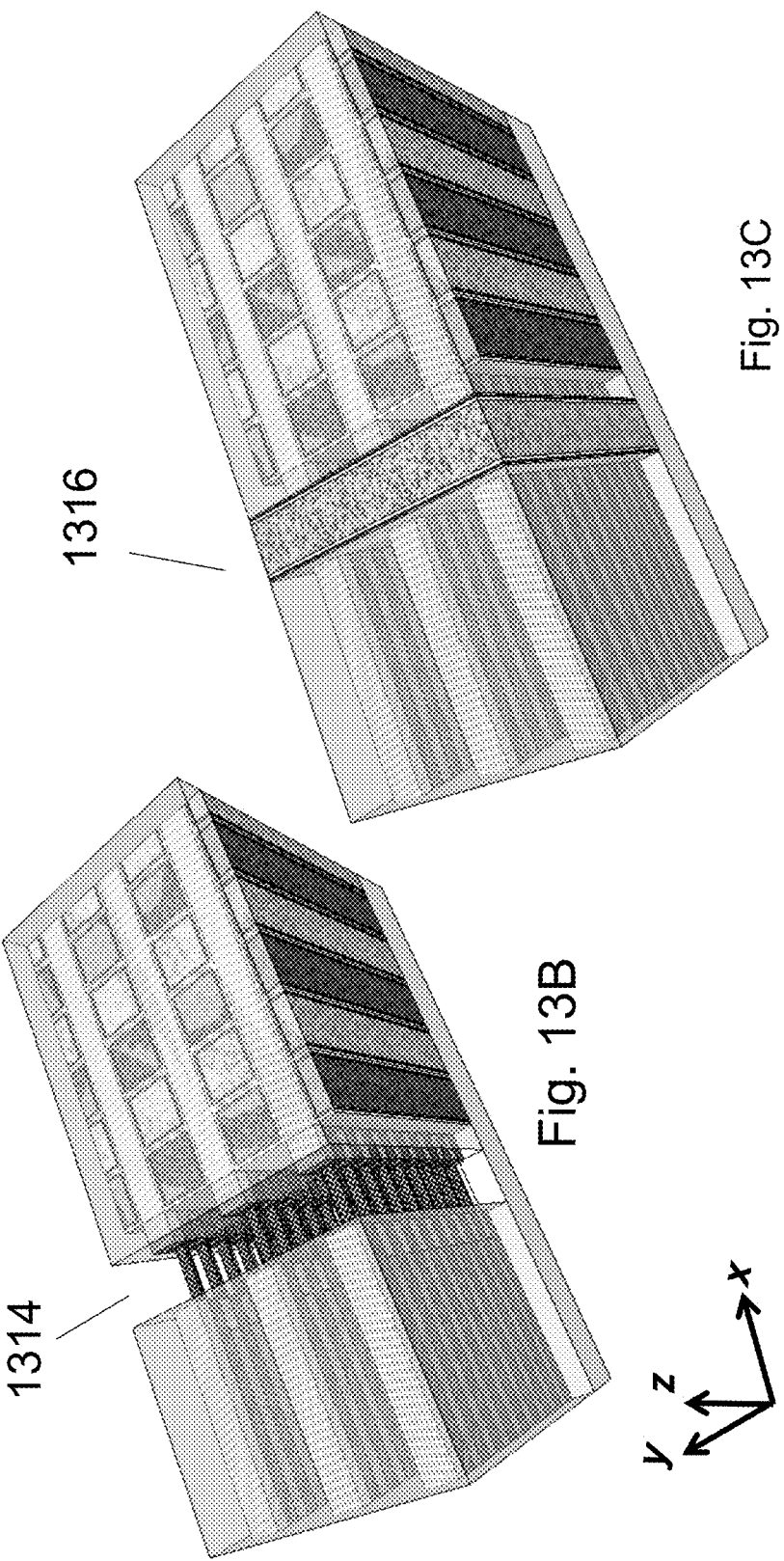

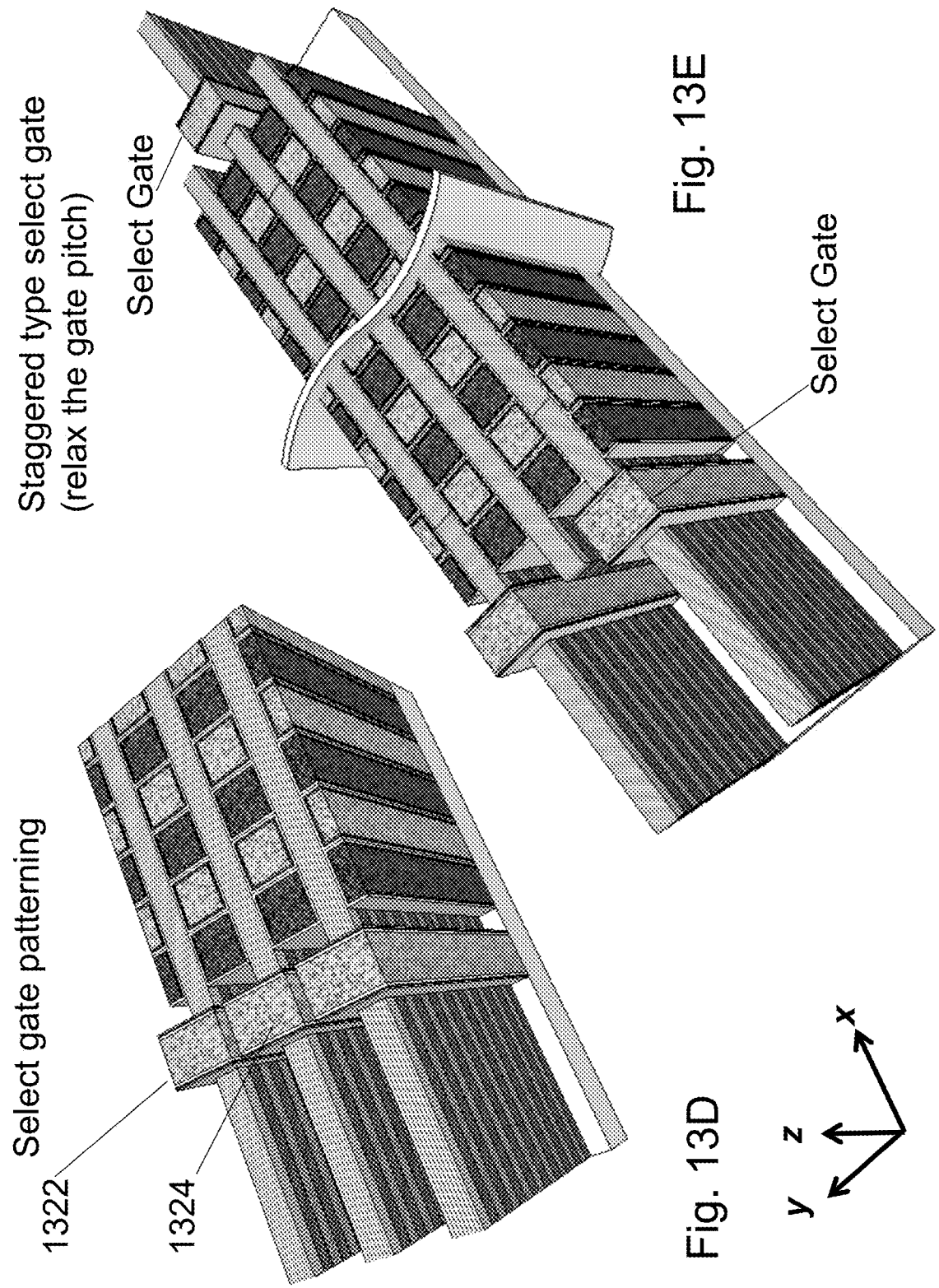

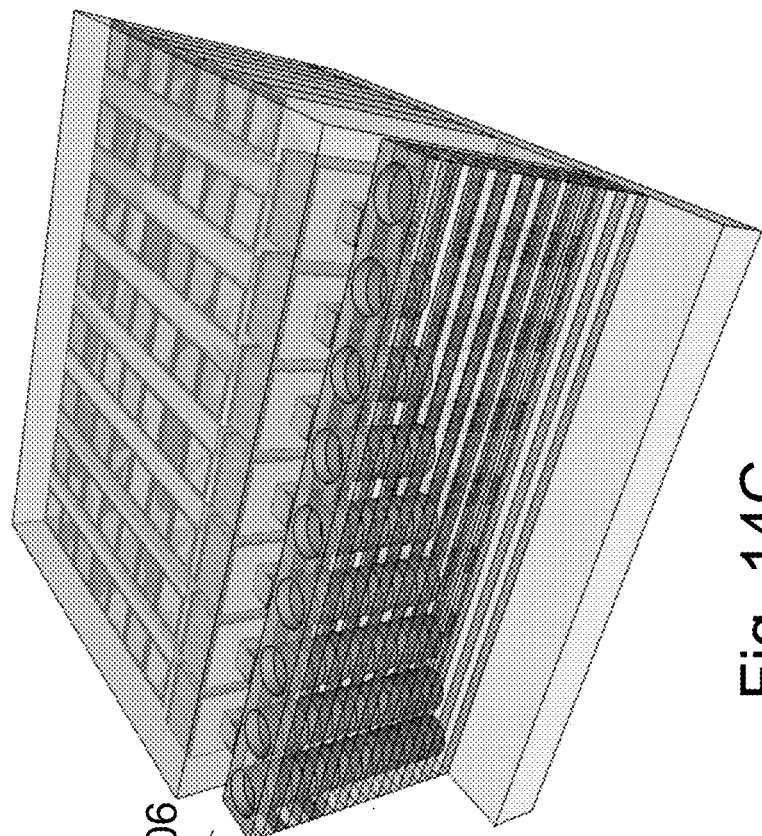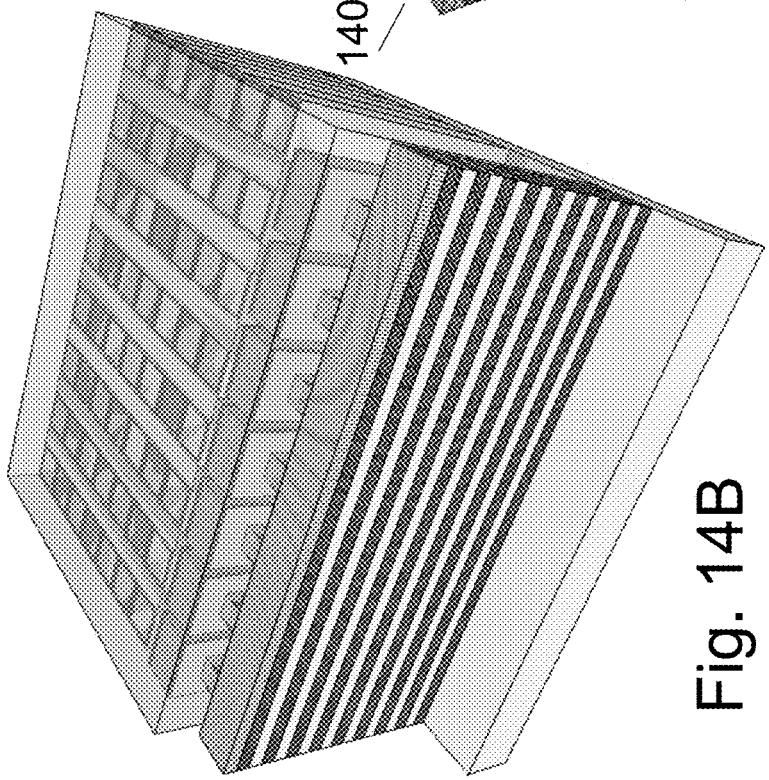

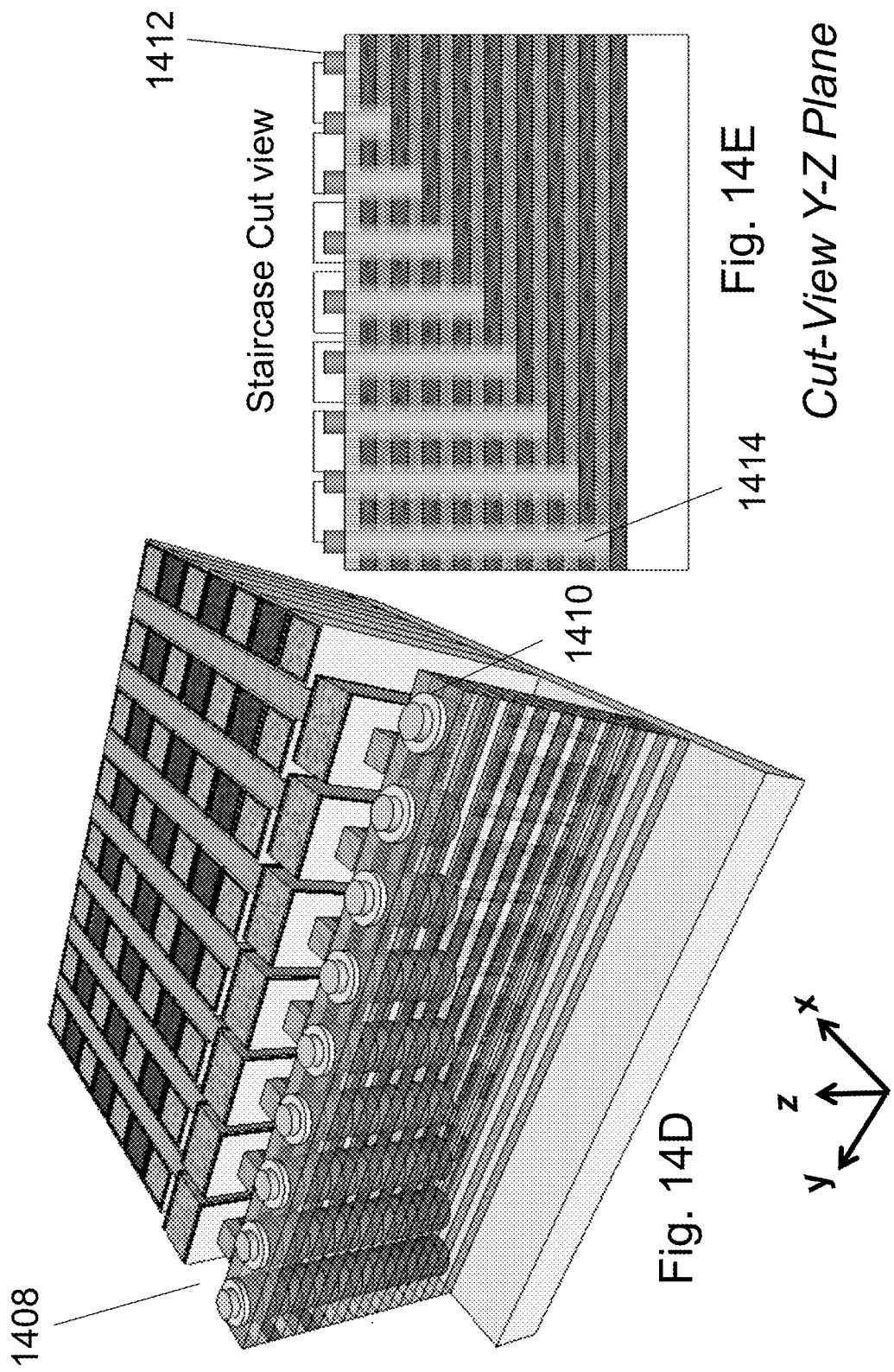

Cut-Views Y-Z Plane

Fig. 17

*Cut-View X-Y Plane*

| Clt | Pt0 | Pt1 | Pt2 | Pt3 | Pt4 | Pt5 | Pt6 | Pt7 | Crt |
|---|---|---|---|---|---|---|---|---|---|
| Pl0 | | | | | | | | | Pr0 |
| Pl1 | | | | | | | | | Pr1 |
| Pl2 | | | | | | | | | Pr2 |
| Pl3 | | | | | | | | | Pr3 |
| Pl4 | | | | | | | | | Pr4 |
| Pl5 | | | | | | | | | Pr5 |
| Pl6 | | | | | | | | | Pr6 |
| Pl7 | | | | | | | | | Pr7 |
| Clb | Pb0 | Pb 1 | Pb2 | Pb3 | Pb4 | Pb5 | Pb6 | Pb7 | Crb |

1701

1702

| Operation | S/D$_{bottom}$ | S/D$_{top}$ | Other S/D | C-Gate |
|---|---|---|---|---|
| Write bit 1 | 0 V | 4.0 V | Floating | 8 V |
| Write bit 2 | 4.0 V | 0 V | Floating | 8 V |
| Erase bit 1 | 0 V | 4.0 V | Floating | -8 V |
| Erase bit 2 | 4.0 V | 0 V | Floating | -8 V |
| Read on top channel (S/D$_{top}$ and S/D$_{bottom}$ swapping) | 1.0 → 0 V | 0 → 1.0 V | Floating | 4 V |

Cut-Views X-Z Plane

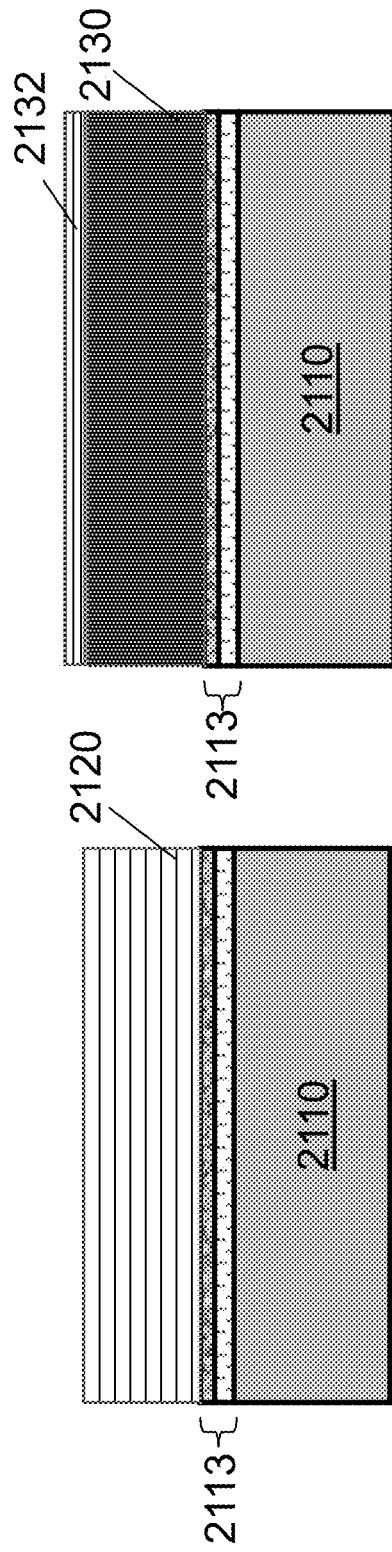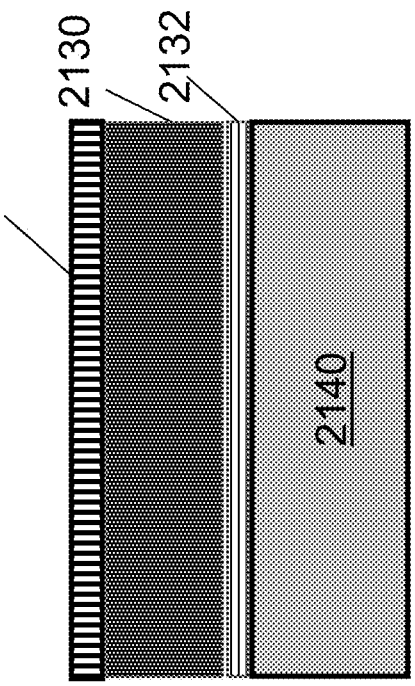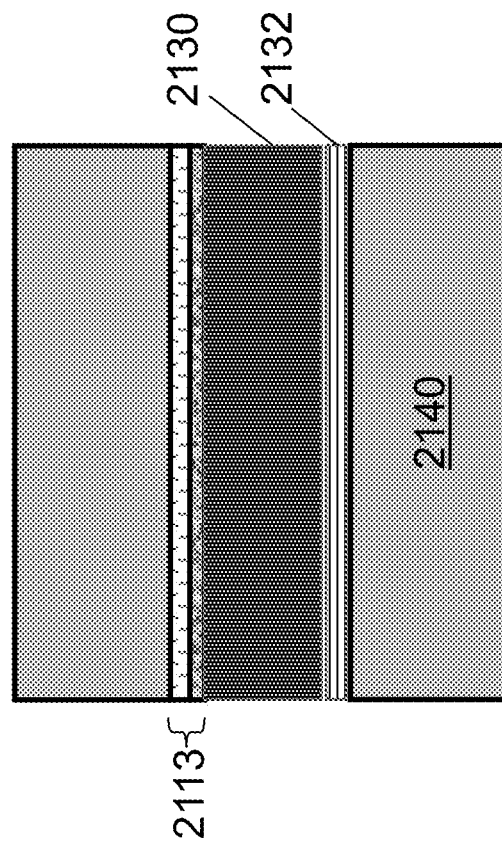
Fig. 21A  Fig. 21B  Fig. 21C  Fig. 21D
Cut-Views Y-Z Plane

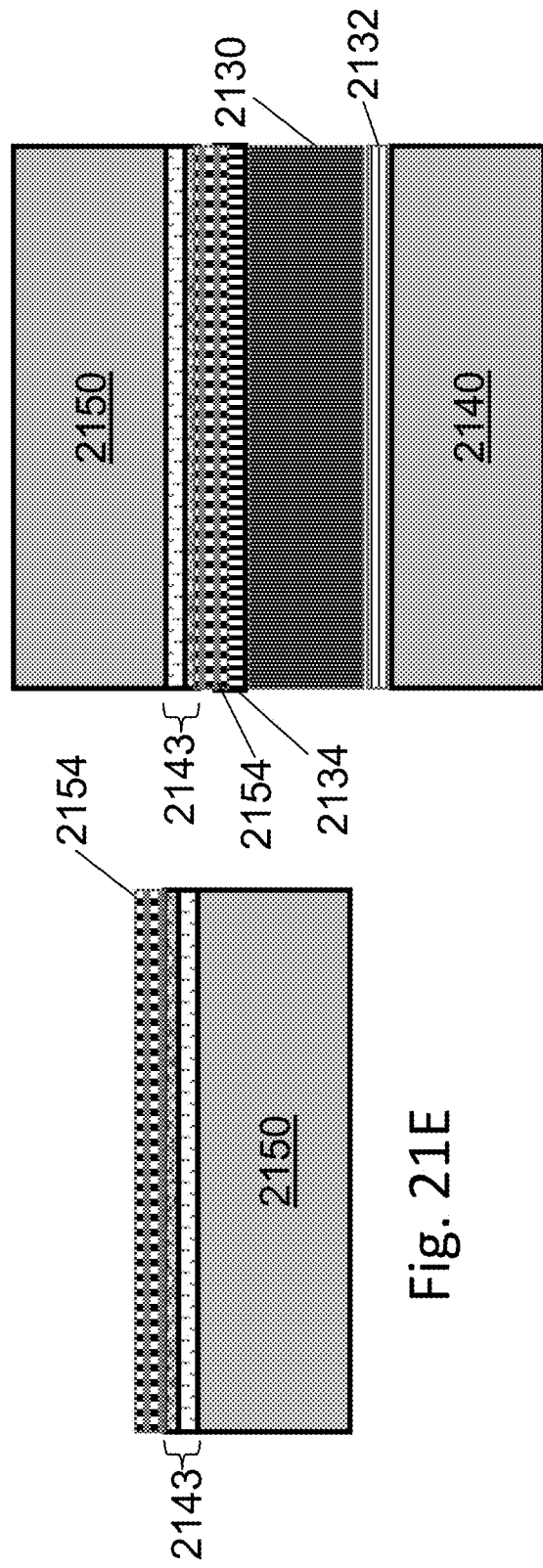

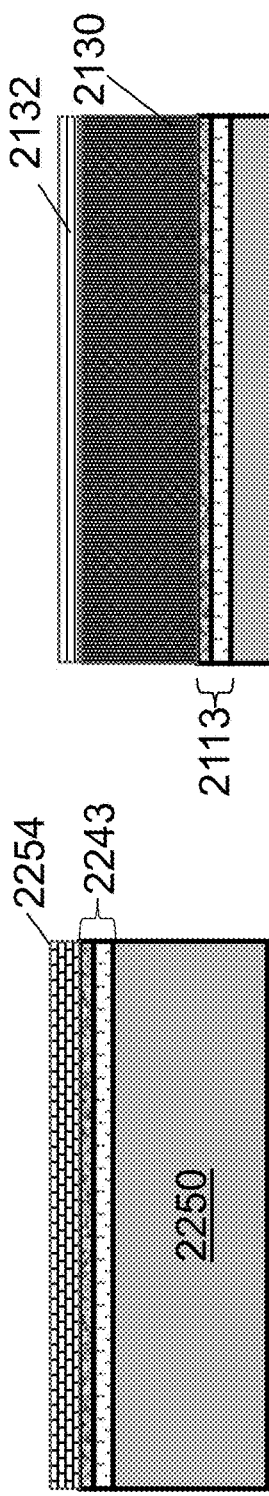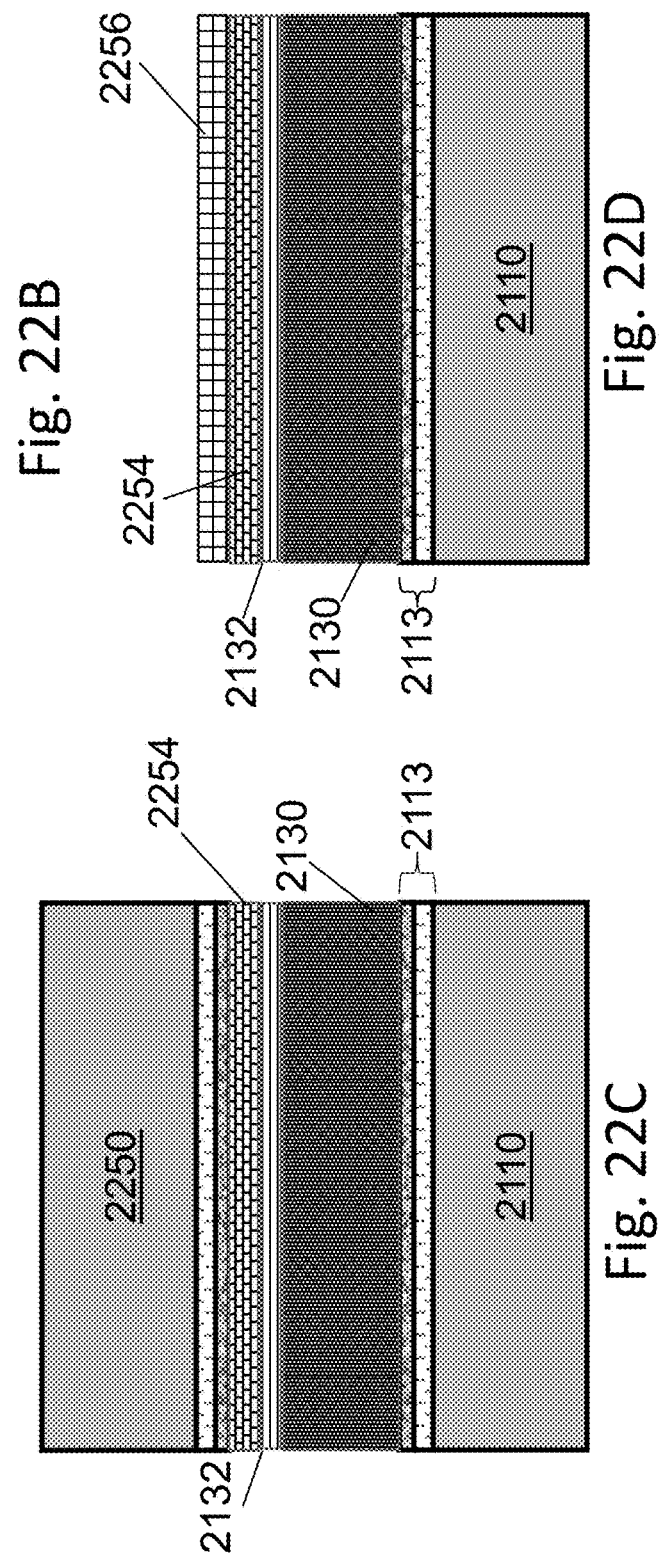

Cut-Views Y-Z Plane

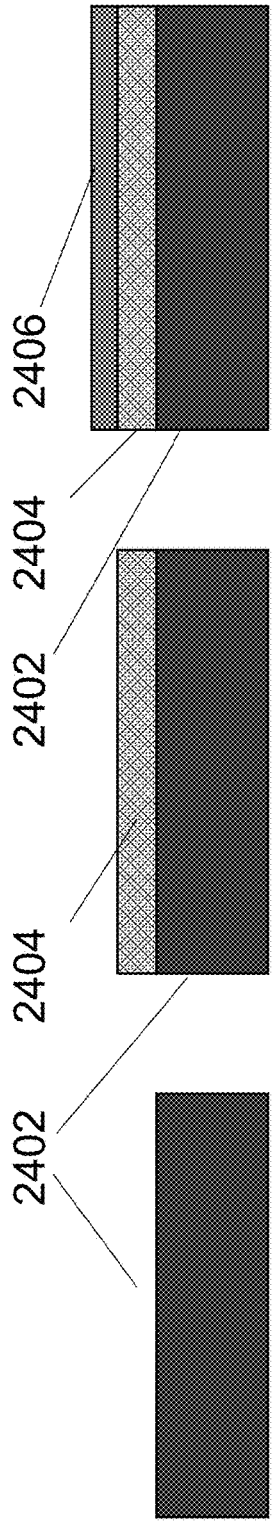
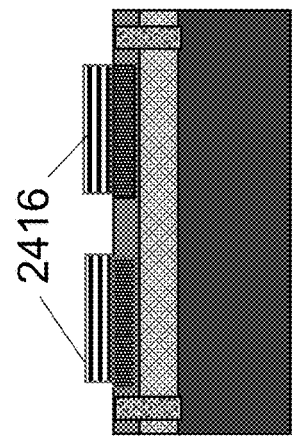
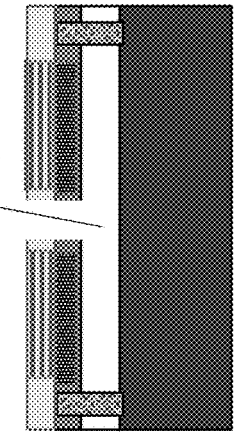
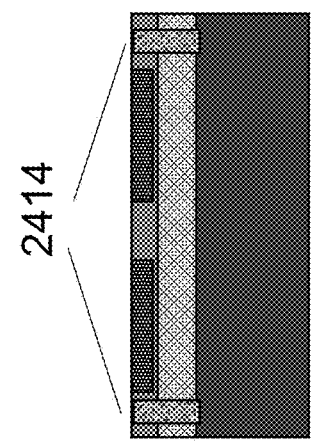
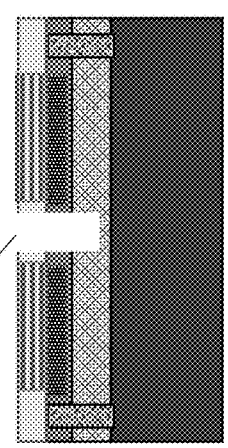
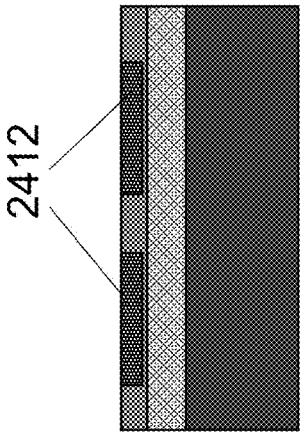
Fig. 24A, Fig. 24B, Fig. 24C, Fig. 24D, Fig. 24E, Fig. 24F, Fig. 24G, Fig. 24H, Fig. 24I
Cut-Views Y-Z Plane

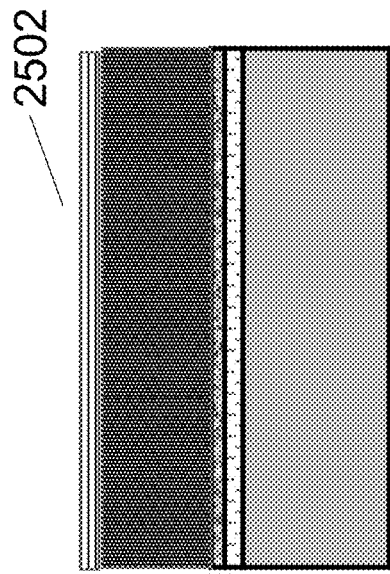
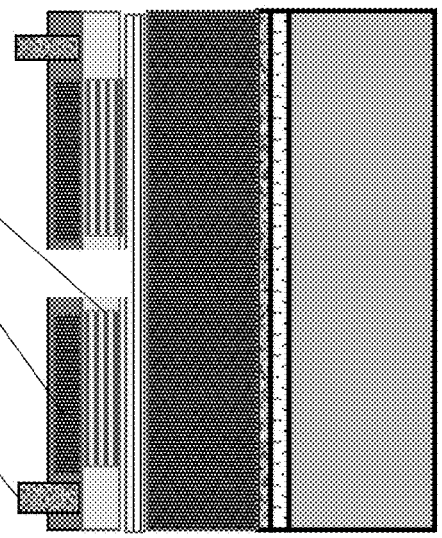
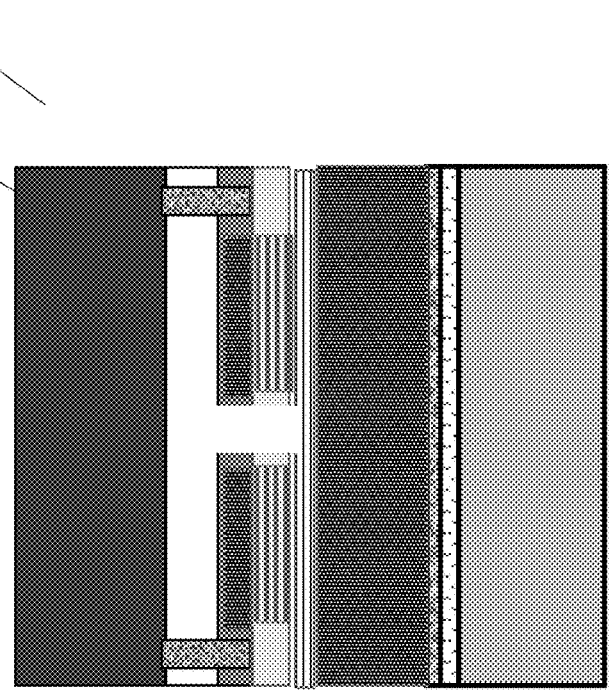
Fig. 25A  Fig. 25B  Fig. 25C  Fig. 25D
Cut-Views Y-Z Plane

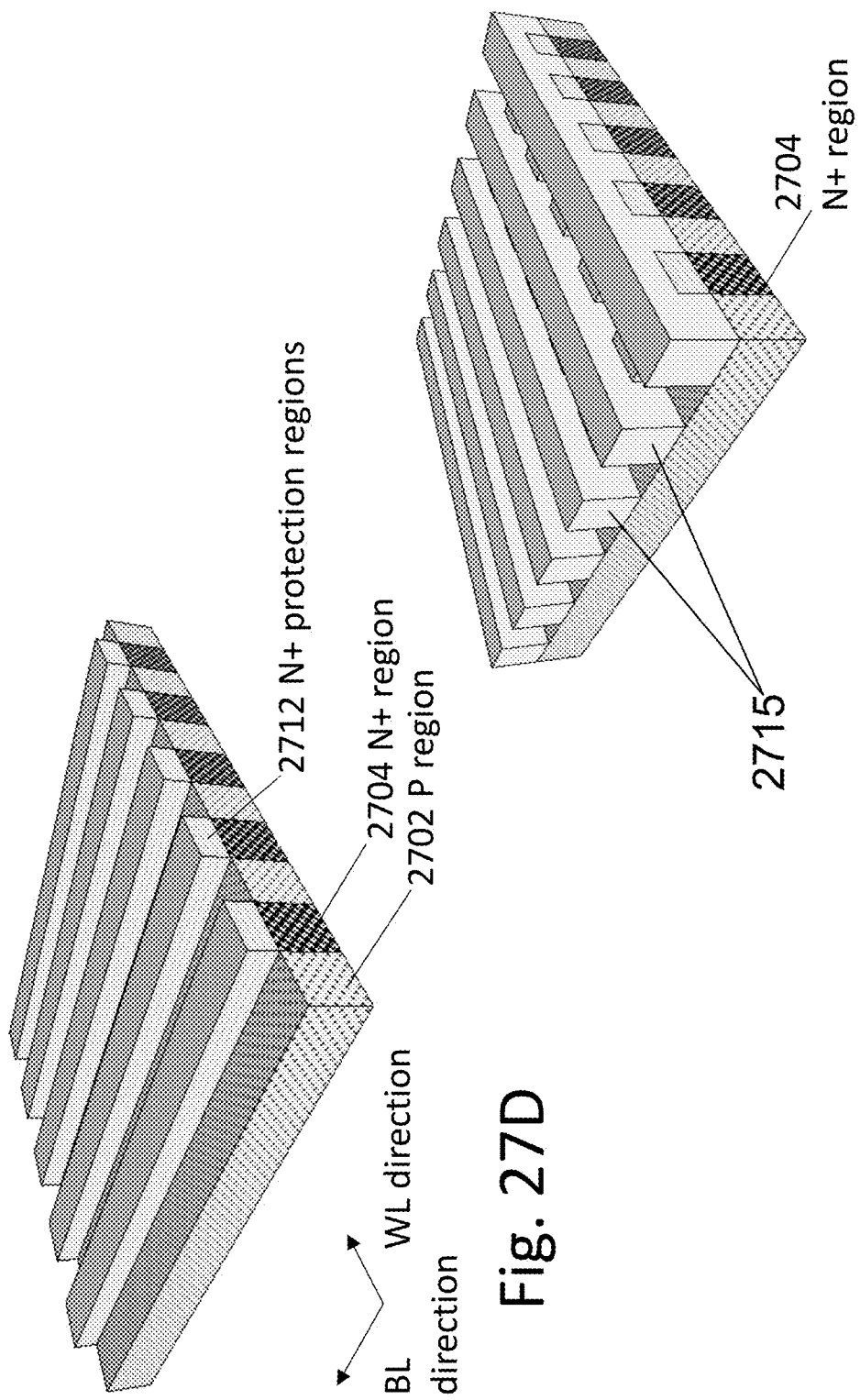

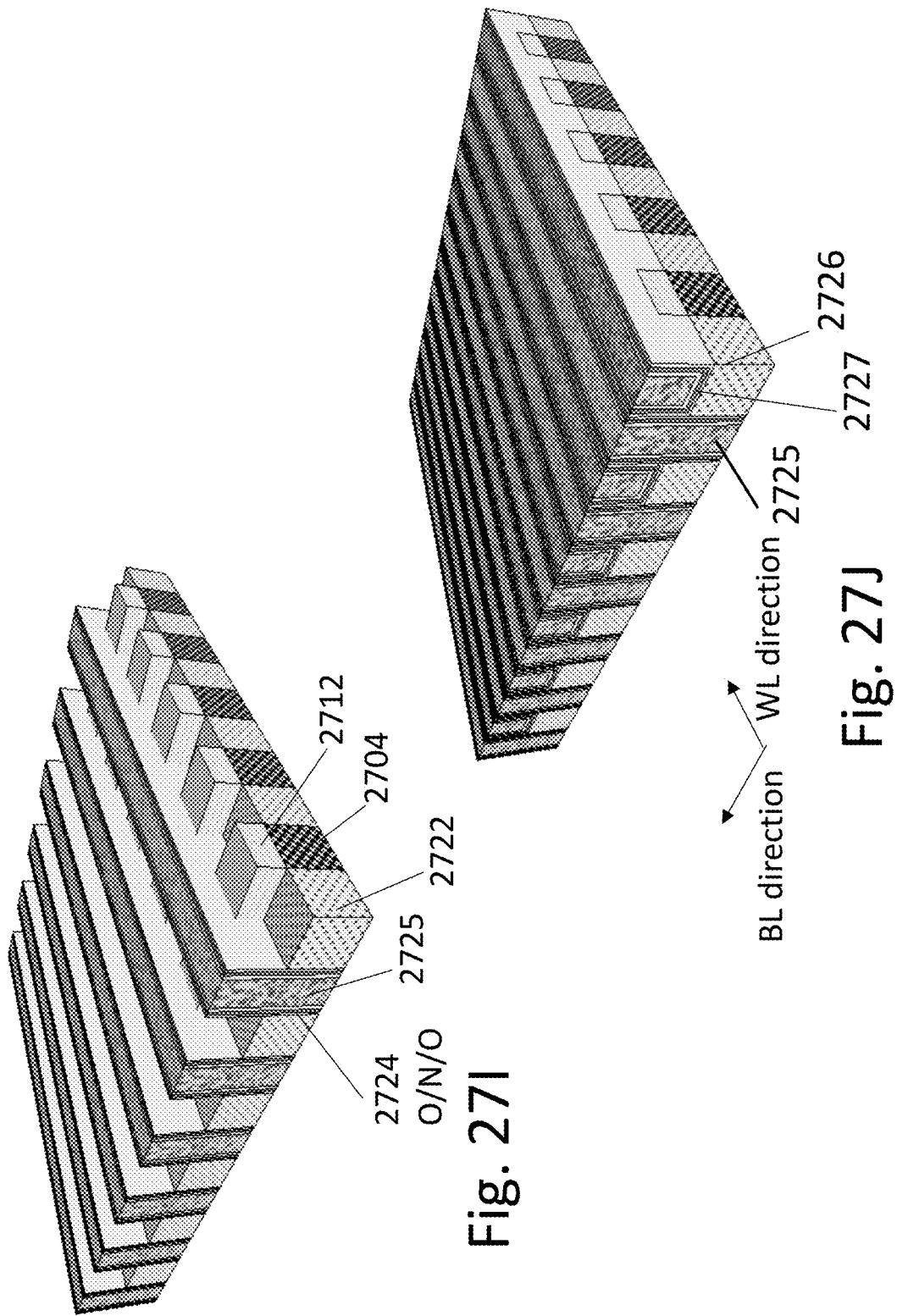

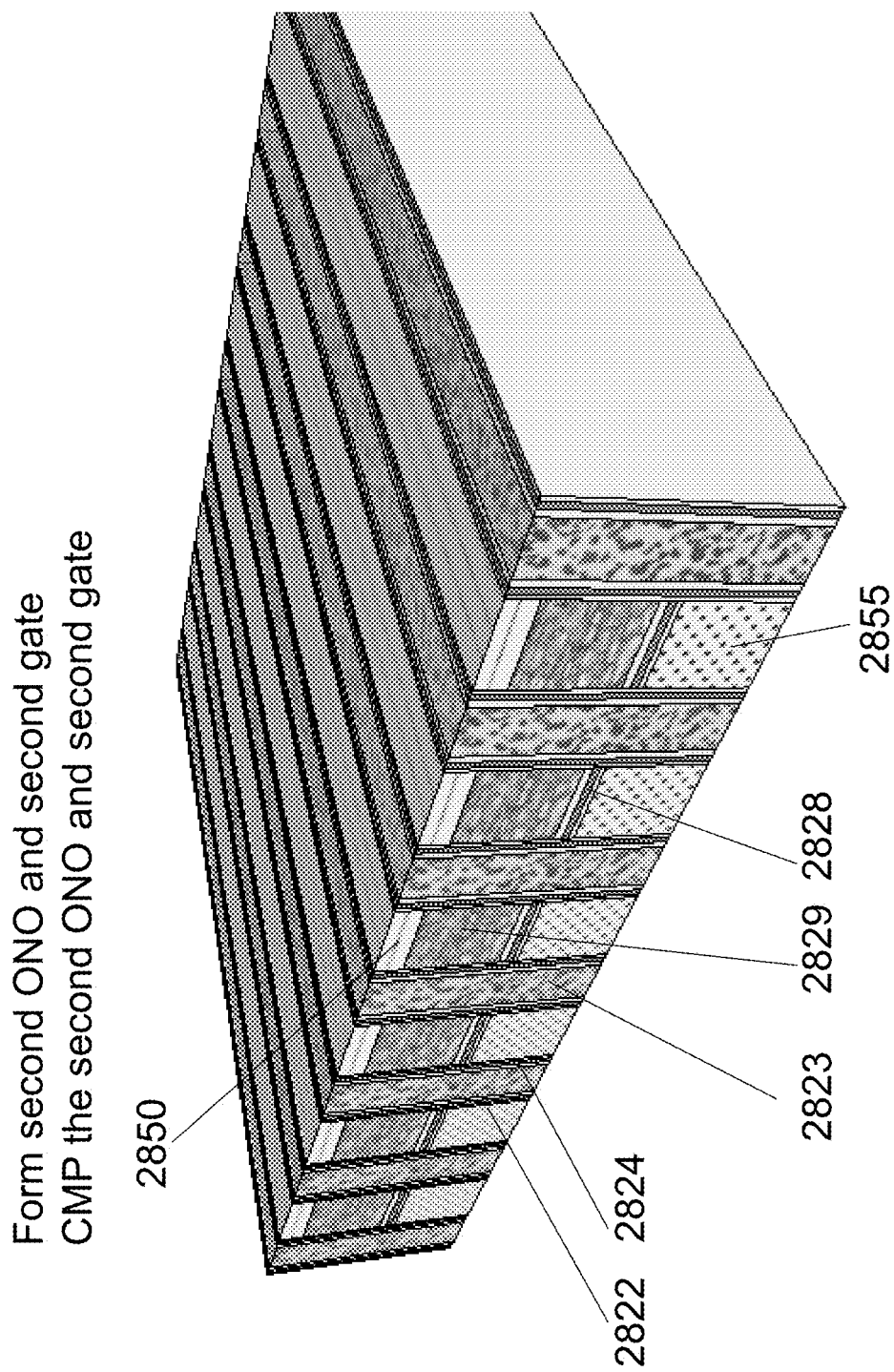

| Operation | S/D$_n$ | S/D$_{n+1}$ | Other S/D | GL$_{top,m}$ | GL$_{left\ side,m}$ | GL$_{right\ side,m}$ | Other GLs |
|---|---|---|---|---|---|---|---|
| Write bit 1 | 0 V | 4.0 V | Floating | 8 V | 0 V | 0 V | 0 V |
| Write bit 2 | 4.0 V | 0 V | Floating | 8 V | 0 V | 0 V | 0 V |
| Erase bit 1 | 0 V | 4.0 V | Floating | -8 V | 0 V | 0 V | 0 V |
| Erase bit 2 | 4.0 V | 0 V | Floating | -8 V | 0 V | 0 V | 0 V |
| Read on top channel (S/D$_n$ and S/D$_{n+1}$ swapping) | 1.0 → 0 V | 0 → 1.0 V | Floating | 4 V | 0 V | 0 V | 0 V |
| Write bit 3 | 0 V | 4.0 V | Floating | 0 V | 8 V | 0 V | 0 V |
| Write bit 4 | 4.0 V | 0 V | Floating | 0 V | 8 V | 0 V | 0 V |
| Erase bit 3 | 0 V | 4.0 V | Floating | 0 V | -8 V | 0 V | 0 V |
| Erase bit 4 | 4.0 V | 0 V | Floating | 0 V | -8 V | 0 V | 0 V |
| Read on left side channel (S/D$_n$ and S/D$_{n+1}$ swapping) | 1.0 → 0 V | 0 → 1.0 V | Floating | 0 V | 4 V | 0 V | 0 V |
| Write bit 5 | 0 V | 4.0 V | Floating | 0 V | 0 V | 8 V | 0 V |
| Write bit 6 | 4.0 V | 0 V | Floating | 0 V | 0 V | 8 V | 0 V |
| Erase bit 5 | 0 V | 4.0 V | Floating | 0 V | 0 V | -8 V | 0 V |
| Erase bit 6 | 4.0 V | 0 V | Floating | 0 V | 0 V | -8 V | 0 V |
| Read on right side channel (S/D$_n$ and S/D$_{n+1}$ swapping) | 1.0 → 0 V | 0 → 1.0 V | Floating | 0 V | 0 V | 4 V | 0 V |

Fig. 31

| Operation | $S/D_n$ | $S/D_{n+1}$ | Other S/D | $GL_{top,m}$ | $GL_{left\,side,m}$ | $GL_{right\,side,m}$ | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | -8 V | -4 V | 0 V | 0 V |
| Read on top channel ($S/D_n$ and $S/D_{n+1}$ swapping) | 1.0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | -8 V | 0 V | -4 V | 0 V |
| Read on left side channel ($S/D_n$ and $S/D_{n+1}$ swapping) | 1.0 → 0 V | 0 → 1.0 V | Floating | 4 V | 0 V | 4 V | 0 V |

Fig. 33

| Operation | $S/D_n$ | $S/D_{n+1}$ | Other S/D | $GL_{top,m}$ | $GL_{left\ side,m}$ | $GL_{right\ side,m}$ | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | -8 V | -4 V | 0 V | 0 V |
| Read on top channel ($S/D_n$ and $S/D_{n+1}$ swapping) | 1.0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | -8 V | 0 V | -4 V | 0 V |
| Read on left side channel ($S/D_n$ and $S/D_{n+1}$ swapping) | 1.0 → 0 V | 0 → 1.0 V | Floating | 4 V | 0 V | 4 V | 0 V |
| Write bit 5 | 0 V | 4.0 V | Floating | 8 V | -4 V | -4 V | 0 V |
| Write bit 6 | 4.0 V | 0 V | Floating | 8 V | -4 V | -4 V | 0 V |
| Erase bit 5 | 0 V | 4.0 V | Floating | -8 V | 4 V | 4 V | 0 V |
| Erase bit 6 | 4.0 V | 0 V | Floating | -8 V | 4 V | 4 V | 0 V |
| Read on left side channel ($S/D_n$ and $S/D_{n+1}$ swapping) | 1.0 → 0 V | 0 → 1.0 V | Floating | 4 V | -4 V | -4 V | 0 V |

Fig. 35

| Operation | S/D$_n$ | S/D$_{n+1}$ | Other S/D | GL$_{riht\ side,m}$ | Bottom Gate | GL$_{top,m}$ | Other GLs |
|---|---|---|---|---|---|---|---|
| Write bit 1r | 0 V | 4.0 V | Floating | 8 V | 4 V | 0 V | 0 V |
| Write bit 2r | 4.0 V | 0 V | Floating | 8 V | 4 V | 0 V | 0 V |
| Erase bit 1r | 0 V | 4.0 V | Floating | -8 V | -4 V | 0 V | 0 V |
| Erase bit 2r | 4.0 V | 0 V | Floating | - 8 V | -4 V | 0 V | 0 V |
| Read on top channel (S/D$_n$ and S/D$_{n+1}$ swapping) | 1.0 → 0 V | 0 → 1.0 V | Floating | 4 V | 4 V | 0 V | 0 V |
| Write bit 3r | 0 V | 4.0 V | Floating | 8 V | 0 V | 4 V | 0 V |
| Write bit 4r | 4.0 V | 0 V | Floating | 8 V | 0 V | 4 V | 0 V |
| Erase bit 3r | 0 V | 4.0 V | Floating | -8 V | 0 V | -4 V | 0 V |
| Erase bit 4r | 4.0 V | 0 V | Floating | - 8 V | 0 V | -4 V | 0 V |
| Read on left side channel (S/D$_n$ and S/D$_{n+1}$ swapping) | 1.0 → 0 V | 0 → 1.0 V | Floating | 4 V | 0 V | 4 V | 0 V |
| Write bit 5r | 0 V | 4.0 V | Floating | 8 V | -4 V | -4 V | 0 V |
| Write bit 6r | 4.0 V | 0 V | Floating | 8 V | -4 V | -4 V | 0 V |
| Erase bit 5r | 0 V | 4.0 V | Floating | -8 V | 4 V | 4 V | 0 V |
| Erase bit 6r | 4.0 V | 0 V | Floating | - 8 V | 4 V | 4 V | 0 V |
| Read on left side channel (S/D$_n$ and S/D$_{n+1}$ swapping) | 1.0 → 0 V | 0 → 1.0 V | Floating | 4 V | -4 V | -4 V | 0 V |

Fig. 38A

| Operation | S/D$_n$ | S/D$_{n+1}$ | Other S/D | GL$_{side,m}^{left}$ | Bottom Gate | GL$_{top,m}$ | Other GLs |
|---|---|---|---|---|---|---|---|
| Write bit 1l | 0 V | 4.0 V | Floating | 8 V | 4 V | 0 V | 0 V |
| Write bit 2l | 4.0 V | 0 V | Floating | 8 V | 4 V | 0 V | 0 V |
| Erase bit 1l | 0 V | 4.0 V | Floating | -8 V | -4 V | 0 V | 0 V |
| Erase bit 2l | 4.0 V | 0 V | Floating | -8 V | -4 V | 0 V | 0 V |
| Read on top channel (S/D$_n$ and S/D$_{n+1}$ swapping) | 1.0 → 0 V | 0 → 1.0 V | Floating | 4 V | 4 V | 0 V | 0 V |
| Write bit 3l | 0 V | 4.0 V | Floating | 8 V | 0 V | 4 V | 0 V |
| Write bit 4l | 4.0 V | 0 V | Floating | 8 V | 0 V | 4 V | 0 V |
| Erase bit 3l | 0 V | 4.0 V | Floating | -8 V | 0 V | -4 V | 0 V |
| Erase bit 4l | 4.0 V | 0 V | Floating | -8 V | 0 V | -4 V | 0 V |
| Read on left side channel (S/D$_n$ and S/D$_{n+1}$ swapping) | 1.0 → 0 V | 0 → 1.0 V | Floating | 4 V | 0 V | 4 V | 0 V |
| Write bit 5l | 0 V | 4.0 V | Floating | 8 V | -4 V | -4 V | 0 V |
| Write bit 6l | 4.0 V | 0 V | Floating | 8 V | -4 V | -4 V | 0 V |
| Erase bit 5l | 0 V | 4.0 V | Floating | -8 V | -4 V | -4 V | 0 V |
| Erase bit 6l | 4.0 V | 0 V | Floating | -8 V | -4 V | -4 V | 0 V |
| Read on left side channel (S/D$_n$ and S/D$_{n+1}$ swapping) | 1.0 → 0 V | 0 → 1.0 V | Floating | 4 V | -4 V | -4 V | 0 V |

Fig. 38B

| Clt | Pl0 | Pl1 | Pl2 | Pl3 | Pl4 | Pl5 | Pl6 | Pl7 | Clb |
|---|---|---|---|---|---|---|---|---|---|
| Pt0 | | | | | | | | | Pb0 |
| Pt1 | | | | | | | | | Pb1 |
| Pt2 | | | | | | | | | Pb2 |
| Pt3 | | | | | | | | | Pb3 |
| Pt4 | | | | | | | | | Pb4 |
| Pt5 | | | | | | | | | Pb5 |
| Pt6 | | | | | | | | | Pb6 |
| Pt7 | | | | | | | | | Pb7 |
| Crt | Pr0 | Pr1 | Pr2 | Pr3 | Pr4 | Pr5 | Pr6 | Pr7 | Crb |

Fig. 40

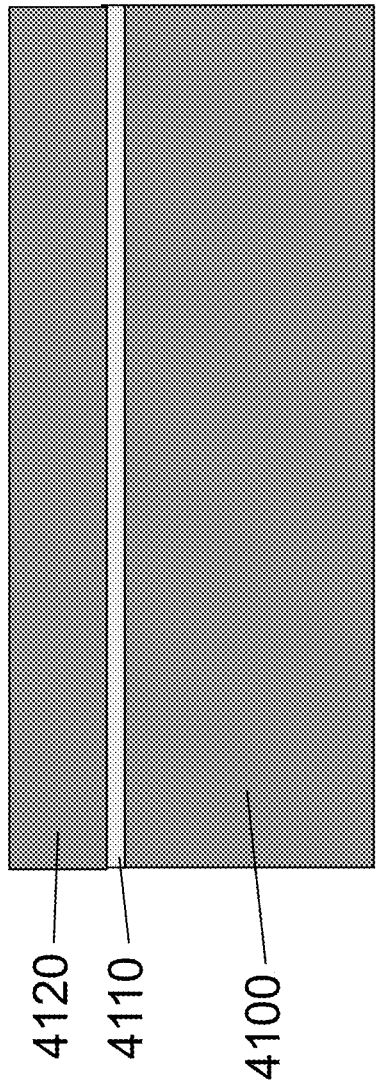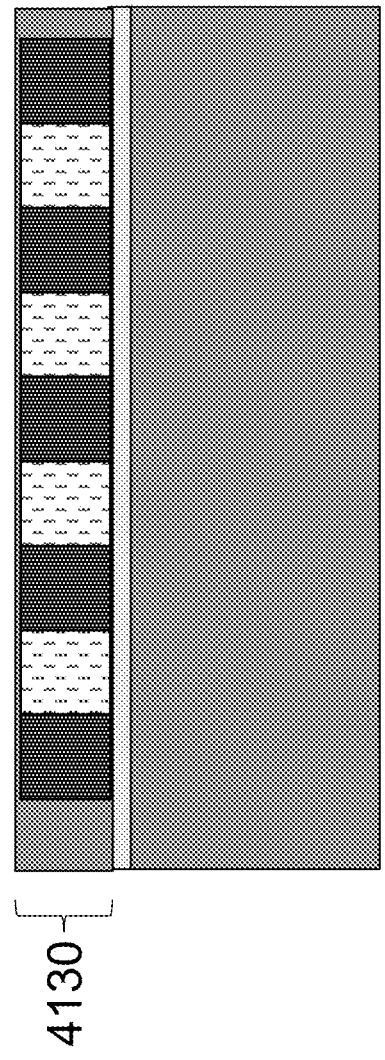
Fig. 41A
Fig. 41B

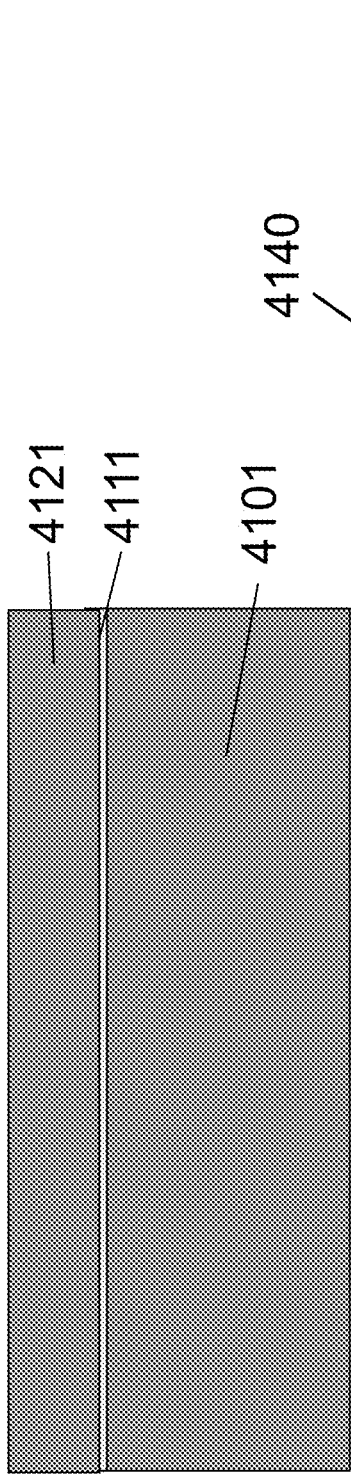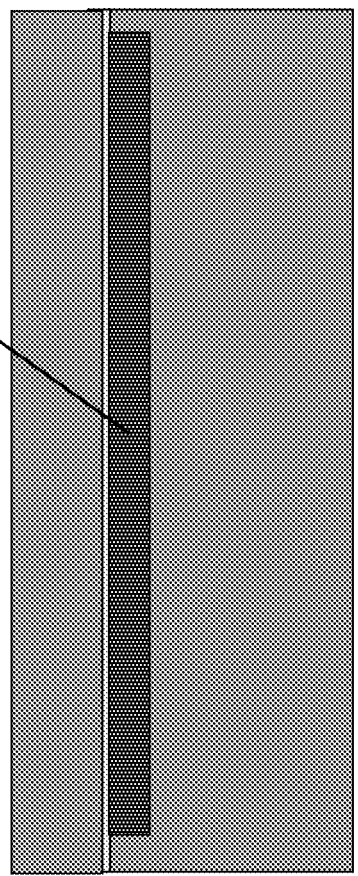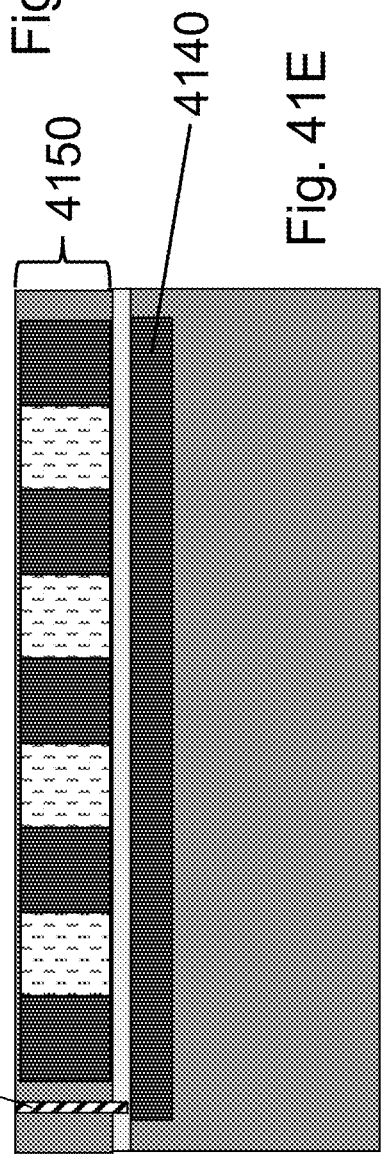

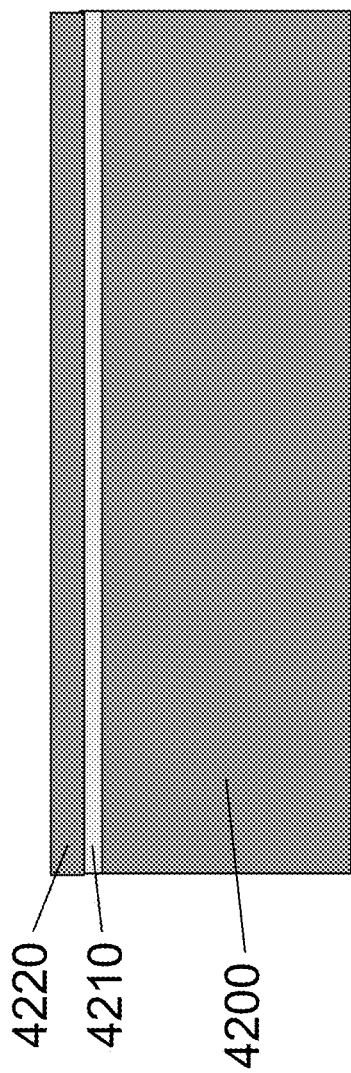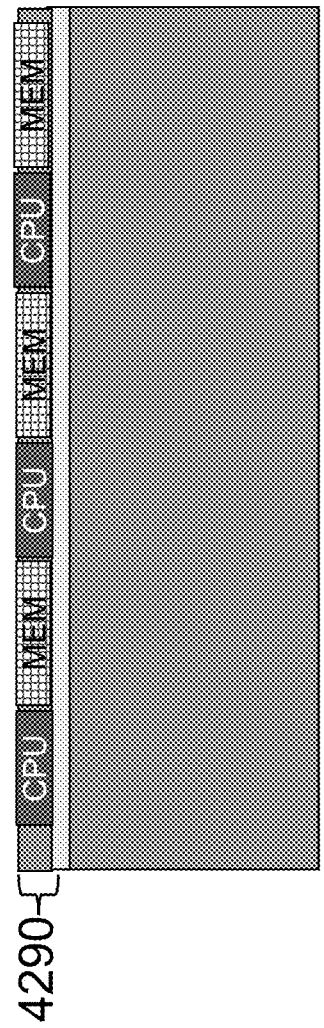
Fig. 42A
Fig. 42B

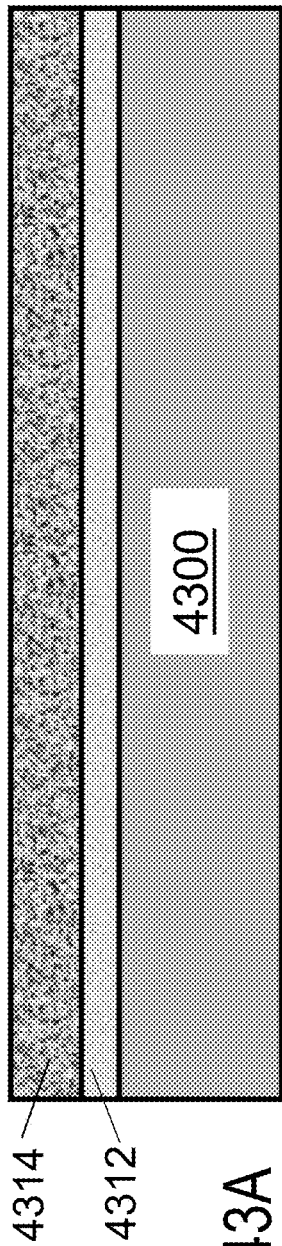
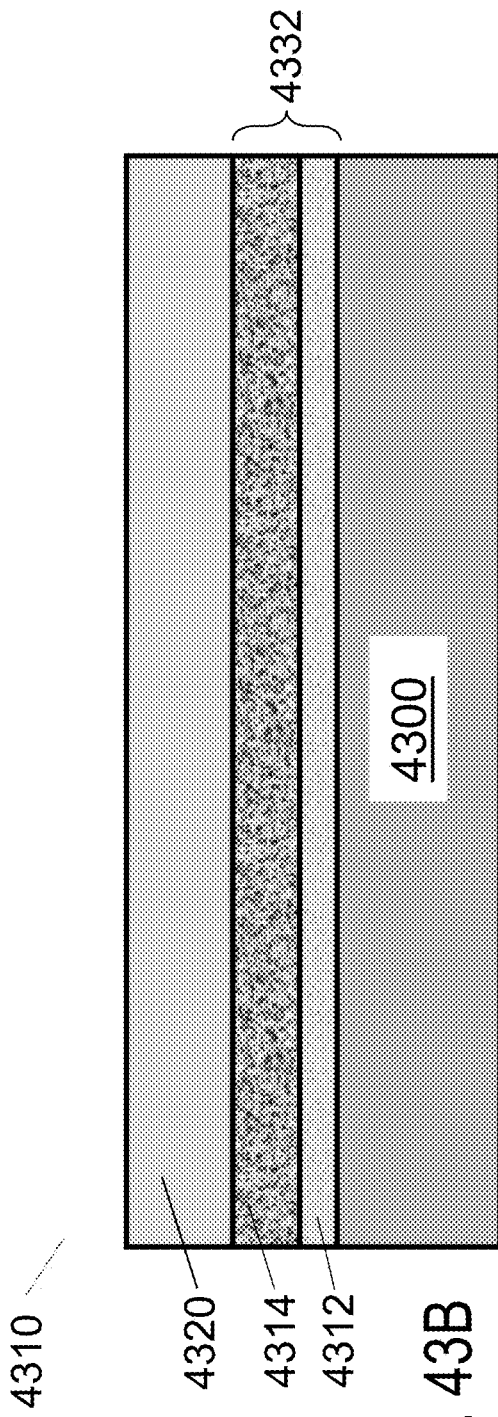
Fig. 43A
Fig. 43B

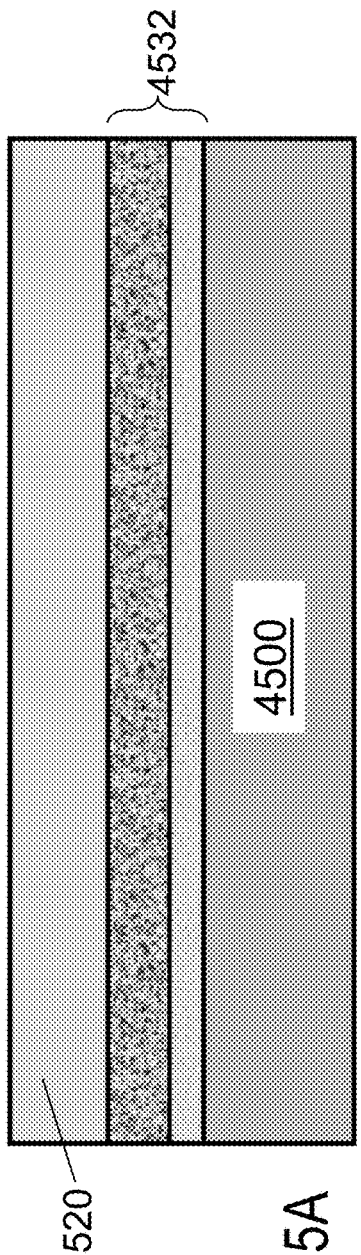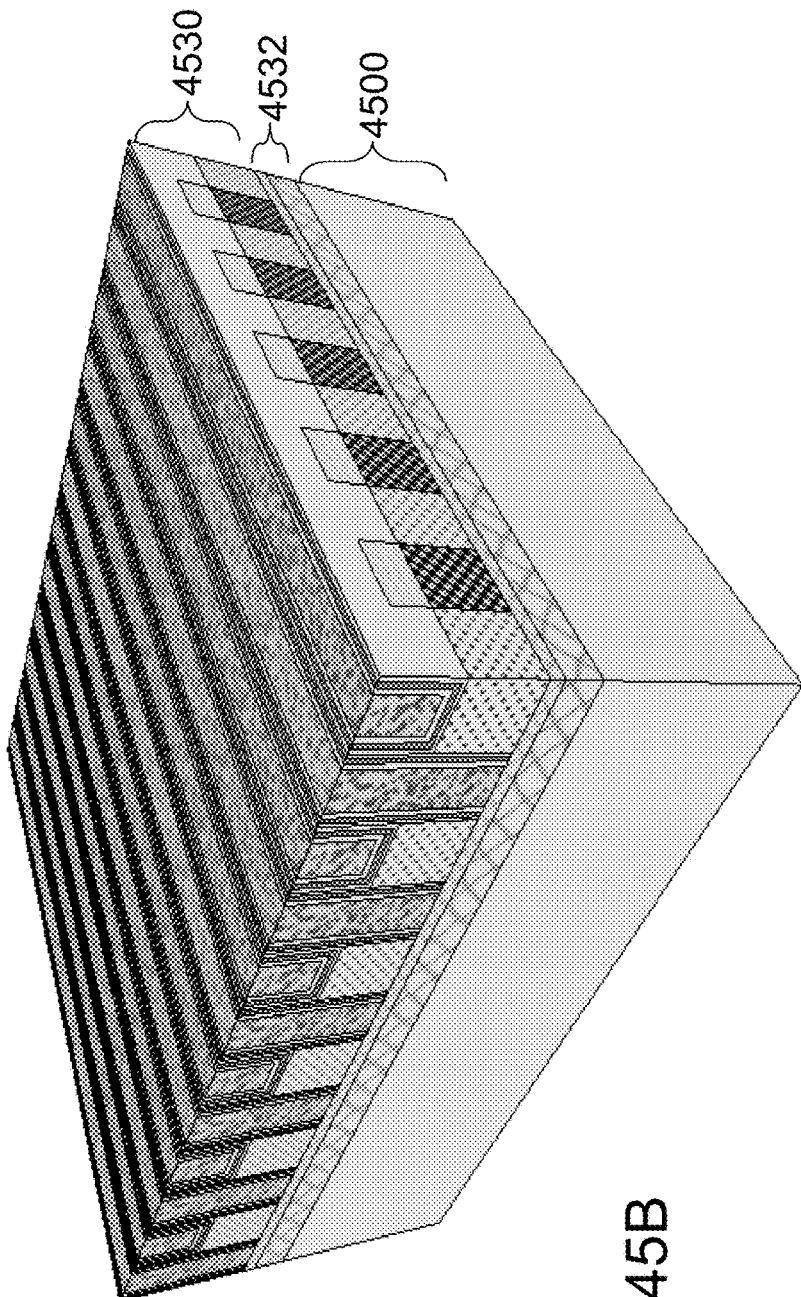
Fig. 45A
Fig. 45B

| Operation | S/D$_n$ | S/D$_{n+1}$ | Other S/D | C-Gate | L-Gate | R-Gate | Other GLs |
|---|---|---|---|---|---|---|---|
| Write bit 1 | 0 V | 4.0 V | Floating | 8 V | 4 V | 0 V | 0 V |
| Write bit 2 | 4.0 V | 0 V | Floating | 8 V | 4 V | 0 V | 0 V |
| Erase bit 1 | 0 V | 4.0 V | Floating | -8 V | -4 V | 0 V | 0 V |
| Erase bit 2 | 4.0 V | 0 V | Floating | -8 V | -4 V | 0 V | 0 V |
| Read on n+1 channel (S/D$_{n+1}$ and S/D$_n$ swapping) | 1.0 → 0 V | 0 → 1.0 V | Floating | 4 V | 4 V | 0 V | 0 V |
| Write bit 3 | 0 V | 4.0 V | Floating | 8 V | 0 V | 4 V | 0 V |
| Write bit 4 | 4.0 V | 0 V | Floating | 8 V | 0 V | 4 V | 0 V |
| Erase bit 3 | 0 V | 4.0 V | Floating | -8 V | 0 V | -4 V | 0 V |
| Erase bit 4 | 4.0 V | 0 V | Floating | -8 V | 0 V | -4 V | 0 V |
| Read on n+1 channel (S/D$_{n+1}$ and S/D$_n$ swapping) | 1.0 → 0 V | 0 → 1.0 V | Floating | 4 V | 0 V | 4 V | 0 V |
| Write bit 5 | 0 V | 4.0 V | Floating | 8 V | 2 V | -4 V | 0 V |
| Write bit 6 | 4.0 V | 0 V | Floating | 8 V | 2 V | -4 V | 0 V |
| Erase bit 5 | 0 V | 4.0 V | Floating | -8 V | -2 V | 4 V | 0 V |
| Erase bit 6 | 4.0 V | 0 V | Floating | -8 V | -2 V | 4 V | 0 V |
| Read on n+1 channel (S/D$_{n+1}$ and S/D$_n$ swapping) | 1.0 → 0 V | 0 → 1.0 V | Floating | 4 V | -2 V | 4 V | 0 V |
| Write bit 7 | 0 V | 4.0 V | Floating | 8 V | -4 V | 2 V | 0 V |
| Write bit 8 | 4.0 V | 0 V | Floating | 8 V | -4 V | 2 V | 0 V |
| Erase bit 7 | 0 V | 4.0 V | Floating | -8 V | 4 V | -2 V | 0 V |
| Erase bit 8 | 4.0 V | 0 V | Floating | -8 V | 4 V | -2 V | 0 V |
| Read on n+1 channel (S/D$_{n+1}$ and S/D$_n$ swapping) | 1.0 → 0 V | 0 → 1.0 V | Floating | 4 V | -4 V | -2 V | 0 V |

Fig. 47

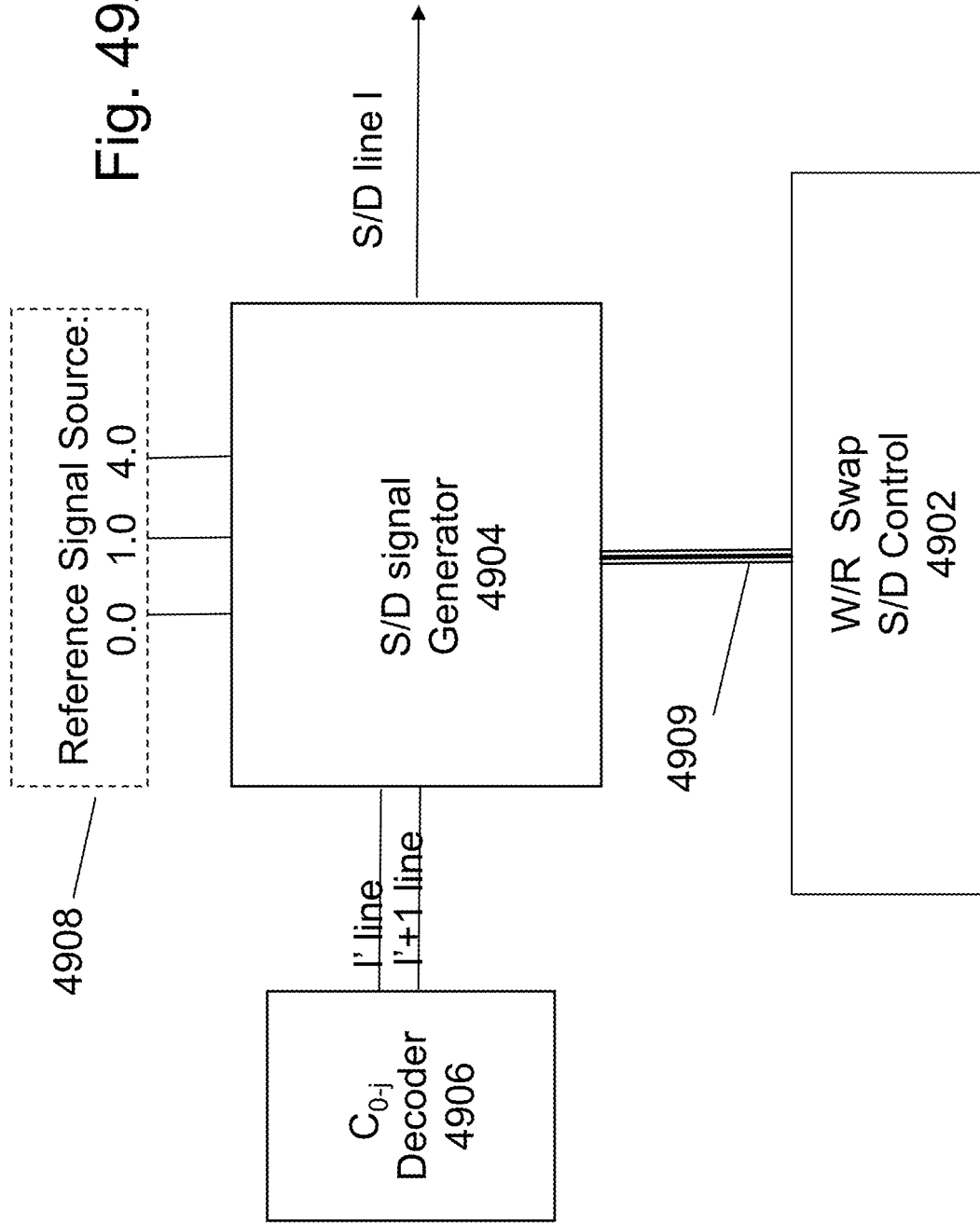

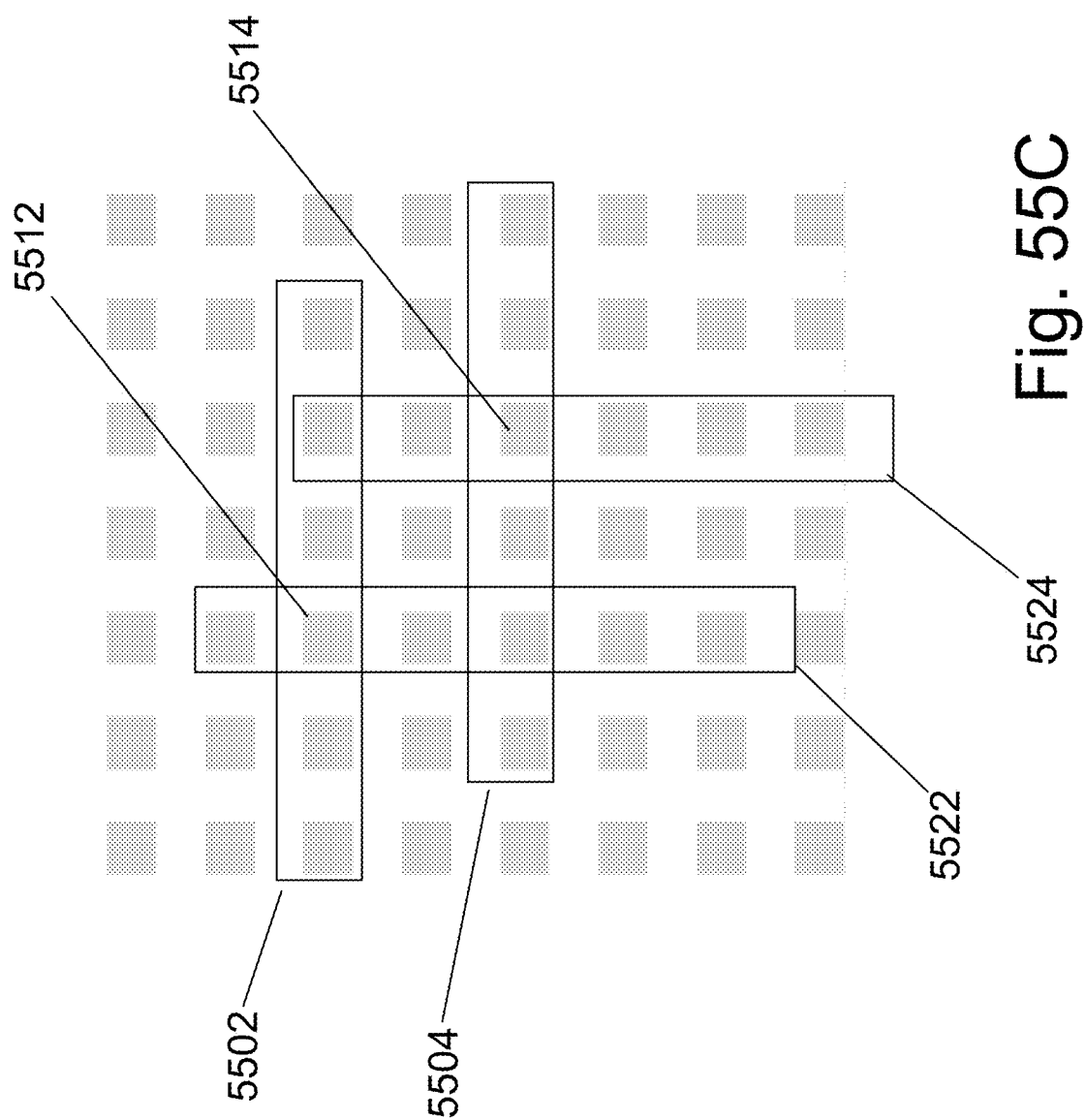

3D SEMICONDUCTOR MEMORY DEVICES AND STRUCTURES

BACKGROUND OF THE INVENTION

1. Field of the Invention

This application relates to the general field of Integrated Circuit (IC) devices and fabrication methods, and more particularly to NOR architecture non volatile Memory Circuit (NOR-Memory) devices and fabrication methods.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology.

Memory technology has enjoyed this trend, but now the gains of scaling have slowed and almost stopped. Hence, increases in memory capacity and performance have virtually stalled. There is a need to provide continuing increases in memory capacity and performance.

One way to tackle this is to increase the number of bits per memory cell, effectively increasing the capacity without increasing production cost.

As well, integration of logic and memory needs to be improved, as current methods suffer a high energy cost and large time latency during memory fetches. Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. Patent Application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/0013791; and PCT Applications (and Publications): PCT/US2010/052093, PCT/US2011/042071 (WO2012/015550), PCT/US2016/52726 (WO2017053329), PCT/US2017/052359 (WO2018/ 071143), PCT/US2018/016759 (WO2018144957), PCT/US2018/52332 (WO 2019/060798), PCT/ US2021/44110, and PCT/US22/44165. The entire contents of all of the foregoing patents, publications, PCTs, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, 10,943,934, 10,998,374, 11,063,071, and 11,133, 344. The entire contents of all of the foregoing patents are incorporated herein by reference.

In a land mark papers at VLSI 2007 and IEDM 2007, Toshiba presented techniques to construct 3D memories which they called—BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In at least our U.S. Pat. Nos. 8,026,521, 8,114,757, 8,687,399, 8,379,458, and 8,902,663, these are incorporated herein by reference; we presented multiple 3D memory structures generally constructed by successive layer transfers using ion cut techniques. In this work we are presenting multiple methods and structures to construct 3D memory with monocrystalline channels constructed by alternative methods to ion cut and successive layer transfers. This structure provides the benefit of multiple layers being processed by one lithography step with many of the benefits of a monocrystalline channel, and provides overall lower construction costs.

In addition the entire contents of U.S. patent application Ser. Nos. 16/786,060, 16/377,238, 15/911,071, 15/344,562, 62/297,857, 62/269,950, 62/258,433, 62/252,448, 62/208, 812, 62/215,112, 62/221,618, 62/246,054, 62/266,610, 62/271,251, 62/276,953 and 62/286,362 are incorporated herein by reference.

SUMMARY

In one aspect, a 3D semiconductor device, the device including: a first level including a first single crystal layer and a memory control circuit, the memory control circuit including a plurality of first transistors; a first metal layer overlaying the first single crystal layer; a second metal layer overlaying the first metal layer; a plurality of second transistors disposed atop the second metal layer; a third metal layer disposed atop the plurality of second transistors; and a memory array including word-lines and memory cells, where the memory array includes at least four memory mini arrays, where at least one of the plurality of second transistors includes a metal gate, where each of the memory cells includes at least one of the plurality of second transistors, and where the memory control circuit includes at least one digital to analog converter circuit.

In another aspect, a 3D semiconductor device, the device including: a first level including a single crystal layer and a memory control circuit, the memory control circuit including a plurality of first transistors; a first metal layer overlaying the first single crystal layer; a second metal layer overlaying the first metal layer; a plurality of second transistors disposed atop the second metal layer; a third metal layer disposed atop the plurality of second transistors; and a memory array including word-lines and memory cells, where the memory array includes at least four memory mini arrays, where at least one of the plurality of second transistors includes a metal gate, where each of the memory cells includes at least one of the plurality of second transistors, and where the memory control circuit includes at least one cache memory circuit.

In another aspect, a 3D semiconductor device, the device including: a first level including a single crystal layer and a memory control circuit, the memory control circuit including a plurality of first transistors; a first metal layer overlaying the first single crystal layer; a second metal layer overlaying the first metal layer; a plurality of second transistors disposed atop the second metal layer; a plurality of third transistors disposed atop the plurality of second transistors; a third metal layer disposed atop the plurality of third transistors; and a memory array including word-lines, where the memory array includes at least four memory mini arrays, where each of the at least four memory mini arrays includes at least four rows by at least four columns of memory cells, where at least one of the plurality of second transistors includes a metal gate, where each of the memory cells includes at least one of the plurality of second transistors, and where the memory control circuit includes at least one logic counter circuit.

BRIEF DESCRIPTION OF THE DRAWINGS

Various embodiments of the invention will be understood and appreciated more fully from the following detailed description, taken in conjunction with the drawings in which:

FIGS. 1A and 1B are example illustrations of forming multilayer porous structures;

FIG. 2 is an example illustration of multilayer porous structures;

FIGS. 3A-3I are example illustrations of the formation and structure of vertically oriented 3D memories;

FIGS. 5A-5E are example illustrations of the formation and structure of a NOR type 3D memory;

FIGS. 7A-7B are illustrations of the formation of $2^{nd}$ gate stack;

FIGS. 8A-8L are example illustrations of the formation and structure of a NOR type 3D memory;

FIGS. 9A-9F are example illustrations of the formation and structure of a NOR type 3D memory;

FIGS. 11A-11C are example illustrations of substrate leakage suppression;

FIGS. 13A-13E are example illustrations of the formation of per ridge select of a NOR type 3D memory;

FIGS. 14A-14E are example illustrations of the formation of staircase structure of a NOR type 3D memory;

FIG. 17 is an example illustration of a architecture of a 3D-NOR array;

FIGS. 21A-21G are example illustrations of a review the system process flow;

FIGS. 22A-22D are example illustrations of stack structure variations;

FIGS. 24A-24I are example illustrations of an alternative system process flow; and FIGS. 25A-25D are example illustrations of the structure transfer of an alternative system process flow.

FIGS. 27A-27K are example illustrations of processing and forming 2D HD-NOR array structures;

FIGS. 28A-28D are example illustrations of an alternative processing and formation of 2D HD-NOR array structures;

FIG. 31 is a table of exemplary write, erase or read conditions for the memory cell of FIGS. 30A and 30B;

FIG. 33 is a table of exemplary write, erase or read conditions for the memory cell of FIG. 32;

FIG. 35 is a table of exemplary write, erase or read conditions for the memory cell of FIG. 34;

FIGS. 38A and 38B are tables of exemplary write, erase, or read conditions for the memory cell of FIG. 37;

FIG. 40 is an example illustration of an exemplary architecture of a HD-NOR array;

FIGS. 41A-41E are example illustrations of the formation of an M-SOI wafer and finished structures;

FIGS. 42A-42E are example illustrations of the use of a memory substrate and integration with logic structures;

FIGS. 43A and 43B are example illustrations of the formation of a porous layered donor wafer;

FIGS. 45A-45G are example illustrations of the formation of HD-NOR structures;

FIG. 47 is an example illustration of operating conditions for the cell of FIG. 46;

FIGS. 49A-49B are example illustrations of block diagrams of circuit control circuits;

FIGS. 55A-55C are example illustrations of fine vertical connectivity using HD NOR cell programmable vias.

DETAILED DESCRIPTION

Figure 3C:
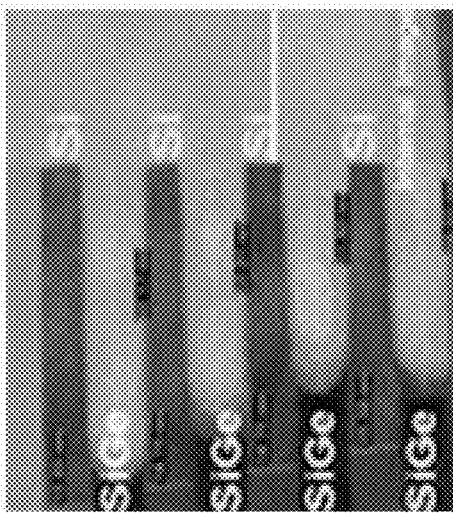

An embodiment or embodiments of the invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for fabricating devices. The process flows, which may be a sequence of steps for fabricating a device, may have many structures, numerals and labels that may be common between two or more successive steps. In such cases, some labels, numerals and structures used for a certain step's figure may have been described in the previous steps' figures.

Memory architectures include at least two important types—NAND and NOR. The NAND architecture provides higher densities as the transistors forming the memory cells are serially connected with only an external connection at the beginning and end of the cell string as is illustrated in at least U.S. Pat. No. 8,114,757, FIGS. 37A-37G. NOR architectures are less dense but provide faster access and could work sometimes when the NAND architecture cannot as individual NOR memory cells are directly accessible and in many cases both its source and drain are accessible, such as being illustrated in at least U.S. Pat. No. 8,114,757, FIGS. 30A-30M. It should be understood that NOR type architecture does not limit its use to only a non-volatile memory but NOR type refers broadly both the non-volatile memory such as Flash memory and volatile memory such as DRAM.

The memory cell could be constructed with conventional N type or P type transistors where the channel doping may be of opposite type with respect to the source and drain doping or the memory cell could utilize a junction-less transistor ('JLT') construction where the gate could significantly deplete the channel when in the off-state. For some architectures, the junction-less transistor is attractive as it may take less processing steps (or provide other device advantages such as a low leakage off-state) to form the memory array without the need to form a change in doping along the transistor.

Some 3D Memory architectures are utilizing a horizontal memory transistor, for example, such as illustrated in at least U.S. Pat. No. 8,114,757 in at least FIGS. 37A-37G and FIGS. 30A-30M. Others may use vertical memory transistors, for example, such as in the Toshiba BiCS architecture such as illustrated in at least U.S. Pat. No. 7,852,675.

Multiple methods to construct 3D memory structures using horizontal junction-less transistors for a NAND architecture, and for horizontal NAND and NOR architectures in general may be found in, for example, such as U.S. Pat. No. 8,114,757 in at least FIG. 33 and FIG. 37. The following would present multiple techniques to form a multilayer silicon over oxide start structure equivalent to, for example, such as at least FIGS. 33D and 37D (of U.S. Pat. No. 8,114,757), without the use of ion-cut layer transfer.

The starting structure could be similar to FIG. 41A of U.S. application Ser. No. 14/642,724, incorporated herein by reference, as illustrated in FIG. 1A. A base donor substrate 110 may be used to form a dual porous layer for future cut layer 113 on which an epitaxial process may be used to form relatively thick crystalline layer 120. Future cut layer 113 may include two porous layers; an upper layer of porous silicon, which may contain microscopic pores of diameter of a few nm, and below this may be formed a lower layer of porous silicon for which the pore diameter may be a few (or more) times greater (similar to FIG. 23 of U.S. application Ser. No. 14/642,724), for the future 'cut' or cleave. The epitaxial formation of relatively thick crystalline layer 120 could include successively altering the addition of dopants to further support the following steps.

Then, by utilizing anodizing processes, thick crystalline layer 120 may be converted to a multilayer of alternating low porosity over high porosity as illustrated in FIG. 1B, which is similar to FIG. 41B of Ser. No. 14/642,724. The alternating-porosity multilayer can be converted later into alternating multilayer of monocrystalline-Si over insulating $SiO_2$, as described below. Herein, the monocrystalline can be understood as single-crystalline or single crystal interchangeably. FIG. 1B illustrates relatively thick crystalline layer 120 after going through a porous formation process which forms multilayer structure 122. Multilayer structure 122 may include layer 144, layer 142, layer 140, layer 138, layer 136, layer 134 and layer 132. Multilayer structure 122 may include base donor wafer substrate 110 with porous cut layer 113 for the planned transfer of the fabricated multilayer structure over the target wafer, which could include the memory peripheral circuits prefabricated on the target wafer. Alternatively, multilayer structure 122 may not include porous cut layer 113 when the transfer to a target wafer is not intended. Layer 144 could be the portion of layer 120 which remains after the multi-layer processing. The alternating layers could have alternating porosity levels such as layers 132, 136, 140 with porosity of less than 30% or less than 40% while layers 134, 138, 142 with porosity over 50% or over 60%, or layers 132, 136, 140 with a porosity of less than 55% while layers 134, 138, 142 with porosity over 65%, or other alternating level of porosity based on the target application, process, and engineering choices. Each layer may include a varying porosity thru its thickness, or a number of sublayers of varying porosity.

The number of alternating layers included in multilayer structure 122 could be made as high as the number of layers needed for the 3D memory (for example, greater than 20, greater than 40, greater than 60, or greater than 100) or for the transferring of a subset of multilayer structures one on top of the other to form the desired final structure. The porosity modulation could be achieved, for example, by (1) alternating the anodizing current, or (2) changing the light illumination to the silicon structure while in the anodizing process, or (3) by first alternating the doping as layer 120 is being grown through epitaxial process. Below are listed few embodiments of the above method of forming a c-Si/$SiO_2$ multilayer from an alternated porosity multilayer For example, U.S. Pat. No. 7,772,096, incorporated herein by reference, teaches the formation of a multilayer structure according to (3) above, starting with alternate doping following these steps:

i—Epitaxially grow alternating layers of p+ silicon 134, 138, 142, with dopant concentrations in the range of $1\times10^{19}$ $cm^{-3}$ to $2\times10^{20}$ $cm^{-3}$, respectively, over p-type silicon layers 132, 136, 140, with dopant concentrations in the range of $1\times10^{14}$ $cm^{-3}$ to $5\times10^{18}$ $cm^{-3}$. Layers 132, 134, 136, 138, 140, 142 could have thickness of 3 nm to 20 nm, or even thicker such as 20 nm to 100 nm.

ii—Perform an anodization process in a hydrofluoric acid (HF) containing electrolyte solution to convert the doped layers to porous layers. The p+ layers 134, 138, 142 would convert to a high porosity layer with coarse porous structures while the p layers 132, 136, 140 will convert to a fine porous structure.

iii—Perform an oxidization process to convert the p+ 134, 138, 142 layers to oxide.

iv—Perform a high temperature annealing, for example, such as at 1,000° C. for a few hours, to convert the p 132, 136, 140 layers into high quality monocrystalline layers.

Alternatively, the above steps ii-iv can be carried out after valleys 151, 152 and ridges 154 are formed by masking and etch processes as shown in FIG. 2, where valleys 151 may be filled by, for example, isolation oxide or contact metal or gate stacks in subsequent processing (not shown). Valleys 151 may include regions of opening (not shown). Thus a second desired multilayer structure 124 may be formed.

The above processing may result in first desired multilayer structure 122 or second desired multilayer structure 124 for the formation of 3D memories.

In yet another embodiment of method (3), U.S. patent application Ser. No. 12/436,249, incorporated herein by reference, teaches an alternative method for the formation of the multilayer structure 122 with alternating doping. In brief, the method starts by multiple depositions of amorphous silicon with alternating doping, then performing a solid phase recrystallization to convert the stack into a stack of p-type doped single crystal Si-containing layers using a high temperature recrystallization, with recrystallization temperatures from about 550° C. to about 700° C. After recrystallization, the single crystal Si-containing layers could be subjected to anodization and so forth as presented in ii-iv above. U.S. patent application Ser. No. 12/436,249 teaches alternatives for the formation of the alternating doping layer structure which could be employed herein for the 3D memory multilayer structure formation.

In an embodiment of method (2), the epitaxial layer 120 could include alternating n doped and n+ doped layers. The porous formation of the n doped layers may be assisted by light to form the holes for the anodizing process to effectively work as had been presented in S. Frohnhoff et. al., Thin Solid Films, (1994), U.S. patent application Ser. Nos. 10/674,648, 11/038,500, 12/436,249 and U.S. Pat. No. 7,772,096, all of these incorporated herein by reference. Following the anodizing step, the structure could be oxidized and then annealed as presented in steps iii and iv above.

In an embodiment of method (1), a method to form alternating layers of coarse and fine porous layers is by alternating the anodizing current similar to the description in "Porous silicon multilayer structures: A photonic band gap analysis" by J. E. Lugo et al J. Appl. Phys. 91, 4966 (2002), U.S. Pat. No. 7,560,018, U.S. patent application Ser. No. 10/344,153, European patent EP0979994, and "Photonic band gaps analysis of Thue-Morse multilayers made of porous silicon" by L. Moretti et al., 26 Jun. 2006/Vol. 14, No. 13 OPTICS EXPRESS, all of these incorporated herein by reference. Following the anodizing step, the structure could be oxidized and then annealed as presented in steps iii and iv above.

The anodizing step could be done as a single wafer process or lot of wafers by using a batch mode as illustrated in U.S. Pat. No. 8,906,218, incorporated herein by reference and other similar patents assigned to a company called Solexel.

In yet another embodiment combining methods (3) and (2), the multilayer structure 122 may be formed by first forming a multilayer structure of alternating n type over p type. Such a method is illustrated in U.S. Pat. No. 8,470,689 and in "Silicon millefeuille": From a silicon wafer to multiple thin crystalline films in a single step" by D. Hernandez et al., Applied Physics Letters 102, 172102 (2013); both incorporated herein by reference. These methods leverage the fact that such n type silicon would not become porous without light while p type silicon would only need current for the anodizing process to take place. For these methods the multilayer of n over p could be first etched to form the multilayer pattern such as is illustrated in FIG. 31E or FIG. 37E of U.S. Pat. No. 8,114,757 followed by an anodizing process to convert the p type silicon to porous while leaving the n type solid and un-etched. Then the step of oxidation step iii could be used to convert the porous layer to an isolation layer. The annealing step iv could be made short or skipped as the n layers might be very lightly etched or not be etched at all.

In yet another embodiment of method (3), a multilayer structure could be achieved by successive epitaxial growths of n type silicon over p+ type silicon multiple times for which the n silicon could be etched at a much higher rate than the p+ silicon. In a paper titled: "Fabrication of conducting GeSi/Si microand nanotubes and helical microcoils" by S V Golod, V Ya Prinz, V I Mashanov and A K Gutakovsky, Semicond. Sci. Technol. 16 (2001) 181-185, incorporated herein by reference, it presents that p+ silicon would be etched at a much lower rate than n silicon, quoting: "As a selective etchant, an ammonium hydroxide-water solution can be used. It was shown in [8] that the 3.7 wt. % NH4OH solution has a pp+ selectivity of approximately 8000:1 at 75° C. and boron concentration p+=100 m $m^3$."

Another alternative is an embodiment of method (4), according to which one forms multilayers of silicon over $Si_{1-x}Ge_x$ as illustrated in "New class of Si-based superlattices: Alternating layers of crystalline Si and porous amorphous Si$_{1-x}$Ge$_x$ alloys" by R. W. Fathauer et al., Appl. Phys. Lett. 61 (19), 9 Nov. 1992, incorporated herein by reference. In such a multilayer structure there is high degree of selectivity in etching Si1-x Gex layers over Si layers. This may be followed by oxidation such as step iii. and anneal step iv. which could provide multilayers of silicon over oxide. In a paper titled: "Novel Three Dimensional (3D) NAND Flash Memory Array Having Tied Bit-line and Ground Select Transistor (TiGer)" by Sc Hwan Park et al., IEICE Transactions on Electronics. May 2012, incorporated herein by reference, the authors present the use of multilayers of silicon over Si$_{1-x}$Ge$_x$ for forming a 3D NAND device.

An alternative method to the modulated-porosity method for forming c-Si/SiO2 multilayers may be to utilize the Bosch process. In a paper titled "Fabrication and Characterization of Vertically Stacked Gate-All-Around Si Nanowire FET Arrays" by Davide Sacchetto et al. at IEEE SDDR09, incorporated herein by reference, a technique used for deep hole etch has been applied to form structures of crystalline lines one on top of the other each with oxide all around. Similar techniques could be used to form the base structure for 3D memory.

Yet another alternative for forming c-Si/SiO2 multilayer structures is direct epitaxy of silicon, special oxide, and silicon again. The special oxide is a rare-earth oxide which, if deposited properly, would keep the crystal structure of the silicon to allow the growth of crystalline silicon on top of the special oxide as presented in at least U.S. patent application publication 2014/0291752, incorporated herein by reference.

The epitaxial process of multilayers of an n+ type layer over a p type layer could be done at low temperatures such as below about 400° C., 400-500° C., 500-600° C., 600-700° C. or below about 800° C. to reduce the dopant movement of the n+ layer, at the lower portion of the multilayer structure, into the p type layer as the multilayer structure is being formed, which is also referred to as 'autodoping.' There are known epitaxial processes in the art which allow good quality layers to be formed while keeping the process temperature low to avoid autodoping. For example, such has been presented in papers by D. SHAHRJERDI, titled "Low-Temperature Epitaxy of Compressively Strained Silicon Directly on Silicon Substrates" published at Journal of ELECTRONIC MATERIALS, Vol. 41, No. 3, 2012; by S. Wirths titled "Low temperature RPCVD epitaxial growth of Si1_xGex using Si2H6 and Ge2H6" published at Solid-State Electronics 83 (2013) 2-9"; and by Pere Roca I Cabarrocas titled "Low temperature plasma deposition of silicon thin films: From amorphous to crystalline" published at Journal of Non-Crystalline Solids, Elsevier, 2012, 358 (17), pp. 2000-2003; by R. Kircher et al. titled "LOW-TEMPERATURE EPITAXY AND IN-SITU DOPING OF SILICON FILMS" published in JOURNAL DE PHYSIQUE IV September 1991, and in U.S. Pat. Nos. 7,262,116, 8,778,811 and application US 2014/0045324, all of the forgoing papers and patents incorporated herein by reference.

Base wafers or substrates, or acceptor wafers or substrates, or target wafers substrates herein may be substantially comprised of a crystalline material, for example, mono-crystalline silicon ("Si") or germanium ("Ge"), or may be an engineered substrate/wafer such as, for example, an SOI (Silicon on Insulator) wafer or GeOI (Germanium on Insulator) substrate. Similarly, donor wafers herein may substantially comprise a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

3D Memory may be multi-layers of 2D memory in which memory cells are placed as a matrix with rows and columns. These memory cells are controlled by memory control lines such as bit-lines, source-lines, and word-lines, usually in a perpendicular arrangement, so that by selecting a specific bit-line and specific word-line one may select a specific memory cell to write to or read from. In a 3D memory matrix, having three dimensions, selecting a specific memory cell requires the selection of a specific layer, which could be done by additional memory control lines such as select-lines. As presented herein, some of the select lines could be formed in the semiconductor layer in which the memory devices are built into (for example, in at least FIGS. 31H—SL 3134 and FIG. 50D SL 5034 of U.S. Pat. No. 8,114,757). Other select lines could be deposited or formed thru epitaxial growth. These memory control lines could therefore comprise semiconductor materials such as silicon (for example monocrystalline) or conductive metal layers such as tungsten or aluminum or copper.

A preferred embodiment of monolithic 3D memory according to the present invention is demonstrated herein and outlined below. It utilizes mono-crystalline transistors whose channels are vertically oriented so the current flows vertically through the device across each of the device layers rather than horizontally along the device layers. Yet, this structure is designed to be low cost by sharing lithography, etch and deposition of multiple layers together forming self-aligned vertically oriented transistors.

FIG. 3A illustrates the starting material structure for these vertically oriented 3D memories. On top of a substrate such as Si, Ge, SiGe, SOI, strained layered substrate, or substrate with buried cut layer, are deposited interchanging layers of designated source/drain (S/D) material 302 and designated channel material 304 layer in between. These layers could be processed by epitaxial steps with in-situ alternating doping of N/N+ type, N/P+ type, P/N+ type, or P/P+ type and/or alternating between silicon and SiGe layers, etc. Or using any of the techniques presented herein in reference to at least FIG. 1A to FIG. 2. The selection of the composition of these layers could include consideration of a choice of a high etch selectivity between adjacent layers to enable faster etching of the designated channel layers 304 than the (S/D) layers 302. The selection of the thickness of these layers could be based on a consideration of etch electivity, autodoping, dopant diffusion due to thermal budget, etch rate, and short-channel effect, memory interference, and so on. The thickness of each of these layers could be 10-20, 20-50, 50-100, 100-200 nm up to hundreds of nm. Suppression of dopant diffusion may be accomplished by use of low temperature epitaxial processes, for example the AMAT 450-500 deg C. epi process. Also, interlayer diffusion barriers may be employed, for example, such as thin single, double, or multiple atomic layers of a diffusion suppressor, such as carbon. These interlayer diffusion barriers may be incorporated within the multilayer epitaxial growth process. Particularly, the diffusion barrier layer may be incorporated near the transition region between channel layer and S/D layer. Also, the doping of each layer may not be uniform but rather vertically profiled to enhance or suppress physical processes such as hot carrier injection in accordance with the specific application requirements of the device.

For example the composition of the S/D layers 302 could be N+ silicon while the channel layers 304 could be P type silicon and the selective etch process would utilize anodic etching as detailed in U.S. Pat. No. 8,470,689 and as was described herein.

An alternative is to use P++ silicon for the S/D layers 302 and N silicon for channel layers 304 and the later selective etch would utilize the NH$_4$OH solution as taught by Golod et al.

Yet another alternative is to use N+ silicon for the (S/D) layers 302 and P type SiGe for channel layers 304 and the later selective etch would utilize the process taught by Sc Hwan Park et al. in a paper titled "Novel Three Dimensional (3D) NAND Flash Memory Array Having Tied Bit-line and Ground Select Transistor (TiGer)" published in TECHNICAL REPORT OF IEICE in 711 (APWF_PSH), a paper by FL W. Fathauer et al. titled "New class of Si-based superlattices: Alternating layers of crystalline Si and porous amorphous Si, -, Ge, alloys" published in Appl. Phys. Lett. 61 (19), 9 Nov. 1992, a paper by Jang-GnYun titled "Single-Crystalline Si Stacked Array (STAR) NAND Flash Memory" published in IEEE TRANSACTIONS ON ELECTRON DEVICES, VOL. 58, NO. 4, April 2011 and U.S. Pat. No. 8,501,609, all of the forgoing incorporated herein by reference.

An interesting aspect of the multilayer structure that are epitaxially based rather than the layer transfer approach is that the whole structure in most cases would resemble one monolithic crystal, in which the crystal repeating element which could be a silicon atom or other molecules which are very well aligned across layers. No molecular level alignment would happen in a layer transfer process. So in an epitaxial process of multilayer formation the molecules forming the multilayer structure are all aligned forming lines that are parallel at better than 0.01 of degree on atomic scale, while in layer transfer based multilayer structure misalignment between layers almost always will be far greater than 0.1 degree. Accordingly the multilayer structure 122 formed by the methods presented herein has single crystal layers having atomic level alignment between the layers, unlike a multilayer structure formed by techniques such as successive layer transfer.

Such a multilayer structure could be constructed on top of a cut layer as illustrated in FIG. 1A to FIG. 2, to allow transferring of the full multilayer structure and accordingly processing both sides of the multilayer structure. If a cut layer has been used then the multilayer structure of the end device could have connection and circuits on its top and bottom surface without a thick bulk silicon of more than 40 micron. The use of cut layer or structure transfer techniques presented herein and in the incorporated by reference art could support forming support circuits and connections with thin isolation to the memory structure such as 5-20, 20-100, 100-200, 200-400 nm or 0.5-1, 1-2, 2-5, 5-10 microns thickness of isolation.

For simplicity we shall outline the flow for a vertical channel 3D memory structure including S/D layers 302 as N+ silicon and P type silicon for channel layers 304. A person skilled in the art would be able to modify the flow for other alternative embodiments.

On top of the alternating 302/304 multilayer a hard mask material 306 is deposited.

FIG. 3B illustrates the structure after 'valleys' etching forming multilayer ridges 309 and valleys 308 in between, resulting in repetitive ridge structure 307. Alternatively selectivity could leverage crystal orientation plan such as using warm KOH to selectively etch down/along the <100> crystallographic planes.

The width of the ridges and the valleys could be from about 10 nm to a few hundreds of nm. The width of the ridges and the valleys could be determined in consideration of the thickness of layers 302/304, the number of layers, the type of memory being build and other considerations. For example, the valleys and the ridges could have similar widths or other ratios such as 50 nm valleys with a 100 nm ridge, and may be engineered for the specific target structure.

Many of the drawings herein illustrate a section or sections of a 3D structure with either 2D drawings of a cut plane or perspective 3D drawings. In general, the direction along the ridge is referenced as the 'X' direction, orthogonal to the ridge is referenced as 'Y' direction, and along the epitaxial layers growth—the vertical direction is referenced as Z direction. To help understanding, many of the drawings include a Cartesian direction indicator (for example, direction indicator 300 in FIGS. 3A &3B) or indication along which plane the cut-view has been done, for example cut-view Y-Z plane 200 in FIG. 2).

FIG. 3C illustrates the high etch selectivity of SiGe vs. Silicon, which, in this example, could be made using the Applied Material Selectra etch system. Alternatively, the selective etch may be made using wet chemical etch. In these 3D structures the multilayer of, for example, FIG. 3A could be made with layers that could be selectively etched, for example, such as Silicon (single crystal or poly or amorphous), SiGe (mix of silicon and Germanium), P doped silicon, N doped silicon, etc.

Figure 3D:
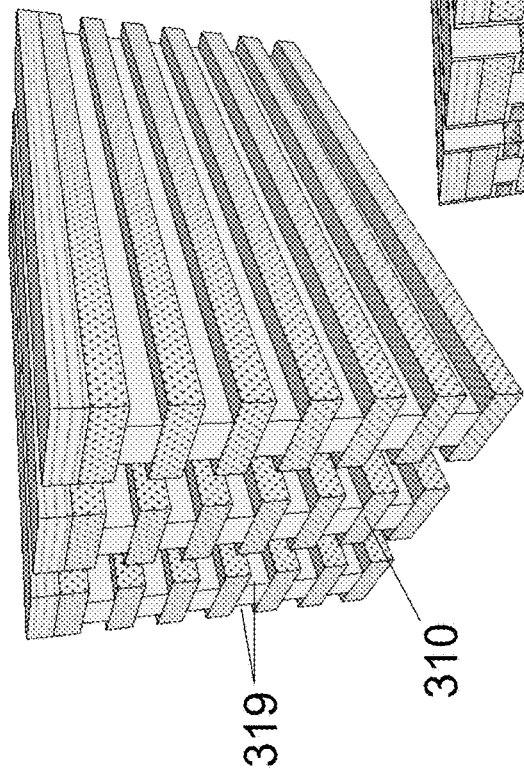

FIG. 3D illustrates the structure after a step of selective isotropic etch of the channel layers 304, forming horizontal notches 319 while keeping the S/D layers 310, 302 mostly un-etched. A selective plasma etch process may be used. Alternatively a two step process could be used by first forming pores in the desired regions of the channel layers by selective anodization processing, then use plasma etch of the porous regions.

Figure 3E:
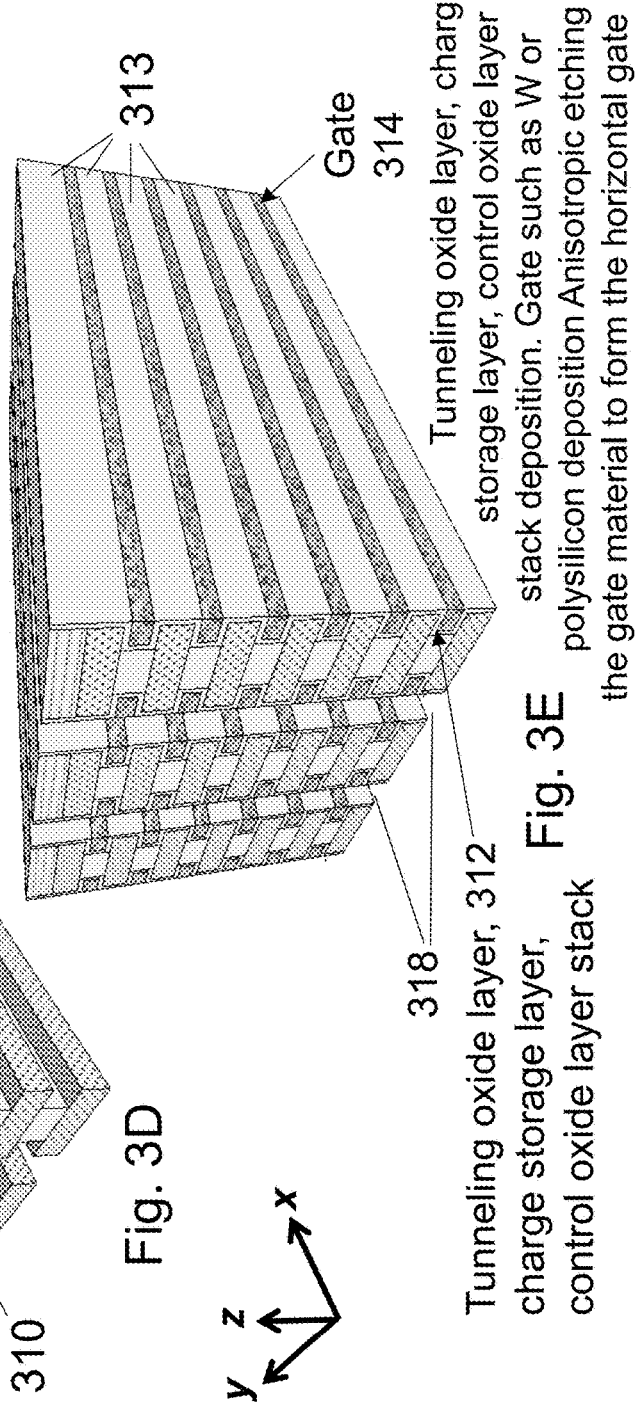

FIG. 3E illustrates the structure after depositing a stack of tunneling oxide layer/charge storage layer/control oxide layer 312 such as oxide/nitride/oxide—"O/N/O", and gate conductive material 314. In this embodiment the charge storage layer is made of a charge trapping material. Alternatively, the charge trap layer can be a defect rich high-k dielectric or silicon rich silicon nitride. Alternatively, the charge trap layer can be nanocrystal floating dots. Alternatively, the charge trap layer may be replaced by floating gate. This could be done by thermal oxidation, Atomic Layer Deposition (ALD) or alternative processes used for semiconductor device fabrication. A directional anisotropic etch step may be used to remove substantially all gate material from the side walls of the S/D layers 313. A slight touch-up isotropic etch may also be employed to remove residual stringers.

Figure 3F:
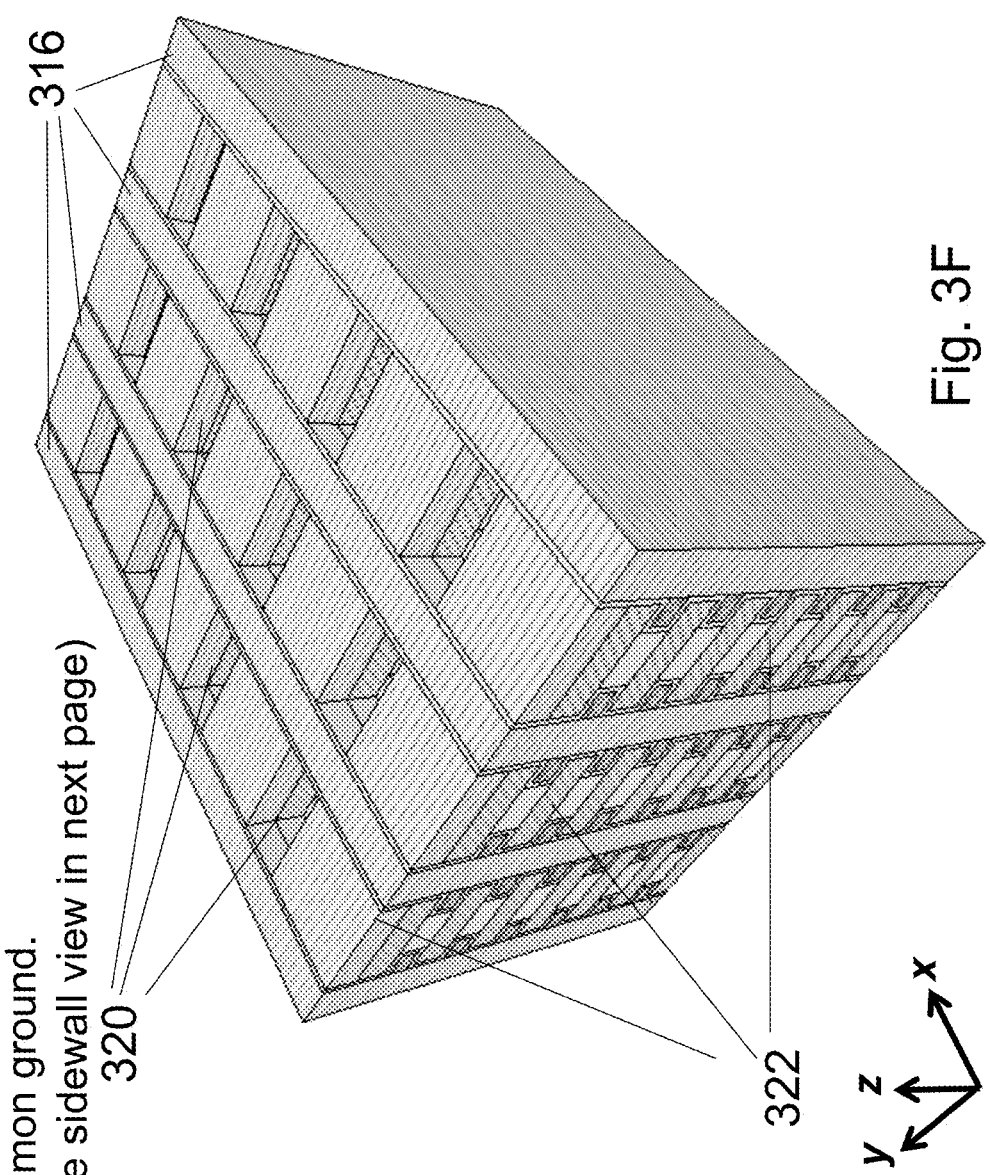

FIG. 3F illustrates the structure after filling the 'valleys' 318 with insulating material 316, followed by an etch step which forms holes 320 along the ridges 309 of FIG. 3B, effectively forming vertical strings 322 of alternating N+/P material. The etch step could be done in two steps. First apply anisotropic etch to the stack of alternating 302/304 multilayers to form the vertical individual strings 322, this anisotropic etch does not etch the gate stacks, and then apply isotropic selective etch to remove the source/drain 302 in-between the g gate stack 312, while leaving the horizontal oriented gate and oxide lines unattached. The etching may be stopped before the lowest N+ layer so it may serve as a common ground. Conductive etch stop layers may be employed.

FIG. 3G illustrates a vertical cross-sectional view along the metal gate word line of the structure of FIG. 3F. The empty spaces left after removal of the in-between channel material 334 (previously vertical gaps 320) may filled with oxide and then serve as part of the memory cell isolation. The remaining most bottom material 338 could serve as a common ground line. The lower gate line 340 could serve as ground select gate and the upper gate line string select gate 344 may serve as the string select. The S/D line on top of the vertical strings 332 would serve as the string drain region and could be connected later to the bit-lines (BL). The resultant structure forms a matrix of vertically oriented non-volatile NAND memory cells. The horizontal control gates 342 form the memory word lines controlling current through the vertical channels between successive source/drain layers, forming vertical NAND strings.

FIG. 3H illustrates a vertical cross section of one vertical NAND string 336 perpendicular to the word-line direction.

Figure 3I:
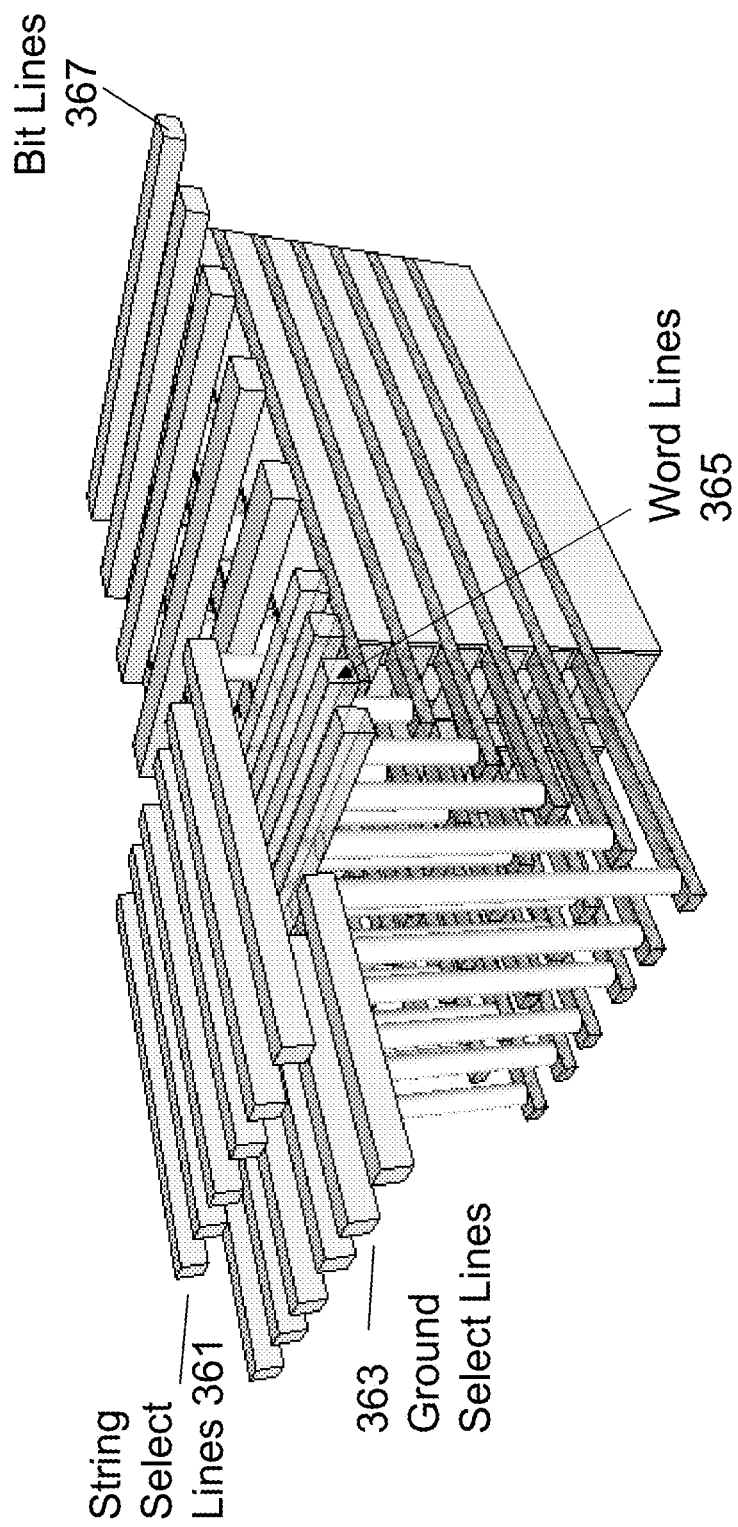

FIG. 3I illustrates the 3D NAND memory structure after adding the grid of memory control lines: word-lines 365, bit-lines 367, string select-lines 361 and ground select-lines 363.

Figure 4A:
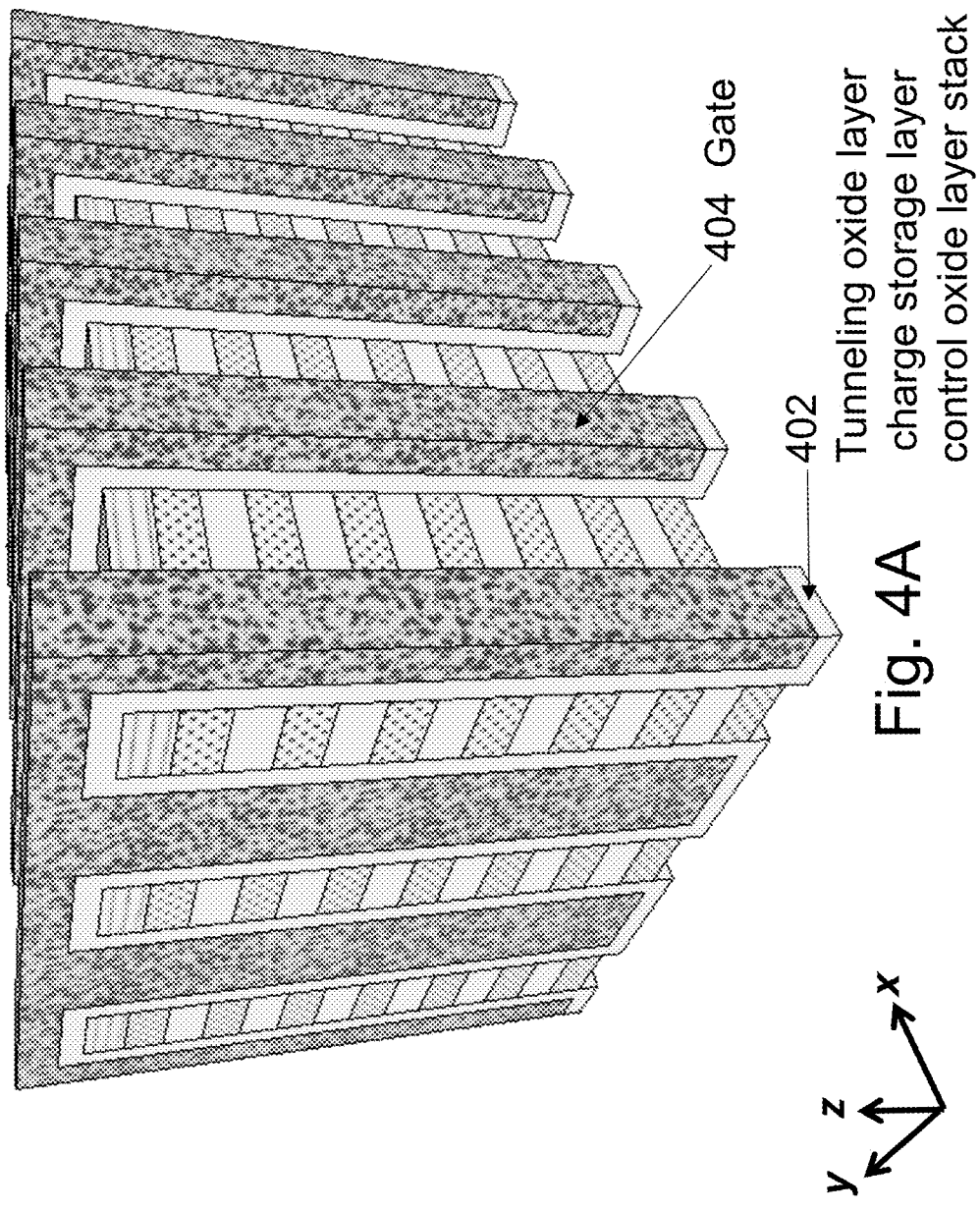
FIGS. 4A-4C are example illustrations of the formation and structure of a NOR type 3D memory.

FIG. 4A illustrates a structure for the formation of a NOR type 3D memory which we could refer to as the 3D-NOR. It may start from the structure 307 illustrated in FIG. 3B above. Masking and etching techniques are used to gate-stakes in 'y' direction. First by coating the ridge structure 307 with dielectric multilayer of tunneling-oxide layer, charge-trap layer such as silicon nitride, and blocking oxide layer, forming the charge storage stack 402. Charge storage stack 402 could also be called O/N/O (Oxide-Nitride-Oxide). A gate material 404 such as heavily doped polysilicon, metal such as tungsten, or other conductive material is subsequently deposited. Then, patterning by masking and etching techniques may be utilized to form elongated strips in 'y' direction perpendicular to the ridge direction. Alternatively, the gate stack can be formed by filling the pre-patterned space within oxide, which is called damascene process. Alternatively, the gate stack can be formed by replacing the dummy gate, which is called replacement gate process. The deposition step could use ALD techniques. Alternatively, combination of thermal oxide and other deposition techniques could be used.

Figure 4B:
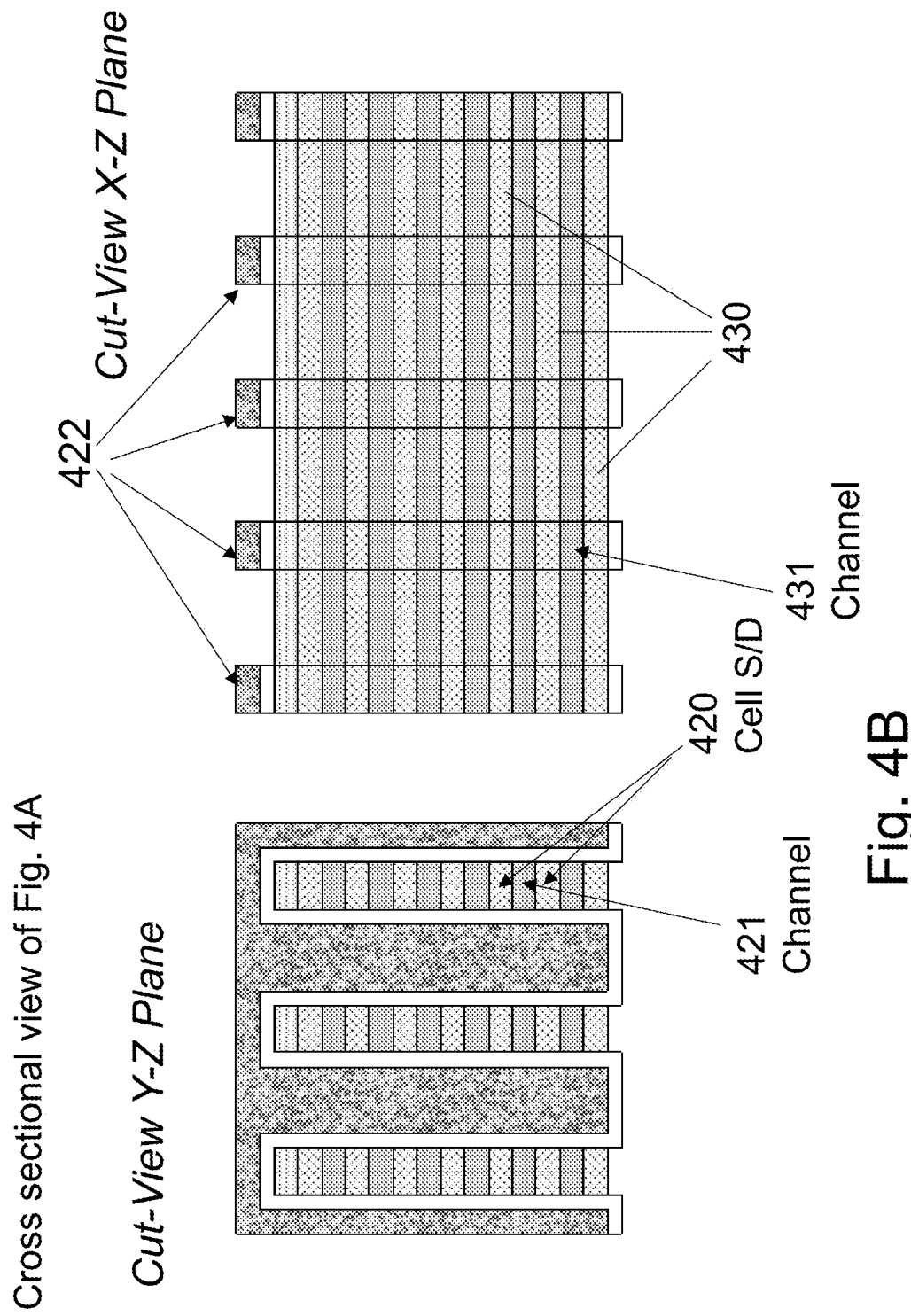

FIG. 4B illustrates a cross section of the structure of FIG. 4A. The gates 422 could be designed to control the conductivity between the source and the drain (S/D) 420, 430 through the channel 421, 431. When the S/D material is selected to be N+ silicon and the channel material is selected to be P type silicon, then each memory cell would include an NPN transistor with two side-gate stacks to form non-volatile memory cells. As the S/D lines are running along the ridge all the way to the edge of the block, proper design could enable selecting a pair of adjacent S/D lines to select a specific channel layer 421 within a ridge, and a specific word-line controlling the gate 422 could select the column of a specific memory cell. The memory could be arranged as a matrix of memory blocks. Each memory block could be a rectangular sized X in x direction and Y in y direction, each direction could be 1-2, 2-10, 10-50, 50-200, 200-1,000 microns. And the number of layers could be 2-8, 8-32, 32-96, 96-128. These are examples and bigger or smaller numbers could be designed too. At the ridge edge a staircase structure could be formed to allow per layer connection to the ridges S/D lines. Preferably at the staircase region the P layers may be etched and replaced with oxide or other isolation material. Similarly, the P layers between two adjacent word lines may be etched and replaced with oxide or other isolation material (not shown herein). Selective isotropic etching of the P-type layers could be used to etch in between the horizontal N-type strips as previously discussed herein.

Figure 4C:
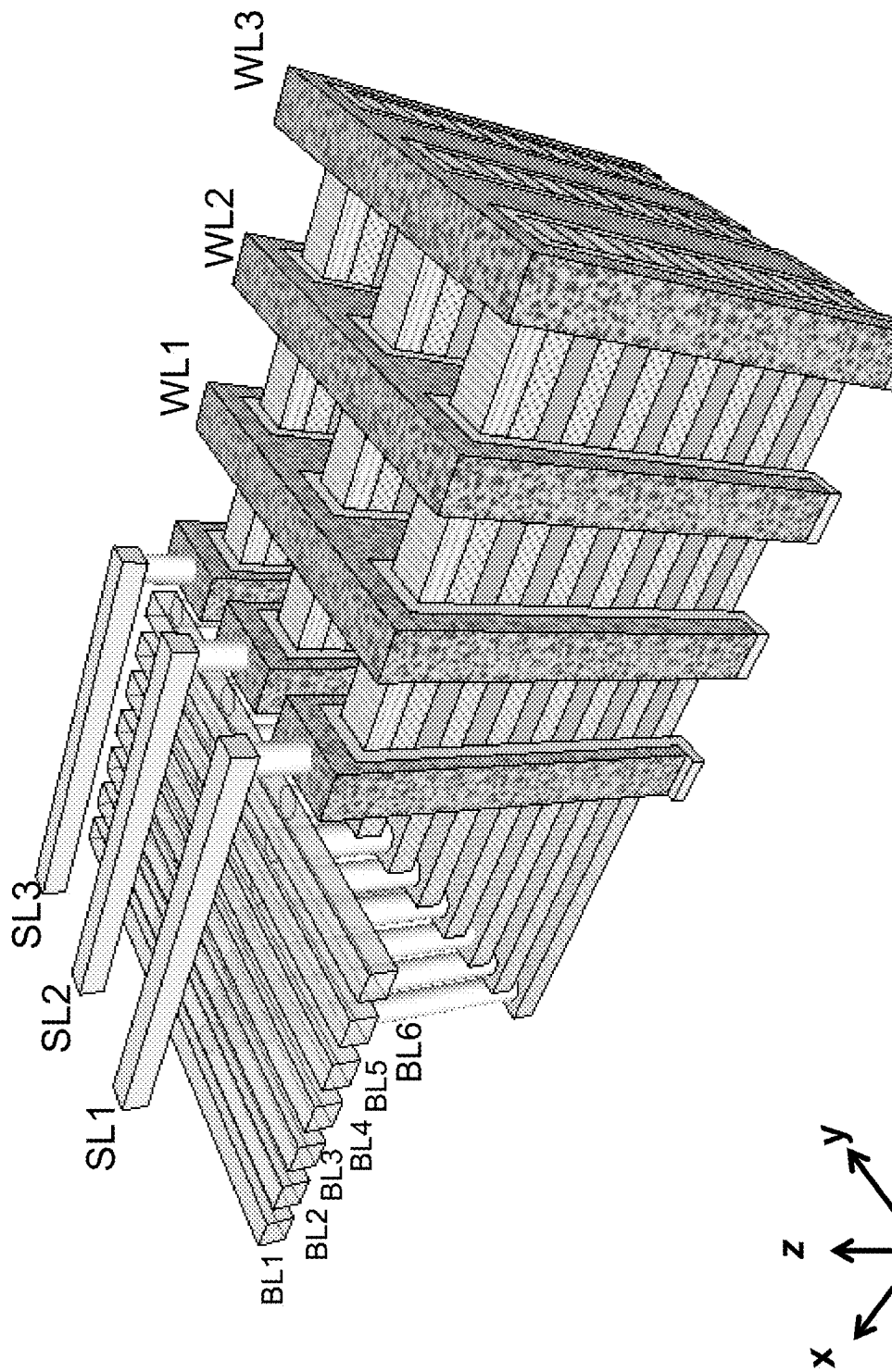

FIG. 4C illustrates the 3D NOR structure after forming a staircase for per layer connection at the ridge edge and adding control lines. Shared gates forming word-lines WL1, WL2, WL3 run in y direction, perpendicular the ridges direction. The interconnect line BL1 controls the S/D of the first layer of all the ridges in the memory block, BL2 controls the S/D of the second layer as well as the D/S of the first layer, BL3 controls the S/D of the third layer as well as the D/S of the second layer, and so forth. The select-lines provides per ridge control. SL1 control the access to the first ridge, SL2 to the second ridge SL3 control the third ridge and so forth.

In this 3D-NOR structure, and also in many other memory structures herein, the horizontal per layer line through the matrix the S/D lines 430 could be the limiting factor of the power and performance of the device with respect to how long it could be made. On the other hand, the overhead area required for the stair-case interconnects structure suggests longer lines to save device real-estate and reduce cost per bit. In such a structure, the P type layer may be relatively thick such as larger than about 100 nm to prevent leakage current between two N+ layers consisting of the S/D lines. Alternatively the P type channel in between the S/D lines could be selectively etched for the staircase zones and replaced with an electrically isolative material, as the leakage concern is more severe at zones which have no active gates; for example, active gates could be used to block leakage through the P type channel.

The ridge selection control device may be constructed by first removing the channel material 421 at the region designated for ridge selection control. Then the select gate transistors are formed along the N+S/D lines as outlined in respect to FIG. 13A-13C herein. The select gate transistors may be designed to function as junction-less transistors ('JLT') also known as gate all around nano-wires. In some cases it might be desired to thin the S/D lines in the region designated as select gate transistors to achieve better gate control. Such thinning would narrow these regions to about 20 nm thickness or about 15 nm or about 10 nm. Alternatively, the select gate transistors are could be formed along the N+S/D lines by having the channel formed from P-type silicon that is selectively regrown from the etched sidewall of N+ region.

The architecture referred to as '3D NOR' and illustrated herein in reference to FIGS. 4A to 4C as well as in similar illustrations herein, is also similar to a structure called in the art 'AND' nonvolatile memory architecture, for example as presented in a patent such as U.S. Pat. No. 7,414,889, and as 1T MONOS as in a paper by Hidenori Mitani et al. titled "A 90 nm Embedded 1T-MONOS Flash Macro for Automotive Applications . . . " presented at ISSCC 2016, and a 3D architecture as presented in U.S. Pat. No. 8,426,294, all the forgoing are incorporated herein by reference including their teaching of memory control, and the subsequent adaptation for control of the 3D NOR structure herein.

Figure 5A:
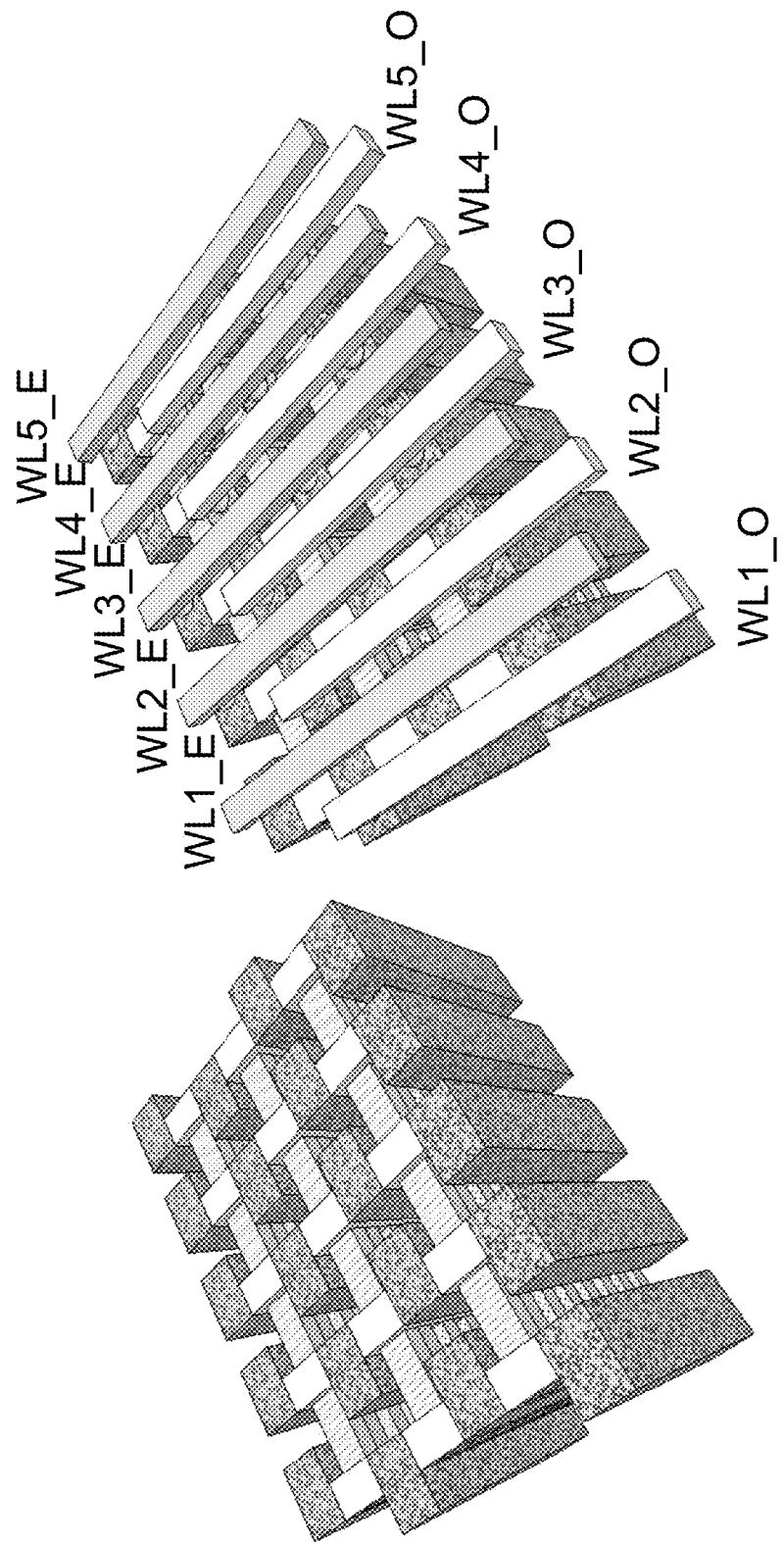

An additional enhancement to such 3D NOR is to break the gate control into two independent side gates—even gates, in the even valleys, and odd gates, in the odd valleys, controlling a ridge, as shown in FIG. 5A. For example, control line WL1_O will control all the odd side gates and WL1_E would control all the even side gates. Such a split could allow doubling the storage capacity. If the width of indented P-layer is too thin, such as less than 20-50 nm, WL odd can be primary gate(s) while WL even can be the support gate(s) that may be used to support write, read, or hold the memory states.

Figure 5B:
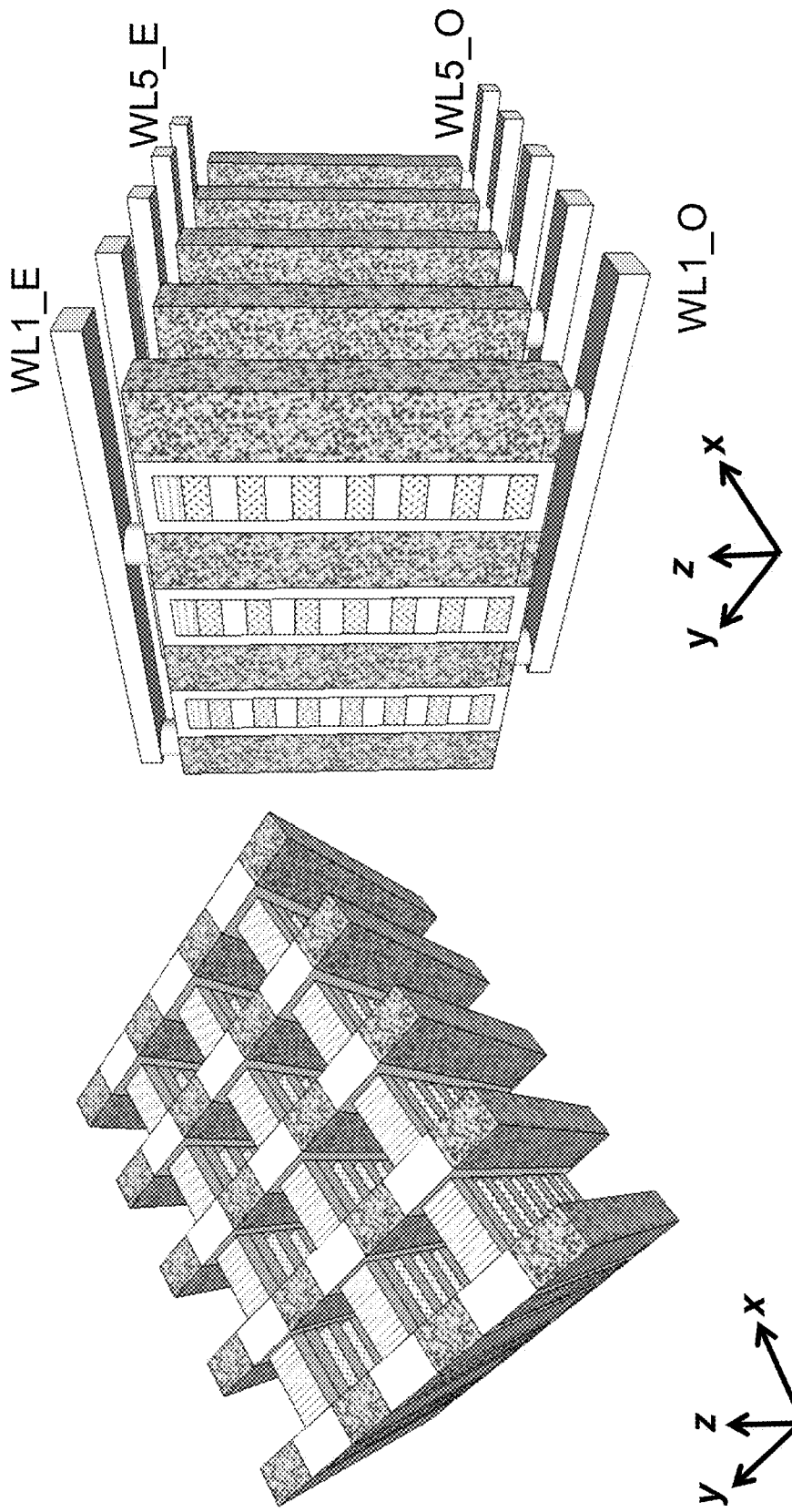

These two gate control lines can be placed on the top connection layer side by side as illustrated in FIG. 5A, or alternatively one on top and one under bottom as illustrated in FIG. 5B. When these two gate control lines are placed both on top, the technology node for the top connection may be more advanced than the technology node used for the 3D memory block.

Additional enhancement to such 3D NOR is to implement MirrorBit® technology as was produced commercially by Spansion for NOR products. The MirrorBit concept was presented in a paper by Boaz Eitan et al. in a paper titled "NROM: A Novel Localized Trapping, 2-Bit Nonvolatile Memory Cell" published at IEEE ELECTRON DEVICE LETTERS, VOL. 21, NO. 11, November 2000, and patents such as U.S. Pat. Nos. 5,768,192, 6,204,529 and application US 2006/0007745, all incorporated herein by reference.

These two enhancements could be combined to allow '4 bit per cell' as is illustrated in FIG. 5C. Such technology is detailed in U.S. Pat. No. 7,091,551, incorporated herein by reference.

Leveraging this concept a technology detailed in U.S. Pat. No. 6,670,669 incorporated herein by reference, teaches how to add additional center bit for 3 bit locations per facet and total of 6 bit location per channel.

Another known enhancement is to control the amount of charge being stored in a given charge trap location to allow multi-level voltages per cell, hence coding more than 1 bit per storage site. These different enhancement techniques could be combined to achieve an even higher number of bits per cell. Accordingly if each site is designed to hold 4 levels then the cell could store 8 bits and with center site even 12 bits. If more levels are managed at each storage site than the storage capacity of a cell could be even higher.

An additional alternative to consider for the high density multi-bit per cell memory is a refreshable memory or volatile memory. In general, the conventional requirement for non-volatile memory devices is 10 years of data retention time. Some of the techniques described herein for increases of storage capacity might be challenged with holding those stored charges distinctive for the full 10 years, especially for devices that might be operated in high temperature environments, or with the motivation to scale down cell size and tunneling oxide layer thickness. An alternative solution is to periodically tune the device to the desired state at a fixed (or variable) time interval, such as days, weeks, month or few years. Alternatively, a memory controller could read and verify the degree of charge loss or spread and make adjustments. If the integrity of some memory sites has fallen below a set threshold, these memories could be refreshed to repair the memory sites to the full charge level. Such self-monitoring could be done with a minimal impact on the normal device operations or its overall power consumption.

Figure 5E:
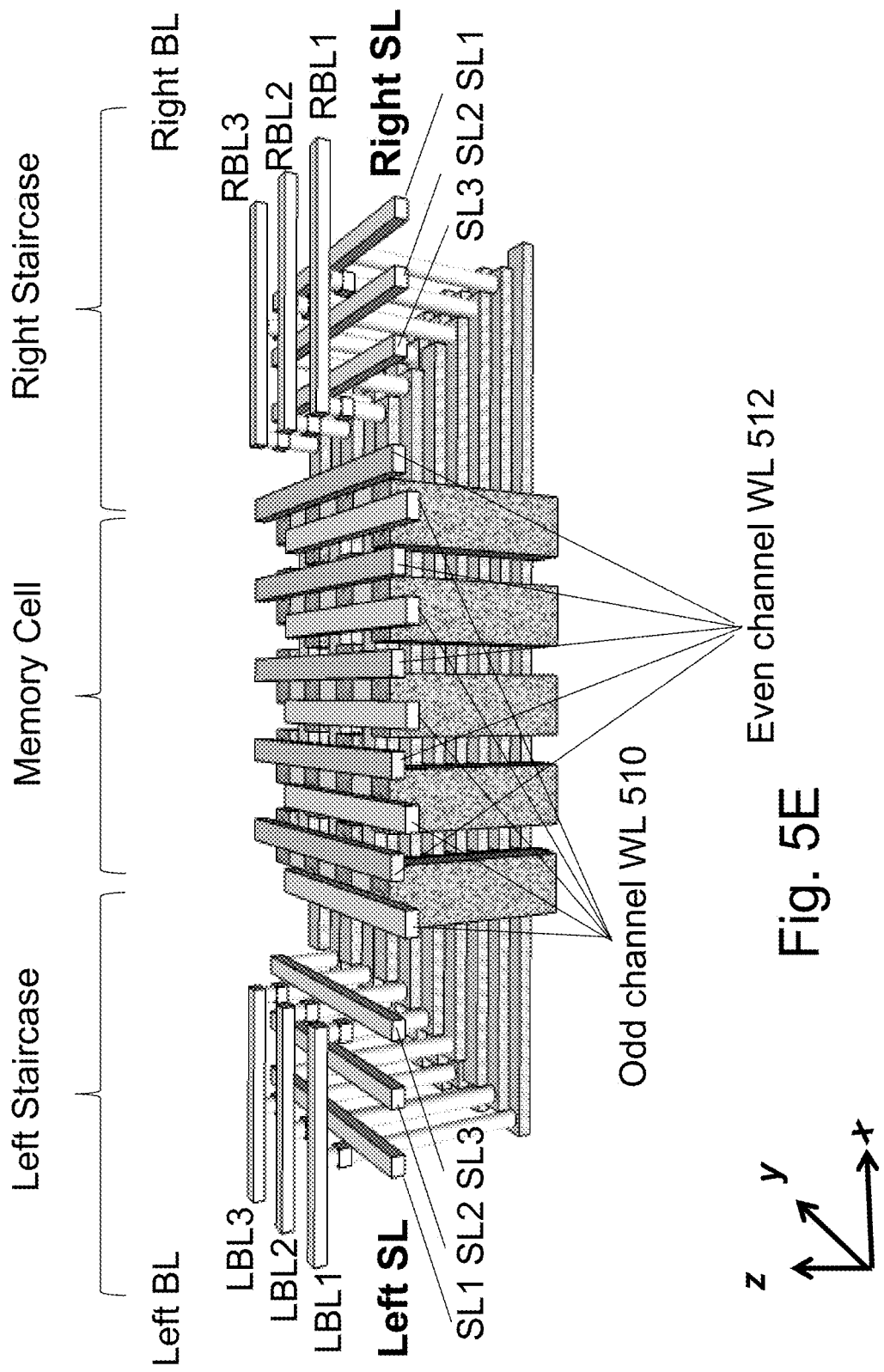

FIG. 5E illustrates an alternative 3D NOR memory block without using ridge select gates leveraging having staircases on both sides of the ridge—Left Staircase and Right Staircase. The specific channel selection could be done by proper allocation of connections along ridges and along levels. As an example, all even levels may be connected to Select Lines such as SL1 to level 2, SL2 to level 4, SL3 to level 6 and so forth. The select lines can also be considered source lines. This could be done for the Left Staircase and the Right Staircase. Then along the ridge for each ridge the Left Staircase could be used to connect Left Bit Line 1 (LBL1) to Ridge 1 levels 1 and 5 and 9 etc., Left Bit Line 2 (LBL2) to Ridge 2 levels 1 and 5 and 9 etc. and so forth; and for Right side—Right Bit Line 1 (RBL1) to Ridge 1 levels 3 and 7 and 11 etc., Right Bit Line 2 (RBL2) to Ridge 2 levels 3 and 7 and 11 etc. and so forth. As a result, the voltage applied to the left bit lines does not conflict with the voltage applied to the right bit lines. In addition, two levels of bit cells in a ridge can be accessed simultaneously. In a single operation cycle, two levels of bit cells can be read by left and right bit lines. In a single operation cycle, alternatively, one level of bit cells can be read by one side of the bit line while the other level of bit cells can be written by the opposite side of the bit line.

An example approach to select and access a specific bit could be as follows:

Select a specific Ridge 1→RBL 1 or LBL 1

Select a specific channel—between S/D 4 and S/D 5→Use Right SL 2 (SL 2) and Left Bit Line 1 ('LBL1')

Odd side bit & Even side bit→Odd side WL 510 and Even side channel 512

In a similar approach any specific storage location could be selected by the choice of one select-line, one bit-line, and one word-line.

Forming staircases on both edges of the ridge, for example, as is illustrated in FIG. 5E, is advantageous even when using a per ridge select. This could be useful for redundancy and/or better access time and less access time variation between cells along the ridge. It could allow the chip designer to keep the S/D total resistance substantially equal for all channels in the ridge by accessing the source from one side and the drain from the other keeping the total conduction length about equal to the ridge length. For devices having multiple memory blocks real estate efficiency can be improved by sharing each staircase between both the right and the left sides of adjacent blocks.

The number of layers forming the 3D NOR fabric could increase over time to answer demands to increase the device capacity. For a large number of layers, the vertical access time through the staircase could become large enough to impact the effective access time between lower levels and upper levels. An optional solution to maintain the symmetry and equalization of the access length could be to use access from both sides of the device. Accordingly, one staircase access could be from the top while the other from the bottom, thus keeping the S/D access similar to all memory cells within the unit.

Figure 6:
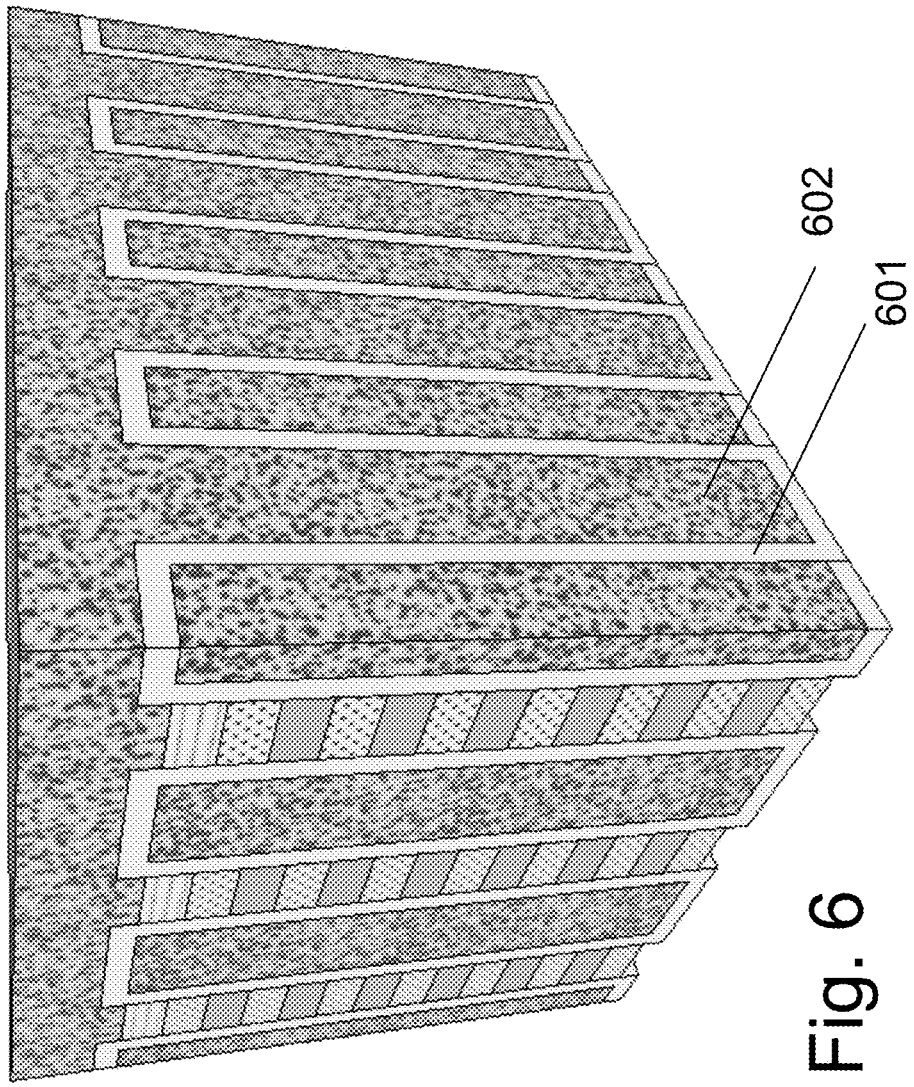
FIG. 6 is illustrations of the formation of $2^{nd}$ gate stack.

The O/N/O multilayer dielectric charge storage stack 402 in FIG. 4A could be called $1^{st}$ O/N/O dielectric gate stack and its metal gates 404 could be called $1^{st}$ gates. Increases in storage density could be achieved by adding a second multilayer dielectric charge storage stack on top of the structure $2^{nd}$ O/N/O 601 and depositing metal gate 602 over it as is illustrated in FIG. 6 with $2^{nd}$ dielectric gate stack 601 and $2^{nd}$ gates 602.

FIG. 7A illustrates the structure after a step of CMP which also forms isolated $2^{nd}$ gate lines 702 controlling charge trapping in the $2^{nd}$ O/N/O 703 while the $1^{st}$ gate lines 712 controls $1^{st}$ O/N/O 701. FIG. 7B is a 'cut' look in the valley 713 between adjacent ridges 712, 714 showing the $2^{nd}$ gates 702 and the $1^{st}$ gates 712.

The choice for gate material could be those common in the art, such as heavily doped n-type polysilicon, heavily doped p-type polysilicon, titanium nitride, tantalum nitride, tungsten, or stack of some of those. Alternatively, it could include more than one type of material such as first depositing a material that is optimized to the device functionality (for example work function) such as doped polysilicon and then additional material such tungsten to reduce the Word-Line resistivity.

Figure 8A:
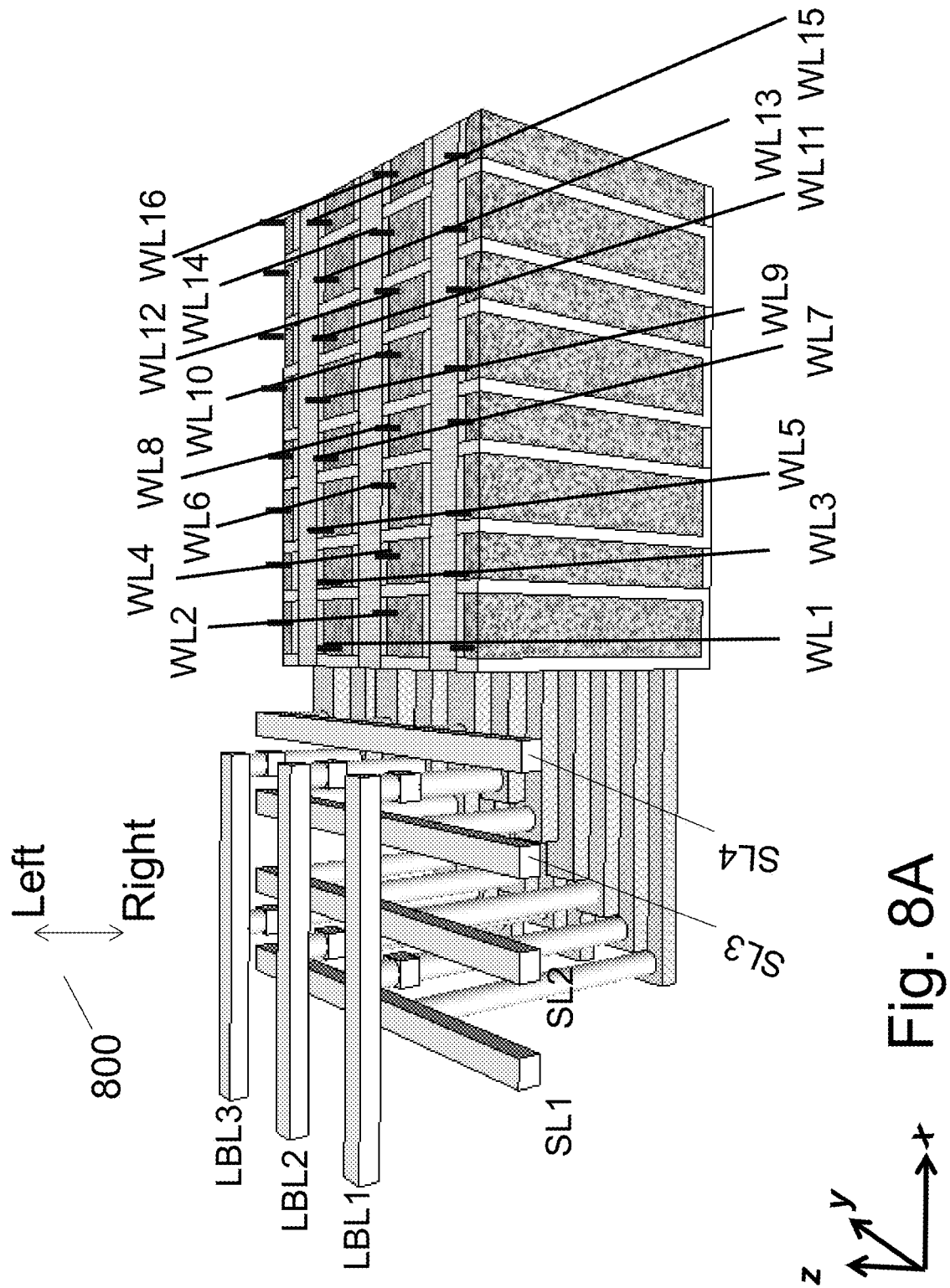

FIG. 8A illustrates subset of the structure of FIG. 5E. FIG. 8A illustrates word-lines WL1, WL3, WL5, WL7, WL9, WL11, WL13 connecting to the gates in the odd valleys which we call odd gates while word-lines WL2, WL4, WL6, WL8, WL10, WL12, WL14, WL16 are connected to those in the even valleys which we call even gates. Each gate is dual function and could affect the ridge to its right and the ridge to its left. The arrow indicator 800 indicates the right and left direction in the illustration.

Figure 8B:
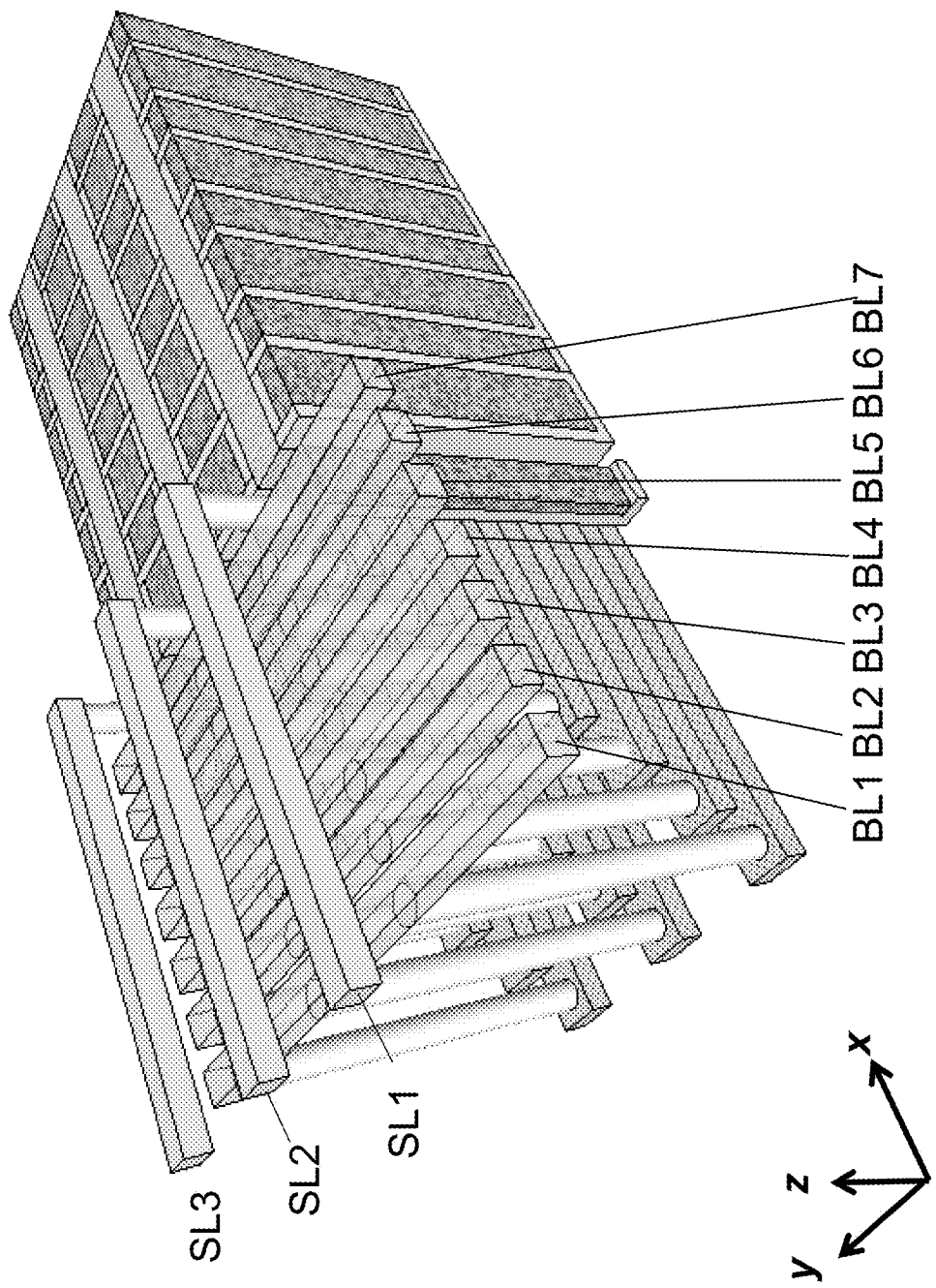

FIG. 8B illustrates the structure of FIG. 4C after doubling the number of channels by adding 2nd dielectric gate stack and breaking the gates into odd gates and even gates. Not all the gates of the 3D NOR fabric need to have the same charge storage gate stack. In fact, for some applications it might be desired to have more than one type of gate stack on the same IC. Alternative dielectric gate stacks could include the same O/N/O materials with different thicknesses, or different materials. Some of such dielectric gate stack materials have been presented in paper by Xuguang Wang et al. titled A Novel MONOS-Type Nonvolatile Memory Using High-Dielectrics for Improved Data Retention and Programming Speed published in IEEE TRANSACTIONS ON ELECTRON DEVICES, VOL. 51, NO. 4, April 2004 597, and by Chun Zhao titled "Review on Non-Volatile Memory with High-k Dielectrics: Flash for Generation Beyond 32 nm" published at Materials 2014, 7, 5117-5145; doi:10.3390/ma7075117, both incorporated herein by reference. The charge storage dielectric gate stack could include band gap engineering for better performance. Herein the charge storage dielectric could be called O/N/O also when non nitride materials are used for charge trapping. Also each of tunnel oxide/nitride/control oxide can be a silicon-oxide-nitride composite with various stoichiometries. Additionally, the percent composition of nitride within the 'O/N/O' can be modulated either abruptly or gradually. Particularly, the band-gap engineering may be focused on the tunneling oxide to increase write speed without sacrificing retention time. Such band-gap engineering has been described in papers such as by Dong Hua Li et al. titled "Effects of Equivalent Oxide Thickness on Bandgap-Engineered SONOS Flash Memory" published at the 2009 IEEE Nanotechnology Materials and Devices Conference Jun. 2-5, 2009, and by Hang-Ting Luc et al. titled "BE-SONOS: A Bandgap Engineered SONOS with Excellent Performance and Reliability" published at IEDM 2005, by C. Sandhya et al. titled "Impact of SiN Composition Variation on SANOS Memory Performance and Reliability Under NAND (FN/FN) Operation" published in IEEE TRANSACTIONS ON ELECTRON DEVICES, VOL. 56, NO. 12, December 2009, and by C. Sandhya et al. titled "NITRIDE ENGINEERING AND THE EFFECT OF INTERFACES ON CHARGE TRAP FLASH PERFORMANCE AND RELIABILITY" published in IEEE CFP08RPS-CDR 46th Annual International Reliability Physics Symposium, Phoenix, 2008; and in U.S. patents such as U.S. Pat. Nos. 6,384,448, 6,456,535, 6,864,139, 6,888,749, 6,906,953, 6,958,937, 7,230,848, 7,414,889, 7,512,016, 7,525,147, 7,633,110 7,839,696, 7,759,715, and 7,848,148, all of the forgoing are incorporated herein by reference.

For example it could be advantageous to make the tunneling oxide of O/N/O-2 stack extra thin, which we could term 'thin O/N/O'. The tunneling oxide of the 2nd dielectric gate stack could be made substantially thinner than the thickness required to be a non-volatile memory or even not being formed. Therefore, the thin O/N/O hereinafter might be referred to as the stack without tunneling oxide and charge trap layer being directly contact with the channel. Such could result in shorter retention time but also with shorter write and erase times. Such ultra-thin tunneling oxide is sometimes considered a DRAM (Dynamic Random Access Memory) alternative. Accordingly, such 3D NOR memory could integrate multiple memory types in one device such as conventional NV (Non-Volatile) memory in the facets controlled by, for example, first gates while the faster memories with shorter retention time in the facets controlled by second gates. Such faster memories with shorter retention times are presented in papers such as by H. Clement Wann and Chenmming Hu titled "High-Endurance Ultra-Thin Tunnel Oxide in MONOS Device Structure for Dynamic Memory Application" published at IEEE ELECTRON DEVICE LETTERS, VOL. 16, NO. 11, November 1995; by Dong-Il Moon et al. titled "A Novel FinFET with High-Speed and Prolonged Retention for Dynamic Memory" published at IEEE ELECTRON DEVICE LETTERS, VOL. 35, No. 12, December 2014; by Shih-Jye Shen et al. titled "Ultra Fast Write Speed, Long Refresh Time, Low Power F-N Operated Volatile Memory Cell with Stacked Nanocrystalline Si Film" published at IEDM 96; by Ya-Chin King et al. titled "A Long-Refresh Dynamic/Quasi-Nonvolatile Memory Device with 2-nm Tunneling Oxide" published at IEEE ELECTRON DEVICE LETTERS, VOL. 20, NO. 8, August 1999, and titled "Charge-Trap Memory Device Fabricated by Oxidation of Si11-x Gex" published at IEEE TRANSACTIONS ON ELECTRON DEVICES, VOL. 48, NO. 4, April 2001; by ZongLiang Huo et al. titled "Sub-6F2 Charge Trap Dynamic Random Access Memory Using a Novel Operation Scheme" published 2006 64th Device Research Conference; by M. Gonhan Ertosun et al. titled "Novel Capacitorless Single-Transistor Charge-Trap DRAM (1T CT DRAM) Utilizing Electrons" published at IEEE ELECTRON DEVICE LETTERS, VOL. 31, NO. 5, May 2010; by VA. Gritsenko et al. titled "A new low voltage fast SONOS memory with high-k dielectric" published at Solid-State Electronics 47 (2003); by K. Tsunoda et al. titled "Ultra-High Speed Direct Tunneling Memory (DTM) for Embedded RAM Applications" published in 2004 Symposium an VLSI Technology; by Kooji TSUNODAV et al. titled "Improvement in Memory (DIM) Retention/Program Time Ratio of Direct Tunneling for Low Power SoC Applications" published at IEICE Trans. Electron. Vol E88-C No. April 2005; and in U.S. patent application Ser. No. 11/737, 961, 12/030,485, 12/133,237, 12/007,012, and U.S. Pat. Nos. 5,608,250, 6,456,535, 6,888,749, 6,906,953, 6,909, 138, 6,958,937, 7,288,813, 7,432,153, 7,462,539, 7,759,715, 7,848,148, 8,329,535, 8,426,906 and 9,025,386; all of the foregoing in this paragraph are incorporated herein by reference.

An alternative memory technology is known in the art as ferro-electric technology. This could be implemented by replacing the O/N/O stack with a ferro-electric stack. Ferro-Electric memory stack has been presented in paper by Jae Hyo Park et al. titled "A hybrid ferroelectric-flash memory cells" published in JOURNAL OF APPLIED PHYSICS 116, 124512 (2014); by Hang-Ting Luc et al. titled "Device Modeling of Ferroelectric Memory Field-Effect Transistor for the Application of Ferroelectric Random Access Memory" published in IEEE Transactions on ultrasonics, ferroelectrics, and frequency control, vol. 50, no. 1, January 2003; and in U.S. patent application Ser. No. 14/875,744, international application WO 2016/029189, and U.S. Pat. No. 6,067,244, all of the forgoing are incorporated herein by reference.

An additional optional enhancement is to combine two levels of memory forming structure in the gate stack such as presented by Daniel Schinke et al. titled "Computing with Novel Floating-Gate Devices" published at IEEE Computer magazine February 2011; and also described by Daniel Johannes Schinke A dissertation submitted to the Graduate Faculty of North Carolina State University 2011, titled "Computing with Novel Floating Gate Devices"; by Biplab Sarkar titled "Dual Floating Gate Unified Memory MOSFET With Simultaneous Dynamic and Non-Volatile Operation" published at IEEE ELECTRON DEVICE LETTERS, VOL. 35, NO. 1, January 2014; and by Yu-Chien Chiu, titled "Low Power 1T DRAM/NVM Versatile Memory Featuring Steep Sub-60-mV/decade Operation, Fast 20-ns Speed, and Robust 85° C.-Extrapolated $10^{16}$ Endurance" published at IEEE 2015 Symposium on VLSI Technology, all of the foregoing in this paragraph are incorporated herein by reference.

The 3D NOR memory could include memory columns having thick tunnel oxide, which may support long term charge trapping and thus provide a long retention time. This long retention time may be more than about a year, more than about 3 years, and even more than about 10 years for tunneling oxide thicker than 2.5 nm. These memory cells would have longer write times, perhaps of more than 1 micro-second or even more the 10 micro-seconds. And for other memory columns having a thin tunneling oxide, the thickness may be less than about 1 nm or even less than about 0.5 nm, or even no tunneling oxide—provides only short retention time but with a faster write time. Other portions of the 3D NOR fabric could have a very different level of tunneling oxide such as 0-1, 1-2, 2-3, 3-4,4-5, 5-8 nm. These tradeoffs allow engineering of devices with specific memory attributes to support the end system application.

The preference would have been long retention with fast write cycles. One embodiment to provide longer retention for a very thin tunneling oxide is to use the other side gate of the same channel as a charge retention support which could be described using illustration FIG. 5D. For the purpose of this description we could consider the word-lines being split to odd word-lines 500 controlling the ridge odd gate and even word-lines 502 controlling the ridge even gate. The oxide stack of the odd O/N/O 501 could be made with thin tunneling oxide while the even oxide 503 could be made with just thin gate oxide—without a charge trapping structure. The ridges could be made to have a relatively thin channel width 506 below about 20 nm or below about 10 nm so the even gate 502 could be biased with a negative voltage, particularly during a holding state such as −1 volt which would not disturb the channel electrons to be charged into the odd O/N/O 501 tunneling oxide, but will help to extend retention time by pushing trapped electrons away from the channel to extend retention time of electrons trapped at the odd trapping layer within the odd side O/N/O 501. The retention support signal of the even gate 502 could be disabled during read or write cycles of that memory cell. The retention support signal of the even gate 502 may be shaped with respect to at least time and voltage to maximize the overall retention time of the intended cells.

U.S. Pat. No. 6,864,139 titled "Static NVRAM with Ultra-Thin Tunnel Oxides", incorporated herein by reference, teaches the use of positive biasing the primary gate— the word line for holding the trapped charge by having the memory being built using N channel (PNP transistors) for which a positive gate charge disables the transistors. In most memory designs P channels are used for better performance and other considerations. An alternative option is to operate the word-line of a 'thin tunneling oxide' in a dual operating mode. For writing it could be charged to a high enough voltage to provide electron tunneling over the tunneling oxide barrier, for example to +4 volt. For retention it could be kept at a retention voltage such as +1 volt to keep holding the electrons in the trap layer. And for reading and other operations for channels related to that word-line it would be set to the proper signal as required for that specific operation. Such multiple functions of the word-line could suggest breaking the word-line to multiple independently controlled individual segments to allow keeping a retention voltage on more memory cells for a longer time without interfering with access to the cells for read and write operations. At high retention bias such as +1 volt many channels could get open. To reduce the potential high leakage of these open channels the related S/D lines could be kept in a floating state which could be achieved by disabling that ridge select transistor(s). And prior to accessing the ridge all these retention biases could be first removed, and may be removed in a sequence to minimize leakage and charge loss. Another alternative is to use a low retention voltage, for example such as +0.34 volts, which could be set below the channel threshold voltage. The retention time could be lower but the ease of operation and the operating power could motivate use of such lower retention bias. The following table suggests exemplary conditions for the word-lines ('WL'):

|    | Not Selected Unite | Selected Unit Not selected Channel/side | Selected Unit Channel/side | | |
|----|----|----|----|----|----|
|    |    |    | Read | Write '1' | Erase |
| WL | 1 v | 0 v | +1 v | +4 v * | −4 v * |

Notes:
The values in the table are exemplary and could be adjusted base on the specific 3D NOR fabric.
* The write and erase voltage are relatively low as the tunnel oxide is ultra-low.

The 3D-NOR memory could be designed with more than two tunnel oxide thicknesses. It could have multiple variations of tunnel oxide thicknesses across units of memory, ridges and/or memory-column-side. These could include high speed memory-column-side with a low natural retention all the way to conventional charge O/N/O resulting in a slow write and erase time and 10 years retention. As system needs could be quite different, the fabric may allow targeting the amount of memory types with a wide range of options and ability to very effectively transfer of data from one type to another type within the device. This range of memory types could include sections within a chip with gate supported retention and sections with floating gate as an alternative to charge trap and many other variations or combination of them.

For better performance, the tunneling oxide could be engineered for improved write speed and retention at the same time such as presented by Hang-Ting Luc et al. in a paper titled "BE-SONOS: A Bandgap Engineered SONOS with Excellent Performance and Reliability" published at IEDM 2005, incorporated herein by reference.

Another variation is to avoid tunneling oxide all together as presented by Dong-Il Moon et al. titled "A Novel FinFET with High-Speed and Prolonged Retention for Dynamic Memory" published in IEEE ELECTRON DEVICE LETTERS, VOL. 35, NO. 12, December 2014, incorporated herein by reference.

An optional enhancement for these 'trap charge' memory operations is to monitor the level of the charge during a read operation. Such monitoring could guide the refresh operation to reduce overall device power usage. Such monitoring could drive refresh to the cell, the column, the ridge or the unit.

Other variations could be integrated with the described 3D NOR fabric such as been described in a paper by Hee-Dong Kim et al., titled "A New Class of Charge-Trap Flash Memory With Resistive Switching Mechanisms" published in IEEE Transactions on Electron Devices—November 2010, incorporated herein by reference.

To reduce the thermal budget required to form a tunneling oxide and to form a uniform tunneling oxide in any convex and concave corners of the ridges, radical oxidation could be used for the formation of a high quality oxide such as for the formation of the tunneling oxide and/or for smoothing sharp corners and edges to mitigate unintended high e-field conditions. For example, by a TEL SPA (slot plane antenna) tool/machine, wherein oxygen radicals are generated and utilized to form thin thermal oxides (generally of single crystal silicon) at less than 400 deg C.

Figure 8C:
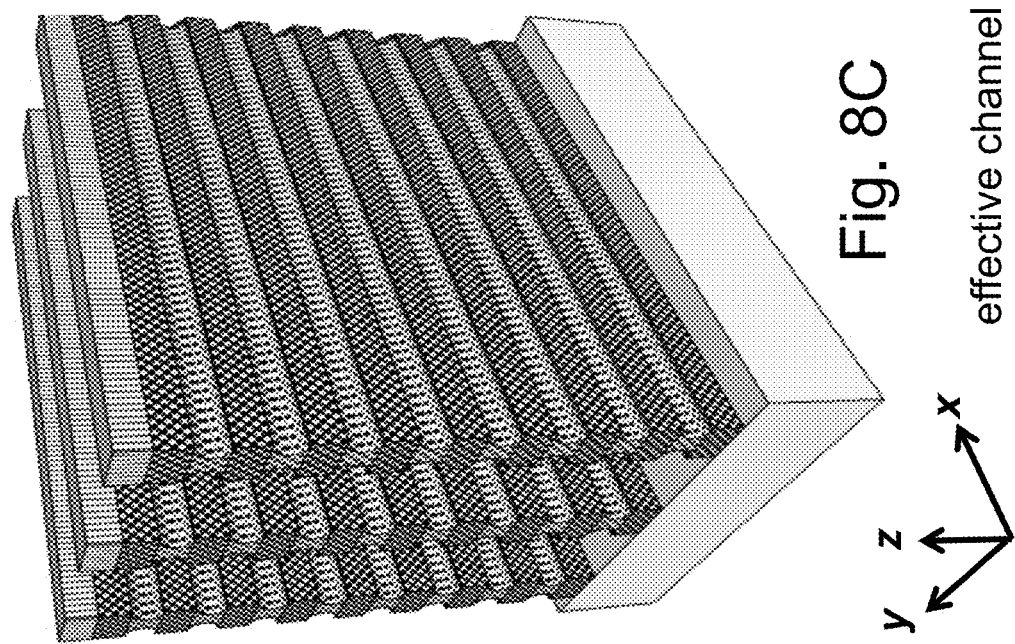
Figure 8D:
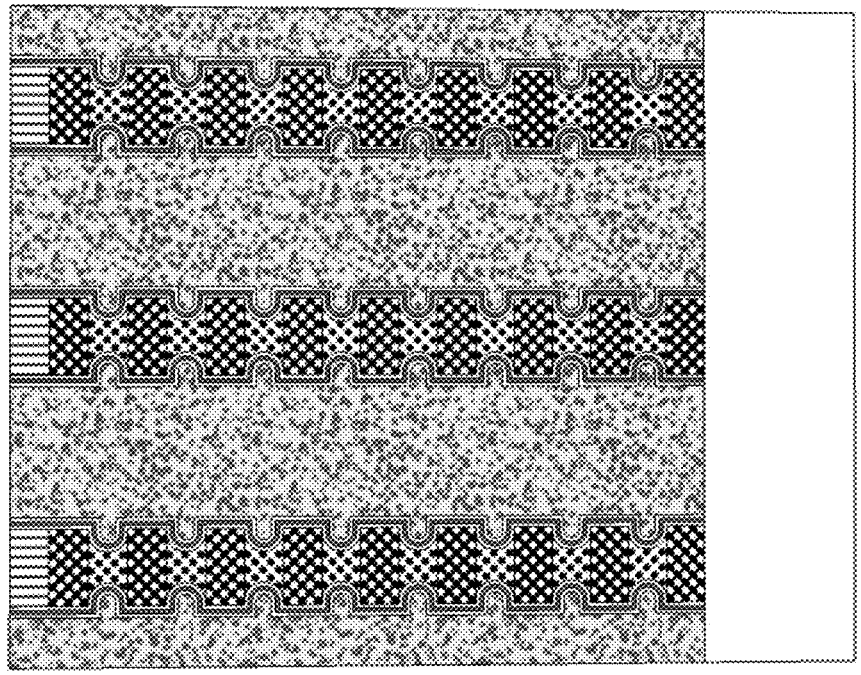

FIG. 8C illustrates an alternative for a curved channel formation. In this alternative the ridge formation illustrated in FIG. 3B may be followed by a selective partial etch of the channel regions similar to the one illustrated in FIG. 3C. Such an isotropic selective etch of the channel regions could form a curved channel. FIG. 8D illustrates forming a gate stack over the channels. Such curved channel in presented in U.S. patent application Ser. No. 11/379,723 incorporated herein by reference. An advantage of such a shaped channel is that for the same layer thickness the effective charge trap surface is longer (a geodesic rather than a direct line path) allowing better separation for charge storage, such as mirror bit storage sites, resulting in a potentially higher memory density. This could be done for the full ridge length as is illustrated or selectively to some of the memory channel columns.

Another alternative is to utilize an isotropic selective etch of the P regions to form floating gates for the first gate stack or the second gate stack or first for $1^{st}$ gate stack and then for the 26 gate stack. It should be noted that by adding the polysilicon as the floating gate in the indented channel of only 'first for $1^{st}$ gate stack', the floating gate is made local per channel and is not continuous along the ridge. FIG. 8E illustrates an undercut partial etch of the channel regions indentations 811 similar to the ones illustrated in FIG. 3C and FIG. 8C.

Throughout the patterning, etch (wet/dry) processing, such as cleaning and rinse, selective removal process, and so on herein, the resultant (after each step or after a combination of steps) ridge structure may contain sharp corners. If necessary, corner rounding processing to alleviate the corner effects may be added. The exemplary processes for corner smoothing may include, for example, radical oxidation and partial/full oxide removal, and surface atom migration by heat treatment.

FIG. 8F illustrates forming the tunnel oxide layer 802 following by isotropic deposition of the floating gate material such as poly silicon. And then anisotropic etch of the 'excess' polysilicon materials in the valleys leveraging the top nitride hard mask may be performed, thus leaving 'islands' of poly silicon material in the indented locations 804. FIG. 8G illustrates completing the formation of the floating gate structure by deposition of the control oxide 806 and control gate 808 completing the formation of the basic floating gate stack structure. Removing the tunneling oxide for the floating-gate is a bit more challenging due to the ability of the trapped charge to quickly leak back. The solution is to add a step of etch back after the floating gate polysilicon deposition such that the polysilicon is substantially fully captured within the curve of the P channel formed by the selective isotropic etching of the channel regions as was discussed in respect to at least FIG. 8C. And to reduce rate of the 'trapped' charge leaking back to the channel, the floating gate could comprise N+ doped polysilicon.

Another alternative is to etch some portion but not completely the second channel, such as a P-type region, before adding the $2^{nd}$ gate stack. These recesses in the channel regions could be made deep enough so that 2nd gates could be used to manipulate the bit locations horizontally in the 1st O/N/O charge storage layer. In U.S. application Ser. No. 14/874,366, incorporated herein by reference, in reference to at least FIGS. 5-13B, a technique to manipulate the location within a charge-trap layer is presented. The technique uses side gates to manipulate the charge storage location, increasing the bit capacity per facet. This technique could be implemented here with the $2^{nd}$ gates acting as a right side gate and left side gate while the $1^{st}$ gate acts as the top (main) gate. The amount of recess could be adjusted based on multiple engineering considerations and as well as the thickness of the $2^{nd}$ O/N/O or the dielectric gate stack, for optimizing such a 3D NOR structure.

Another alternative is to process the structure and to silicide the S/D (The N+ regions) which could be used to form a Schottky Barrier between the S/D and the channel, and strongly reduce the bit-line (S/D) resistivity. The silicide region may be directly in contact with the channel. Alternatively, the silicidation in the S/D N+ region may be formed to simply reduce series resistance when the silicide region is not substantially close to the channel. If desired, the silicidation region may be substantially close but not directly in contact with the channel where the channel and the silicide region are separated by a segregated n-type doped region. Some of techniques for these tunings are presented herein later.

The starting point could be similar to the one illustrated in FIG. 8E.

FIG. 8H illustrates the structure after depositing a protection oxide 821 to substantially fill the indentations 811 (FIG. 8E) of the channel region. Then anisotropic etching, using the ridges hard mask protections 822, to expose the side walls of the S/D regions 824 may be performed. Thus the channel regions 826 would be protected by the protection oxides 821 while the sidewall of S/D regions 824 are left exposed.

FIG. 8I illustrates the structure after deposition of the silicide material 830 such as Co, Ti, Ni or other metals as desired. The deposition could be done using ALD for precise control or by other techniques such as sputtering and evaporation. The use of ALD for the silicidation metal would fit well with the 3D NOR structure herein and could fit well in other advanced applications of 2D or 3D structures. ALD allows atomic level control of the deposited material for the following silicidation process to support lower device variations. A review of ALD fundamentals is provided by Richard W. Johnson et al in a paper titled "A brief review of atomic layer deposition: from fundamentals to applications" published at Materials Today Volume 17, Number 5, June 2014, incorporated herein by reference.

Figures 8J, 8K, 8L:
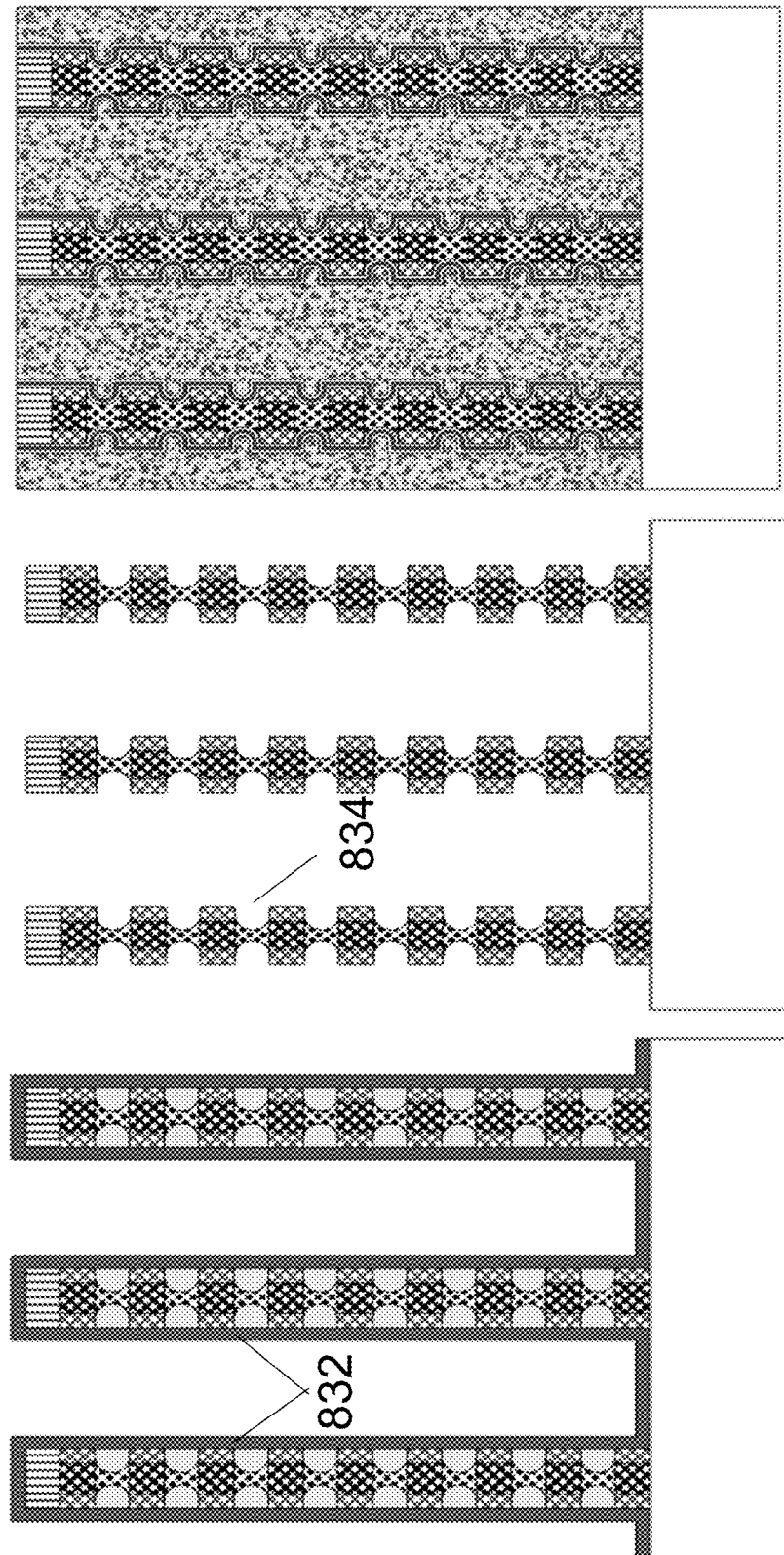

FIG. 8J illustrates the structure after performing the silicidation, of the exposed S/D regions, by annealing the structure using techniques such optical heating using spike, flash or laser processes or alternatively microwave or heating oven. It might be desired to tune the process so the silicidation 832 would not get into the channel regions known as junction spike.

FIG. 8K illustrates the structure after removal of unused silicidation metal and the protection oxide 821 exposing the channel regions 834.

FIG. 8L illustrates the structure after forming, by deposition techniques such as ALD, the full gate stack such as O/N/O and gate material as was presented herein for forming gate stacks.

An important note in respect to the silicidation process of the 3D NOR fabric is that any S/D regions that are designated to become horizontal transistor—JLT, such as the ridge select regions, should be protected from the silicidation process by proper masking and protection.

Some techniques for such silicidation and using silicidation for memory applications, has been presented by Chaochao Fu et al. in a paper titled "Schottky Barrier Height Tuning via the Dopant Segregation Technique through Low-Temperature Microwave Annealing" published at Materials 2016, 9, 315; and by Yu-Hsien Lin et al. in a paper titled "Microwave Annealing for NiSiGe Schottky Junction on SiGe P-Channel" published at Materials 2015, 8, 7519-7523; doi:10.3390/ma8115403; and by Chung-Chun Hsu et al. titled "High-Performance Schottky Contact Quantum-Well Germanium Channel pMOSFET With Low Thermal Budget Process" published at IEEE ELECTRON DEVICE LETTERS, VOL. 37, NO. 1, January 2016, all incorporated herein by reference. Use of a Schottky barrier to enhance charge trap memory device has been reported by Chun-Hsing Shih et al. in a paper titled "Multilevel Schottky Barrier Nanowire SONOS Memory With Ambipolar n- and p-Channel Cells" in IEEE TRANSACTIONS ON ELECTRON DEVICES, VOL. 59, NO. 6, June 2012, and another titled "Effects of Dopant-Segregated Profiles on Schottky Barrier Charge-Trapping Flash Memories" in IEEE TRANSACTIONS ON ELECTRON DEVICES, VOL. 61, NO. 5, May 2014; and another titled "Nonvolatile Schottky Barrier Multibit Cell With Source-Side Injected Programming and Reverse Drain-Side Hole Erasing in IEEE TRANSACTIONS ON ELECTRON DEVICES, VOL. 57, NO. 8, August 2010; and similar works reported by Wei Chang et al. titled "A Localized Two-Bit/Cell Nanowire SONOS Memory Using Schottky Barrier Source-Side Injected Programming" in IEEE TRANSACTIONS ON NANOTECHNOLOGY, VOL. 12, NO. 5, September 2013; another titled "Drain-induced Schottky barrier source-side hot carriers and its application to program local bits of nanowire charge-trapping memories" in Japanese Journal of Applied Physics 53, 094001 (2014), another "Sub-IOY 4-Bit/Cell Schottky Barrier Nanowire Nonvolatile Memory" at 2012 12th IEEE International Conference on Nanotechnology (IEEE-NANO); and by Ching-Yuan Ho et al. titled "Enhancement of programming speed on gate-all-around poly-silicon nanowire nonvolatile memory using self-aligned NiSi Schottky barrier source/drain" in URNAL OF APPLIED PHYSICS 114, 054503 (2013), all of the forgoing are incorporated herein by reference.

In a Schottky Barrier ('SB') transistor the source and the drain ('S/D') of the transistor are defined by the silicidation and not by the N+ doping. The use of a Schottky Barrier S/D results in a sharper electric field profile near the junction compared to the N+S/D. Therefore, the trapped charge profile can be more tightly localized near the junction region which makes more distinctive state differences for mirror-bit applications. Additional advantage is in reading a mirror-bit set up, by allowing a read of both bits with a single cycle, which supports use of mirror-bit density doubling for high speed applications, such has been described in a paper by Zhou Fang et al. titled "A Study on Schottky Barrier NOR Flash Memory" published at Nanoelectronics Conference (INEC), 2011 IEEE 4th International and a paper by Yan-Xiang Luo et al. titled "Coupling of carriers injection and charges distribution in Schottky barrier charge trapping memories using source-side electrons programming" presented at Semicond. Sci. Technol. 29 (2014) 115006, and in U.S. Pat. No. 8,183,617 all of the forgoing are incorporated herein by reference. The desired Schottky Barrier S/D may be achieved with the appropriate device and operational engineering choices.

For the 3D NOR fabric processing and to enable selective etching of the channel region 811 at FIG. 8E, the multilayer structure of FIG. 3A could be made of Silicon over SiGe. Etching techniques that are very selective between SiGe and Silicon are well known. FIG. 3C and SiGe is an attractive channel material for its higher holes mobility. In addition, using SiGe as the channel material may facilitate hot-carrier programming and hot-hole erase due to its lower energy bandgap.

Alternatively the S/D layer could be first form N+ doped layers such that the silicidation process could form Dopant Segregated Schottky Barrier (DSSB). Such has been described by Sung-Jin Choi et al. in papers titled "High Speed Flash Memory and 1T-DRAM on Dopant Segregated Schottky Barrier (DSSB) FinFET SONOS Device for Multi-functional SoC Applications" published at 2008 IEEE International Electron Devices Meeting; "Enhancement of Program Speed in Dopant-Segregated Schottky-Barrier (DSSB) FinFET SONOS for NAND-Type Flash Memory" in IEEE ELECTRON DEVICE LETTERS, VOL. 30, NO. 1, January 2009; "High Injection Efficiency and Low-Voltage Programming in a Dopant-Segregated Schottky Barrier (DSSB) FinFET SONOS for NOR-type Flash Memory" in IEEE ELECTRON DEVICE LETTERS, VOL. 30, NO. 3, March 2009; "Performance Breakthrough in NOR Flash Memory with Dopant-Segregated Schottky-Barrier (DSSB) SONOS Devices" in IEEE 2009 Symposium on VLSI Technology; "Fin Width (Wfin) Dependence of Programming Characteristics on a Dopant-Segregated Schottky-Barrier (DSSB) FinFET SONOS Device for a NOR-Type Flash Memory Device" in IEEE ELECTRON DEVICE LETTERS, VOL. 31, NO. 1, January 2010; "P-Channel Nonvolatile Flash Memory With a Dopant-Segregated Schottky-Barrier Source/Drain" in IEEE TRANSACTIONS ON ELECTRON DEVICES, VOL. 57, NO. 8, August 2010; and "Analysis of Trapped Charges in Dopant-Segregated Schottky Barrier-Embedded FinFET SONOS Devices" in IEEE ELECTRON DEVICE LETTERS, VOL. 30, NO. 10, October 2009, additional work by Yu-Hsuan Chen analyzes the effect of S/D doping as reported in a paper titled "Iterative Programming Analysis of Dopant Segregated Multibit/Cell Schottky Barrier Charge Trapping Memories" published at the 2015 15th Non-Volatile Memory Technology Symposium (NVMTS), all of the forgoing are incorporated herein by reference. More articulately, the overall S/D regions consist of the metal-silicide while the S/D to channel junction is formed with dopant-segregated Schottky barrier junction as explained by the references incorporated herein. An important advantage of a DSSB based structure is the reduction of ambipolarty which interferes with the 3D NOR memory functionality. Both SB and DSSB enable a very significant reduction of write time for the same tunneling oxide thickness and accordingly enable high retention time together with a high speed write time. This could make this memory fabric very attractive to replace DRAM type memory applications in which a fast memory access for read and write is very important. Combining silication according to these techniques with a thinner tunneling oxide could enable fast access with a still long enough retention thus reducing the device active power, operational overhead and complexities. Additional advantage is the added flexibility in engineering the 3D NOR fabric. SiGe could be used to define the channel and the S/D while doping could be used to optimize the transistor performance together with silicidation to engineer the Schottky barrier and segregation to further engineer the transistor and its related memory performance. If desired, the exposed surface of Ge or SiGe channel could be passivated by a capping layer, for example, comprised of Si, followed by gate oxide stack formation. This will reduce the interface states and relative noise and improve the channel mobility. Alternatively, the exposed surface of Ge or SiGe channel can be directly in contact with charge trapping layer. This embodiment increases the interface state, which can be positively utilized to increase charge trap density for DRAM application and trapping efficiency.

An additional alternative could be forming an asymmetrical memory transistor, such as having different doping of the odd S/D layers and the even S/D layers such that the vertical transistor could be engineered for conventionally a doped source and a dopant segregated Schottky barrier or normal Schottky barrier drain. Alternatively, the vertical transistor can be formed with a dopant segregated Schottky barrier or normal Schottky barrier source and a conventionally doped drain. Such asymmetric memory structure could also exhibit less ambipolar transport characteristics. In addition, such asymmetrical memory transistor could be engineered for faster time or lower voltage erase conditions. Such as has been presented in a paper by Yu-Hsuan Chen et al. titled "Drain-Controlled Ambipolar Conduction and Hot-Hole Injection in Schottky Barrier Charge-Trapping Memory Cells" published at 15th International Workshop on Junction Technology (IWJT) and is incorporated herein by reference.

The silicidation process enables an alternative form of ridge select transistor formed in the S/D line. Such an alternative to JLT 1314, 2113, 4020, 4134 as a horizontal S/D line control device could be formed and utilized. For such the Source or the Drain or both could be left uncovered and accordingly forming an DSSB transistor or SB transistor. Another alternative is the asymmetric Schottky-barrier transistor ("ASSBT") such as presented in a paper by Zer-Ming Lin et al. titled "Characteristics of n-Type Asymmetric Schottky-Barrier Transistors with Silicided Schottky-Barrier Source and Heavily n-Type Doped Channel and Drain" published in the Japanese Journal of Applied Physics 51 (2012) 064301; and by Ru Huang et al. titled "High performance tunnel field-effect transistor by gate and source engineering" published in Nanotechnology 25 (2014) 505201; or an alternative structure using two control gates as presented by Sebastian Glassner et al. in a paper titled "Multimode Silicon Nanowire Transistors" published at Nano Lett. 2014, 14, 6699-6703; or by Jian Zhang et al. titled "A Schottky-Barrier Silicon FinFET with 6.0 mV/dec Subthreshold Slope over 5 Decades of Current" published at IEDM14; or a paper titled "Polarity-Controllable Silicon Nanowire Transistors With Dual Threshold Voltages" published at IEEE TRANSACTIONS ON ELECTRON DEVICES, VOL. 61, NO. 11, November 2014; or similar work by M. De Marchi et al. titled "Polarity Control in Double-Gate, Gate-All-Around Vertically Stacked Silicon Nanowire FETs" published at IEDM12; and a follow-on paper titled "Configurable Logic Gates Using Polarity-Controlled Silicon Nanowire Gate-All-Around FETs" published in IEEE ELECTRON DEVICE LETTERS, VOL. 35, NO. 8, August 2014; or a work by T. A. Krauss et al. titled "Favorable Combination of Schottky Barrier and Junctionless Properties in Field Effect Transistors for High Temperature Applications" to be published at PRiME 2016, all of the forgoing are incorporated herein by reference. Such a transistor could be formed horizontally by the silicidation process in which just the channel is protected from silicidation or the channel and the drain are protected from silicidation for the asymmetric ASSBT. The use of multiple gates with SB transistors as presented in these papers provide electronic control of SB transistors controlling its ambipolarity to get an N type or P type unipolar transistors. As previously presented the S/D layers doping could allow engineering of the vertical memory transistors in the range from SB transistors to DSSB transistors. With low doping the gate biasing could help increase transistor channel control thus enabling further engineering of the vertical transistors and the horizontal transistors within the 3D NOR fabric. These open up multiple device tuning options for better support of various targeted applications.

FIG. 9A illustrates a variation to the structure of FIG. 4A. On a substrate 900 the multilayer ridges 904 and valleys 906 are formed as is described with respect to FIG. 3B. Then hard mask stripes 902 may be formed perpendicular to the ridge direction for the subsequent damascene gate stack process.

FIG. 9B illustrates the structure after deposition (using ALD or compatible process) of 1st O/N/O multilayer and 1st metal gate forming 1st Gate Stack 910.

FIG. 9C illustrates the structure after removal of the hard mask used to form the damascene gate stack.

FIG. 9D illustrates the structure after optional channel indentation or recess as described previously herein.

FIG. 9E illustrates the structure after deposition of 2nd gate stack.

FIG. 9F illustrates the structure after CMP of both the 2nd gate stack and the 1st gate stack thus forming independent gates.

Figure 10B:
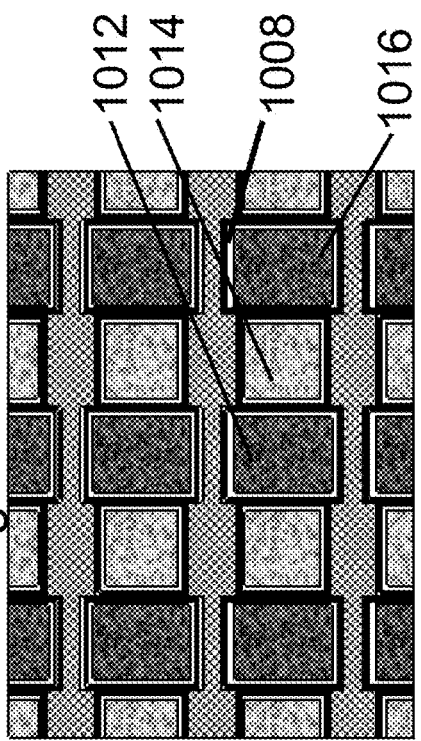
FIGS. 10A-10D are example illustrations of cut views of a NOR type 3D memory of FIG. 9F.
Figure 10A:
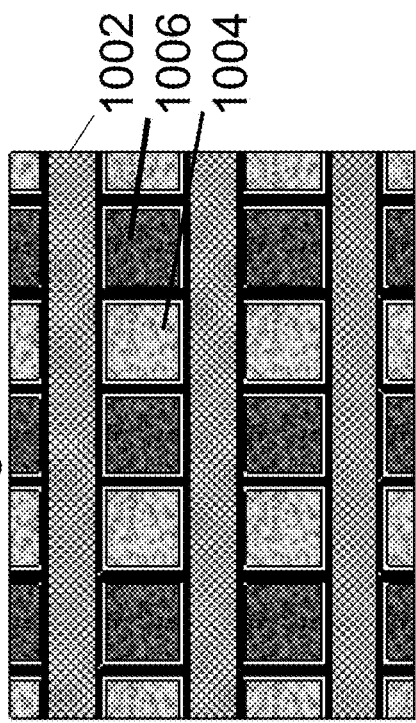

FIG. 10A illustrates a horizontal cut through the channel (P) layer 1002, illustrating a cut of the 1st gate stack 1004 and the second gate stack 1006.

FIG. 10B illustrates a horizontal cut along the channel (P) layer, illustrating the recess into the channel 1008.

Figure 10D:
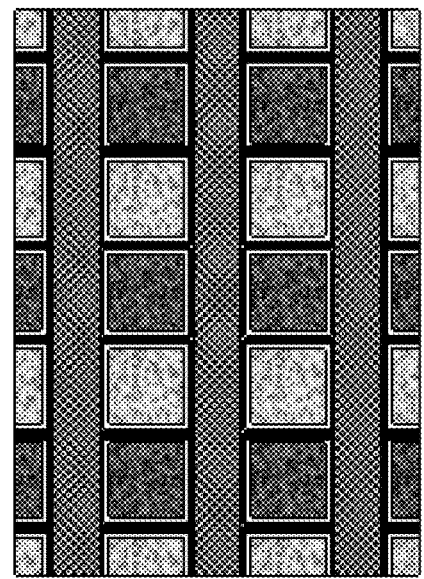
Figure 10C:
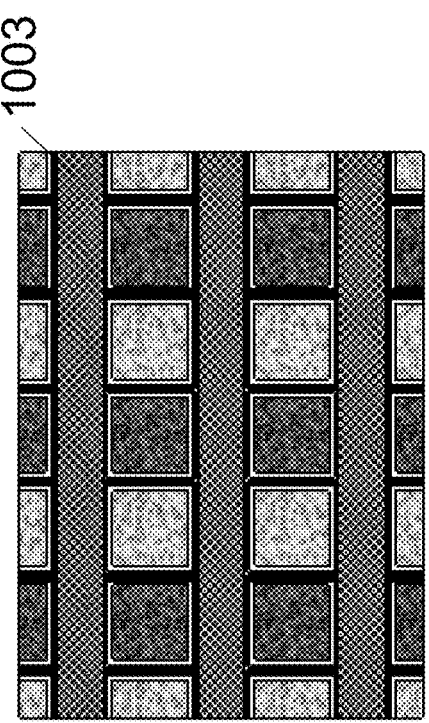

FIG. 10C illustrates a horizontal cut along N+S/D layer 1003.

FIG. 10D illustrates a horizontal cut along N+ layer showing no recess of the S/D lines.

The 3D NOR engineering to a specific application could include any of the techniques presented herein and their combinations. One of such combinations could be the use of the non-indented memory column 1014 with a thinner tunneling oxide. Thinner tunneling is used for shorter retention, faster access, with higher rate of refresh. Using the side word lines 1012 and 1016 could allow doubling the number of storage locations by proper biasing of the side gates which are also indented to give them better control of the electric field of the memory cell(s) being accessed in the non-indented memory column 1014 and accordingly controlling the storage location laterally with respect to the channel area. Having that memory designated for shorter storage time makes it less impacted by (the stored) charge movement over time as it is often refreshed. The natural spread of a charge within the charge trap layer is highly related to time and temperature. Memory cells that are functioning as a DRAM could make use of multiple charge storage locations per facet thereby increasing the effective memory storage and density. Two or more locations could therefore be controlled by the side gates 1012, 1016. Such a density increase could be used with decreasing the memory access time.

Other storage density enhancements such as mirror bits and multilevel programmation/reads could be also be used, but these techniques do impact the access time or may require special sense amplifier techniques. The level of channel indentation could be engineered for the specific memory application, it could be made about 5%, about 10%, about 20% or even about 30% of the channel width. It could be made symmetrical on both the odd side the even side, simplifying the related processing, or asymmetrical.

Figure 10E:
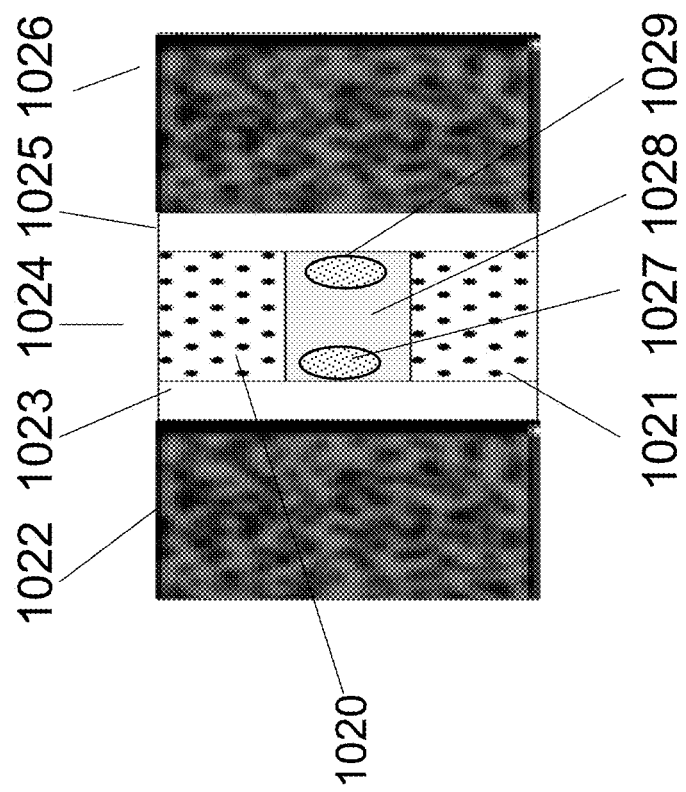
FIG. 10E is an example illustration of bit locations achievable with programming techniques.

FIG. 10E illustrates bit locations which may be achievable when utilizing the indented gates second gates 1012 and/or 1016. A programming voltage (+4 v) could be applied to the non-indented gate, thru non-indented memory column 1014 for example. FIG. 10E is a vertical cut along the ridge side along the O/N/O of the non-indented memory column 1014, showing just one memory cell 1024. The illustration includes the left side indented gate 1022, in-between isolation/ONO 1023, the right side in-between isolation/ONO 1025, and the right side indented gate 1026; as well as the upper S/D 1020, the channel 1028, and the lower S/D 1021. A pulling voltage that is not enough to program, for example, (+2 v), could be applied to the left side indented gate 1022 to pull the electrons to the left side 1027. Or a pushing field could be applied via a negative voltage, for example, (−2 v) to the right indented gate 1026. Those could also be applied together or in various time and intensity. For reading, the side indented gates could be used in similar way while the control gate would provide a read voltage, for example (+1 v). An inverse pull/push field could be applied by the indented gates to get the electrons written into the right side 1029. This technique could be extended to more locations based on the acceptable Vt shift and the O/N/O structure bit storage quality.

The right/left bit manipulation could work together with the mirror-bit and or multi-level to provide a higher storage density. Engineering of a memory product could include the trade-offs between the many parameters such as storage density, access time, sense amplifier complexity, retention time, and so forth.

An additional engineering alternative of the 3D NOR memory is to leverage the indent concept to reduce cell to cell interference. The charge trapped corresponding to the non-indent channels 1012, 1016 could provide a longer distance and thus less interference on the neighboring channels—the indented channels 1014, while the charge trapped corresponding to the indent channels 1014 could have a shorter distance and more interference on the neighbor channels—the non-indented channels 1012, 1016. The memory structure could be engineered to take advantage of this asymmetry by trapping more charge at the non-intended cells and less charge at the intended cells. This could correspond also in use of a thinner charge trapping layer for the indented cells than for the non-indented cells or other type of tuning the O/N/O trapping capacity to trap smaller charge in the indent cells. For example the trapping capacity of the indent cell could be engineered to be about 30%, about 50% or even about 70% lower than that of the non-indent cells 1014. Another alternative is to have the indent gate narrower and the non indent cell wider in respect to X direction (along the ridge). The wider cell would have both more charge being trapped and a higher average distance to the interference. An added advantage for such could be an increased storage room for more storage sites as was discussed in reference to FIG. 10E. The non-indent channel could be made about 10%, about 20%, about 40%, about 70% or even more than 100% wider (in x direction) than the indented channels. Engineering the memory device accordingly could provide a higher overall memory density and support different memory functionalities within the same device.

FIGS. 11A to 11C illustrate methods to isolate a bottom most S/D of a ridge from a neighboring ridge. The shallow trench isolation may be incorporated to isolate any adjacent bottom most S/Ds. Alternatively, as the presented 3D memory block may not use an oxide isolation scheme or so-called shallow-trench-isolation (STI), alternative methods could be used for field isolation.

FIG. 11A illustrates one alternative in which the 3D NOR fabric is constructed over an SOI substrate which includes buried oxide 1101.

FIG. 11B illustrates one alternative in which the 3D NOR fabric is constructed over a bulk substrate. To reduce through-substrate leakage between adjacent ridges the upper part of the substrate 1102 may be doped to a high P concentration and in operation this layer may be back-biased with a negative voltage, such as about −1 v.

FIG. 11C illustrates another alternative for having the 3D NOR over bulk substrate. In this alternative the through-substrate leakage may be blocked by having the bottom most S/D line 1104 connected such to be used as a common source line.

Figure 12B:
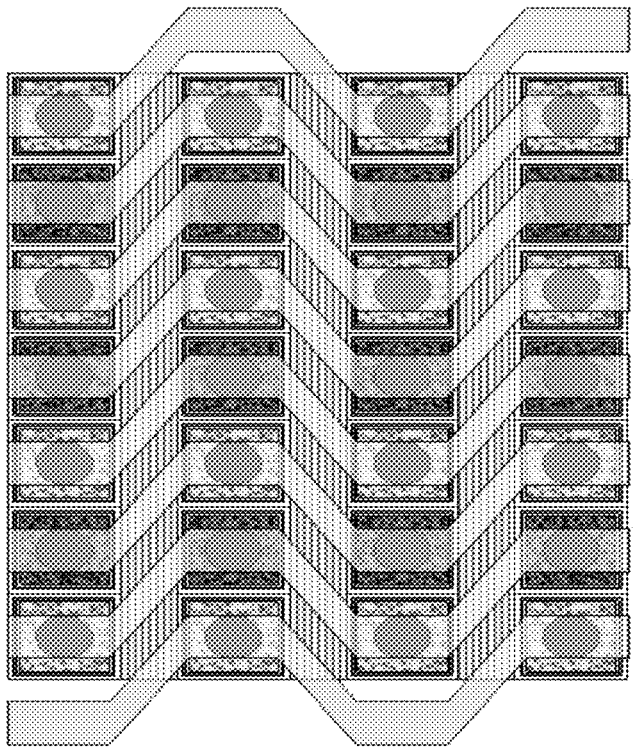
FIGS. 12A-12B is an additional example illustration of the word-lines of a NOR type 3D memory.
Figure 12A:
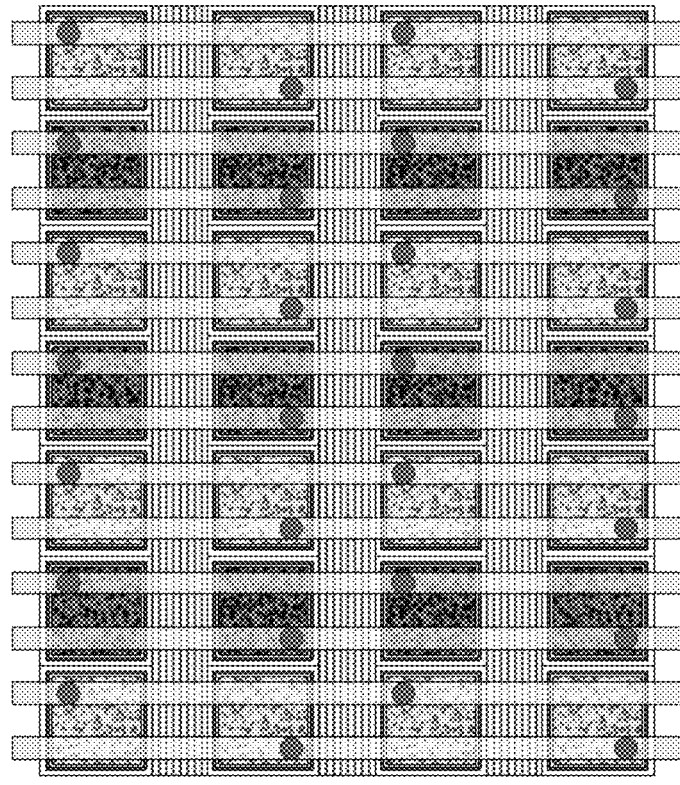

FIG. 12A illustrates a top-viewed 3D NOR structure. It illustrates an optional word-line connectivity in which two word lines are servicing one channel, to enable independent control of one channel from the gate on its right facet and from the gate on its left facet. This interconnect arrangement can be implemented by using a more advanced lithography step than that used for forming the 3D memory cells.

FIG. 12B illustrates an alternative 3D NOR structure in which two word lines are servicing one channel to enable independent control of the gate on its right facet from the gate on its left facet, yet without doubling the number of word lines but rather a substantially zig-zag shape of the word-lines, for example, as illustrated.

As explained previously, FIG. 4C illustrates a select line per ridge as part of forming the controlled access to the memory fabric. The following is a description of a process flow for forming per ridge select control.

Figure 13A:
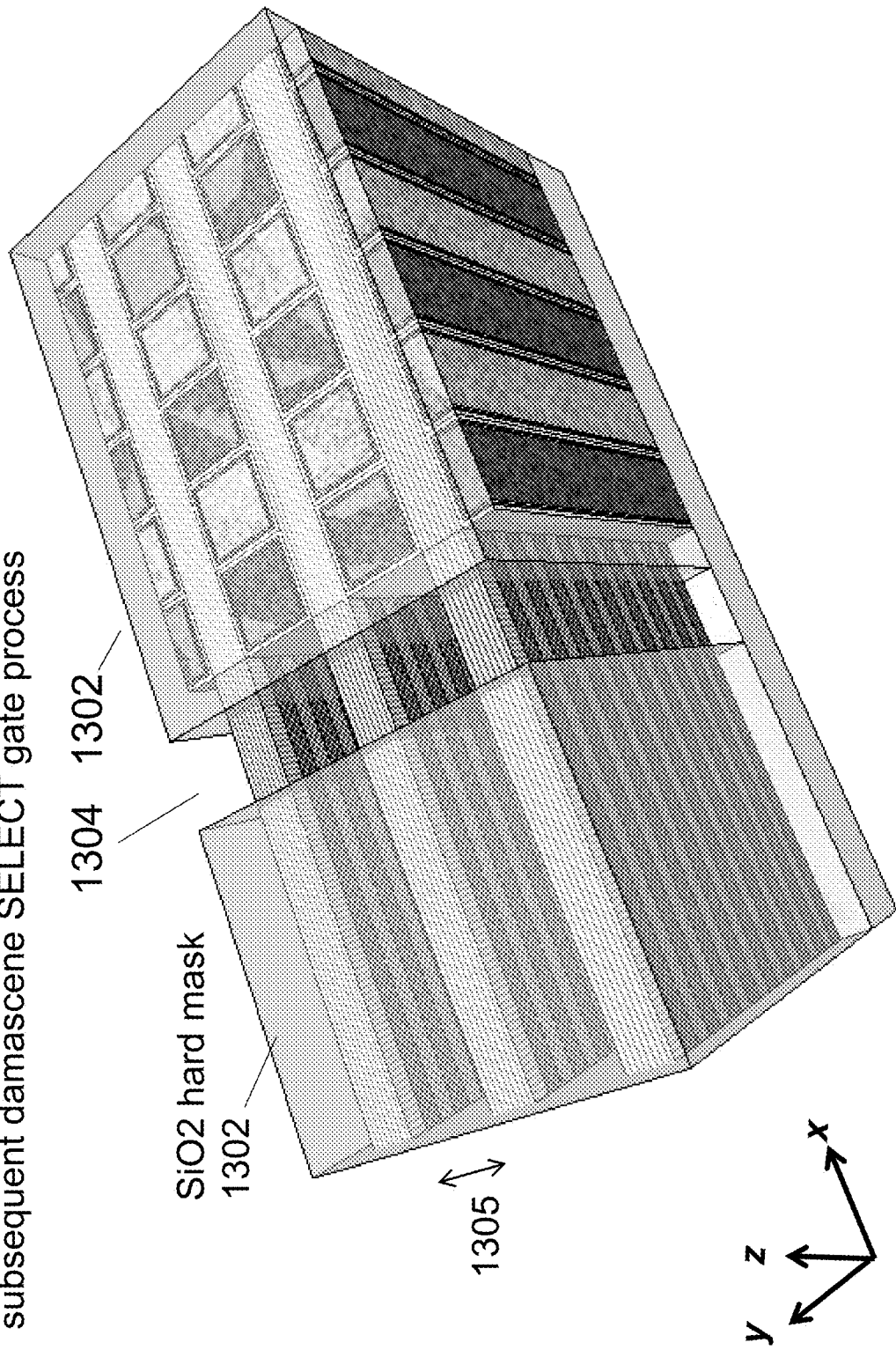

FIG. 13A illustrates the structure after forming hard mask 1302 to protect the structure other than in the region 1304 designated for forming per-ridge select control device.

FIG. 13B illustrates the structure after removal of the P regions in between the S/D lines in the designated ridge select region 1314 using a selective isotropic etch with any of the selective etching techniques described herein or compatible techniques. Then followed by trimming down the S/D lines reducing its diameter to less than about 50 nm, or less than about 20 nm, or less than abut 10 nm, to become effectively junctionless transistors (JLT).

FIG. 13C illustrates the structure after depositing the ridge select gate stack 1316 that may include gate dielectric and gate material. JLT for the horizontal transistor for ridge select as presented herein is one option. Other options for horizontal transistor for S/D control could utilize the Schottky Barrier transistor and the other variations previously discussed herein in respect to the silicidation process.

FIG. 13D illustrates the structure after patterning and etching, forming the per ridge gate control.

It is desirable to keep the ridge select 1322 of a ridge isolated from the ridge select of the adjacent ridge 1324. The objective could be leveraging the thinning of the S/D lines used in forming the JLT 1314 and the thinner gate oxide of the ridge select gate in which no charge trapping nor tunneling oxide is used. Accordingly, such ridge select isolation could have a very low impact valley width 1305.

FIG. 13E illustrates an alternative per ridge select from both sides of the ridges.

As explained previously, in FIG. 3H and other following illustrations, a per layer stair-case is illustrated as a continuation of the ridge along its direction.

The following illustrates an alternative stair-case oriented orthogonally to the ridge direction. For this type of staircase the ridge formation could be designed to leave in a connective vertical ridge 1404. The vertical ridge 1404 could be used to form connection bars in the Y direction to form a per layer connective bar for the S/D lines of the ridge within the unit 1402. This bar could be silicided to reduce the resistivity during the S/D silicidation process. This bars could be made wider such 50-100, 100-200, 200-400 nm or even wider to support a per layer low resistivity connection.

Figure 14A:
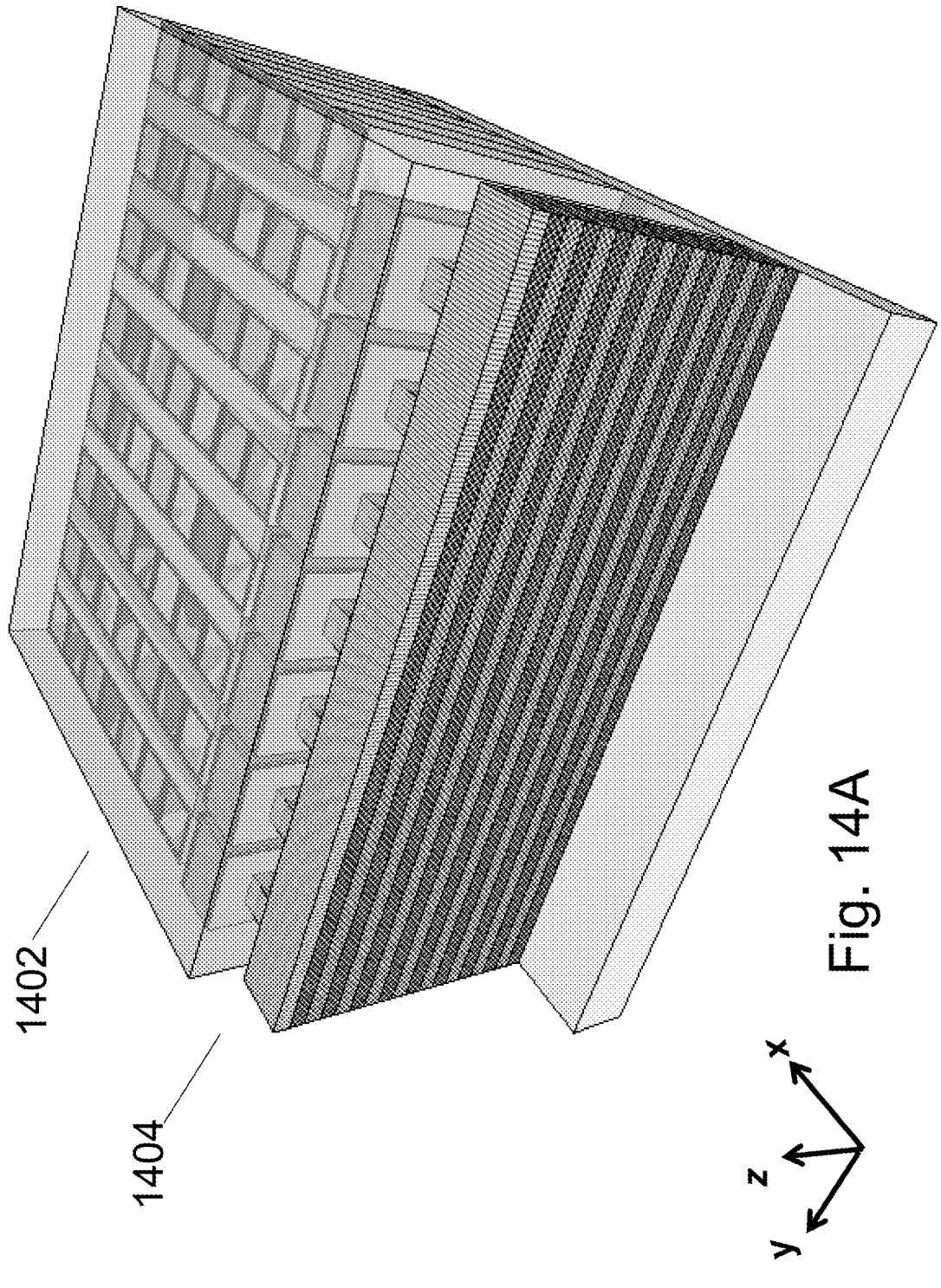

FIG. 14A illustrates the structure after forming hard mask 1402 to protect the structure other than in the region 1404 designated for forming per-layer access—the staircase.

FIG. 14B illustrates the structure after removal of the P regions in-between the S/D lines using selective isotropic etching with any of the selective etch techniques described herein or compatible techniques. This step could be planned to be done together with removal of P regions in various other regions such as in the per-ridge select region. An oxide could be deposited over and between the S/D lines to stabilize the remaining S/D (N+) lines.

FIG. 14C illustrates the structure after forming per-layer contact holes using the staircase methodology.

FIG. 14D illustrates the structure after depositing sidewall isolation oxide and add-in metal plugs.

FIG. 14E illustrates a side view of the formed staircase.

Figure 15A:
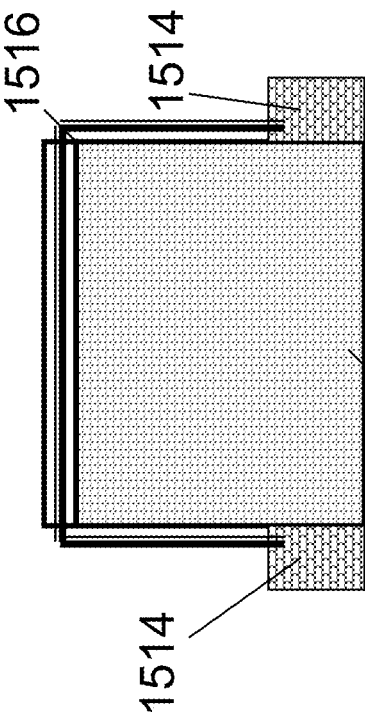
FIGS. 15A-15D are example illustrations of 3D memory arrangements.

FIG. 15A illustrates a side view cross-section of a prior art 2D memory circuit The memory cells 2D matrix 1502 is surrounded by memory control circuits 1504 such as decoders, sense amplifiers and interfaces with external devices. Circuits 1504 are called accordingly memory peripherals. The memory control lines 1506 are running across the memory array columns and rows substantially all the way to the peripheral circuits.

Figure 15B:
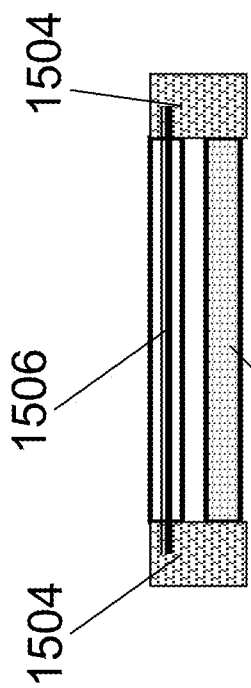

FIG. 15B illustrates a side view cross-section of prior art 3D memory device. Recently 3D memory also known as 3D-NAND has been released to the market. In such 3D NAND the memory cell 3D matrix 1512 is still surrounded by the memory control circuits 1514 such as decoders, sense amplifiers and interfaces with external devices. These memory peripherals are being processed on the silicon wafer substrate in a very similar way to the 2D memory circuits. In these 3D memories the control lines 1516 are running through the memory array columns and rows all the way across the memory matrix, some of these control lines being built on top of the 3D matrix and some of those going through the bulk of the memory matrix but at the edges they are all brought down to the 2D peripheral circuits at the silicon substrate level.

Figure 15C:
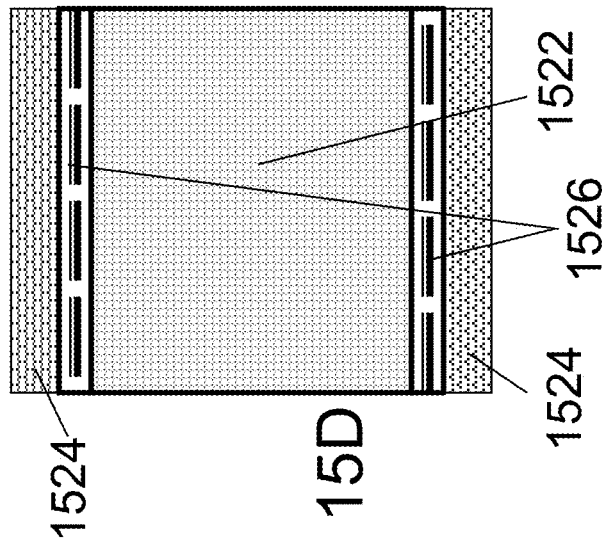

FIG. 15C illustrates a side view cross-section of a 3D memory formed in accordance with the present invention using the techniques presented herein. The 3D memory matrix 1522 comprises columns and rows having the control circuits 1524 which could still be called peripheral circuits but they are formed on top of the memory matrix. According to this embodiment, control lines 1526 are built underneath the peripheral circuits, in-between the peripheral circuits 1524 and the memory matrix 1522.

Figure 15D:
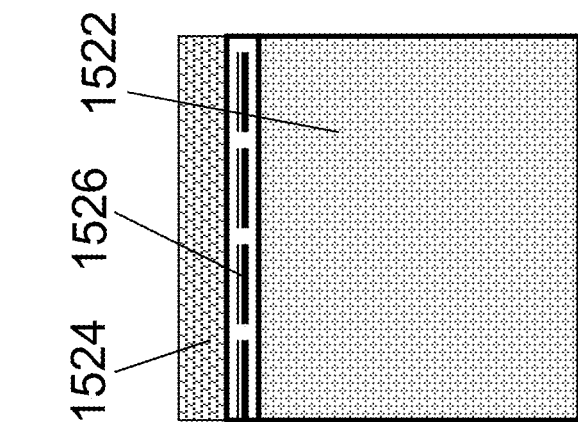

FIG. 15D illustrates a side-view cross section of an alternative 3D memories formed using the techniques presented herein in which the control lines and the control circuits are also disposed underneath the memory cell matrix.

The new type of 3D memory described herewith could be constructed to achieve a significant advantage over prior art by utilizing the 3D architecture illustrated in FIGS. 15C and 15D, by breaking the control lines 1526 into smaller segments within blocks with the control circuits being repeated for each block. Shorter control lines allow reduction of memory access read, write and refresh time and could generate a faster memory. On the other hand, a stair-case for layer access might impact device cost if it is repeated too often, so optimized architecture and overall memory control strategy might use long per-layer control lines (not shown) to save staircase overhead area. Accordingly, optimum memory architecture might use long control lines to the memory cells within the same layer, keeping other (vertical) control lines relatively short, thus achieving the benefits of low power and fast access at a reduced cost.

The 3D memory described herewith could be further enhanced to include dual functionality—high speed volatile memory and low power low speed non volatile memory.

There are many uses for such an enhanced memory including splitting the memory bank to volatile and non-volatile portions, power down with transferring the volatile information into the non-volatile portion, and reduce sleep power by moving the volatile information into the non volatile portion. For some of these use modes the 3D structures presented herein with control circuits on top and/or on the bottom—for example, FIG. 15B and FIG. 15C—could be constructed to enhance effectiveness. For these modes the time and the power required to move the data from the volatile portion into the nonvolatile portion could be reduced by an order of magnitude.

Figure 16A:
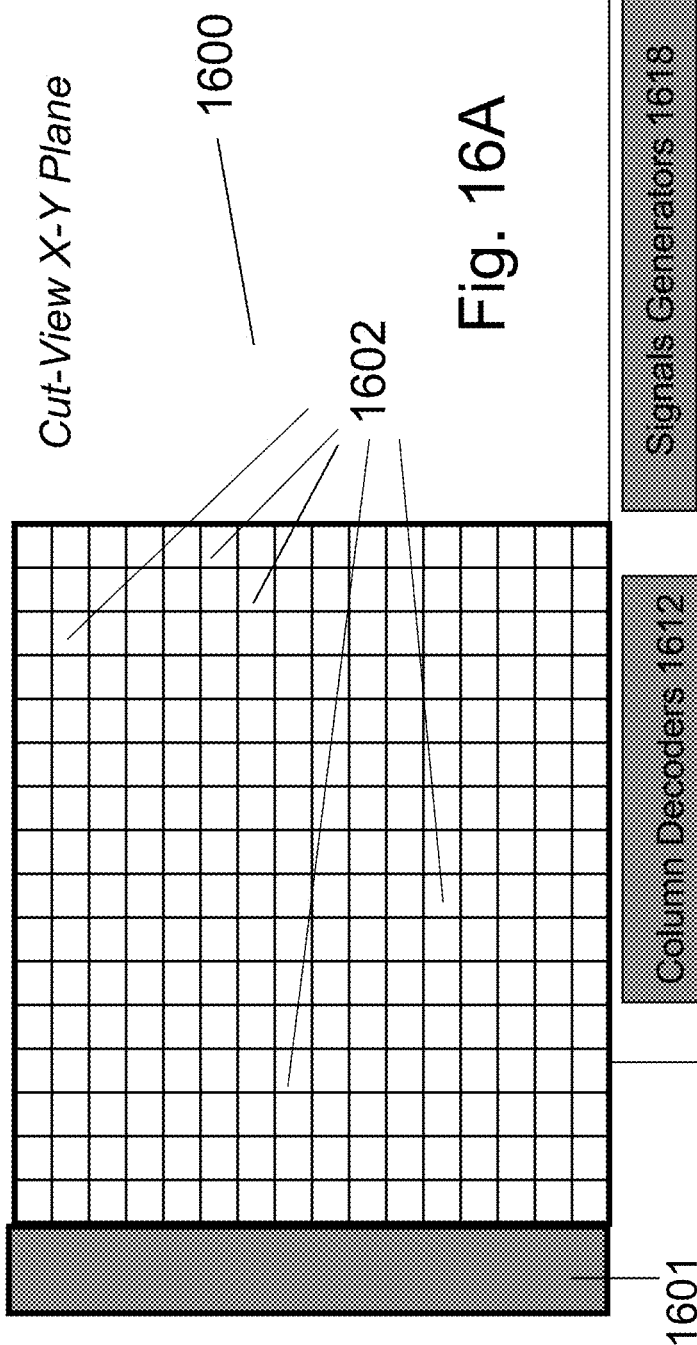
FIGS. 16A-16B are example illustrations of the formation and structure of 3D Memory with dual functionality.

FIG. 16A illustrates top view example of a 3D memory 1600 for such enhanced operation. The side memory control circuits 1601 control the interface to external devices both for instruction and for data in and out. These circuits 1601 could include the per-layer decoders and controls to support all internal memory blocks so the staircase area overhead could be minimized. The 3D memory is then partitioned to many blocks 1602 each is a sub-memory structure with its own top peripheral circuits to control most of its control lines. In such design the operation of moving data from one portion to the other (for example, one block 1602 to another block 1602) could be done in parallel for many units reducing the time and power by orders of magnitude. The side memory control circuits 1601 could synchronize these operations so it could be done one layer at a time.

Figure 16B:
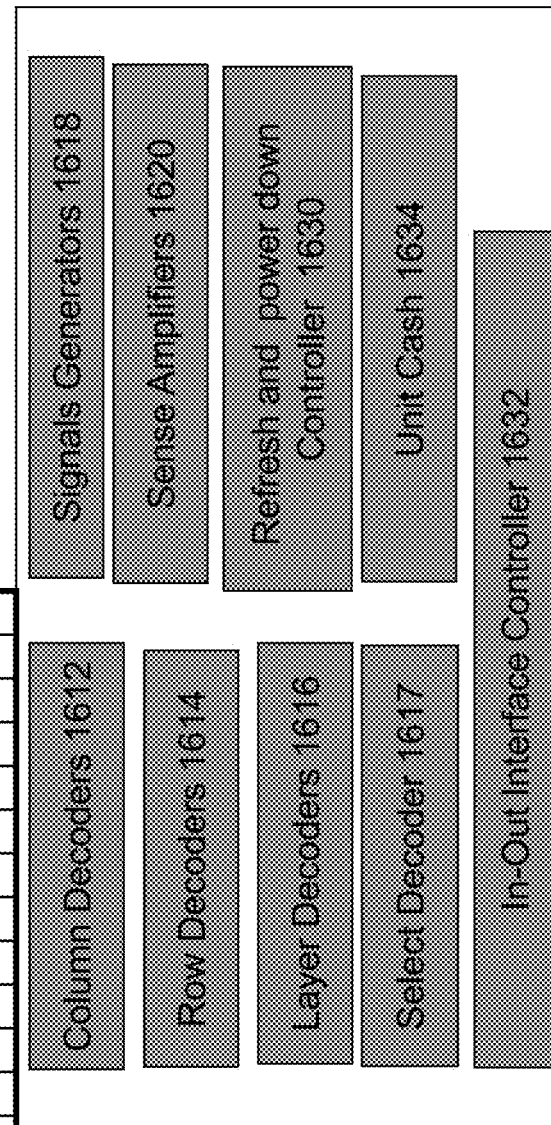

FIG. 16B illustrates a block diagram of the peripheral circuits of a typical block 1602. Each unit 1604 of peripheral control circuits of a block 1602 may include:

Central controller 1630 commanding and controlling operations of sleep mode, recovery mode, etc.

In-Out interface controller 1632 to interface with external data and with the device controller 1601.

Sense Amplifiers 1620 to sense the data of memory cells in the designated block 1602 and convert the resultant digital bit to the block memory cash 1634.

Signal generators 1618 to generate the required voltages and currents for read/write of the memory cells. Some of these circuitries, such as charge pumps, could be shared by many units and be placed inside memory control circuits 1601.

Blocks 1612, 1614, 1616 and 1617 comprise the various control lines such as bit-lines, word-lines, gate-lines, select lines etc. The layer decoders 1616 might be moved from the unit 1604 into the general per-layer circuits at side memory control circuits 1601.

An additional advantage for such memory architecture is the potential ability to move in and out very large blocks of data, as many blocks 1602 could be accessed in parallel. If only a single per-layer staircase is used for maximum array efficiency than the parallel action would be limited to single layer at a time. For many applications this could be managed by proper system data structure and control.

Such 3D Memory could include redundancy circuitry to allow repair of control functions as well as replacement of faulty memory bits or memories in a faulty ridge, or memory in a faulty word line. The architecture of FIG. 15D could be used to allow access to substantially all of the memory control lines from both sides—top and bottom and to have duplication of the device control circuit 1524 at the bottom. Such redundancy scheme could be broken down to the memory block control unit 1602 level. So if one unit of block control circuitry is faulty then it is replaced by its compatible one on the other end/side. Alternatively each unit of block control circuitry could be built with two stratums, one being a back-up for the other as was detailed herein before. The memory control redundancy could be applied to any of the 3D memories herein.

FIG. 17 illustrates an exemplary architecture of a 3D-NOR array. It could be a standalone device structure or embedded within a larger SoC. It illustrates a modular memory structure of 64 memory blocks, for example, first memory block 1701 and second memory block 1702 with the peripheral circuits built in a corresponding modular structure with 8 top units Pt_i to control the word-lines and additional 8 bottom units Pb_i to control the word-lines, and 8 left side units Pl_i to control the bit-lines and 8 right side units Pr_i to control the bit-lines. These could be used to drive the control lines from both sides to improve performance and reduce variability. By accessing from both sides the S/D line resistivity could be neutralized as the overall resistivity of the Source line access plus the Drain line access would be the same and would not highly dependent on the specific memory cell location along the ridge. Accordingly the read and write to a specific cell within a ridge would be substantially similar for all cells of that ridge. In addition it could also be used as redundancy so that single control unit failures could be recovered.

This architecture could also support additional modes of operation. The structure could be designed to allow independent access to 8 blocks provided none of them share the Peripherals circuits. It could be designed to support synchronized access of up to 8 units sharing the same row or sharing the same column and or the same layer, reducing access power and still provides multiple bits.

It could be designed to support on-chip transfer of data from the slow non-volatile portion to the high-speed thin tunneling oxide, also referred as thin O/N/O, portion or the other way around. Such data transfer could be done to, for example, 8 blocks in parallel, thus reducing time and power requirements. Such capabilities could allow high speed access with a low power operating mode. So data is transferred to thin tunneling oxide designated block for fast access but could stored back into the NOR NV section for sleep or power down.

The corners Clt, Crt, Clb, Crb could be used for device top level control for the operating mode, to generate the special voltage source required for read and write, and for interface to external devices.

The allocation of different types of memory within the 3D Memory fabric could be done along layers—vertically or along units—horizontally. Having a 3D Memory fabric with more than one type of memory or even other functions such as logic could enable a very effective 3D heterogeneous device. The on-chip parallel interchange between the various elements using thousand or even millions of lines could not be matched by other form of integration. And added advantage is the use of many common processing steps reducing the manufacturing cost of the overall system in addition to improvements in speed and power.

In general memory design it is common to use partitioning which utilizes powers of 2 numbers such as: 2, 4, 8, 16, 32, 64 . . . Such works well with decoding and addressing. Yet, in some cases the number of bits sited within a facet is 6, which will be challenging for the decoding function—as was described herein and in reference to U.S. Pat. No. 6,670,669. An optional solution is to find a memory allocation which would be close enough to bridge this challenge with minimal overhead. A simple look up table could be used for the circuit to support such a memory allocation.

For example 3 layers could be used to form the 18 memory sites of which 16 would be used. Or 11 layers to form 66 sites of which 64 could be used reducing further the unused memory sites, which could also be used as redundancy for repair of defective sites with proper look up table in the control circuits. This could also be used for other functions, for example, such as error correction codes, radiation mitigation schemes, and so on.

A bit different for many memory structure is this 3D NOR structure in which the S/D line—the bit line is a dual function line. It is the Source line for layer 'n+1' while it is the Drain line for layer 'n', and the source and the drain could be swapped. An optional architecture of peripheral circuits for driving the bit-lines—the S/D lines is presented in the following example.

For simplicity the following peripheral circuits support the bit-lines BL1, BL2, BL3 of the structure illustrated in FIG. 4C. This architecture could be modified to support the alternative structure illustrated in FIG. 8A, for example. The decoding for the select-lines-SL, SL2, SL3, . . . could be done with a wide fan-in NAND receiving the address lines $Ridge_{0-4}$ and their complementary signal lines to decode the active Ridge and enable the bit-lines signals of the selected Ridge activate that Ridge's S/D lines.

Figures 18, 19A:
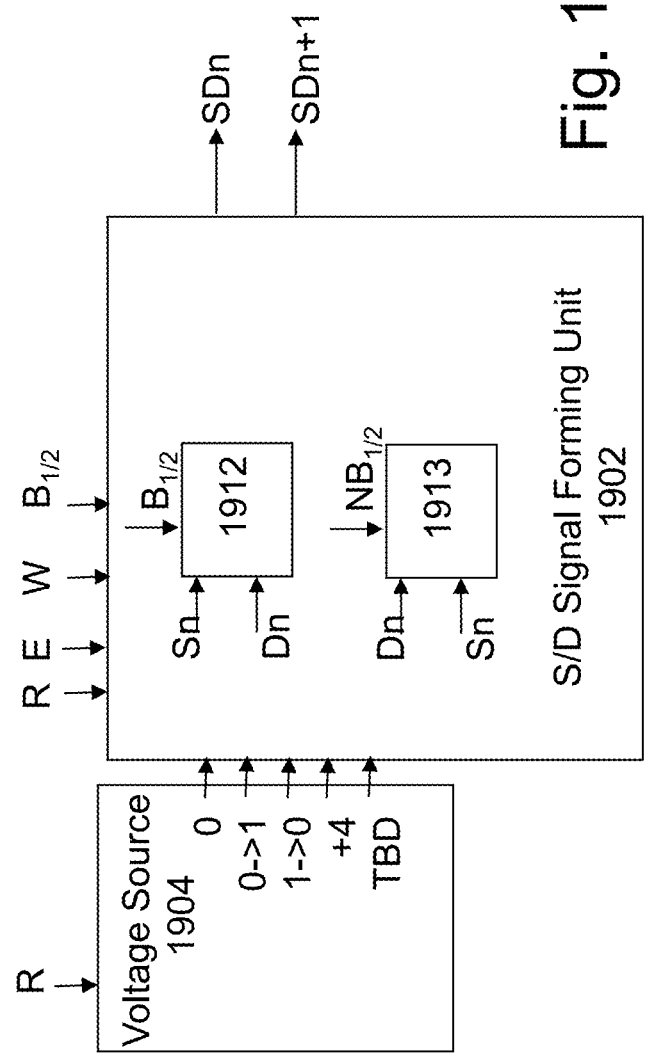
FIG. 18 is an example illustration of operating conditions for the cell with 2 bit per facet—mirror-bit.
FIGS. 19A-19B are additional example illustrations of block diagrams of circuit control circuits.

The FIG. 18 table illustrates an example of the operating conditions for that storage facet. The read is performed by measuring the current (Vth) between the S/Dtop (layer n+1) to S/Dbottom (layer n) when pulsing S/Dtop from low to high for reading Bit1, and swapping it for reading Bit2. These operating conditions are well known as this is the common NOR with MirrorBit. Other unselected S/D lines could be floating while all other unselected word-lines could be grounded.

FIG. 19A illustrates the first part of the bit-lines S/D lines related peripherals circuits. Voltage Source Circuits 1904 circuits may be the voltage generation circuits, those are centralized circuits including charge pumps and other power supply type circuits generating the various voltages require for the 3D-NOR memory operations as indicated in the table of FIG. 18. For reading bits, a pulse to the S/D lines could be used and accordingly the R signal indicating a read function is an input for Voltage Source Circuits 1904. Signal Forming Unit 1902 circuits may be signal forming and selectors which generate the two acting bit-line signals outputs: SDn for the S/Dbottom of FIG. 18, and SDn+1 for S/Dtop of FIG. 18. These signals would be connected to the selected S/D lines of the selected Ridge and accordingly the selected channel. The formation of these signals would be according to the memory operation with write indicted by W signal, R indicated by R signal or Erase indicated by E signal. The choice of the bit location—$B_{1/2}$ would affect the role of Source and Drain according to the bits location on the respective facet as indicated in FIG. 18.

FIG. 19A also illustrates the swapping between the S/D lines for the role of Source or Drain. While physically these lines are fixed the swapping is done electronically by enabling either buffers 1912 or the second buffers 1913.

Figure 19B:
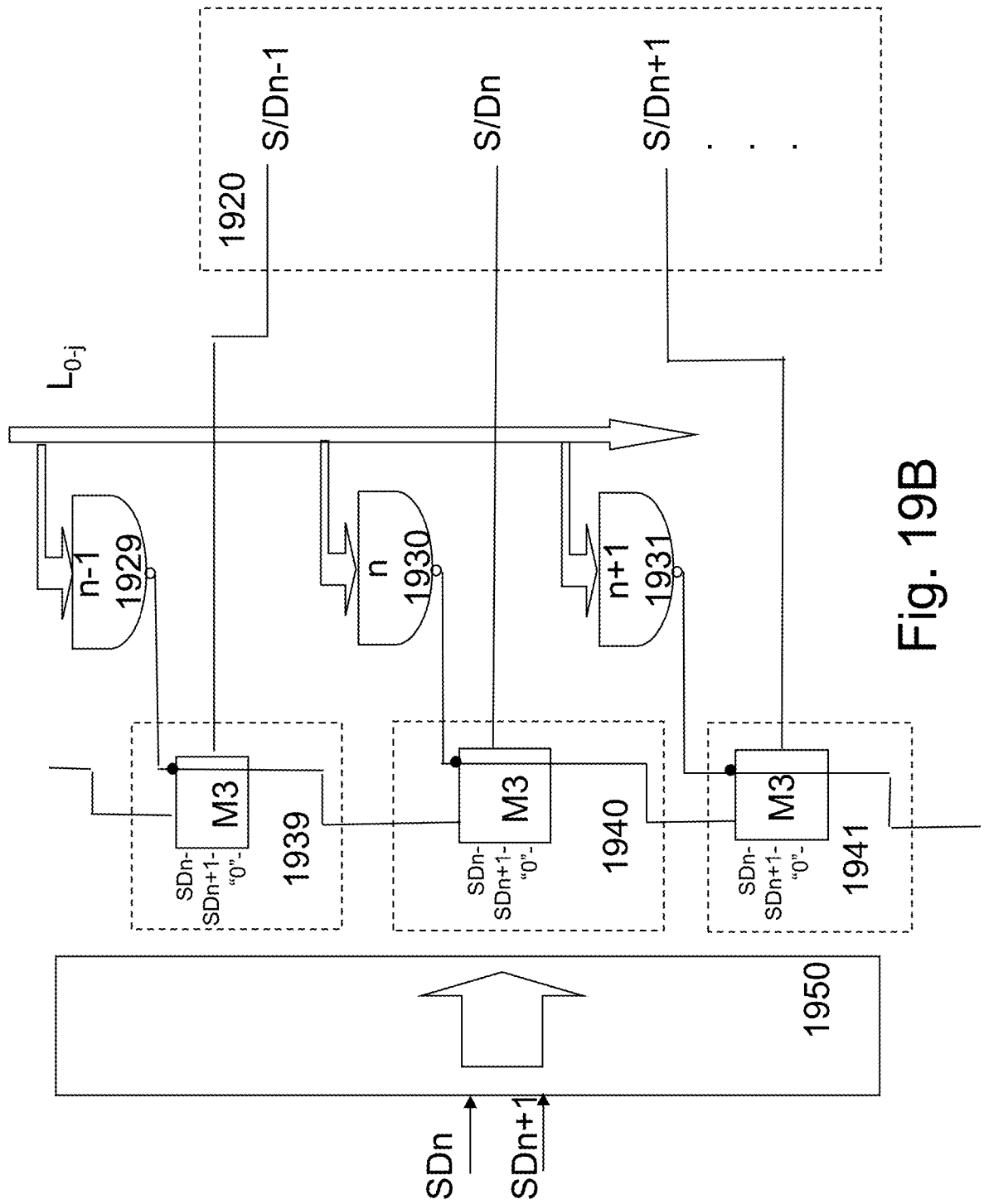

FIG. 19B illustrates the circuits which may be used to drive these centralized signals SDn and SDn+1 to selected bit-lines while all other bit-lines are disabled—such as left floating. The two centralized signals (SDn, SDn+1) are forming bus-like signals for the bit-lines available to be selected for the selected level. Unit 1950 could include the buffers and drive electronics. These are designed according to system considerations such as access time, power and so forth. The layer Address lines $L_{0-j}$ and their complementary signals could be delivered as another bus-like signals. For each layer a large fan-in NAND gate could be used with decoding such as connection to the layer address so NAND 1930 is activated to "0" only once the layer address is addressing layer 'n' (respectively NAND 1929 is activated to "0" only once the layer address is addressing layer 'n−1', and NAND 1931 is activated for n+1). For each layer there is also a dedicated selector block—for 'n−1' selector block 1939, for 'n' selector block 1940, and for 'n+1' selector block 1941. Each selector block could have one-of-three selector M3. These selectors could use a full transmission gate or other switching type circuits.

For the case when column 'n' is addressed NAND 1930 may be activated and accordingly the selector M3 of 1940 would select SDn signal to drive bit-line to S/Dn at 1920 such as BL1, and selector M3 of 1941 would select SDn+1 signal to drive bit line related to S/Dn+1 such as BL2. All non-activated selectors (M3) will output "0", or may be left floating in some configurations, which will prevent their respective channel from being affected or affect the memory operations. Accordingly the proper signal is provided to perform the desired operation to the addressed bit within the addressed facet on the addressed channel.

In some configurations the M3 selector could be constructed to select between two active signals or leave the output floating which will render that line in-active.

Sense amplifiers for memory application are well known in the art. Tuning of the sense amplifier to the VT shift resulted from charge trapping could help the memory to be less sensitive to the ambipolarity associated with some of the options for the vertical memory transistor. The ambipolar current referred herein is the drain current flowing when the gate voltage is biased substantially low or even negative. When the memory is in programmed state, the drain current would be substantially small. However, for the memory device with ambipolarity, the Ambipolar current may flow even for the programmed cell. In order to sense the memory device with Ambipolarity, the slope of drain current over the gate voltage may be used, which can be enabled by a two-step read; read at low gate voltage and at elevated gate voltage followed by comparison of the two. When the memory is in the erased state, the drain current is increased with increasing gate voltage. When the memory is in the programmed state, the Ambipolar current is getting smaller with increases in gate voltage. Designing the sense amplifier accordingly could accommodate the 3D memory with ambipolar transistors. These types of slope tuned sense amplifiers are well known for STT-RAM as presented in a paper by Yiran Chen et al., titled "A Nondestructive Self-Reference Scheme for Spin-Transfer Torque Random Access Memory (STT-RAM)" published at Design, Automation & Test in Europe Conference & Exhibition (DATE), 2010, incorporated herein by reference.

Another alternative is to use thinner tunneling oxide with high speed programming performance. This would require refreshing periodically which could be acceptable for many applications. Another alternative is to have one side of the ridge with regular O/N/O for channel programming and the other side with just oxide for fast gate control resembling the structure of FIG. 5D. In a case in which the two adjacent ridges are utilized in forming a complementing LUT, the valley in between could be used for the 'shared' LUT gate with just oxide (for the transistors) while the other side could have full O/N/O for programming. The ridge could be made thin enough, such as 20 nm, to provide the one side programming enough control to fully program its channel.

Figure 20C:
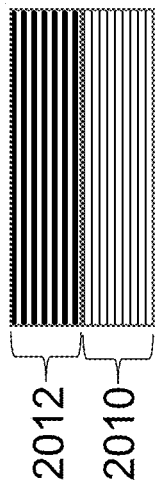
FIGS. 20A-20E are example illustrations of various stacks of 3D stacks.
Figure 20D:
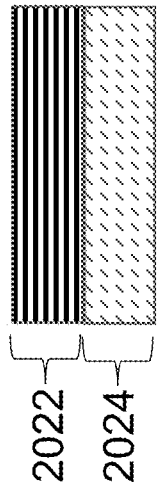
Figure 20E:
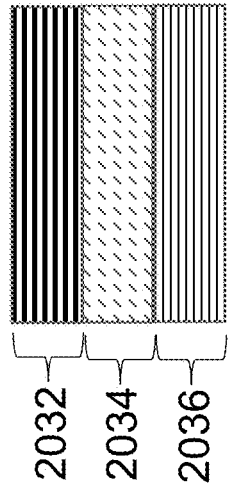
Figure 20A:
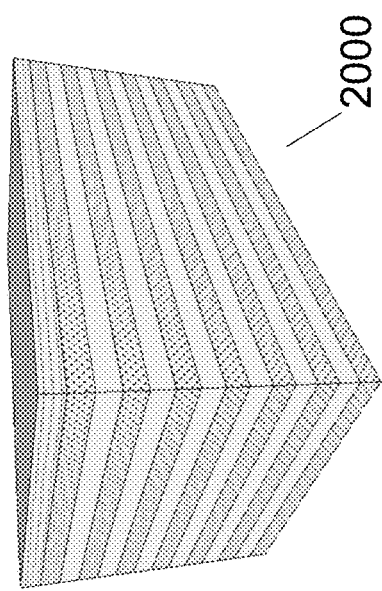
Figure 20B:
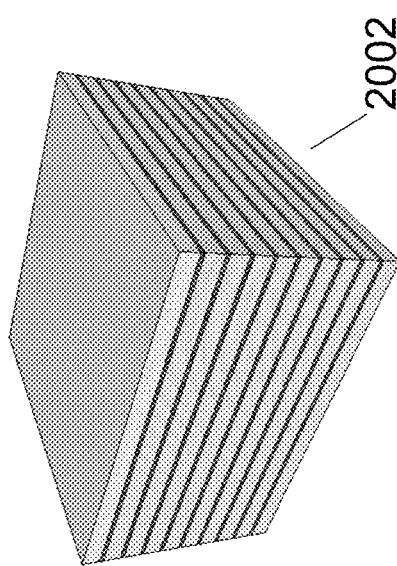

Some of the alternative structures presented herein are leveraging multilayers of 3D stacks, namely a stack of 3D stacks. The stack within 3D stacks can be arbitrarily selected based on its use. FIG. 20A illustrates a first stack 2000 design for a 3D NOR memory fabric and FIG. 20B illustrates a second stack 2002 design for a 3D NOR logic fabric. FIG. 20C illustrates a stack of logic 2012, such as 3D NOR logic, over a stack of memory 2010. FIG. 20D illustrates a stack of logic 2022 over a stack of routing 2024 and FIG. 20E illustrates a stack of logic 2032 over a stack of routing 2034 over a stack of memory 2036. The architectures, structures and process flows presented herein suggest processing multiple layers together will greatly reduce the fabrication cost per layer providing overall a device with many layers of functional transistors and routing providing density cost and performance advantages. An alternative of stack of 3D stacks is to add 2D layer(s) on a 3D stack. These process flows could use a 2D patterning which affects many layers simultaneously as was detailed herein. While creating patterns in 2D in the X and Y directions is a well-known technique in semiconductor device processing, it is far harder to form variation in the Z direction. Yet in some of the structures presented herein there are differences between the memory structure, logic structure and routing structure. Processing devices that integrate these slightly different structures might be harder. So one option is to process those individually and then bond them together. Yet there are techniques to effect changes in the Z direction.

One such Z direction change technique is forming subsets of layers with different thicknesses in the stack. As the stack could be formed by epitaxial growth, changing the gas or deposition time(s) or other process parameters could result in layers with various thickness in the Z direction, which could enable, for example, forming multilayer structures of about 50 nm per layer in thickness in a memory portion overlaid by multilayer structures of less than about 20 nm per layer for the logic portion.

Another alternative is to put a blocking hard pattern in-between the memory stack and the logic stack.

Processing fabrics for 3D NOR Memory while also forming 3D NOR Logic could reduce costs, while in other cases it might work better to process these fabrics mostly independently and then connect them together for a more efficient (cost and/or performance) overall 3D system. There are many options for mix and match between steps and fabrics presented herein and the choice of a specific flavor could also be affected by the target objective for the end 3D system.

FIG. 21A illustrates such starting step having a multilayer (such as N+, P, N+, P, . . . ) structure 2120 over a cut layers 2113 over a carrier 2110.

FIG. 21B illustrates the processing of the multilayer structure 2120 to build in it a 3D NOR fabric 2130 and adding on it the word-lines 2132.

FIG. 21C illustrates flipping the structure on top of a new carrier 2140.

FIG. 21D illustrates processing the back of the 3D-NOR fabric to add the connection of logic gates (LUT, . . . ) 2134. This could include adding also all transistors circuits needed to support the logic gates within the 3D NOR fabric and the memory peripherals circuits. Yet, another alternative is to do those additional circuits on another side wafer 2154 illustrated in FIG. 21E having cut layers 2143 over substrate 2150. This side wafer may be cut then flipped and precisely bonded to the 'already flipped' 3D NOR fabric as illustrated in FIG. 21F.

The substrate 2150 could then be removed as illustrated in FIG. 21G. Then the circuits on 2154 could be connected using the smart alignment technique—"smart alignment"— such as presented in U.S. Pat. No. 7,986,042, incorporated herein by reference, as related to at least its FIGS. 73, 74, 75, 77, 79. In addition since the memory fabric may be constructed as an array of repeating patterns of memory cells and repeating patterns of memory control lines (such as bit-lines and word-lines), the alignment and top layer 2154 connections to the underlying memory structure could be done using the techniques similar to those described in respect to at least FIG. 30 to FIG. 35G and FIG. 69 to FIG. 78B of U.S. Pat. No. 7,986,042. The alignment techniques leveraging repeating patterns are useful when the alignment error is larger than the size of the repeating element. These techniques could be used for any of the 3D integration involving layer transfer presented herein.

This side wafer approach allows the decoupling of the 3D NOR fabrication process from the fabrication of the support circuits. It could allow using a relatively less dense process for generic 3D NOR and an advanced high density process for the support circuits.

In some applications it might be desired to add on the peripheral circuits on top of the word-lines level 2132 using a similar concept of layer transfer and "smart-alignment". FIG. 22A illustrates peripheral circuits 2254 built over cut structure 2243 over carrier 2250. FIG. 22B illustrates the 3D NOR fabric of FIG. 21B. FIG. 22C illustrates flipping and bonding the wafer of the peripherals circuits of FIG. 22A on top of the 3D NOR fabric of FIG. 21B. FIG. 22D illustrates the structure after removal of the carrier 2250 and cleaning the cut structure 2243 residues, and then utilizing the "smart-alignment" adding connections 2256 to connect the peripheral circuits 2254 to the word-lines and the bit-lines of the underlying 3D NOR fabric. The circuits integrated into the transferred layer 2254 could include processing circuits to support what is presently called Processing-in-Memory ("PIM"). Alternatively an additional structure 2256 could be integrated on top using a similar flow and thus support a higher level Processing-in-Memory.

An optional partition of the 3D-NOR fabric, to a multiplicity of units, was previously presented in relation to FIG. 15A-FIG. 17. In such alternative it could be desired to process staircase connections to the bit-lines first. It could also be preferred to form through the 3D-NOR fabric a multiplicity of through-fabric vias which could be used later to connect between the logic circuits 2154 and the peripheral circuits 2254. Then using layer transfer techniques form a device in which the peripheral circuits 2254 are on one side of the 3D-NOR while logic circuits 2154 on the other side interconnected using through 3D-NOR vias (not shown). This unit's formation could be done so each unit has its own stair-case, and accordingly, its own word-lines and bit-lines so it is completely independent and accordingly each unit would be able to read write or erase the portion of memory cells under its control independent from other units. The through fabric vias could enable the logic fabric to control independently each unit to provide a multi-core type programmable fabric. Buses could be established on both sides to allow data to be transferred between cores and to external devices. Other layers could be added in to form even more complex systems with the option of adding in a range of communication circuits such as SER-DES and/or wireless communication with external devices. In this way this additional layer could be tested before integrating them with the 3D-NOR could fabric, and various redundancy techniques could be used with such 3D systems to provide better yield and field repair of the 3D programmable system as is presented in prior patents, incorporated by reference herein.

The formation of the 3D NOR logic fabric as an array of semi-independent units fits well with the ideas of continuous array and 3D configurable FPGAs as presented in U.S. Pat. Nos. 8,384,426 and 8,115,511 incorporated herein by reference, as related to at least its FIGS. 7-13, FIGS. 36-38, and FIG. 41.

Figure 23A:
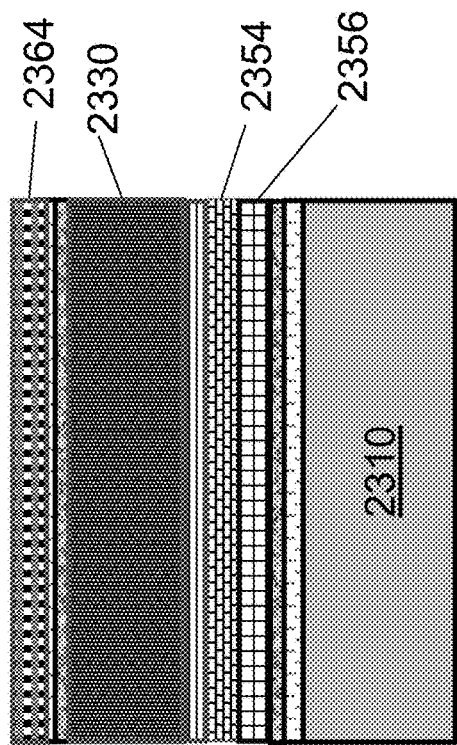
FIGS. 23A-23B are example illustrations of stack structure variations for a 3D programmable system.

Another alternative to increase the 3D NOR logic density is to use the bottom side for logic, as well other sides. A layer transfer flow for forming a 3D programmable system, leveraging the 3D NOR fabric, was described in respect to FIG. 21A to FIG. 22D herein. FIG. 23A illustrated a 3D programmable system including a carrying substrate 2310, a smart connection layer 2356 connecting the peripherals programming circuit 2354 to the 3D-NOR fabric 2330 with overlaying logic control circuit 2364.

Figure 23B:
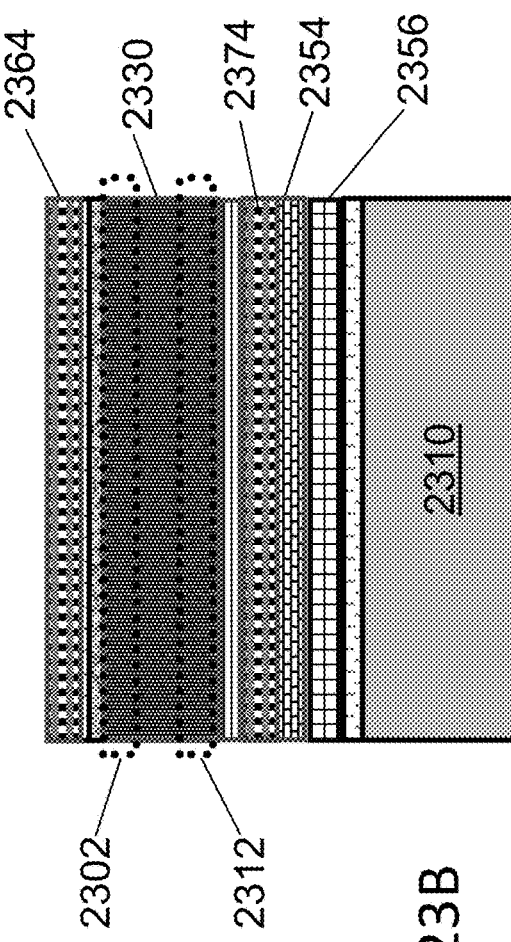

FIG. 23B illustrates the structure adapted to support logic on both sides, the bottom of the 3D-NOR fabric 2312 with its bottom control circuits 2374, and the top 3D-NOR fabric 2302 with its top control circuits 2364.

The gate access could be multiplexed between the programming peripherals circuits 2354 and the bottom logic control circuits 2374.

An alternative application of the technology is to use part of the 3D NOR logic fabric for operations resembling a brain Synapse. A paper by Lixue Xia titled "Technological Exploration of RRAM Crossbar Array for Matrix-Vector Multiplication" published at JOURNAL OF COMPUTER SCIENCE AND TECHNOLOGY 31(1): 3-19 Jan. 2016, incorporated herein by reference, teaches the use of a crossbar RRAM array for matrix-vector multiplication. Accordingly the RRAM pillars and the corresponding S/D segments could be used for such functions. Papers by Sangsu Park, et al., titled "Electronic system with memristive synapses for pattern recognition" published by Scientific Reports |5:10123| DOI: 10.1038/srep10123, by Yu Wang, et al., titled "Energy Efficient RRAM Spiking Neural Network for Real Time Classification", published at the 25th Symposium on VLSI, by Manan Suri, titled "Exploiting Intrinsic Variability of Filamentary Resistive Memory for Extreme Learning Machine Architectures" published by IEEE Transactions on Nanotechnology 15 Jun. 2015 and Sangsu Park, titled "Nanoscale RRAM-based synaptic electronics: toward a neuromorphic computing device" published by Nanotechnology 24 (2013), all the forgoing incorporated herein by reference. These teachings use of an RRAM cross-bar for brain type processing could be implemented in the 3D NOR fabric RRAM pillars and the corresponding S/D segments.

Another alternative is to utilize the 3D NOR fabric floating-body memory structure for a Synapse type circuit as is presented in paper such as one by Min-Woo Kwon et. al. titled "Integrate-and-Fire Neuron Circuit and Synaptic Device using Floating Body MOSFET with Spike Timing-Dependent Plasticity" published in the JOURNAL OF SEMICONDUCTOR TECHNOLOGY AND SCIENCE, VOL. 15, NO. 6, December 2015, incorporated herein by reference.

The 3D NOR fabric could also be adapted to an associative memory function. For an associative memory function, a unit could be programmed and operated to provide a quick and parallel operation to identify a match. For simplicity the description would be for a single ridge. Let use the following terms:

A1 to Ak: A binary vector to be searched having bits 1 to k, Ai: bit i in the vector.

$WL_{odd}i$: Odd word-line i (In reference to FIG. 8A, WL1 is $WL_{odd}1$, WL3 is $WL_{odd}2$, and so forth).

$WL_{even}i$: Even word-line i (In reference to FIG. 8A, WL2 is $WL_{even}1$, WL4 is $WL_{even}2$, and so forth).

S/Dn: The Source line of level n.

$M_{odd}in$: The memory bit stored on the odd side of the channel between S/Dn and S/Dn+1 and controlled by $WL_{odd}i$.

$M_{even}in$: The memory bit stored on the even side of the channel between S/Dn and S/Dn+1 and controlled by $WL_{even}i$.

For associative memory application data could be stored in one bit per channel with the odd facet store the data bit and the even facet stores it inversion.

The word-line would be set so that $WL_{odd}i$=Ai and $WL_{even}i$=The inversion of Ai (AiN).

Then S/Dn line could be set to '1' (Vdd) and the S/Dn+1 would be sensed. Since a stored bit negates the effect of a high word-line '1', a read zero on S/Dn+1 indicates a perfect match of the stored bits negating all the high word-lines, hence an associative memory.

The above concept could be used to provide more operations in parallel by having the S/D line sensed individually per each ridge in the associative memory units. Other variations could be used to achieve a higher memory efficiency, such as, for example, mirror bits The associative memory concept could be adapted to form an analog correlator in which the signal on S/Dn+1 is the 'sum-of-product' between the stored data on the 'n' layer cells ($M_{odd}in$, $M_{even}in$) and the signal on the word-lines. Such a correlation function could very useful for many signal processing functions. Alternatively, the associative memory can be a content-addressable memory. The content addressable memory can be useful for network applications, big data applications such as voice recognition, video processing, and etc.

As a general note we described herein 3D memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some in silicon control lines, providing staircase on both sides of memory blocks to improve speed and reduce variation including sharing staircase in between two blocks and other presented variations herein. Many of these options have been presented here for some memory options and it would be obvious to artisan in the semiconductor memory domain to apply those to the other memory structures.

The structures and flow presented herein are utilizing NPN transistors. Other types of transistors with the corresponding modification of process and materials could be used as an alternative such as junction-less transistors, or non-silicon transistors (for example SiGe, CNT, and so on). Those alternatives could be implemented leveraging the special benefits of the architecture disclosed herein.

The 3D NOR fabric as described herein could be used to form functional blocks such as volatile and non-volatile memories and programmable logic. These could leverage similar process flows and structure, and function with added layers on top and below, such as peripheral circuits 2254, 2154. These could be used to form system devices by mixing these functions one on top of the other and/or one side by side as could be engineered using the principles and flows described herein as an engineer in the art will use to form 3D systems and devices for the required application.

A 3D system could be made by custom design or by use of generic structure, for example, the 3D NOR fabric described herein, which could be combined with structure on top or below forming dedicated 3D systems. In U.S. Pat. No. 9,136,153, incorporated herein by reference, several techniques are presented using generic structure(s), also called continuous array, to form dedicated systems. Such as been described referencing at least FIGS. 11A-11F, 12A-12E, 19A-19J, 84A-84G, 215A-215C, 234A-234B of U.S. Pat. No. 9,136,153. Accordingly the same 3D-NOR fabric could provide fabric to two different products who could have the same size but a different mix of upper structure 3432 or bottom structure 3454. Or have different product sizes so one 3D-NOR fabric of one product could be the same of a subset of the 3D NOR fabric of another device. In general, use of the same fabric for different products reduces both the set up—NRE costs and the volume production costs. Arrays that have a regular structure and being programmable together with 3D construction are a very good fit for these sharing techniques.

The use of layer transfer in construction of a 3D NOR based system could be enable heterogeneous integration. The memory control circuits, also known as peripheral circuits, may include high voltages and negative voltages for write and erase operations. The circuits may include the charge pumps and high voltage transistors, which could be made on a strata using silicon transistors or other transistor types (such as SiGe, Ge, CNT, etc.) using a manufacturing process line that is different than the low voltage control circuit manufacturing process line. The analog circuits, such as for the sense amplifiers, and other sensitive linear circuits could also be processed independently and be transferred over to the 3D fabric. Such 3D system construction could be similar to the one illustrated in at least FIGS. 34A-34G herein. Such 3D construction could be used to provide proper bias voltages to some of the word lines to extend retention time while shutting power to most other circuits to reduce power consumption. "Smart Alignment" techniques could be used with these layer transfers to overcome the wafer bonder misalignments.

Another alternative is to leverage the very high etch selectivity of SiGe vs. Silicon for layer transfer. Instead of using the porous silicon 3443 which has been referred to as modified ELTRAN flow, use sacrificial SiGe. The substrate could have sacrificial SiGe over silicon epitaxial and then epitaxy of silicon over the SiGe. Recently it become a very attractive concept for processing gate all around horizontal transistors and has become the target flow for next generation devices such as the 5 nm technology node. Some of the work in respect to selective etching of SiGe vs. silicon has been presented in a paper by Jang-Gn Yun et al. titled: "Single-Crystalline Si Stacked Array (STAR) NAND Flash Memory" published in IEEE TRANSACTIONS ON ELECTRON DEVICES, VOL. 58, NO. 4, April 2011, and more recent work by K. Wostyn et al. titled "Selective Etch of Si and SiGe for Gate All-Around Device Architecture" published in ECS Transactions, 69 (8) 147-152 (2015), and by V. Destefanis et al. titled: "HCl Selective Etching of Si1-xGex versus Si for Silicon On Nothing and Multi Gate Devices" published in ECS Transactions, 16 (10) 427-438 (2008), all incorporated herein by reference.

The process could include the following steps as illustrated in FIG. 24A-24I and FIG. 25A-25D:

A. As illustrated in FIGS. 24A and 24B, on a reusable donor wafer—base substrate 2402 epitaxially grow epi layer 2404, which may include a layer of about 100 nm, or about 200 nm, or about 500 nm, or about 1000 nm or about 2000 nm thick SiGe. The content of Ge is designed per the selectivity desired and in consideration of the stress. Predefined trenches in the designated dicing streets could be used to release the potential stress. These trenches could have a width and a depth corresponding to the thickness of the SiGe layer.

B. As illustrated in FIG. 24C, epitaxially grow silicon layer 2406 on top of the SiGe epi layer 2404, silicon layer 2406 may have a thickness of about 10 nm, or about 20 nm, or about 50 nm, or about 100 nm, or about 200 nm, or about 500 nm, or about 1000 nm or about 2000 nm, as desired for the electronic circuits.

C. As illustrated in FIG. 24D, process the desired circuits 2412 including contact layer. This could be done using conventional processing including the appropriate high temperature processes.

D. As illustrated in FIG. 24E, form first set of holes 2414 through the top silicon layer 2406 and the SiGe epi layer 2404. This holes could be filled with oxide or other material that would be selective to future silicon and SiGe etches. The holes filling would serve as a posts to hold the to be transferred top layer in place. Those could be done in the dicing streets area and may be designed weak enough to be torn out.

E. As illustrated in FIG. 24F, add one or more interconnection layers 2416 and cover with isolation layer 2422 (FIG. 24G) such as SiO2 and CMP or other form of top surface planarization for future wafer to wafer bonding.

F. As illustrated in FIG. 24H, form many second set holes 2424 to allow a full etch of the sacrificial SiGe layer (remainder of SiGe epi layer 2404). These holes could be made at un-used locations and in locations designated for future Through-Layer-Via (TLVs). The holes need to be open through the top layer all the way into the SiGe epi layer 2404.

G. As illustrated in FIG. 24I, selectively etch the sacrificial SiGe layer creating void 2426.

H. As illustrated in FIG. 25C, flip and bond the structure such as illustrated in FIG. 25A (the structure from FIG. 24I) onto the target wafer 2502 illustrated in FIG. 25B, which could be similar to the one illustrated in FIG. 22B. Resulting with bonded structure 2590 such as illustrated in FIG. 25C. The bonding could be oxide to oxide bonding which could be followed with top wafer interconnection through a TLV (Thru Layer Via) process or metal to metal bonding or hybrid bonding (oxide to oxide and metal to metal bonding).

I. Tear off the donor wafer as is illustrated in FIG. 25D, the donor wafer could be sent for reuse.

J. Clean the top surface and prepare for interconnections. Optionally cover with isolation.

K. Open TLVs for interconnection add in.

The donor wafer 'tearing off' could be assisted by known techniques such as, for example, water-jet, wedge, laser cutting, etched assisted tearing off and mechanical twist and pull.

Alternatively additional interconnection layers and other processing could be added in between step 'G' and 'H' above. So the structure illustrated in FIG. 24I could be further processed before being flipped and bonded to the target wafer. This add-on process could include adding additional metal layers or any other structure including addition transistor layers using similar techniques such as layer transfer.

The use of SiGe for epitaxial base 'cut' layer instead of porous 'cut' layer could be adapted to many of the flows presented in U.S. application Ser. Nos. 14/642,724, 15/095,187, and 15/173,686, all the forgoing are incorporated herein by reference. It does add some complexity related to the holding posts formation and the holes to etch the SiGe through prior to performing the layer transfer. For applications in which two layer of acting silicon, and isolation layer in between, is desired, the in-between SiGe could be removed after the transfer and replaced with isolation material.

Another alternative is to skip steps related to FIG. 24D-24I and use the SiGe layer 2404 as an etch stop. For example, a 3D technique of flip bond and etch back of an SOI donor such as presented in at least U.S. Pat. Nos. 6,821,826, 7,723,207 and 7,312,487, all the forgoing are incorporated herein by reference. The techniques leverage the oxide as an etch stop layer for the full base substrate grind and etch back.

Alternatively the SiGe layer 2404 could be used as an etch stop. In this approach the base substrate 2402 would not be reused but rather be ground and etched away. The back grind and etch back could use wet etching and the SiGe layer 2404 could be designed to be very resistive to the silicon wet etching. The SiGe could be designed to have few layers including one that might have high Ge content, for example, such as over about 20% or over about 40% or over about 80%, followed by other layers with low Ge content such as less than about 20% or even less than about 10% to reduce stress so to support the silicon layer 2406.

Alternatively the 'cut' process could be integrated with could be integrated with Siltectra's 'Cold Split' technology as has been detailed in at least U.S. Pat. Nos. 8,440,129 and 8,877,077, applications 20160064283, 20160086839, all of which are incorporated herein by reference. These techniques would allow recycling, for example, of base substrate 2402. The SiGe could be used to provide the "Pre-Defined Break Initiation Point" as an alternative to the Siltectra use of laser or in addition to it. The Siltectra's 'Cold Split' could reduce the need for the undercut etch and posts formation process while providing reuse of the base substrate 2402 (for example). For this technique a multilevel SiGe could be designed to support the 'cut' on the one hand but also to reduce damage to the device layer on the other. This could be accomplished by increasing the Ge content in the interface with the base substrate 2402 to have high Ge content such as over about 20% or over about 40% or even over about 80% and then on the side interfacing with device layer 2406 forming a low Ge content such as less than about 20% or even less than about 10% to reduce stress so to support the silicon layer 2406.

Once the base substrate 2402 is removed a selective etch could be used to remove the SiGe residues and thinning processes such as etch and/or CMP could be used to further thin the back side of the device layer 2406. Connection layers could be added included vias aligned to the target wafer 2502 using "Smart Alignment" and similar 3D integration techniques discussed here and the incorporated by reference art.

The Cold Split technology could also be utilized to form and manufacture SOI wafers and would be less expensive to manufacture when compared to the current ion-cut methods.

Formation of multiple levels of arrays of transistors or other transistor formations in the structures described herein may be described at least by the terms 'multilevel device' or 'multilevel semiconductor device.' Memory within the fabric herein may have a read and write access time of less than 100 ns, or less than 10 ns, or less than 5 ns or even less than 2 ns and could support multiple ports.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by appended claims (if any).

This application incorporates by reference herein the previous related U.S. patent application Ser. No. 14/874,366, 62/252,448, 62/258,433 and 62/269,950 by the same inventors.

Figure 26A:
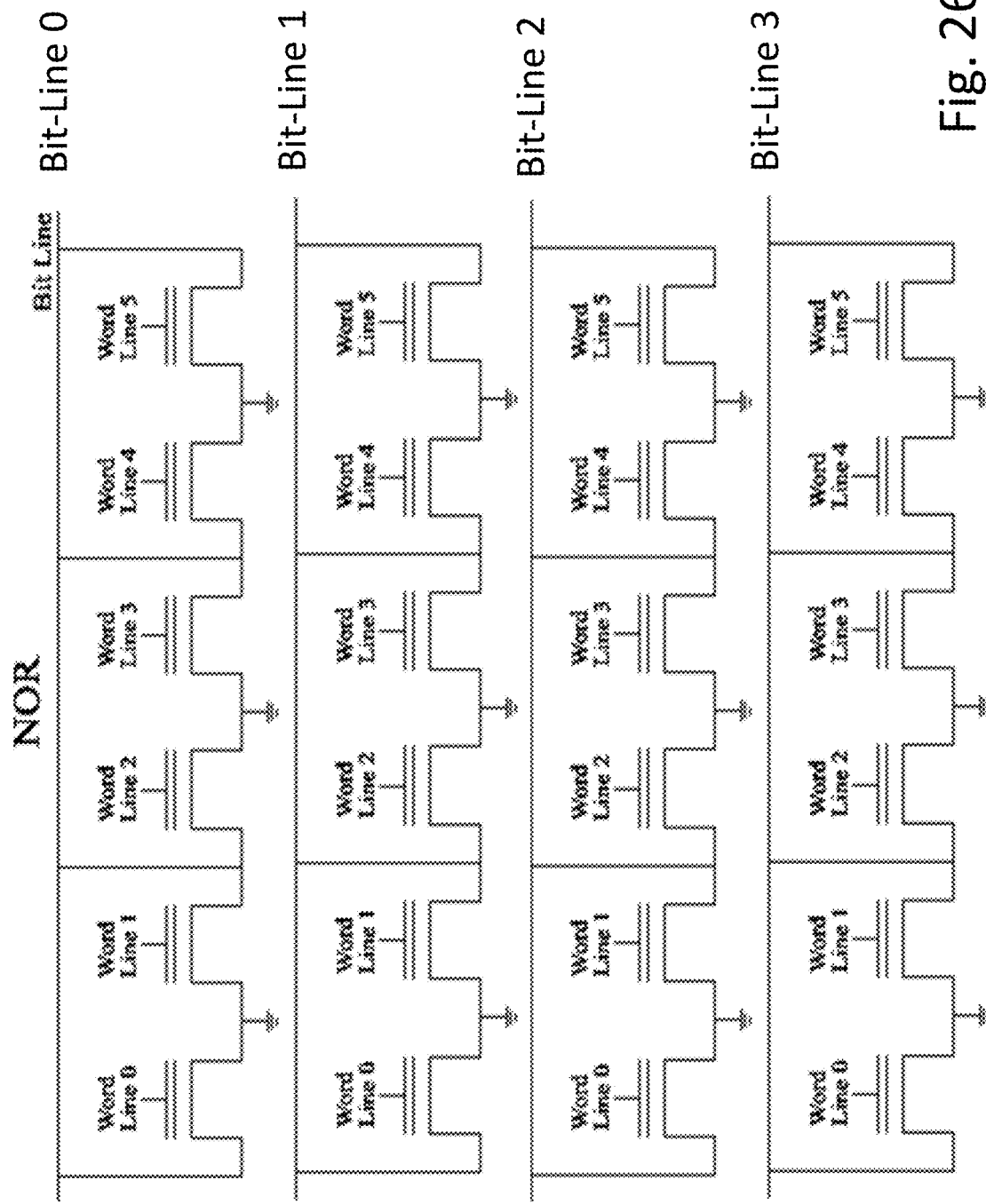
FIGS. 26A-26B are example schematics of prior art NOR and NAND non-volatile (NV) memory.
Figure 26B:
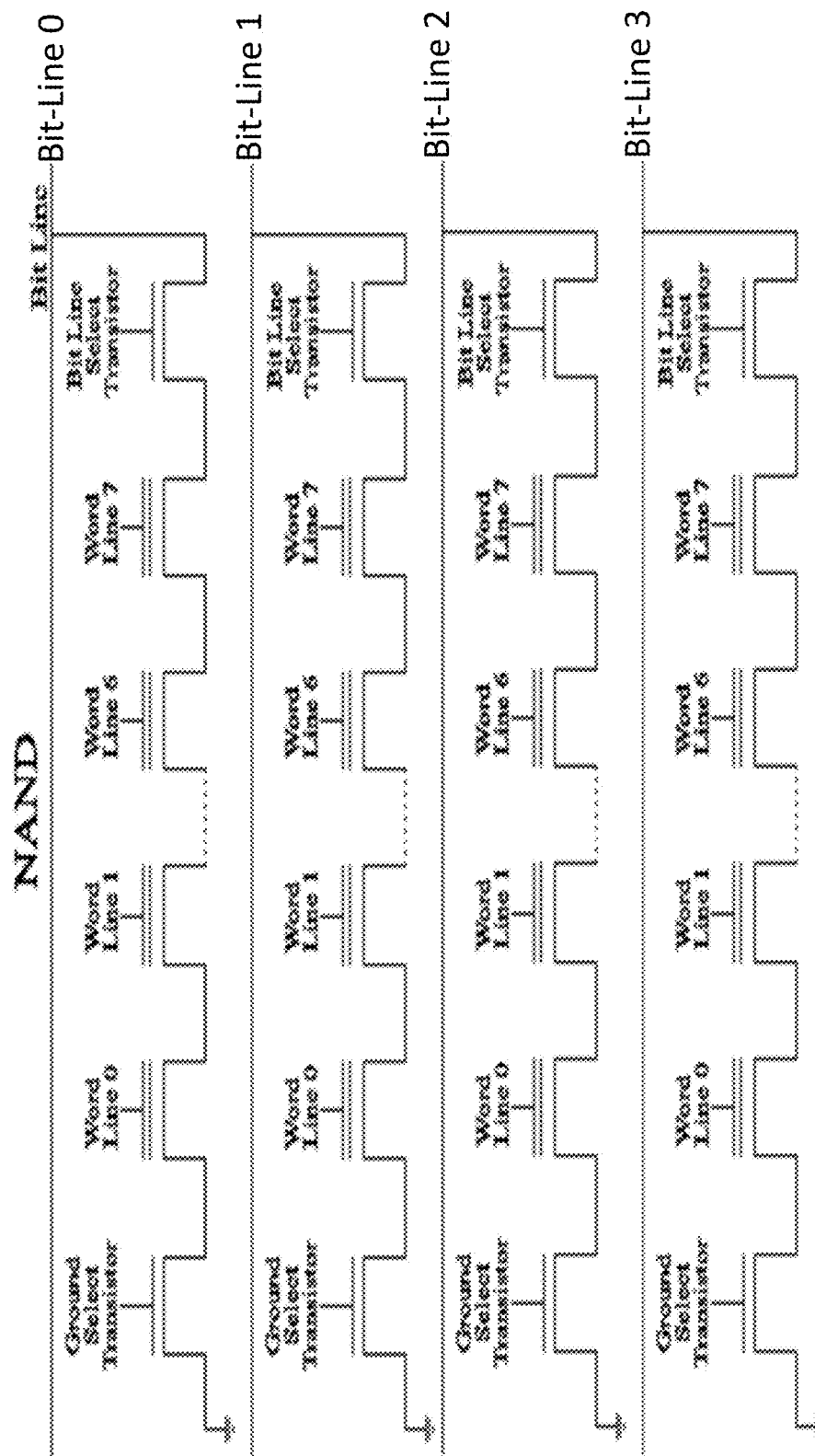

Memory architectures include at least two important types—NAND and NOR. FIG. 26A is a schematic illustration of prior art NOR architecture. FIG. 26B is a schematic illustration of prior art NAND architecture. As illustrated in NOR architecture the memory control lines, bit-lines and word-lines, provide direct access to each memory cell and accordingly quick access. The drawback is the extra area for the contact for each cell resulting in an overall larger area per bit for such architecture.

In contrast the NAND architecture illustrated in FIG. 1B connects memory cells in a daisy chain with source or drain (S/D) contact only at the two ends of the chain. To control a specific cell within the chain all the gates of the other cells in the chain would need to be set to an 'on' state so the signal provided at the chain edge reaches the specific cell within the chain to read or write. NAND architectures require a smaller area per cell than NOR, but would require more time to access an individual cell.

Currently the market has made a clear choice, choosing reducing bit cost even if it results in a much longer memory access.

Figure 26D:
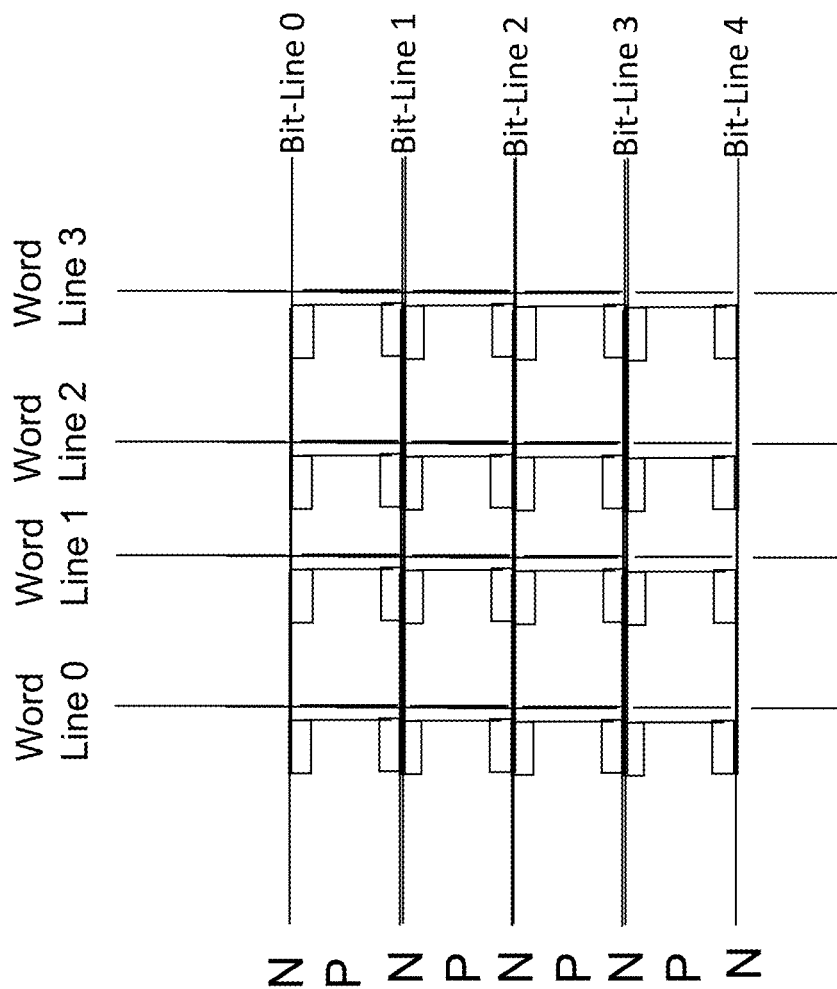
FIGS. 26C and 26D are example schematics of a new HD-NOR non-volatile (NV) memory bit cell and exemplary small array.
Figure 26C:
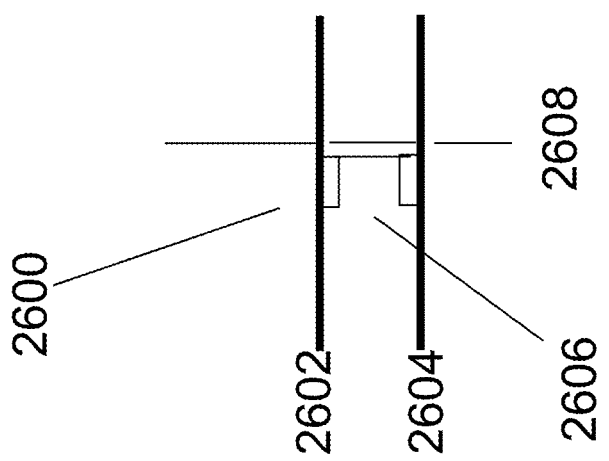

As illustrated in FIG. 26C, a schematic of a bit cell 2600 of a new NOR architecture which provides both high speed access and high density—HD-NOR—is shown. The new NOR architecture and bit cell 2600 leverage a new class of 3D transistor which may be formed on many substrates, for example, bulk or SOI wafers. The bit-lines or source lines, first bit/source line 2602 and second bit/source line 2604, may be formed from N+ silicon strips, which may also act as the individual cell source or drain (S/D). The bit line or source lines are versatile; for example, when one line first bit/source line 2602 acts as bit line, another line second bit/source line 2604 becomes a source line. Also, the bit line and source line swapping may be used to implement mirror bit operation. In between first bit/source line 2602 and second bit/source line 2604 may be disposed p type channel 2606. Gate 2608, which could be made with doped polysilicon for example, going in the vertical direction (substantially orthogonal to bit lines) may function as the word-lines. FIG. 26D illustrates an exemplary small memory array constructed from such a bit-cell.

The architecture referred to by naming as HD-NOR and illustrated herein in reference to FIG. 26C to 26D and in similar illustrations herein is also similar to a structure called in the art AND nonvolatile memory architecture as presented in a patent such as U.S. Pat. No. 7,414,889, and as 1T MONOS as in a paper by Hidenori Mitani et al titled "A 90 nm Embedded 1T-MONOS Flash Macro for Automotive Applications . . . " presented at ISSCC 2016, both incorporated herein by reference.

FIG. 27A to FIG. 27J will be used to illustrate exemplary fabrication steps for processing and forming an HD-NOR array.

Figure 27A:
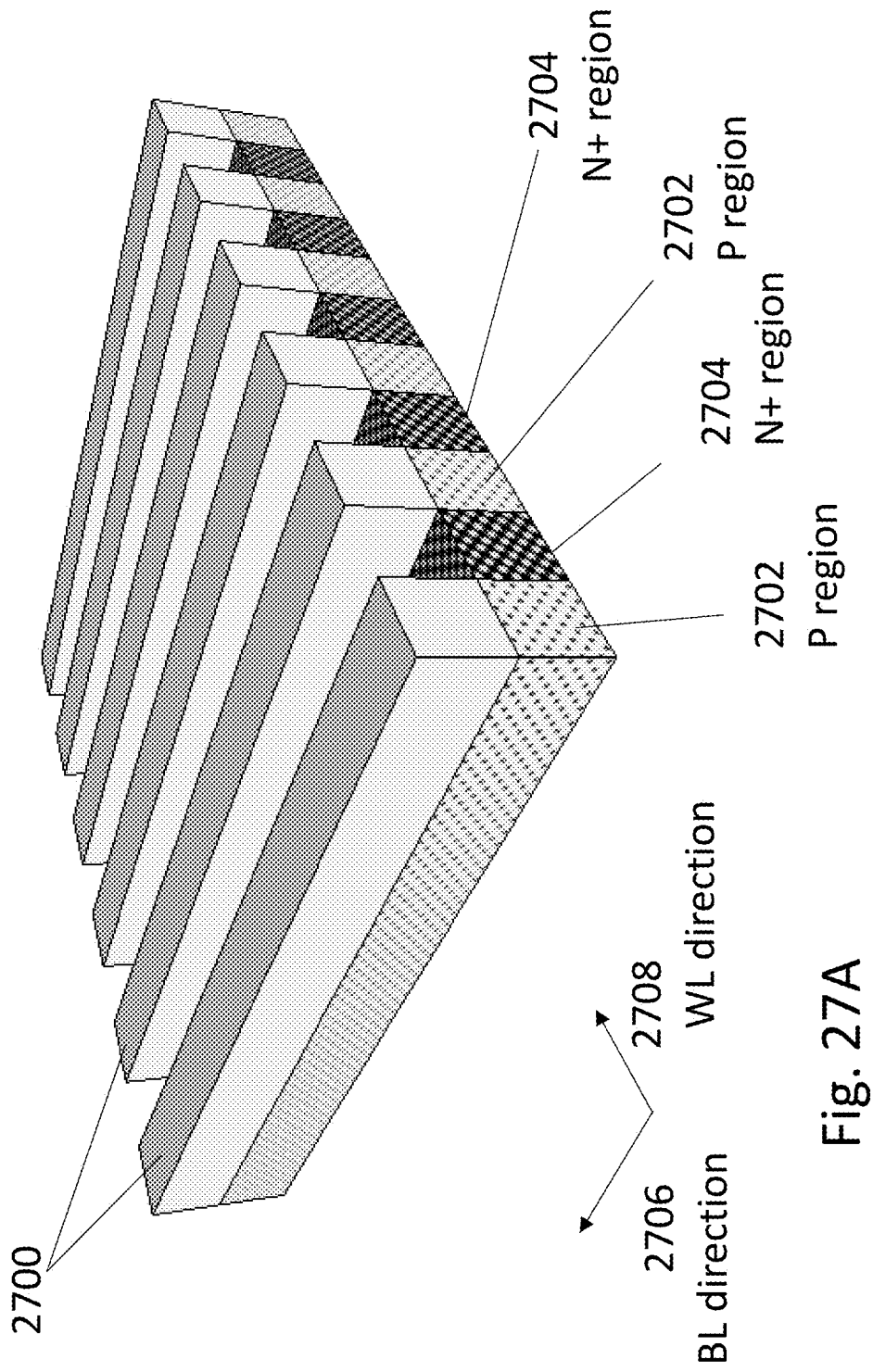

FIG. 27A illustrates a structure of a small portion of an exemplary HD-NOR in a fabrication process. The base silicon may be, for example, a P-doped bulk or an SOI substrate. The base silicon may be patterned with strips of implant masking regions 2700 such as silicon oxide to keep the strips under it as P regions 2702 (nominally the original P concentration of the base silicon, but may be modified as known in the art via, for example, ion implantation) while the non implant-mask strips in between the strips of implant masking regions 2700 may be ion-implanted to form N+ regions 2704. Other doping methods, for example, gas phase or solid phase diffusion may be used. These N+ strips of N+ regions 2704 may serve as the bit line(s) in one direction, BL direction 2706, and also as the future bit cell's source or drain (S/D). The word-lines will be formed later going in an orthogonal direction to BL direction 2706, such as WL direction 2708. The bulk of the substrate is not shown to simply the drawing.

Figures 27B, 27C:
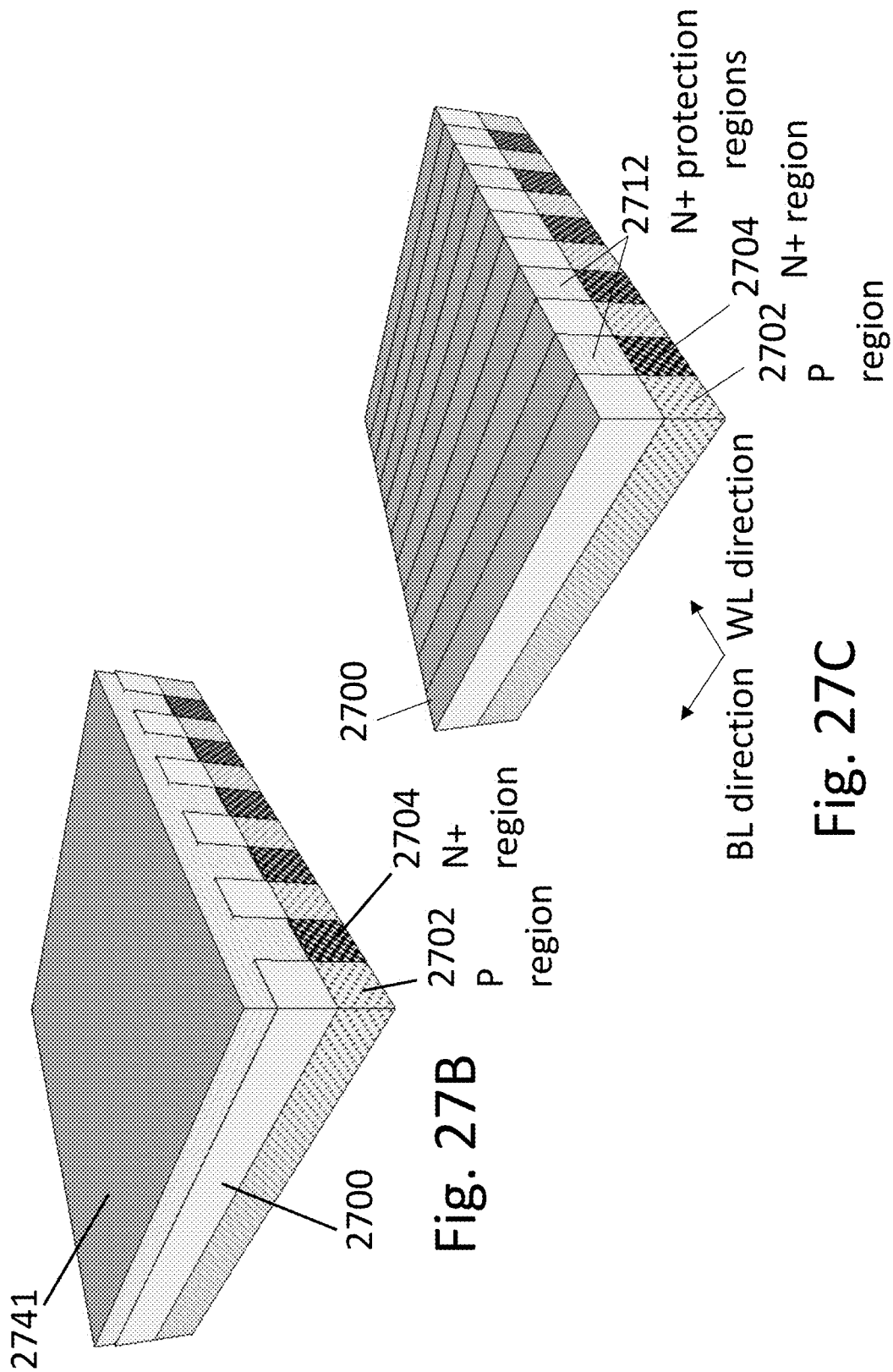

FIG. 27B illustrates the structure after covering the structure of FIG. 27A with a hard mask material 2741 such as silicon nitride, which may be accomplished by a deposition. The hard mask material 2741 may have sufficient etching selectivity in respect to the hard mask material 2700.

FIG. 27C illustrates the structure after the hard mask material 2741 had been polished down using, for example, Chemical Mechanical Polishing (CMP), or alternative process, to expose the implant masking strips 2700 leaving the resultant hard mask material N+ protection regions 27127 protecting the N+ regions 2704. This results in self-alignment of the N+ protection regions 2712 to N+ regions 2704.

FIG. 27D illustrates the structure after selectively removing the implant protection masking regions 2700, leaving the P regions 2702 exposed while the N+ regions 2704 are still protected by N+ protection regions 2712.

FIG. 27E illustrates the structure after deposition of an etch protection layer and patterning it to form orthogonal strips etch mask regions 2715 such as silicon dioxide in the word-line direction.

Figure 27F:
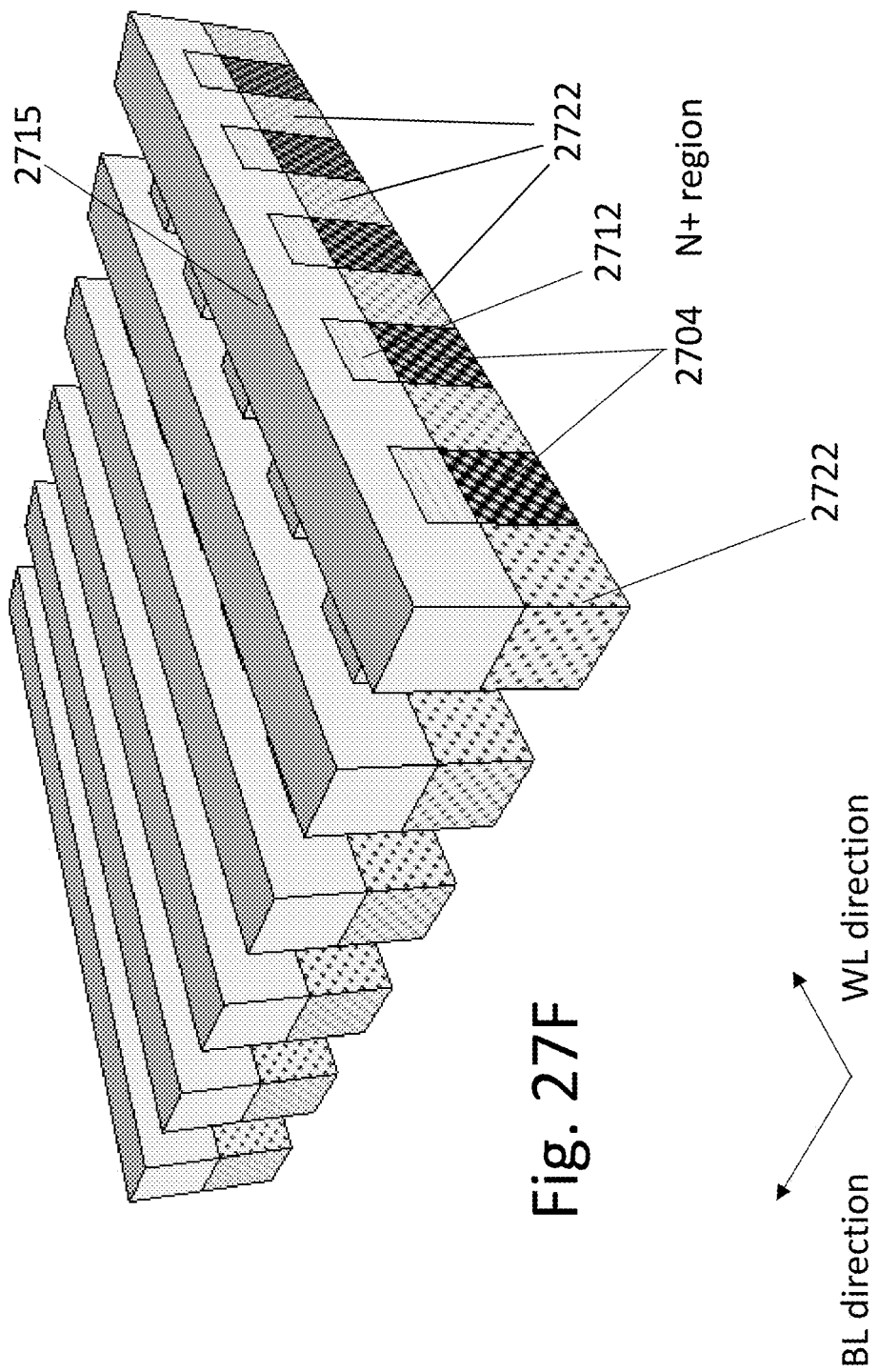
Figure 27G:
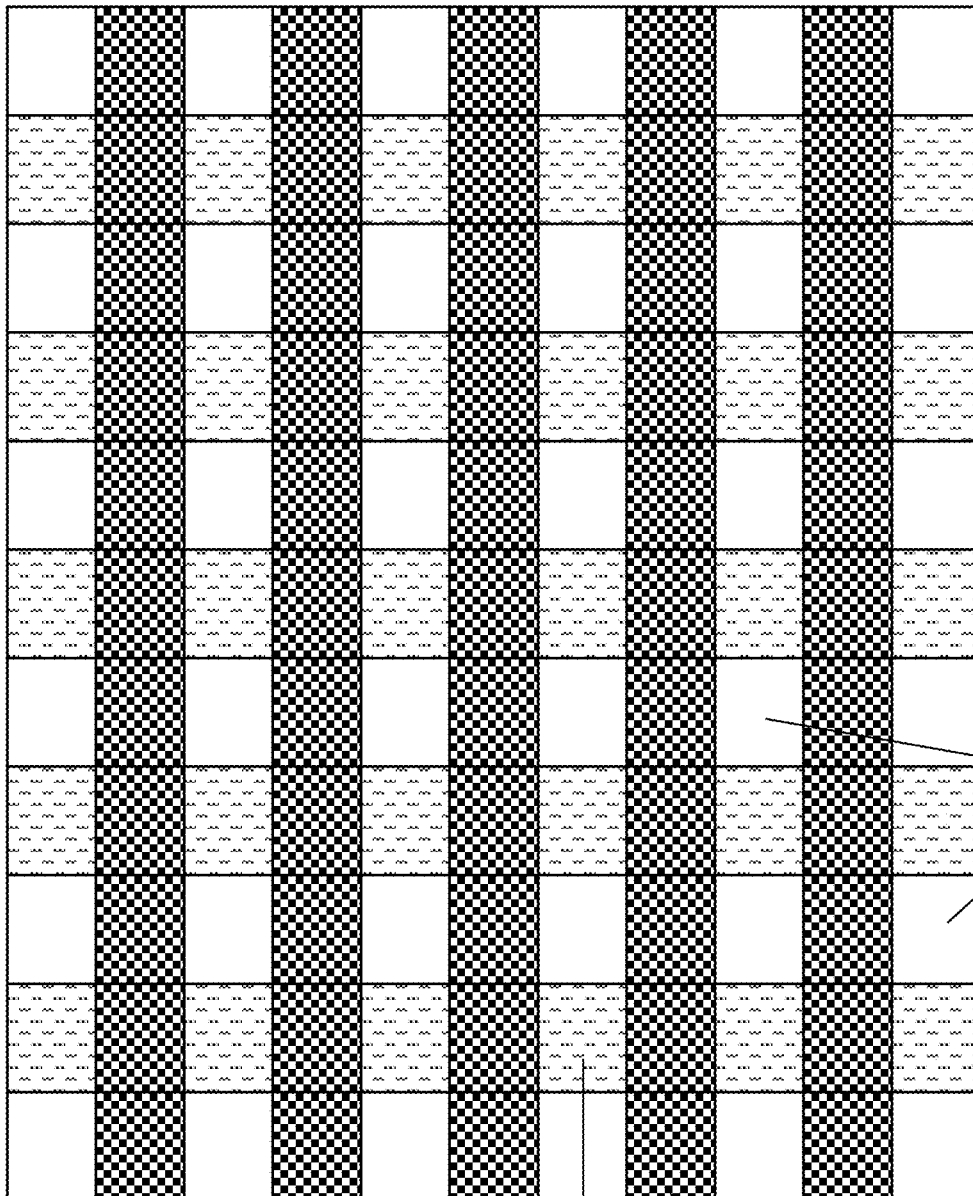

FIG. 27F illustrates the structure after etching the unprotected portions of P regions 2702, thus forming p-regions 2722. This results in S/D strips (N-regions 2704) going in the bit-line direction with fully isolated P regions 2722 disposed in between these S/D strips. Effectively forming an array of Fin shaped channels placed periodically between strips of N+ silicon which serve as the future transistor S/Ds and also as the bit-lines. In one embodiment, the fin height can be from 10 nm to 100 nm, the fin width can be 10 nm to 100 nm. FIG. 27G illustrates the resulting structure at the silicon layer from a top view. The etch portions 2729 of the P regions—the removed portion of the original P regions 2702 P strips would function as isolations between bit cell channels 2732, and as will be explained later, this removed portion will be used to accommodate the sidewall gate stack. The original N+ regions 2704 strips would act as the bit cell S/D and also as the bit-lines 2734.

Figure 27H:
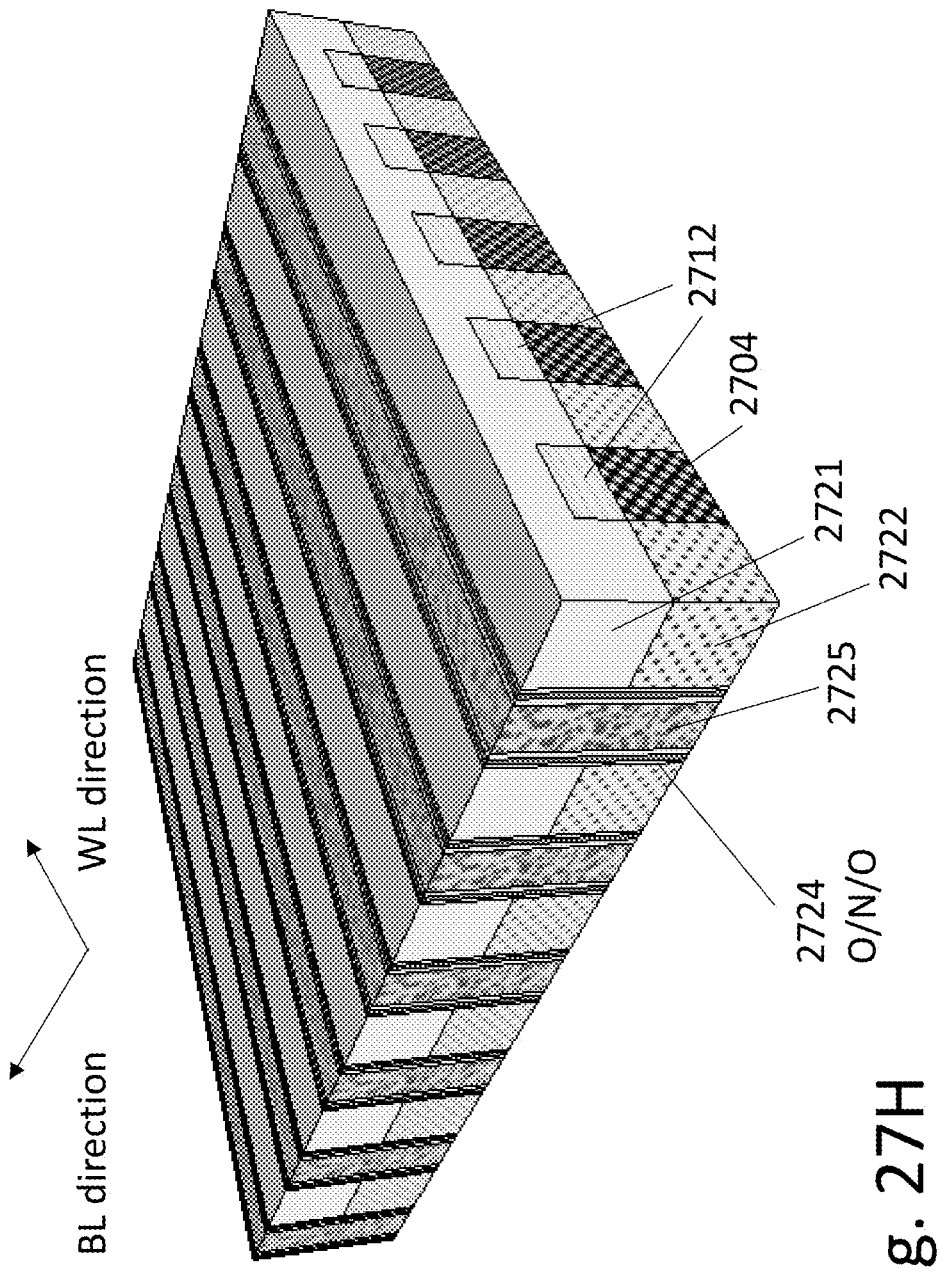

FIG. 27H illustrates the structure after the side gate structures/stack for the array, which may include a gate dielectric by first a deposition of a Tunnel oxide then a Charge trap layer and then a control oxide layer. These three layers are commonly called O/N/O 2724 layers, but may comprise other materials and combinations known in the art for charge trapping. For example, the charge trap layer may be semiconductor quantum dots or metallic quantum dots where these dot size ranges from 1 nm to 10 nm. Alternatively, the charge trap layer may be high-k dielectric such as $HfO_2$ or it nitride. For simplicity herein the term ONO or O/N/O would be used to denote structures which include a charge trap layer/region and support barrier layers/regions which may allow controlled transfer of charge into or out of the charge trap layer. Such O/N/O stack could comprise material described herein or other material combinations including materials that have been included in a review paper by Chun Zhao et al. titled: "Review on Non-Volatile Memory with High-k Dielectrics: Flash for Generation Beyond 32 nm" published in Materials 2014, 7, 5117-5145; doi:10.3390/ma7075117, incorporated herein by reference. These layers could be deposited using Atomic Layer Deposition (ALD) techniques or compatible alternative. Then the side gate material 2725 such as polysilicon may be deposited using Chemical Vapor Deposition (CVD) techniques or compatible alternative. Then the structure may be polished down using CMP to expose the etch mask 2721 (remainder of etch mask regions 2715). Consequently, the gate materials are separated by the etch mask 2721, and thus each sidewall channel of P regions 2722 can be independently controlled by its sidewall gate 2725. Thermal oxides, formed by a thermally activated reaction of oxygen or some form of oxygen (such as water), may result in unwanted redistribution of dopants or other materials within the device at the time of that thermal oxidation. One technique to overcome this would be to use radical oxidation for the formation of the tunneling oxide. For example, by a TEL SPA (slot plane antenna) tool/machine, wherein oxygen radicals are generated and utilized to form thin thermal oxides (generally of single crystal silicon) at less than 400 deg C.

Alternatively thermal oxide could be grown on the P silicon before the step of FIG. 27A. Additional alternative is to defer the step of dopant activation to be done after the formation of the tunneling oxide and account for the thermal budget of all prior thermal processing steps.

FIG. 27I illustrates the structure after the selective removal of the exposed regions of the etch mask 2721. In one embodiment of the present invention, the cell fabrication may be complete here and may continue to the interconnect process. As another embodiment of the present invention, the cell fabrication may be continued in the following process for a higher bit density by adding a top gate material.

FIG. 27J illustrates the structure after adding the top gates by first using a similar flow to FIG. 27H: which may include a gate dielectric by first a deposition of a Tunnel oxide then a Charge trap layer and then a control oxide layer—These three layers are commonly called O/N/O 2726 layers, but may comprise other materials and combinations known in the art for charge trapping. For example, the charge trap layer may be semiconductor quantum dots or metallic quantum dots where these dot size ranges from 1 nm to 10 nm. Alternatively, the charge trap layer may be high-k dielectric such as $HfO_2$ or it nitride. In some cases a radical oxidation may be utilized. These layers could be deposited using Atomic Layer Deposition (ALD) techniques or compatible alternative. Then the top gate material 2727 such as polysilicon may be deposited using Chemical Vapor Deposition (CVD) techniques or compatible alternative. Then the structure may be polished down using CMP to expose the side gates 2725.

Figure 27K:
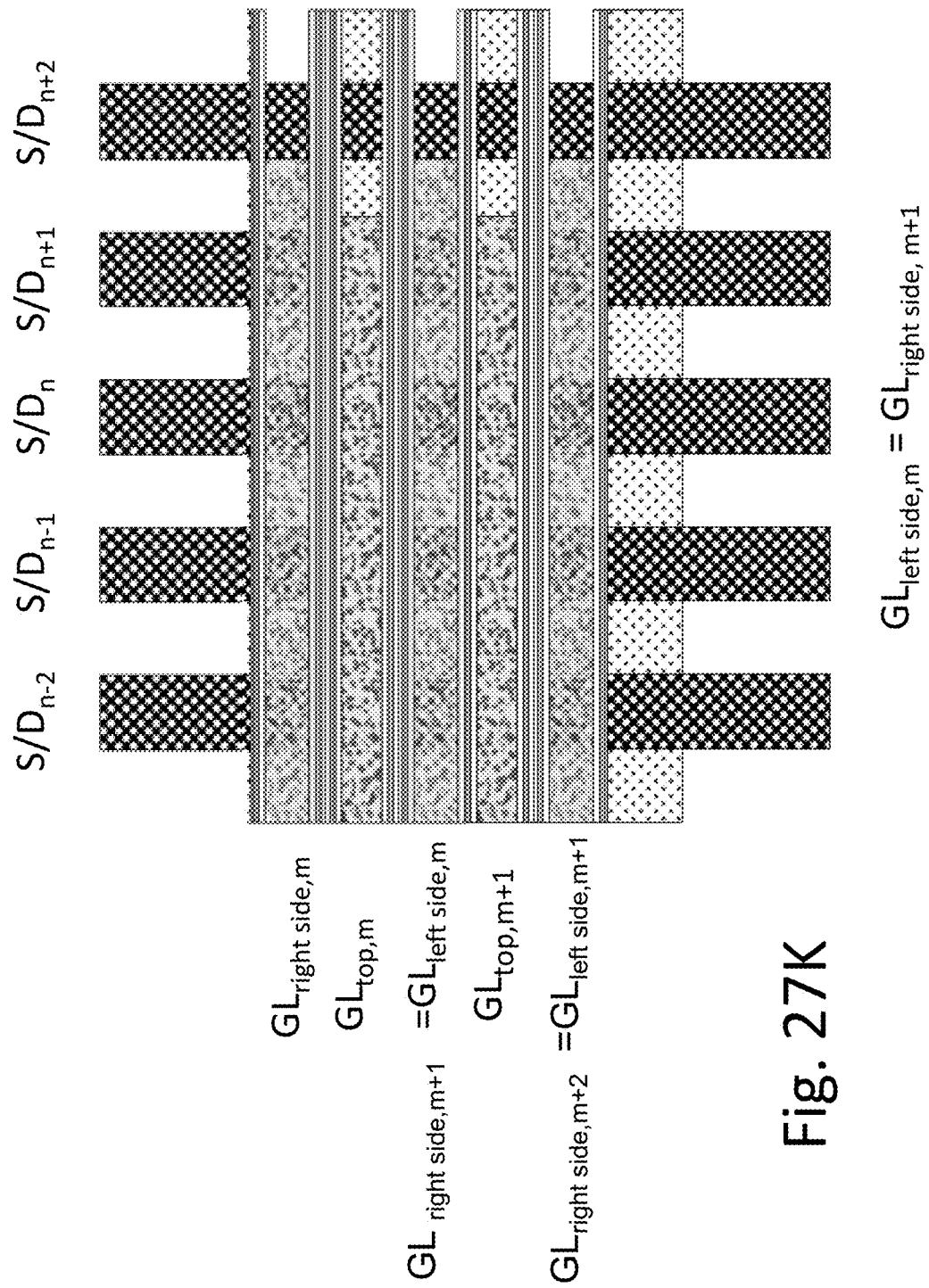

FIG. 27K illustrates a small portion of the resultant structure. Using n for counting cells going along the wordlines and m for cell going along the bit-lines, the structure illustrates the cells and control lines around cell m,n. It shows top gate GLtop,m with two side gates on its sides: GLright side,m and GLleft side,m. The side gate left of cell m is also the right side gate for cell m+1. FIG. 3 also shows 5 sections of bit-lines which also serves as the S/D for the channel in between them.

Figure 28A:
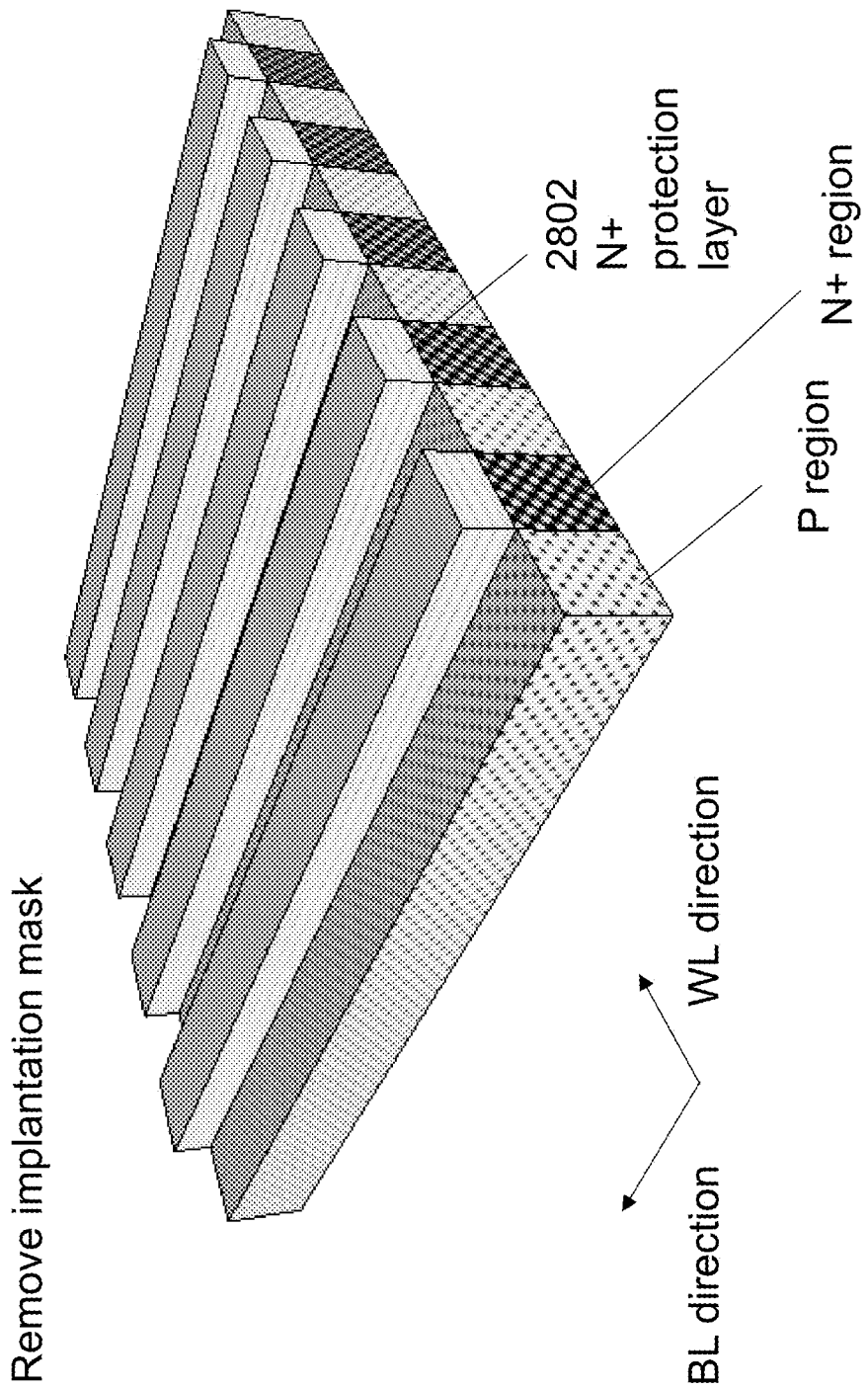

An alternative flow is presented using illustrations FIGS. 28A-28D. FIG. 28A illustrates the structure illustrated in FIG. 27D. It could be desired to optimize the flow so that the N+ protection layer 2802 remaining at this step is relatively thin, for example, about 10 angstroms, 20 angstroms, 30 angstroms, 50 angstroms, 100 angstroms or 200 angstroms.

Figure 28B:
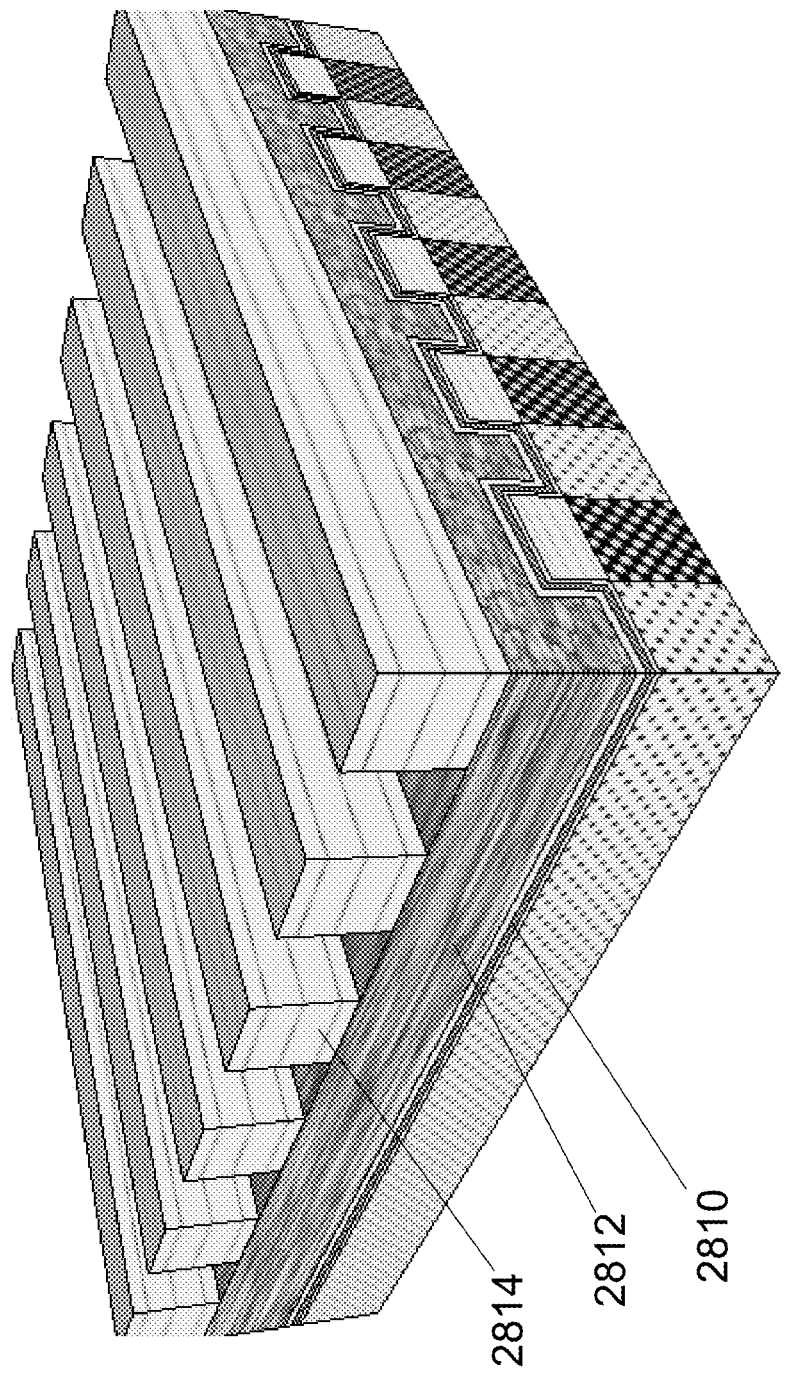

FIG. 28B illustrates the structure of FIG. 28A after formation of the first O/N/O 2810, top gates 2812 and then forming and patterning hard mask 2814 of strips in the Word Line (WL) direction.

Figure 28C:
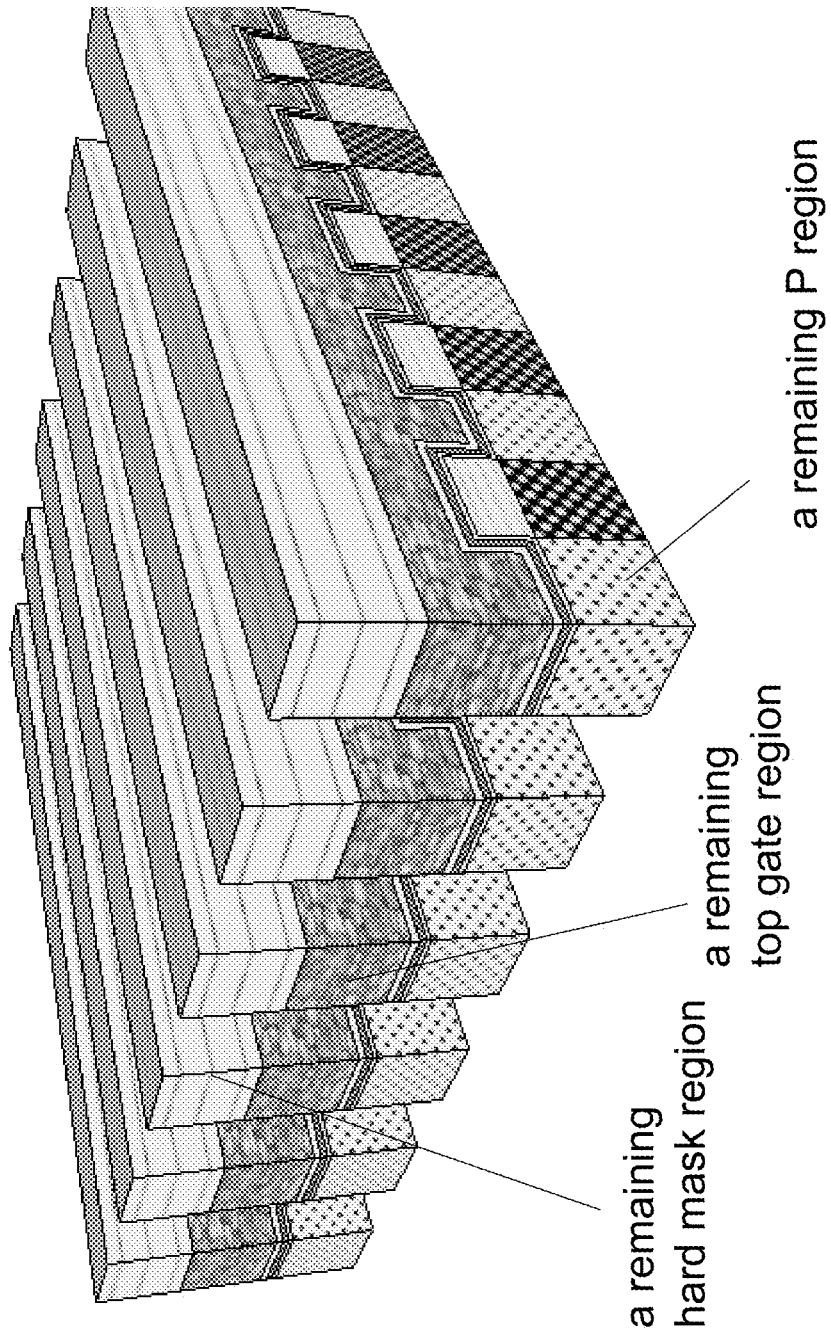

FIG. 28C illustrates the structure of FIG. 28B after etching the unmasked gate, first O/N/O material and the unprotected P silicon.

FIG. 28D illustrates the structure of FIG. 28C after forming side O/N/O 2822, 2824 and side gates 2823. And then CMP the structure, thus leaving a thin hard mask region 2850 separating the side gates 2823, and disposed underneath it the top gates 2829 and the first O/N/O 2828. Side O/N/O 2822, 2824 and side gates 2823 may be disposed between p regions 2855 and top gates 2829.

Figure 29:
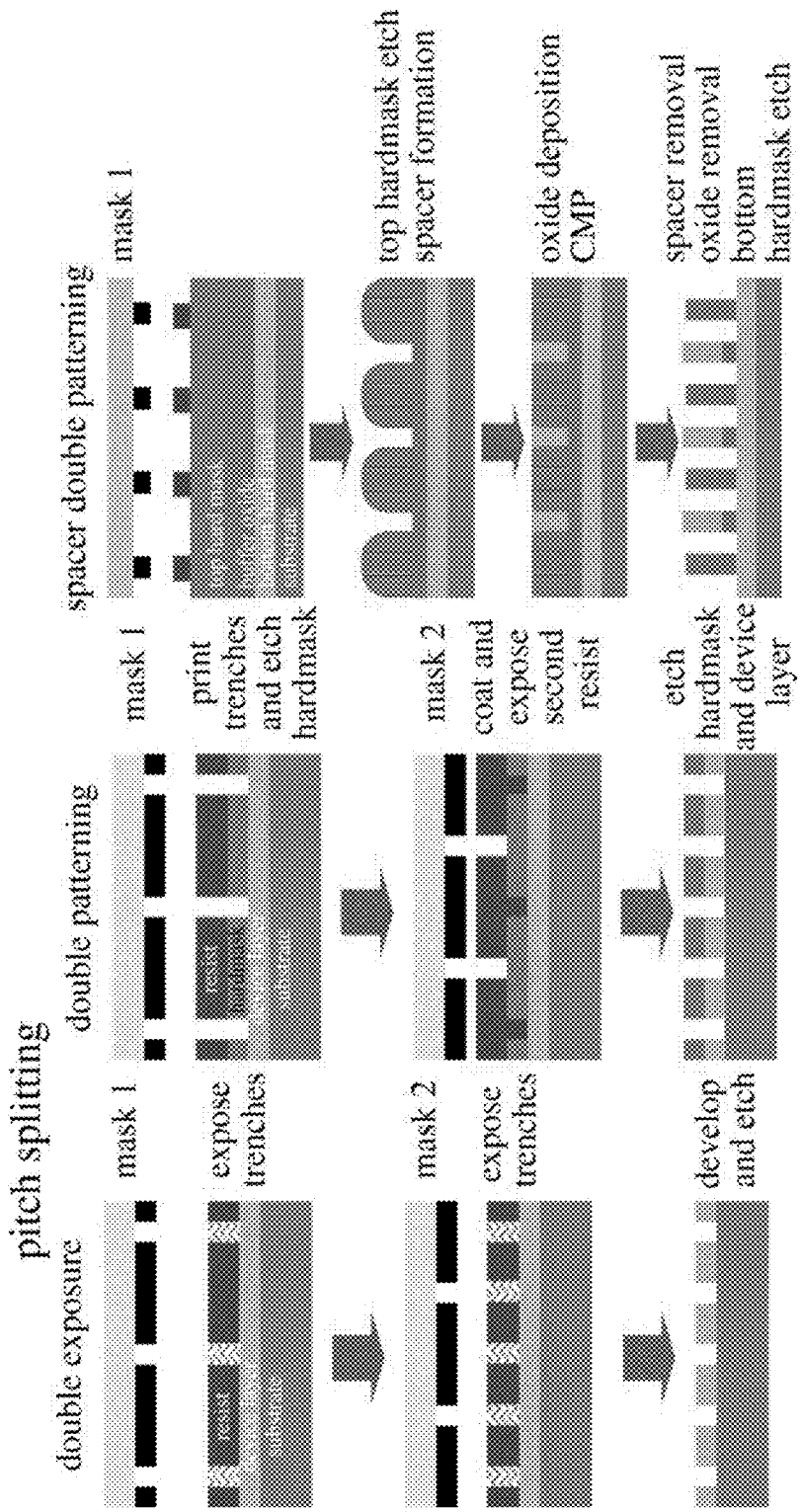
FIG. 29 illustrates known in the art alternatives for low cost grid patterning.

FIG. 29 illustrates three known in the current art process flows for forming parallel running lines with low cost lithography providing high pattern resolution by smart process steps. It illustrates two types of pitch splitting techniques and one for spacer based technique. These techniques could be used for the processing of HD-NOR structure as its array flow is based on parallel lines substantially equally spaced.

When the HD-NOR structure is implemented, for example, on a silicon-on-insulator substrate, the HD-NOR structure could be dual use one providing effectively a universal memory. As illustrated in FIG. 30, every cell has a floating P channel 3004 with N+source and N drain 3010 on its side, forming a known in the art SOI based floating body DRAM. Such dual function memory cell was described in a paper by Jin-Woo Han et. al. titled: "A Unified-RAM (URAM) Cell for Multi-Functioning Capacitorless DRAM and NVM", published at IEEE IEDM 2007, incorporated herein by reference. These DRAM cells could further enhanced by adapting "Autonomous Refresh of Floating Body Cell (FBC)" techniques, which could be also called 'self-refresh'. In a common DRAM refresh a refresh cycle means that each cell is being read and re-written individually. In a 'self-refresh' many or even all cells could be refreshed together by driving a specific current (may be a current range or minimum current, the value being determined by engineering choices) through them. The cell holding 'zero' will keep its zero state and the cell holding 'one' will get recharged to recover the loss of floating body charge due to leakage. This technique had been detailed in a paper by Takashi Ohsawa et. al. titled: "Autonomous Refresh of Floating Body Cell (FBC)" published in IEDM 2008, and in follow-up paper titled: "Autonomous Refresh of Floating-Body Cell due to Current Anomaly of Impact Ionization" published by IEEE TRANSACTIONS ON ELECTRON DEVICES, VOL. 56, NO. 10, October 2009, the entirety of all the forgoing incorporated herein by reference.

In many cases the volatile operation could interfere with the non-volatile operation of the memory cells. So it is common to avoid using them together or in close proximity. A portion of the HD-NOR that is designated to be used as an FB-RAM would be programmed to have all its NV storage cells set to a known state such as all its bits being reset.

There are many use modes for such an enhanced memory, including, splitting the memory bank for volatile and non-volatile portions, power down with saving the volatile information into the non-volatile portion, and sleep mode for power reductions by moving the volatile information into the non-volatile portion.

Figure 30A:
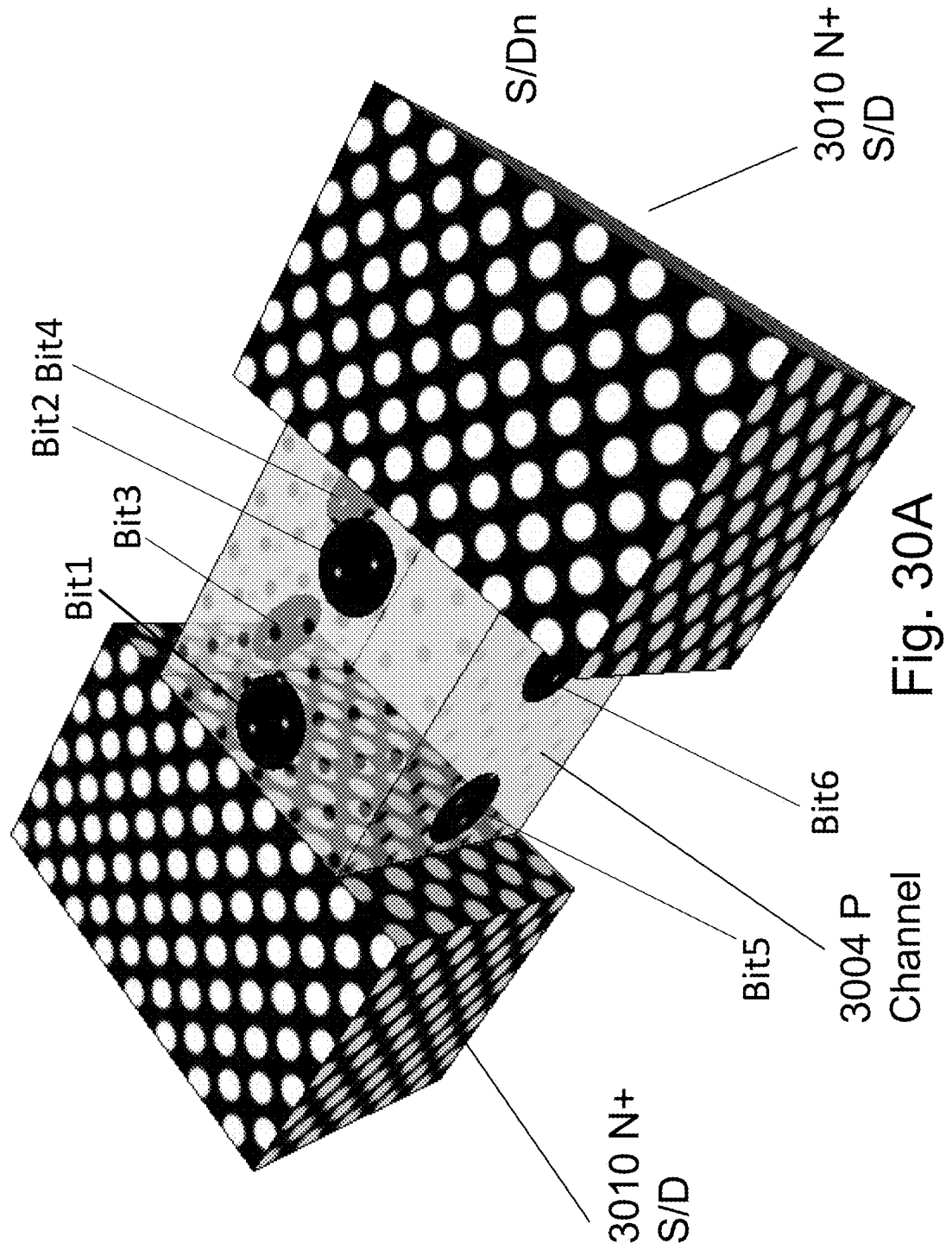
FIGS. 30A and 30B are example illustrations one memory cell basic structure.

Additional enhancement to such HD-NOR, is to implement MirrorBit® technology as was made commercial by Spansion for NOR products. And apply such approach to each of the independent O/N/O+ gates surrounding the given channel as is illustrated in FIG. 30A. Similar techniques were presented for SOI-FinFET type NOR with 4 bits per cell as been detailed in U.S. Pat. No. 7,091,551, incorporated herein by reference.

Figure 30B:
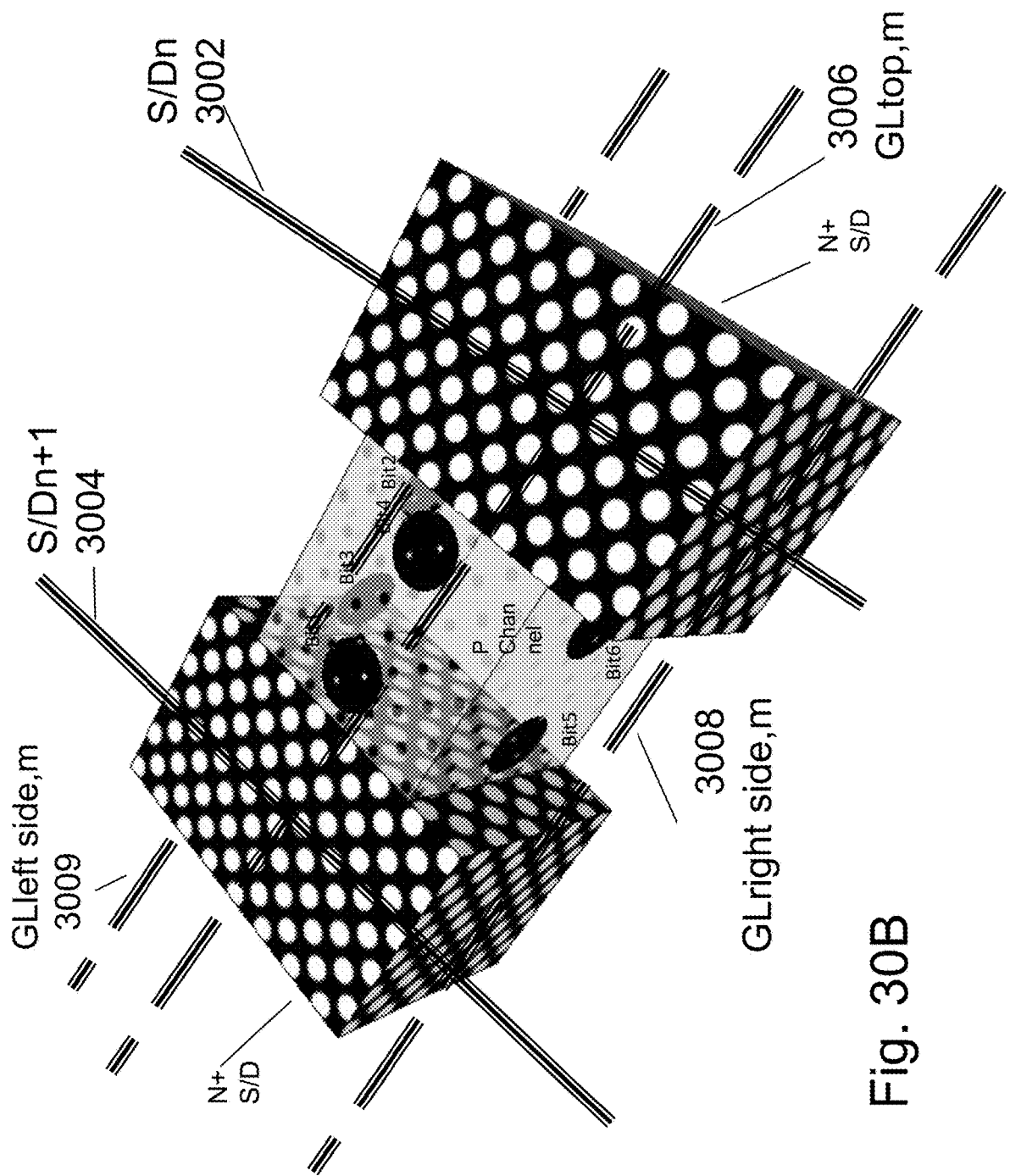

FIG. 30B illustrates on top of the memory cell of FIG. 30A exemplary memory control lines for cell m,n. The lower bit-line 3002 is labeled S/Dn, the higher bit-line 3004 is labeled S/Dn+1. The top word-line 3006 is labeled GLtop,m, the right side word-line 3008 is labeled GLright side,m, and the left side word-line 3009 is labeled GLleft side,m.

FIG. 31 provides a table for the exemplary write or read of each of the memory bits of a cell n,m which is between bit-line n and bit-line n+1, and having a word-line/top gate m, with reference to FIG. 30B.

The 8 v indicates a voltage just high enough to drive charge into the charge trap under its control.

The 4 v indicate about half of the 8 v which would access the read operation but would not be high enough to cause charge tunneling through and enabling charged being trapped or de-trapped.

Examining the table of FIG. 31 reveals that the charge trapping or reading may be performed solely with the gate controlling the specific side being in parallel with the facet of the channel. The other two gates may not be active at that moment. The absolute values of the voltages/biases in FIG. 31 (or any of the voltage/bias tables herein) may be adjusted due to engineering and design choices, as well as driven by material choices and doping types.

Figure 32:
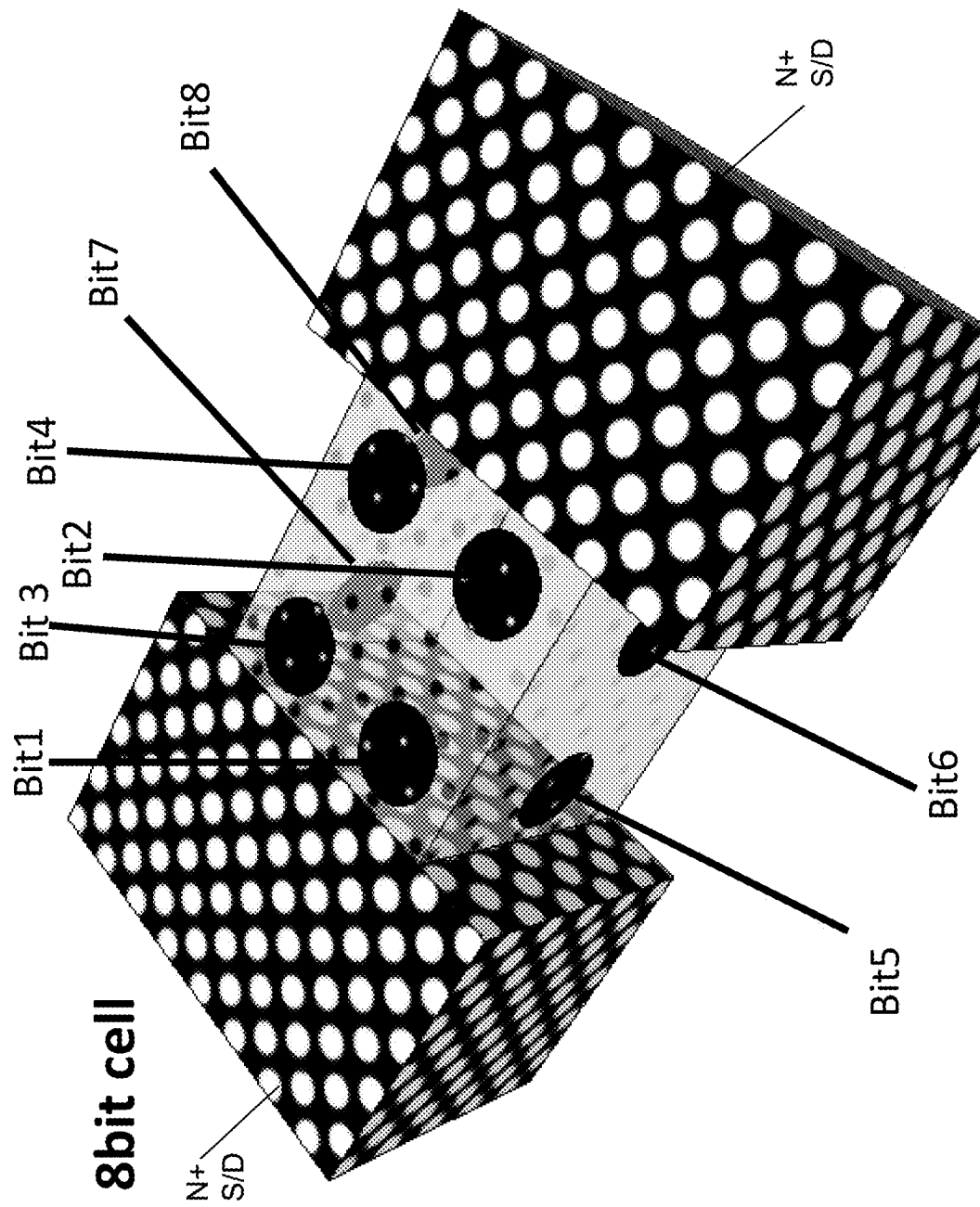
FIG. 32 is an example illustration of another memory cell basic structure.

With this new memory structure a new form of memory enhancement could be applied. FIG. 32 illustrates an 8 bit memory arrangement. In this new technique the side gate helps split the top facet into a right side and a left side to double the storage capacity of the top facet. For a write operation, a voltage such as 4V or −4V applied to the supporting neighboring gates may direct the charge formation toward one side of the channel from an opposite side channel but would not be high enough to cause charge tunneling through the supporting gate side.

FIG. 33 provides a table for the exemplary write or read of each of the memory bits of a cell n,m which is between bit-line n and bit-line n+1, and having a word-line/top gate m, with reference to FIG. 32.

By using the left side gate to pull the charges to the left, the top gate can controllably write bit1 and bit2 and respectively erase them.

By using the right side gate to pull the charges to the right the top gate can controllably write bit3 and bit4 and respectively erase it.

Figure 34:
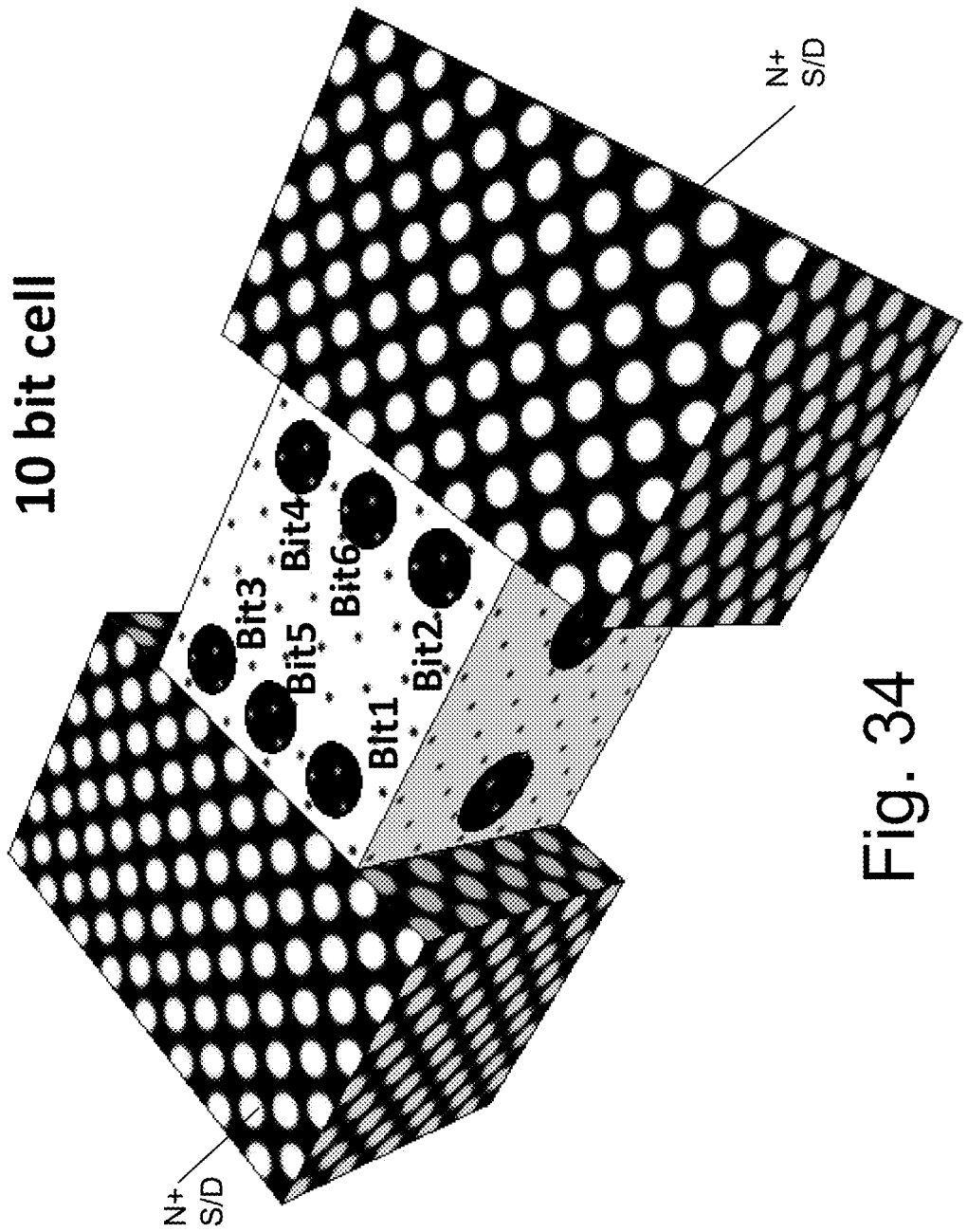
FIG. 34 is an example illustration of another memory cell basic structure.

Pushing the side control further we can increase the memory capacity of the top facet to 6 and the cell total to 10, as is illustrated in FIG. 34. It should be noted that the increased capacity of such an HD-NOR memory device could limit how small the size of the memory cell could be scaled. It is expected that each bit may need its own 20-30 nm region, which may be round, elliptical, etc., and may include an area which may range from 150 nm$^2$ to 800 nm$^2$, and a volume of 500 nm$^3$ to 16,000 nm$^3$. Accordingly the top facet could be kept larger than about 60 nm×40 nm.

FIG. 35 provides a table for the exemplary write or read of each of the memory bits of a cell n,m which is between bit-line n and bit-line n+1, and having a word-line/top gate m.

By using both the right side gate and the left side gate to push the charges away from the sides and into the middle of the top facet the top gate can controllably write bit3 and bit4 and respectively erase them.

This increase of the top facet bit capacity may be applied in the same for the side facet. To do so the structure needs a bottom gate.

Figure 36:
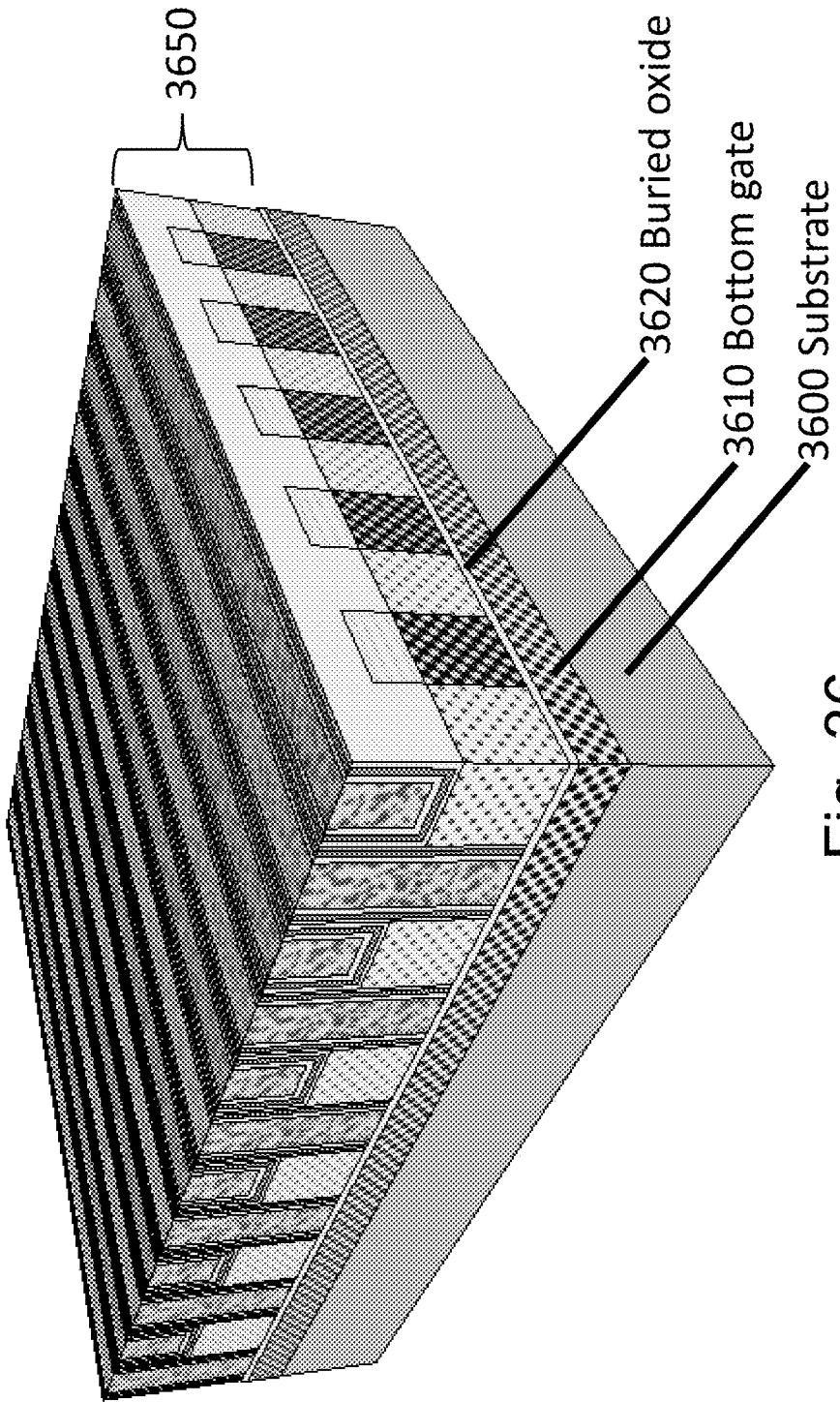
FIG. 36 is an example illustration of a memory structure with a bottom gate.

FIG. 36 illustrates the memory structure 3650 (for example, similar to the memory structure of FIG. 2J) being formed with a bottom gate 3610 by having a portion of the SOI substrate 3600 doped, for example, by ion implantation, to form N+ regions for the areas designated under the HD-NOR, and adding access to control that region's electrical potential. The buried oxide (BOX) 3620 of such SOI or ultrathin buried oxide could be kept thin enough for such bottom gate to have good electrostatic control of the O/N/O of the relevant side facets of the memory cell. One skilled in the art would recognize that there may be other methods to achieve a bottom gate.

Figure 37:
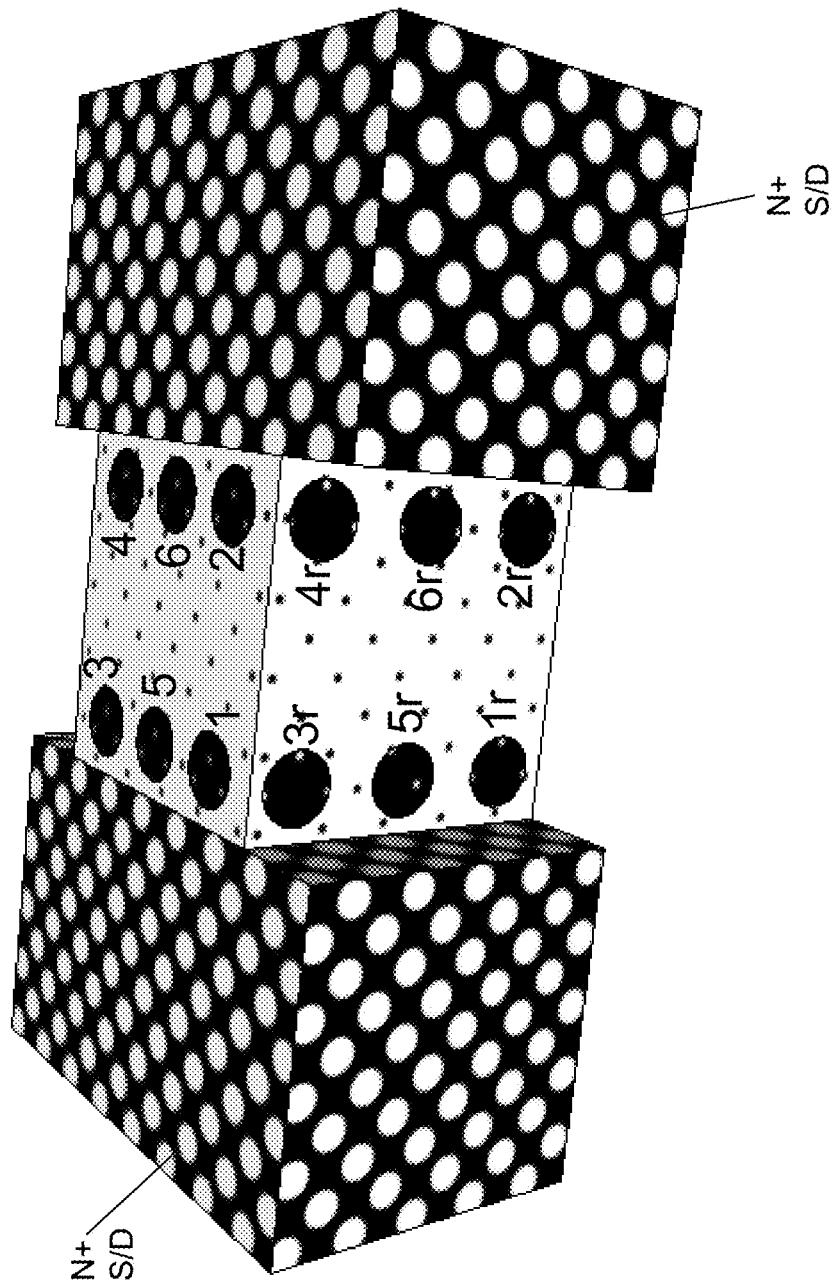
FIG. 37 is an example illustration of another memory cell basic structure.

FIG. 37 illustrates the memory cell capacity allocation with a bottom gate added to the HD-NOR structure.

The table of FIG. 35 could be modified to provide the write read conditions for each side by replacing right and left side with top and bottom accordingly. The bits sited on top are marked 1,2, 3, 4, 5, 6 those on the right side are marked 1r, 2r, 3r, 4r, 5r, 6r, and not shown are those on the right side are marked 1l, 2l, 3l, 4l, 5l, 6l. On the left side 1l, 2l are close to the bottom while 3l, 4l are close to the top.

FIG. 38A provide a table for the exemplary write or read of each of the right side memory bits of a cell n,m which is between bit-line n and bit-line n+1, and having a word-line/top gate m. The new added bottom gate is identified in the table as Bottom Gate.

FIG. 38B provide a table for the exemplary write or read of each of the left side memory bits of a cell n,m which is between bit-line n and bit-line n+1, and having a word-line/top gate m. The new bottom gate is identified in the table as Bottom Gate.

Figure 39A:
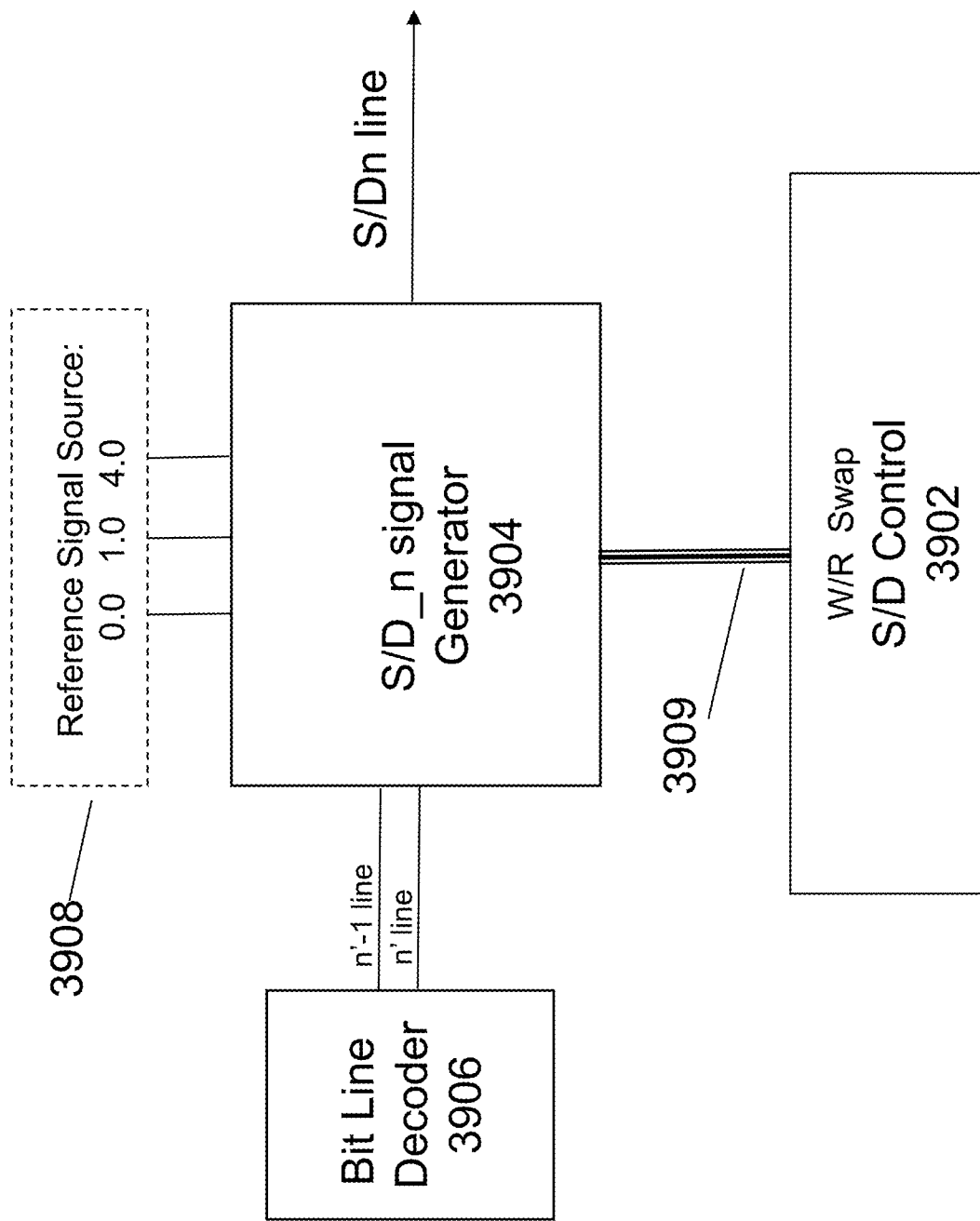
FIGS. 39A-39C are example illustrations of building blocks for the HD-NOR peripheral circuits.

FIG. 39A illustrates some exemplary building blocks for the HD-NOR bit-line related peripheral circuits. The bit-line decoder 3906 function is to at least decode an address of k bits to $2^k$ lines of which one is high while all the remainder may be low. The reference signal generator 3908 provides the required voltages needed to operate the read write operations. All the voltages suggested herein are suggested voltages for some conceptual HD-NOR. This level could be adjusted for specific designs based on the choice of materials, process flow, layer thicknesses, and feature sizes. The S/D_n signal generator 3904 may be activated by the signals on lines from the bit line decoder 3906 the n−1 line and the n line. The signal it generates would reflect if it is to generate the S/D_n signal according to the tables provided in at least FIGS. 6, 8, 10, 13A and 13B, or in the S/D_n+1 signal for the case that n−1 line is asserted. The S/D Control 3902 provides instruction to all the $2^k$ S/D signal generators unite (1404) for what operation should be performed and on which bit. The S/D Control 3902 drives a bus carrying these instructing signals which could include write read signals and swap instructions. The output signal S/Dn line would be generated based on these signals and the tables provided in at least FIGS. 6, 8, 10, 13A and 13B.

Figure 39B:
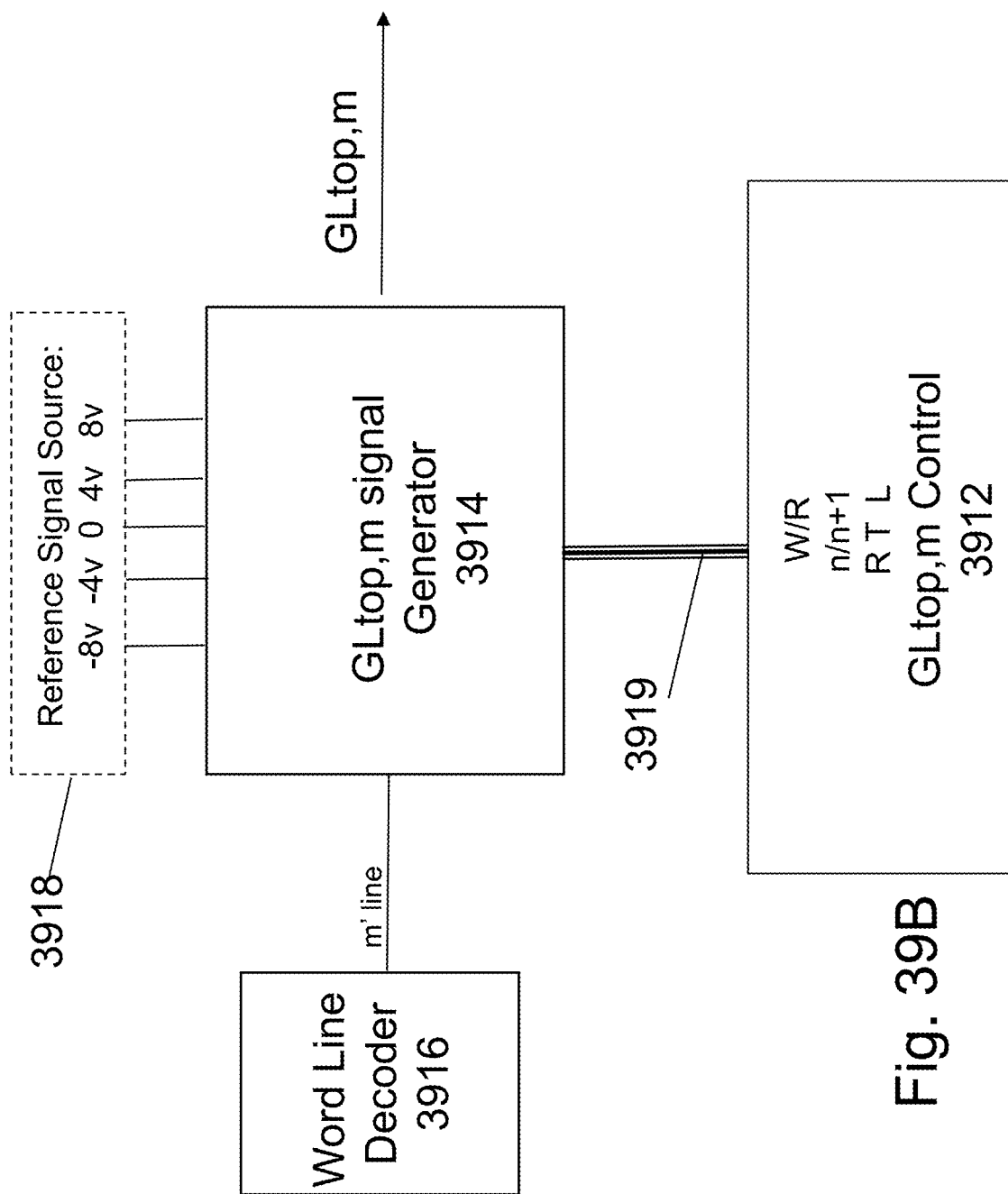

FIG. 39B illustrates some exemplary building blocks for the HD-NOR top word-lines related peripheral circuits. The Word-Line decoder 3916 function is to at least decode an address of j bits to 23 lines of which one is high while all the rest may be low. The reference signal generator 3918 provides the required voltages needed to operate the read write operations. All the voltages suggested herein are suggested voltages for some conceptual HD-NOR. This level could be adjusted for specific designs based on the choice of materials, process flow, layer thicknesses, and feature sizes. The GLtop, m signal generator 3914 is activated by signals on the m lines from the word-line decoder 3916. The GLtop,m Control 3912 provide instructions to all the $2^i$ the GLtop,m signal generators 3914 for what operation should be performed and on which bit. The GLtop,m Control 3912 drives a bus carrying these instruction signals which could include write read signals and depend of which facet is in now in action: Right signal Top signal Left (R T L) signal and n/n+1 signal (these define which facet and which of the 6 bits on that facet is now in action). The output signal GLtop,m line would be generated based on these signals and the tables provided in FIGS. 6, 8, 10, 13A and 13B.

Figure 39C:
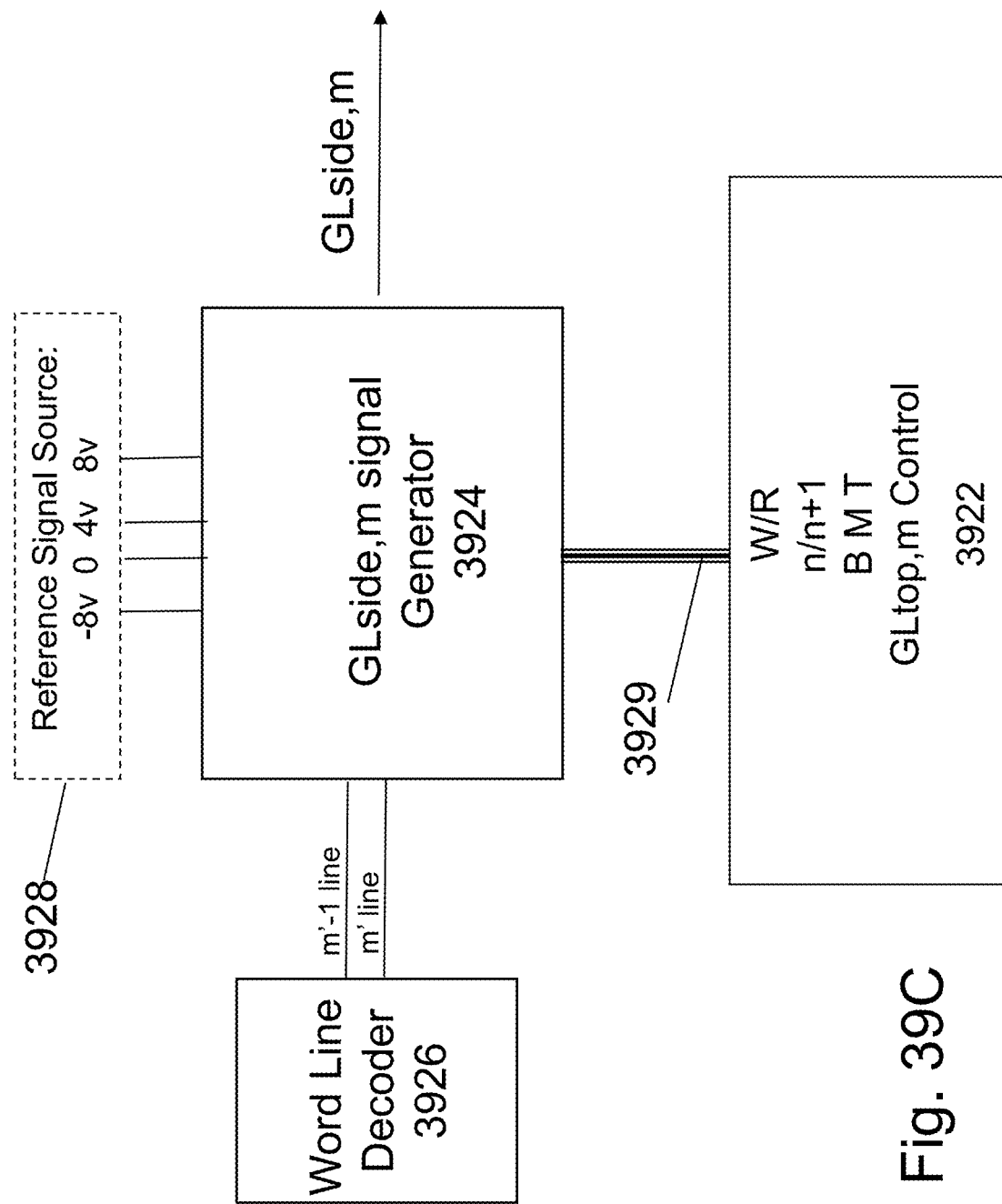

FIG. 39C illustrates some exemplary building blocks for the HD-NOR side word-lines related peripheral circuits. The Word-Line decoder 3926 function is to decode an address of j bits to 23 lines of which one is high while all the rest may be low. The reference signal generator 3928 provides the required voltages required to operate the read write operations. All the voltages suggested herein are suggested voltages for some conceptual HD-NOR. This level could be adjusted for specific designs based on the choice of materials, process flow, layer thicknesses, and feature sizes. The GLside, m signal generator 3924 may be activated by signals on the lines from the word line decoder 3926 the m−1 line and the m line 3916. Accordingly it will function to generate the right side signals or the left side signals. The GLside,m Control 3922 provides instruction to all the 2j the GLside,m signal generators 3924 for what operation should be performed and on which bit. The GLside,m Control 3912 drives a bus carrying these instructing signals which could include write, read signals and depends of which facet is in now in action: Bottom signal, Middle signal, Top signal (B M T) and n/n+1 signal (these define which facet and which of the 6 bits on that facet is now in action). The output signal GLside,m line would be generated based on these signals and the tables provided in FIGS. 31, 33, 35, 38A and 38B.

The control of the bottom gate is relatively straightforward as it may be shared for all cells and it will be activated according the tables in FIGS. 38A and 38B.

Another known enhancement technique is to control the amount of charge being trapped in a cell to allow coding of more than 1 bit based on the amount of charge. These different enhancement techniques could be combined to achieve even higher number of bits per cell. Current charge trap memories are known to achieve 3 bits per cell. A white paper titled "MirrorBit® Quad Technology: The First 4-bit-per-cell Flash Memory Spansion™ MirrorBit Quad Technology to Expand Flash Memory Innovation for Electronic Devices" was published by Spansion—www.spansion, Doc. 43704A (September 2006), incorporated herein by reference. The paper shows the use of MirrorBit in which every bit site could be programmed to one of 4 levels representing 2 bits, providing in total 4 bits per cell. Adapting such to the HD-NOR could result with a 54 bits per cell non-volatile memory structure. And the structure could be used to have some of the memory used as fast access FB-RAM for which a self-refresh mode could be added. In addition known techniques such as Probabilistic error correction in multi-bit-per-cell flash memory as described in U.S. Pat. No. 8,966,342, incorporated herein by reference, could be integrated for increased robustness of such memory operations.

A known technique to increase performance is to strengthen the bit-lines and the word-lines with upper metal layer strips running in parallel above these lines and periodically being connected to them. This could be important for large blocks of HD-NOR.

The HD-NOR as presented herein utilized SOI substrates. These substrates are more expensive than bulk substrate. The HD-NOR structure could be used as embedded memory for SoC devices. Having the SOI requirement might limit the use of the HD-NOR, as most of the SOC design are using bulk type silicon. One possible technique to overcome this limitation is to use local SOI on bulk. For example the bulk substrate would be processed with epitaxial of SiGe and then epitaxial of silicon on top of the SiGe. The high selectivity of the SiGe layer to etch in respect to silicon could allow later to sacrifice regions of SiGe and to replace them with isolation regions forming local SOI under the HD-NOR structure. Such technique has been detailed in papers by Kyoung Hwan Yeo et al. titled: "A Partially Insulated Field-Effect Transistor (PiFET) as a Candidate for Scaled Transistors" published at IEEE ELECTRON DEVICE LETTERS, VOL. 25, NO. 6, June 2004, and by Chang Woo Oh et al. in paper titled: "A Hybrid Integration of Ultrathin-Body Partially Insulated MOSFETs and a Bulk MOSFET for Better IC Performance: A Multiple-VTH Technology Using Partial SOI Structure" published at IEEE ELECTRON DEVICE LETTERS, VOL. 31, NO. 1, January 2010, the forgoing incorporated herein by reference. An optional stage to perform the step of replacing the sacrificial layer with isolation could be immediately after etching the unused P regions 2729 as is illustrated in reference to FIG. 27G herein.

Another of sacrificial layer could be a porous layer formed by an anodizing process followed by an epitaxial step as was developed by Cannon under the ELTRAN process for the purpose of manufacturing SOI wafers. The porous layer could later be replaced or fully oxidized. The anodizing process for porous formation could be made very selectively by proper doping. U.S. Pat. No. 8,470,689, incorporated herein by reference, teaches such use selectivity for forming a multilayer structure. This concept could be adapted to form the back gate and isolation with very good layer control for the formation of an 18 bits HD-NOR structure.

Another alternative is first to deep implant to form the N type back gate, than light implant the top layer to form minimal N type but high enough to protect it from the anodizing process. Then open holes in the designated locations for cell isolation etch—within regions 2729 as is illustrated in reference to FIG. 27G. Then anodize the wafer forming the porous sacrifice layer for the future bottom gate and reducing the need for an epitaxial step. The channel area would later be doped to make them P type.

FIG. 40 illustrates an exemplary architecture of a HD-NOR array. It could be a standalone device structure or embedded within a larger SoC. It illustrates a modular memory structure of 64 memory blocks 4001, 4002 with the peripheral circuits built-in a corresponding modular structure with 8 top units Pt_i to control the word-lines and additional 8 bottom units Pb_i to control the word-lines, and 8 left side units Pl_i to control the bit-lines and 8 right side units Pr_i to control the bit-lines.

These could be used to drive the control lines from both sides to improve performance and reduce variability.

In addition it could be used as redundancy so single control unit failure could be recovered.

This architecture could also support additional modes of operation.

The structure could be designed to allow independent access to 8 blocks provided none of them share the Peripherals circuits.

The structure could be designed to support synchronized access to up to 8 units sharing the same row or sharing the same column reducing access power and still provide multiple bits.

The structure could be designed to support on chip transfer from the non-volatile portion to the high speed FB-RAM portion or the other way. Such transfer could be done in parallel to or from 8 blocks reducing time and power for such transfer. Such capabilities could allow high speed access with low power operating mode. So data is transferred to the FB-DRAM designated block for fast access but could be stored back into the NOR NV section for sleep or power down.

The corners Clt, Crt, Clb, Crb could be used for device top level control for these operating modes, to generate the special voltage source required for read and write, and for interface to external devices.

The HD-NOR was previously presented herein on an SOI wafer/substrate. Alternatively it could be constructed on bulk borrowing the isolation concept used in modern FinFET technology. In such bulk implementation it would be challenging to form the bottom gate resulting with the 10 bit per cell option. The optional use mode of Floating Body DRAM would also be more challenging to achieve. Yet by adding under the cell isolation a two state memory of the type developed by Zeno Semiconductor, as disclosed in U.S. Pat. No. 9,030,872, incorporated herein by reference, could be implemented.

Another alternative is to build special SOI-like wafers to support a full 6 bits in the bottom facet. Such special M-SOI wafer could then be used to build the HD-NOR on top and aligned to the backside word lines.

FIG. 41A illustrates a standard SOI substrate, which may include substrate 4100, BOX 4110 and silicon 4120. FIG. 41B illustrates the formation of an HD-NOR structure 4130 in silicon 4120.

FIG. 41C illustrates structure of a very thin or ultra thin buried oxide SOI substrate, such as is used for FD-SOI which may include substrate 4101, thinBOX 4111 and silicon 4121. FIG. 41D illustrates the structure after doping a designated back gate 4140 and activating it, utilizing, for example, ion implantation and RTP annealing. FIG. 41E illustrates the structure after forming the HD-NOR structure 4150 and contact 4160 to the back gate 4140.

Figure 41F:
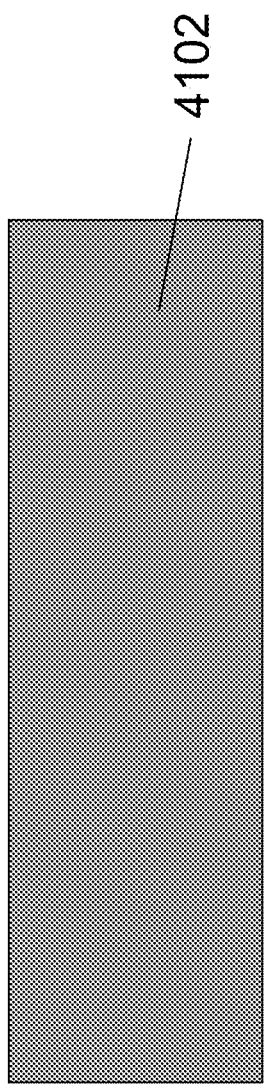
FIGS. 41F-41J are example illustrations of the formation of an M-bulk wafer and finished structures.
Figure 41G:
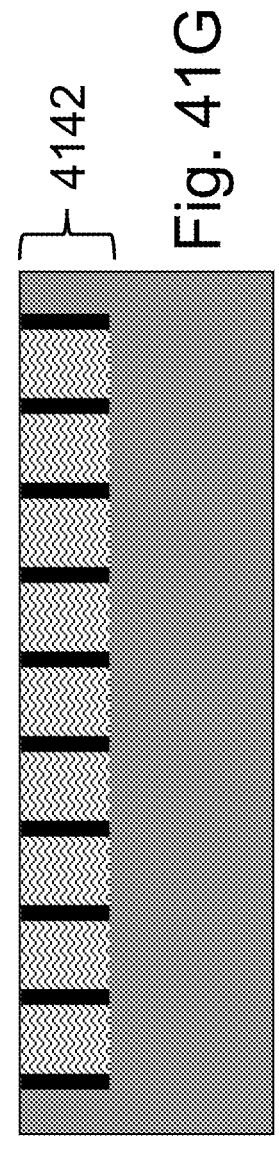
Figure 41H:
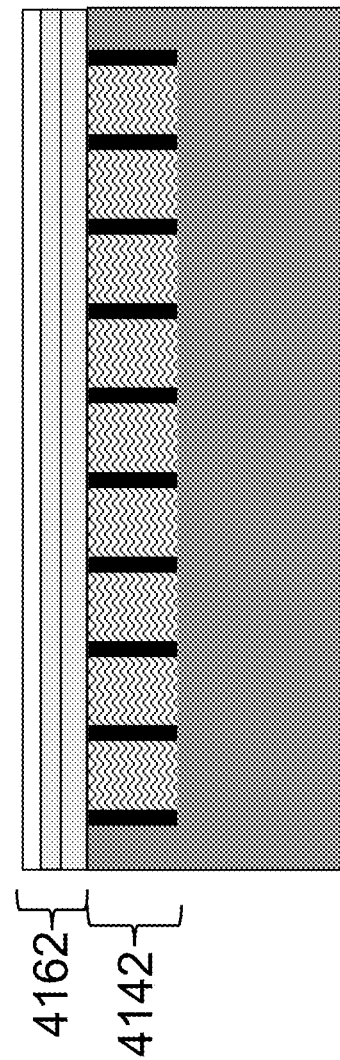
Figure 41I:
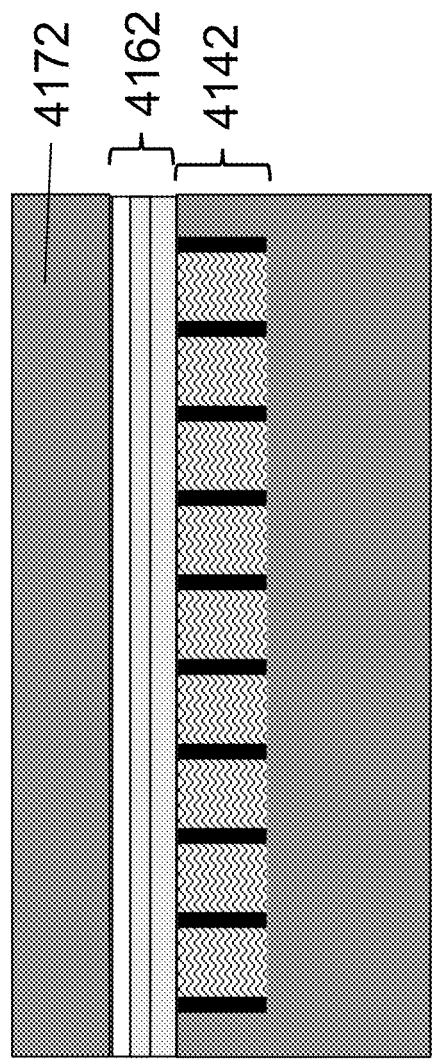
Figure 41J:
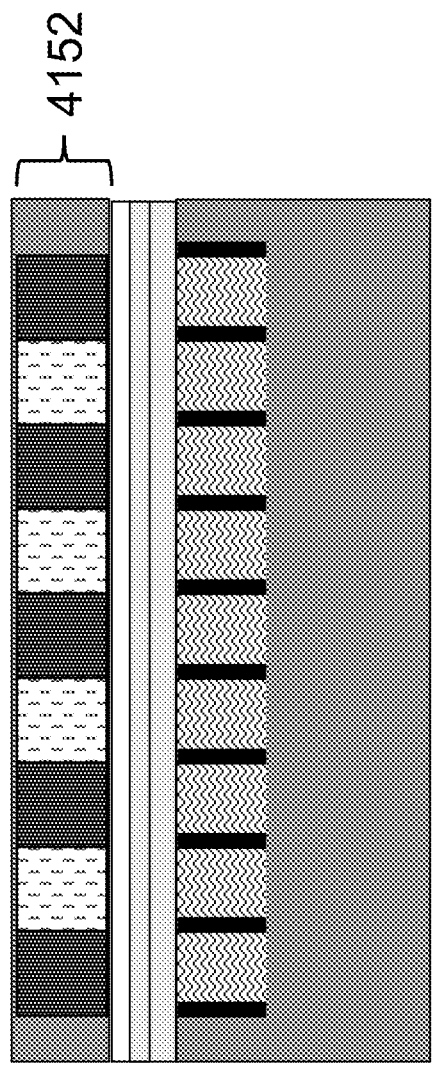

FIG. 41F illustrates structure of bulk substrate 4102. FIG. 41G illustrates the formation of back-gate grid 4142 which would also be the back word-lines. The gate material could be chosen from a range of options such as polysilicon, N type silicon, metals such as tungsten which would withstand high process temperature processing of the following processing. The grid of back-gates could be isolated by oxide or other isolation materials. FIG. 41H illustrates the addition of the O/N/O layers 4162 for the back gate grid 4142. FIG. 41I illustrates the structure after bonding a transferred monocrystalline silicon layer 4172. The transfer could utilize ion-cut or ELTRAN or any other layer transfer technique. The O/N/O layers 4162 could be split between the base structure of FIG. 41H and the transferred layer to facilitate the bonding. FIG. 41J illustrates forming the HD-NOR 4152, which may include the 24 bit per cell option. The connection to the back word-lines (back gate grid 4142) may be done at the line out edges.

Another alternative is to provide an HD-NOR structure. For example, as illustrated in FIG. 27J previously herein, as a 'Memory Substrate'. Thus a vendor can fabricate the Memory Substrate, cover with isolation and then transfer on top of a bare wafer using ion-cut, ELTRAN or other layer transfer technique. Such 'Memory Substrate' could be a useful fabric for SOC applications. Designers could customize the underlying memory fabric by etching through to break it into memory blocks per their need. The memory peripherals could be fabricated on the upper layer and then using through layer via connects to the bit-lines and word-lines. An EDA tool with HD-NOR peripherals library and memory compiler could be tied together to support a designer in integration for an SoC product. FIG. 42A illustrates a reference SOI wafer which may include substrate 4200, BOX 4210 and silicon 4220. FIG. 42B illustrates it after forming multi-core circuits 4290 on it, for example, of processor blocks—CPU and memory blocks—MEM.

Figure 42C:
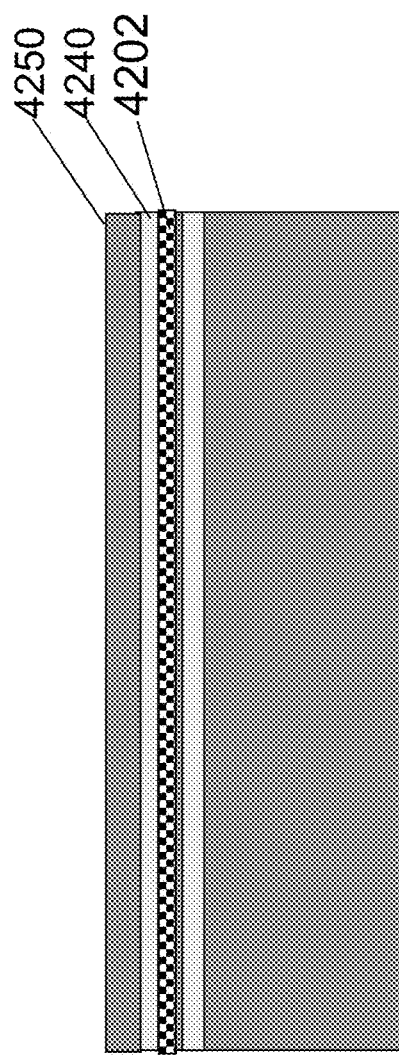
Figure 42D:
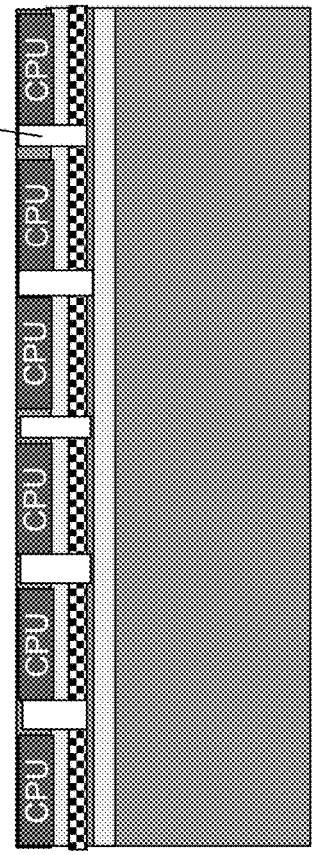
Figure 42E:
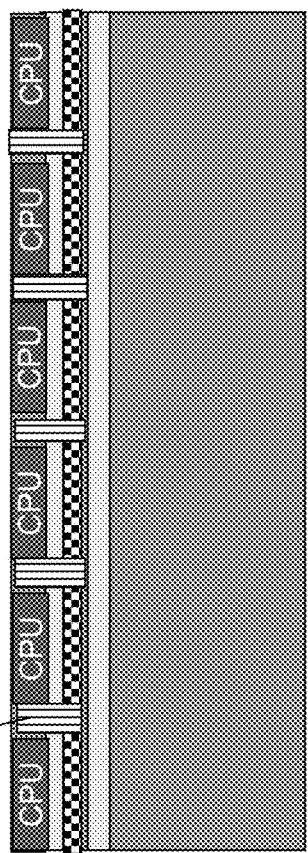

FIG. 42C illustrates a Memory SOI substrate with generic HD-NOR fabric 4202 built inside, and may include an isolation oxide layer 4240 on top of the HD-NOR fabric 4202 and a monocrystalline silicon layer 4250 on top. These may be formed by layer transfer. The structure may be similar to those presented in FIGS. 41E and 41I. FIG. 42D illustrates adding the multi-cores but just of processor block—CPU and etching trenches 4204 to customize the generic memory terrain and to open access into it. FIG. 42E illustrates adding the peripheral circuits 4260 for controlling the generic underlying memory block and the connections 4206 to the processors.

An alternative system approach could be to use the custom logic 4265 as the base and to bond the NOR fabric 4202 on top of the logic circuit and etch holes 4208 in the NOR fabric 4202 for the adding of connections to the circuits underneath, as illustrated in FIG. 42F. In such alternative, the NOR fabric alignment precision would be based on the wafer bonder precision, which is far less precise than lithographic alignment (~200 nm vs. 2 nm). Yet, the NOR fabric is a repeating fabric and techniques described in U.S. Pat. No. 8,405,420, incorporated herein by reference, could be used to allow accommodation of the bonder misalignment and still form an effective 3D system integration.

Figure 44:
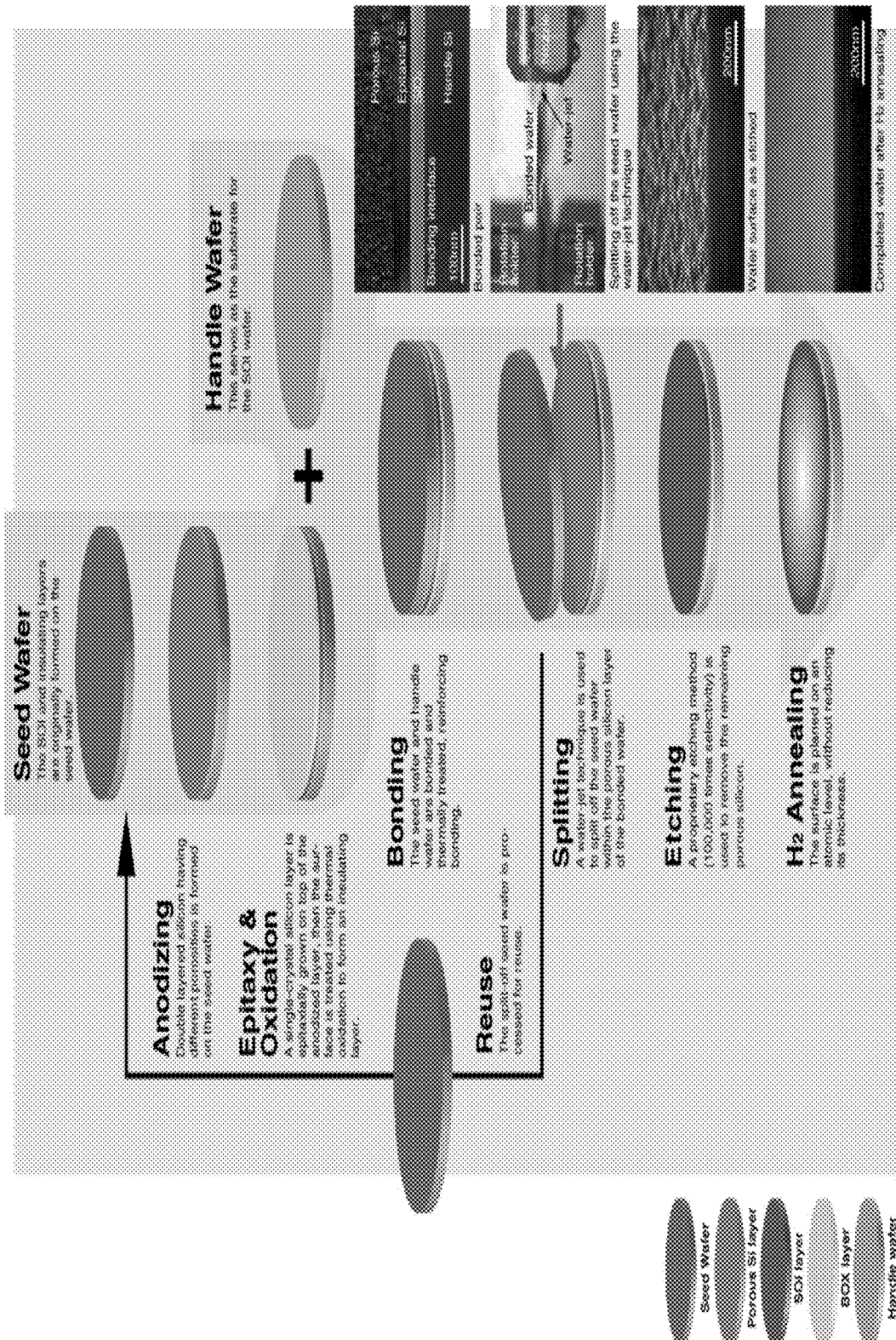
FIG. 44 is an example illustration of the general top-level flow of the ELTRAN process.

In another alternative instead of the base wafer being an SOI wafer as is illustrated in FIGS. 41A-41B, a donor wafer such as illustrated in FIG. 18A could be used. The wafer could include a porous structure 1812/1814 and a mono-crystallized layer 1820 on top of it. Such donor wafer fabrication could use a modified flow of the one developed by Cannon, named ELTRAN, as detailed in a paper by T. Yonehara, entitled "ELTRAN® (SOI-Epi Wafer™) Technology", published in Chapter 4, pp. 53, Silicon Wafer Bonding Technology for VLSI and MEMES applications, INSPEC, IEE, 2002, incorporated herein by reference. The general top-level flow of the ELTRAN process for the fabrication of SOI wafer is illustrated in FIG. 44.

As illustrated in FIG. 43A, a donor wafer 4310 may be constructed. Lower porous layer 4312 and upper porous layer 4314 may be formed by means of anodization on a substrate 4300 such as, for example, a mono-crystalline silicon wafer. The anodization process may involve passing a current through a solution of HF and ethanol with the single-crystal silicon wafer as the anode in order to form microscopic pores of diameters of a few nm on the surface of the wafer at a density of about $10^{11}$/cm$^2$. The reaction occurs at the far end of the pores, meaning that the pores progressively elongate into the inside of the wafer. The structure of the porous silicon can be controlled by the concentration of the solution, the current density and the resistivity of the silicon. Moreover, the thickness of the porous silicon layer can be controlled by the length of time for which the anodization is carried out. The easiest way of controlling the porous structure is to vary the current density. By doing this a porous layer that has a multi-layered structure, for example, lower porous layer 4312 and upper porous layer 4314, may be formed. In this example, the layer of porous silicon closest to the top surface, upper porous layer 4314, was formed in the base silicon wafer using a low current density, and then after this the current density was raised and a second layer of different/higher porosity was formed (lower porous layer 4312). The upper layer of porous silicon upper porous layer 4314 contains microscopic pores of diameter a few nm, and below this is formed lower porous layer 4312 for which the pore diameter is a few times greater than the upper porous layer 4314.

Dry oxidation of the porous silicon may be carried out at a low temperature of about 400° C. This results in oxidization of about 1~3 nm of the inner walls of the pores, thus preventing the structure of the porous silicon from changing, such as bending or relaxing for example, under a subsequent high-temperature treatment.

Baking may be carried out at about 1000~1100° C. in a hydrogen atmosphere in a CVD epitaxial reactor. Hydrogen pre-baking causes the pores in the porous silicon surface to close up to the extent that the density of these pores goes down from about $10^{11}$/cm$^2$ before to less than $10^4$/cm$^2$, and hence the surface is smoothed. To reduce defects, a pre-injection method could be used whereby a small additional amount of silicon is provided from the gas phase (for example as silane) during the hydrogen pre-baking and surface diffusion is made to occur so that the remaining pores in the surface of the porous silicon close-up.

After the pre-injection, epitaxial growth may be carried out at temperatures of about 900~1000° C. The epitaxial layer illustrated as epi layer 4320 in FIG. 43B could be grown to a few nm thick layer, for example, such as about 5 nm or about 10 nm; or to a moderately thick layer, such as, for example, about 100 nm or about 200 nm; or to a relatively thick layer, such as, for example, about 1 micron, or about 3 microns thick. The donor wafer 4310 would then have a silicon layer, epi layer 4320, on top of a cut structure 4332. Cut structure 4332 may include the porous layers, such as lower porous layer 4312 and upper porous layer 4314. Epi layer 4320 may be monocrystalline silicon. Cut structure 4332 may include more than 2 layers (for example three differing pore densities) or may be accomplished by a single layer of changing characteristics, for example, a linearly (or non-linear) changing porosity, or a combination of both. Donor wafer 4310 may include substrate 4300, epi layer 4320 and cut structure 4332, which may include lower porous layer 4312 and upper porous layer 4314. The process may also be modified to leave an edge pore exclusion zone (not shown) including and back from the wafer edge that would not receive the anodization and thereby result in no pores being formed. This could be useful for at least mechanical strength, scaling, selectivity objectives. The edge pore exclusion zone may include widths of 1 um to 5 mm and may include/cover the wafer edge, or be pulled back from the edge. The edge pore exclusion zone may also be designed to not be a continuous ring around the wafer's edge, but rather include breaks/regions in the pore exclusion zone ring of porous silicon to improve the future cleaving process, giving direct or near-direct pore access from the wafer edge at select points/regions/cross-sections, which may result in fewer defects.

A key advantage of the porous base layer transfer technology is the ability of acquiring a base wafer with 'cut' porous structure built-in, run a conventional process including high temperature steps such as doping activation and then later bonds it to a target wafer and then cut.

FIG. 45A illustrates a donor wafer with silicon base substrate 4500, porous double layer cut structure 4532 and top silicon 4520. FIG. 45B illustrate the structure after forming the NOR structure on the top silicon 4520. Resulting with base substrate 4500, cut structure 4532, and top NOR structure 4530 with 3 active facets per cell, which is similar to 1150 or the structure illustrated in FIG. 21 herein.

Figure 45C:
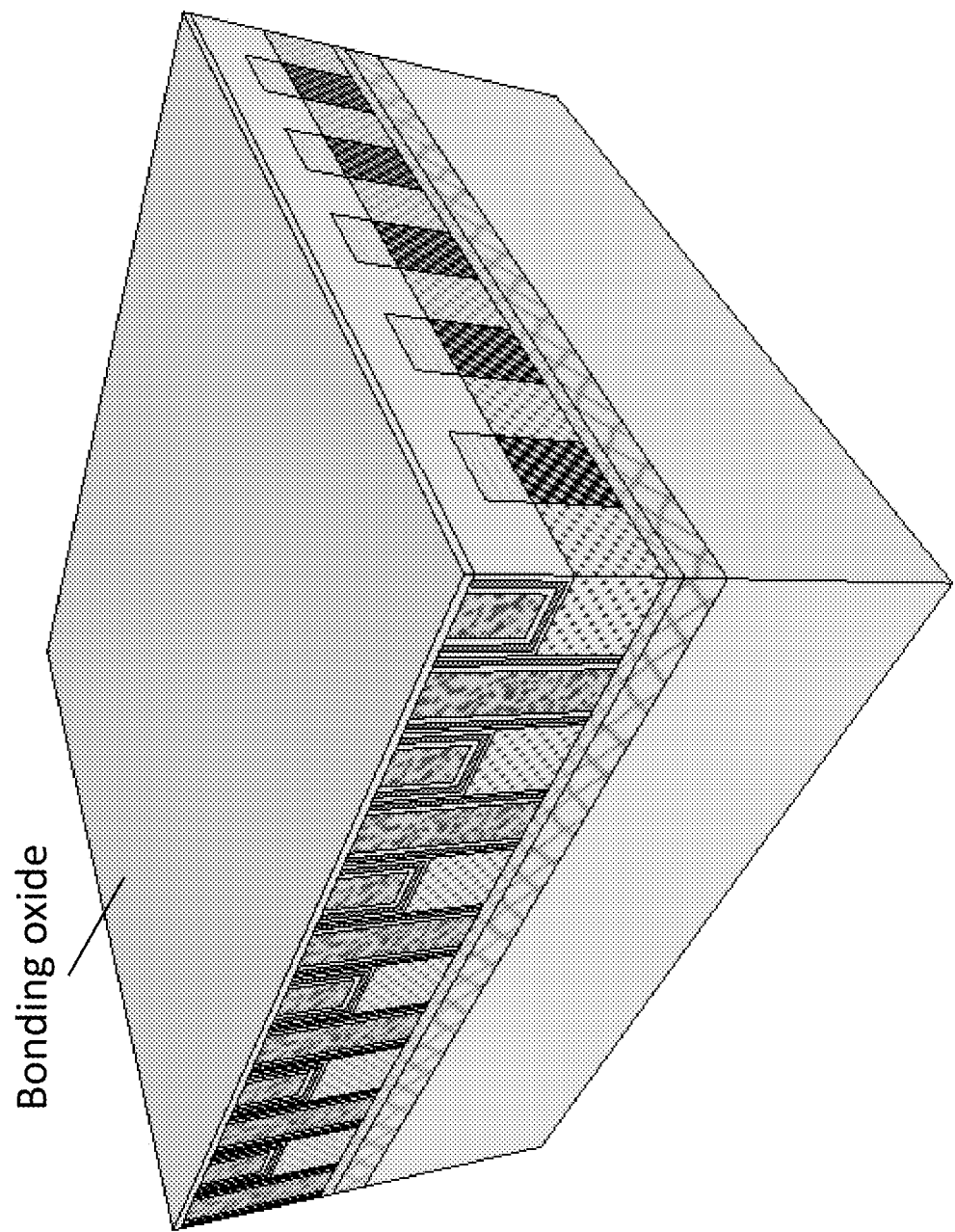
Figure 45D:
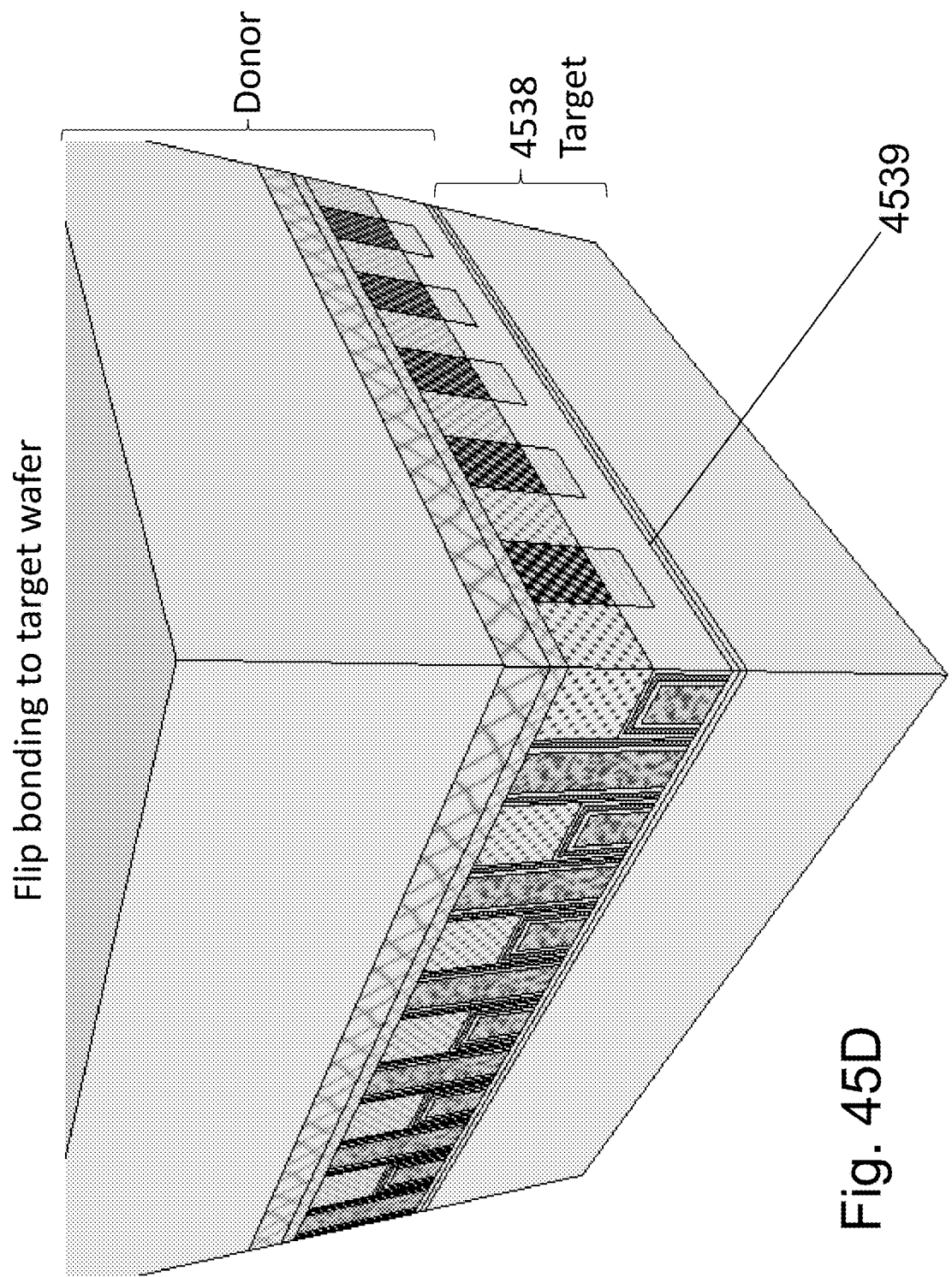

FIGS. 45C and 45D illustrate the structure after flipping it and bonding it on top of a wafer with a top oxide layer, and then cutting the porous cut structure 4532, lifting off the base substrate 4500 which could be sent to recycle and reuse.

Figure 45E:
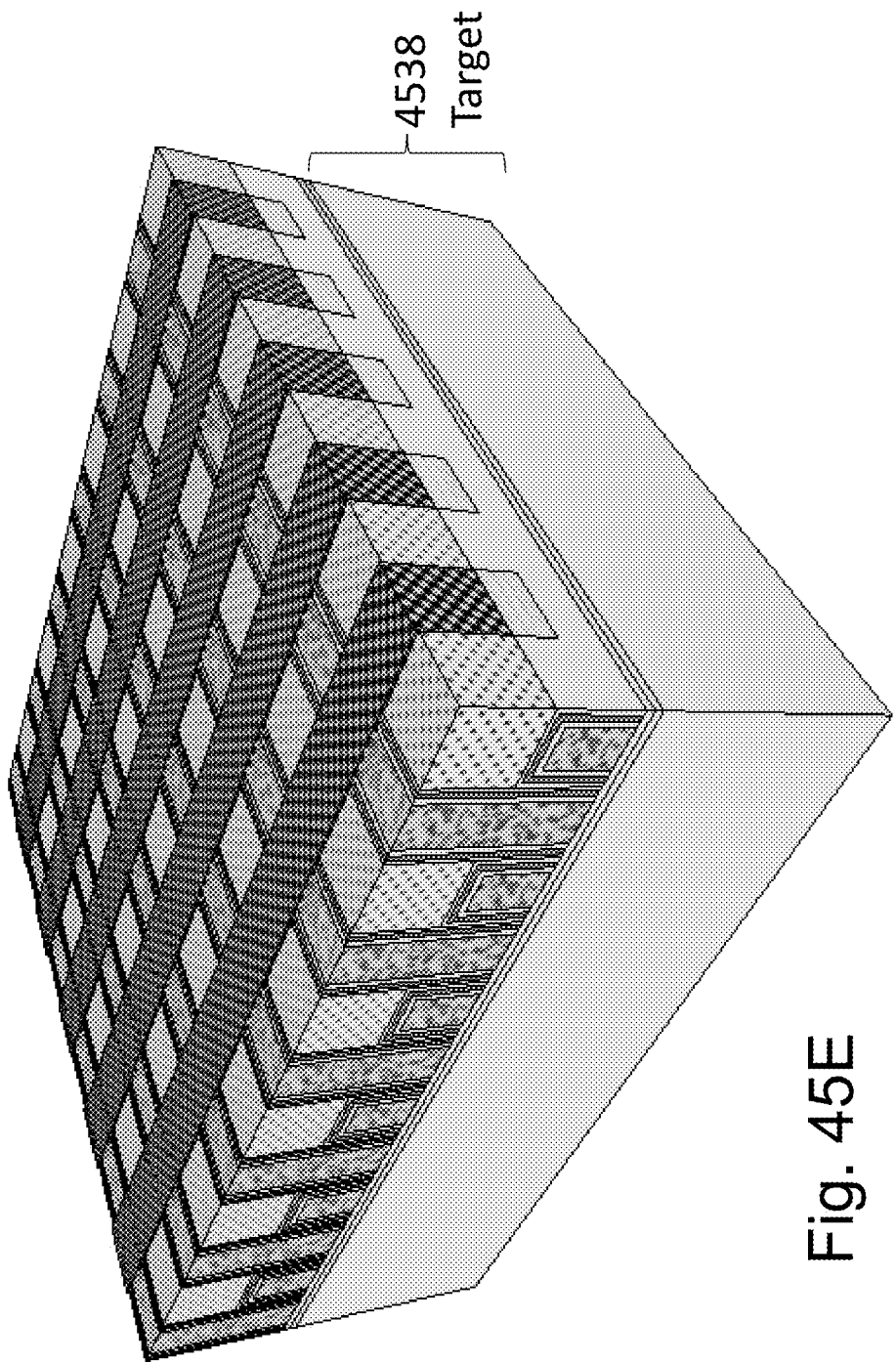

FIG. 45E illustrates the structure after cleaning off the porous residues.

Figure 45F:
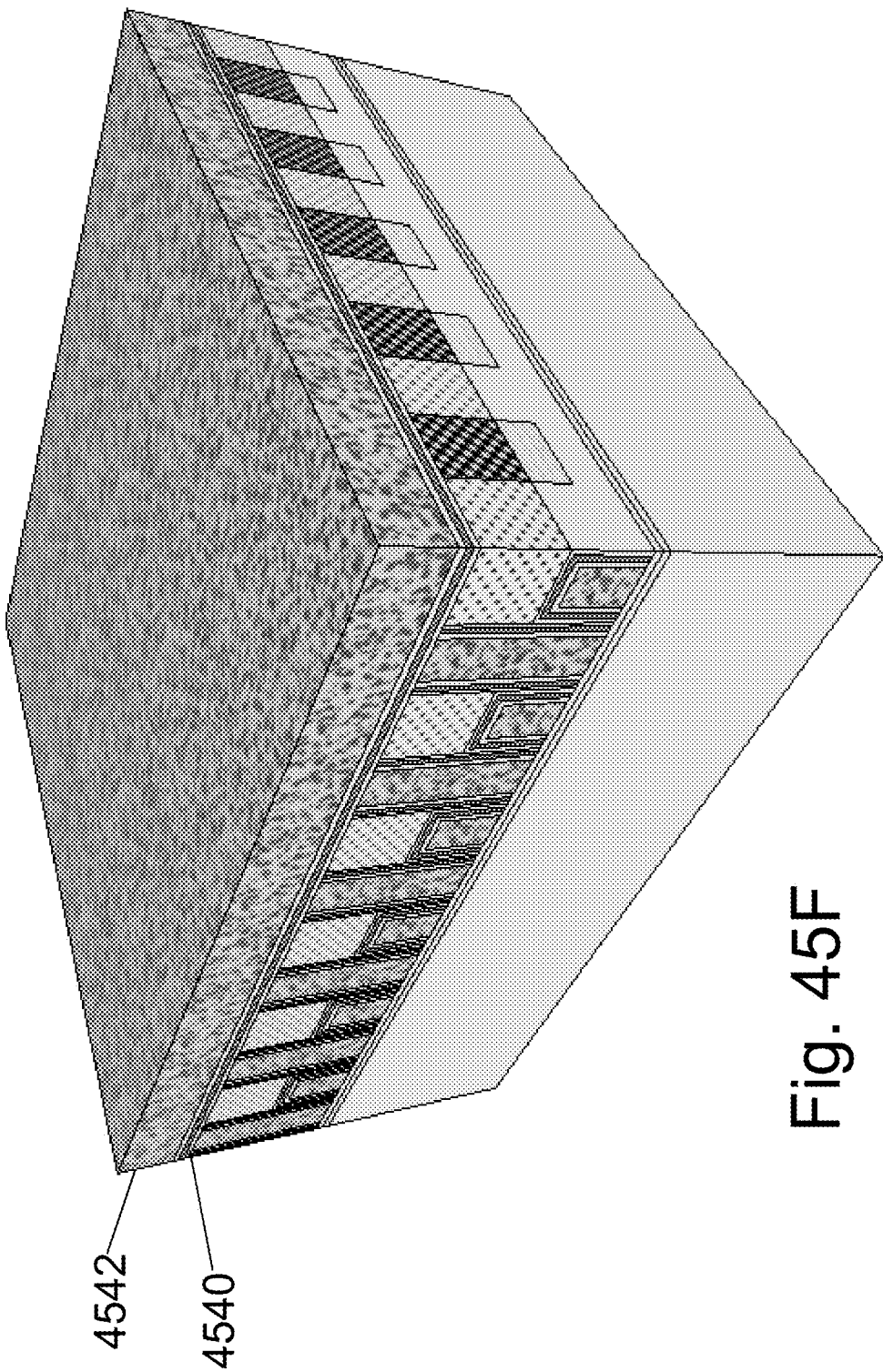

FIG. 45F illustrates then adding O/N/O layers on the now exposed 'back-side'.

Figure 45G:
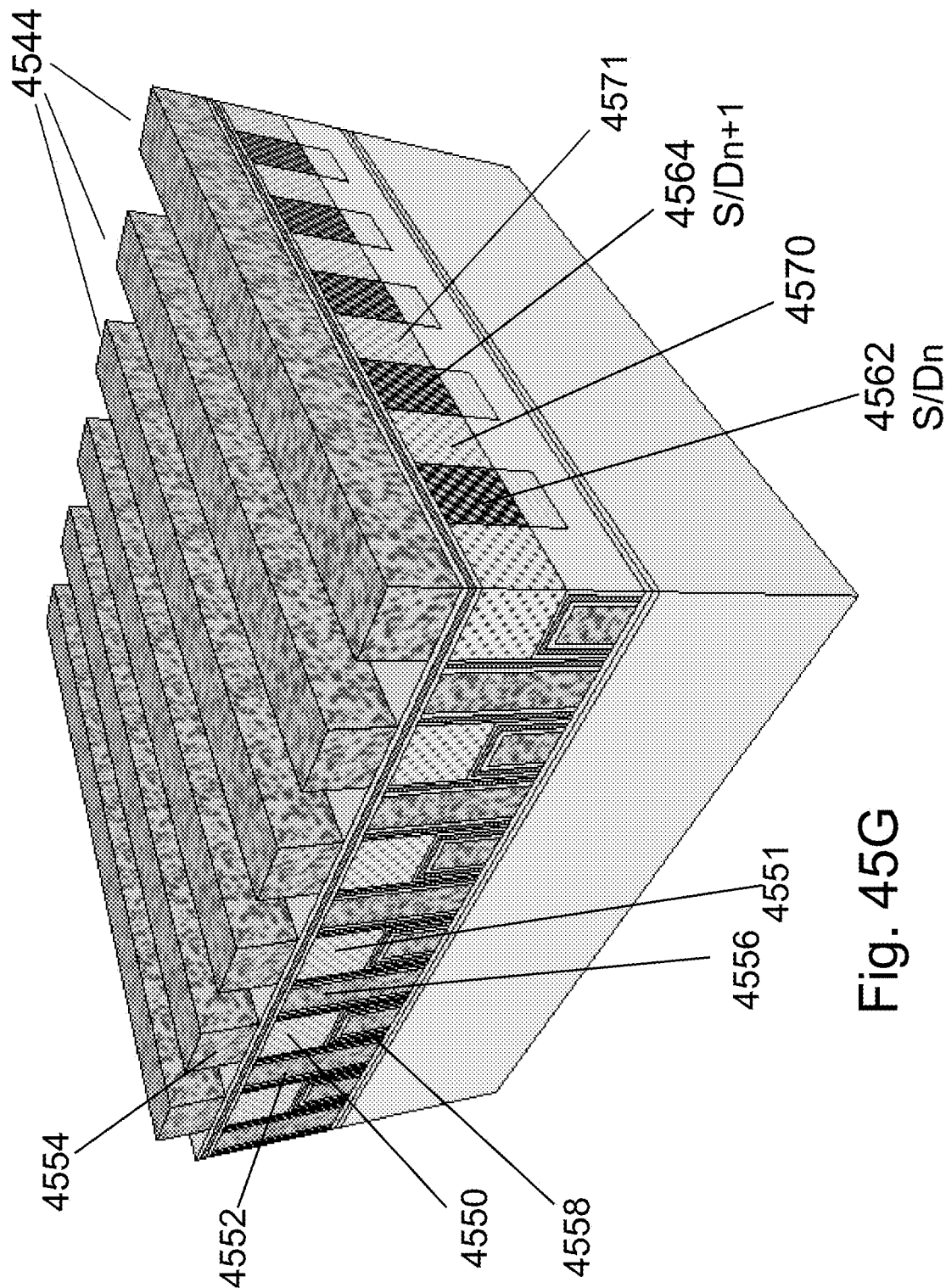

FIG. 45G illustrates then forming gates for the fourth channel facet resulting in four facets each with control gate (C-Gate), right gates (R-Gates) and left gates (L-gates). Thus, channels 4550 are surrounded with gates 4552, 4554, 4556, 4558 to all four facets that are not connected to the S/D lines.

An alternative fabrication technique is to not use porous base donor wafer but rather use a bulk wafer and form the porous cut layer as part of forming the 2D NOR structure. Specifically, following the step of etching the P regions for channel isolation as illustrated in FIG. 2F and FIG. 2G herein, place the entire structure into an anodizing process forming the porous cut structure underneath through the openings 229. To avoid anodizing the active channel due to the isotropic nature of the anodizing etch process, the O/N/O layers 224, or part of it, could be first deposited then a short RIE etch could be used to reopen the bottom of 229 and then an anodizing step could be used to form the porous structure underneath saving the need for epitaxy of layer 4520. In such an alternative then after flipping, bonding, and cut the now exposed back side needs to be planarized, using, for example CMP or $H_2$ annealing. After which O/N/O and fourth gate could be formed.

Additional alternative is to increase the number of bits per facet by utilizing techniques such as non-uniform channel as presented in a paper by Gu Haiming et al. titled "Novel multi-bit non-uniform channel charge trapping memory device with virtual-source NAND flash array" published in Vol. 31, No. 10 Journal of Semiconductors October 2010, incorporated herein by reference.

Additional alternative is to increase the number of bits per facet by utilizing techniques such as advanced charge trap layer such as one utilizing ambipolar polymer as presented in a paper by Ye Zhou et al. titled "Nonvolatile multilevel data storage memory device from controlled ambipolar charge trapping mechanism" published in SCIENTIFIC REPORTS |3: 2319 | DOI: 10.1038/srep02319, incorporated herein by reference.

Additional alternative is to increase the number of bits per facet by utilizing techniques such as advanced charge trap layer such as one utilizing multilayer silicon nanocrystal as presented by T. Z. Lu et al. in a paper titled "Multilevel Charge Storage in Silicon nanocrystal Multilayers" published in Appl. Phys. Lett. 87, 202110 (2005), incorporated herein by reference.

Additional alternative is to increase the number of bits per facet by utilizing techniques such as advanced charge trap layer such as one utilizing multi-layered Ge/Si nanocrystals as presented by Guangli WANG et al. in a paper titled "Charge trapping memory devices employing multi-layered Ge/Si nanocrystals for storage fabricated with ALD and PLD methods" published in Front. Optoelectron. China 2011, 4(2): 146-149, incorporated herein by reference.

For one skilled in the art, other variations or alternatives known for charge trap memory with the required corresponding enhancements to the channel or to the charge trap—O/N/O layers may be employed.

Figure 46:
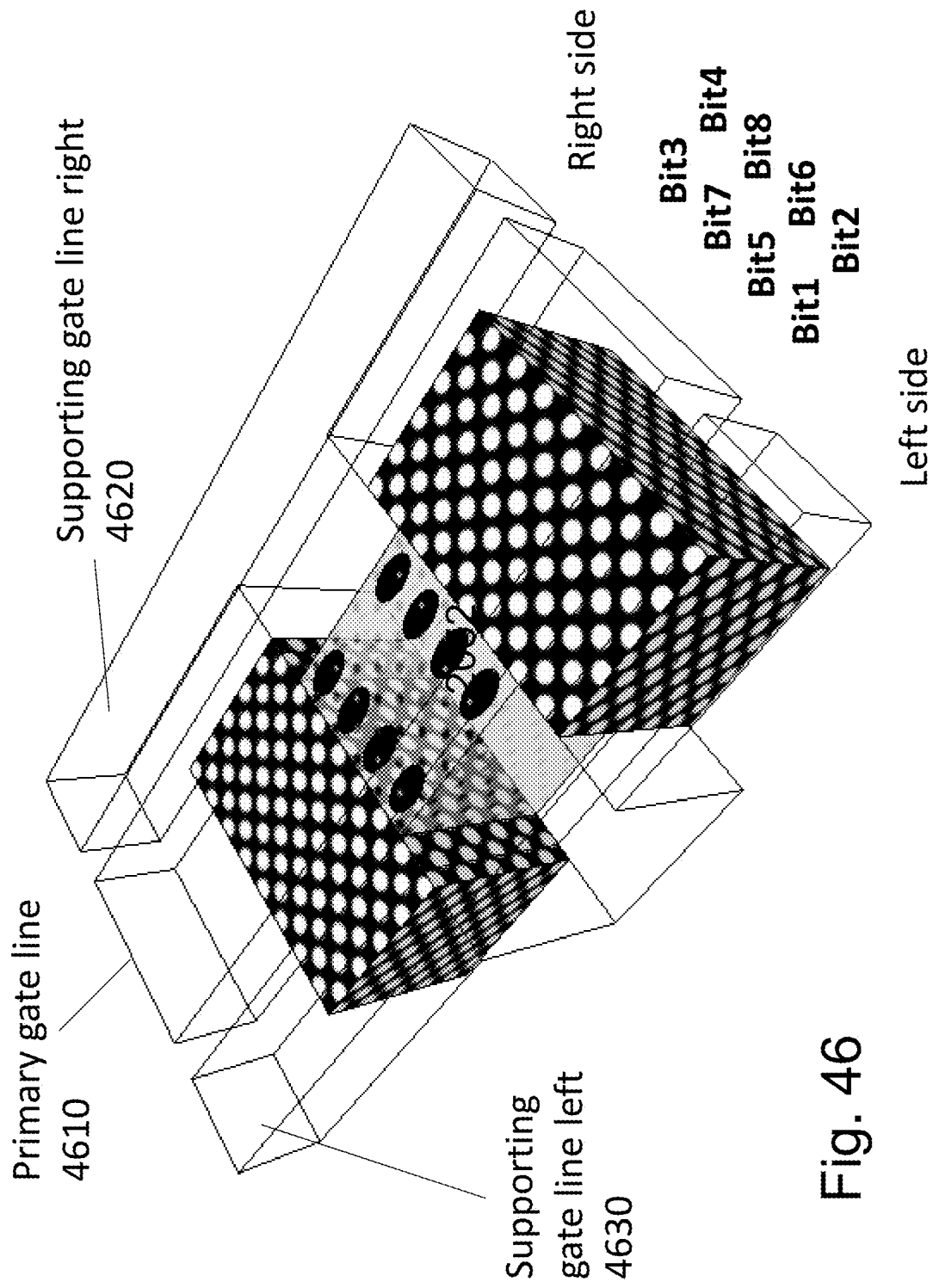
FIG. 46 is an example illustration of a channel with a facet holding 8 bits.

FIG. 46 illustrates 8 bit naming and location on a facet. Each of the four facets have a primary gate line 4610 which we can call C-Gate, a supporting gate line right 4620 which we call R-Gate, and supporting gate line left 4630 which we can call L-Gate. Reference to FIG. 20F, it could be:

C-Gate 2052 with R-Gate 2058 and L-Gate 2054 or alternatively,
C-Gate 2054 with R-Gate 2052 and L-Gate 2056 or alternatively,
C-Gate 2056 with R-Gate 2054 and L-Gate 2058 or alternatively,
C-Gate 2058 with R-Gate 2056 and L-Gate 2052 FIG. 22 illustrates the operating condition for that storage facet. The read is by measuring the current (Vth) between the S/Dn 2062 to S/Dn+1 2064 shown in FIG. 20F.

Engineering the memory peripheral circuits for the memory matrix including the circuits to generate the required signals for the memory control lines and the sense circuits to sense the memory content is a well-practiced memory engineering task. The memory structure presented herein adds some less common variations as a word-line controlling a gate may be function as a R-Gate or as C-Gate or as L-Gate depend on the specific channel presently in action. In the following we review the high level architecture for such a memory control circuit.

The following discussion would be for a specific one of the many alternative architecture options—of an 8 bit per facet as illustrated in FIG. 20F and FIG. 46. However, this methodology may be applied to a variety of architecture options.

As an alternative the gate control lines of the cells adjacent to a channel which is being written to or read from could be biased to a negative voltage such as −4 v to disable these adjacent channels. For example, if in reference to FIG. 3 a GLtop,m is active as being the control gate (C-Gate) for the channel underneath it and GLleft,m is acting as L-Gate, then GLtop,m+1 and not shown GLbottom,m+1 are both being set to −4 v negative (which still do not erase), and also GLleft,m+1 could be set to −4 v negative, so the channel underneath GLtop,m+1 is deactivate to avoid disturb.

FIG. 47 illustrates the table of write read conditions to form 8 independent memory locations per facet resulting with 32 memory locations per channel.

Figure 48:
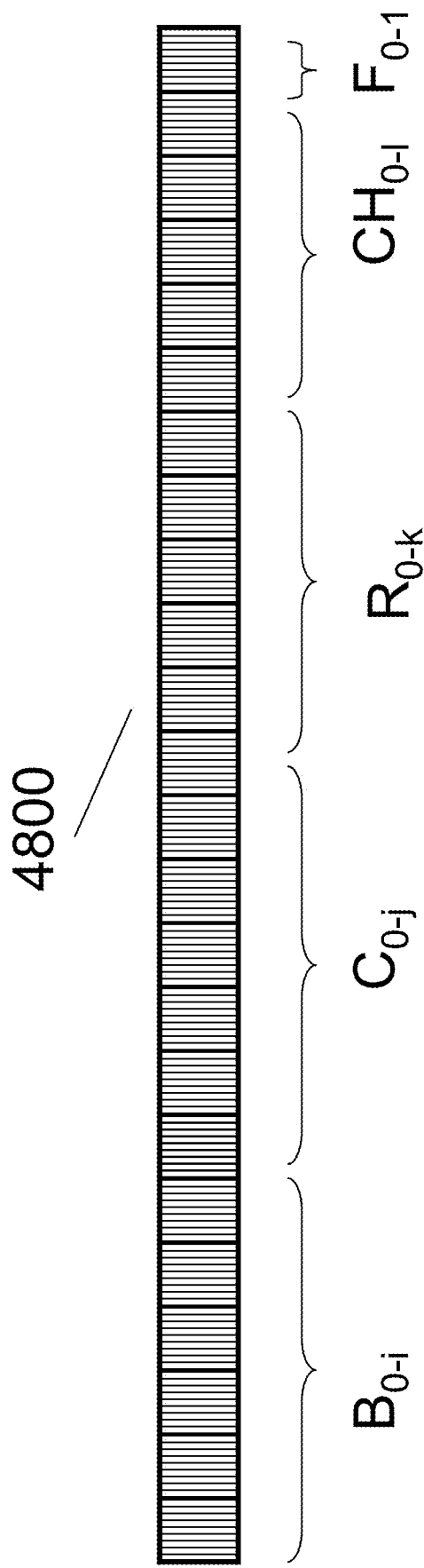
FIG. 48 is an example illustration of a memory addressing format.

FIG. 48 illustrate a memory addressing format 4800 which could include 0-2 bits to select the specific facet ($F_{0-1}$), a few bits to select the specific Channel ($CH_{0-1}$), a few bits to select the specific Row ($R_{0-k}$), a few bits to select the specific Column ($C_{0-j}$) and a few bits to select the specific memory Block ($B_{0-i}$). The decoding function of the Block is straightforward.

FIG. 49A illustrates block diagram of the circuit controlling each of the bit-lines—S/D line 1 in which 1 denotes the active channel column. The decoder 4906 will assert one line of the 1 lines for each column. The signal generator 4908 will provide the required signals that could be applied to the S/D line. The signal generator 4904 will activate signals only to the S/D line 1' for 'left'-S/Dn function activated by 1' or 'right'-S/Dn+1 function activated by 1'+1 to provide the proper signal to the selected channel according to the table of FIG. 22 and the operation control as signaled by the S/D control 4902 to activate write read or erase.

Figure 49B:
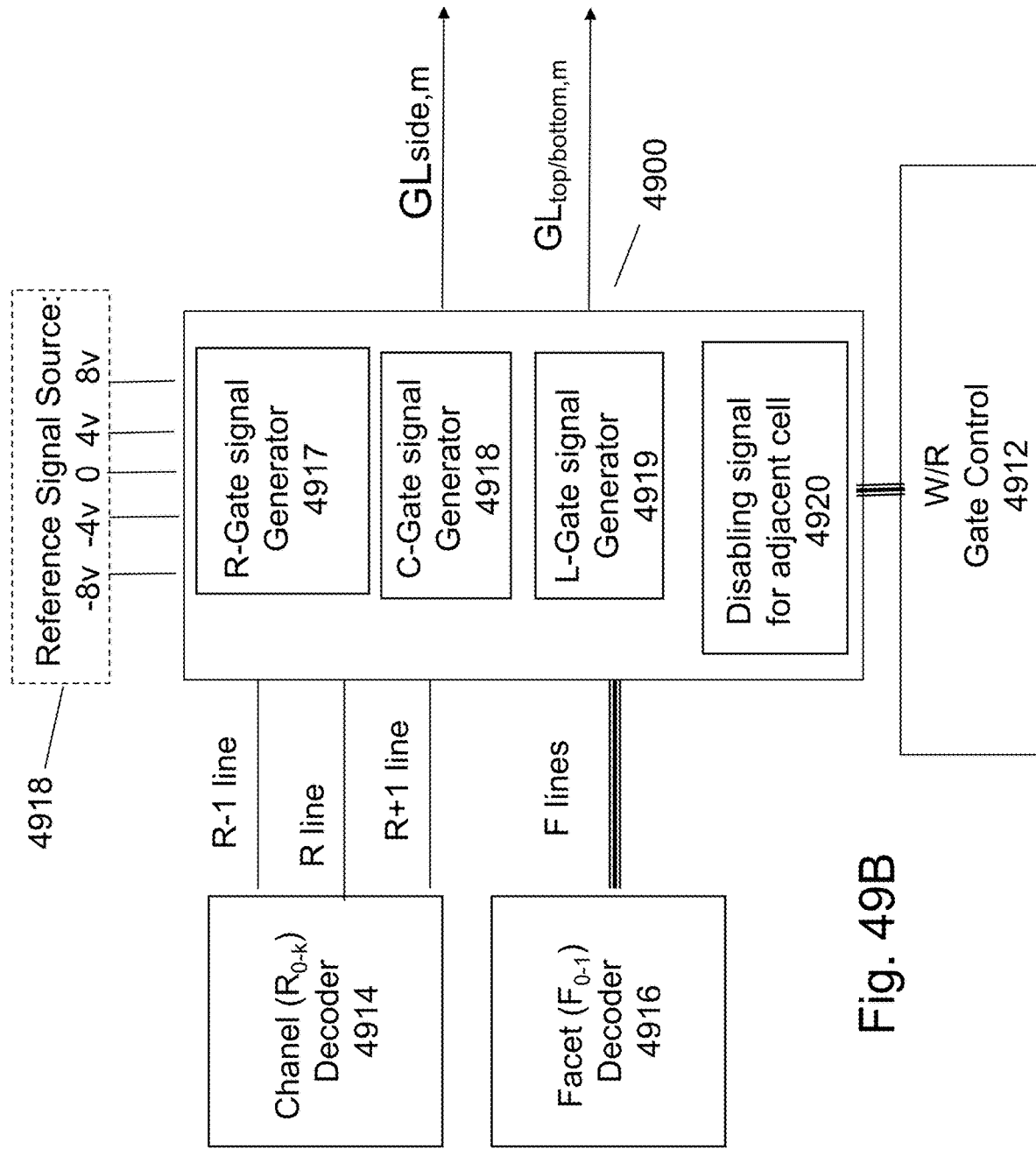

FIG. 49B illustrates a general block diagram of the circuits to control the gate-lines. Each gate-line could function as R-Gate, C-Gate or L-Gate according to the Chanel decoding and the Facet decoding. The Side-Gate-Lines could affect two adjacent channels so the Top/Bottom Gates could help select the active channel and disable the adjacent non-selected non-active channel, as activated by the channel decoder 4914. The gate line generator 4900 could generate GLside,m and GLtop/bottom, m signals. Each of these Gate Lines could function as R-Gate, C-Gate or L-Gate according to the selection of Facet as decoded by the Facet decoder 4916 and the activated channel line. For each Gate line the signal generator 4900 could include three generators: one for the R-Gate function 4917, one for the C-Gate function 4918, and one for the L-Gate function 4919. These generators would generate the right proper signal according to the selected function which could be signaled by the write/read control 4912 and using reference signals provided by the reference signal generator 4918.

The reference signal generator 4918 provides the required signals to operate the read write operations. All the voltages suggested herein are suggested voltages for some conceptual NOR. These signal levels could be adjusted for specific designs based on the choice of materials, process flow, layer thicknesses, and feature sizes.

Another known enhancement technique is to control the amount of charge being trapped in a cell to allow coding of more than 1 bit base on the amount of charge. These different enhancement techniques could be combined to achieve a higher number of bits per cell. Current charge trap memories are known to achieve 3 bits or 8 levels per cell. A white paper titled "MirrorBit® Quad Technology: The First 4-bit-per-cell Flash Memory Spansion™ MirrorBit Quad Technology to Expand Flash Memory Innovation for Electronic Devices" was published by Spansion—www.spansion, Doc. 43704A (September 2006), incorporated herein by reference. The paper shows the use of MirrorBit in which every bit site could be program to one of 4 levels representing 2 bits, providing in total 4 bits per cell. Adapting such to the HD-NOR could result, if we use 4 levels per location, with 2×32=64 bits per cell, and with 8 levels per location, with 3×32=96 bits per cell of non-volatile memory structure. And the same structure could be used to have some of the memory used as fast access FB-RAM for which a self-refresh mode could be added. In addition known techniques such as Probabilistic error correction in multi-bit-per-cell flash memory as described in U.S. Pat. No. 8,966,342, incorporated herein by reference, could be integrated for increased robustness of such memory operations.

In general memory design it is common to use partitioning which utilizes powers of 2, such as: 2, 4, 8, 16, 32, 64, . . . . Such work well with decoding and addressing. Yet, FIG. 34 illustrates a structure for which the number of bits sited within a facet is 6, which may be challenging for the decoding function. An optimal solution is to find a memory allocation which would be close enough to bridge over this challenge with minimal cost. For example, a facet of 6 sites might allow each site to have 3 levels representing a total memory space of 18 bits per facet. This could be mapped to an address space of 4 bits which would need 16 memory storage option out of the potential 18. A simple look up table could be used for the circuit to support such memory allocation allowing for 2 bits of the 18 to be left unused or for redundancy/check & parity bit use.

Figure 50:
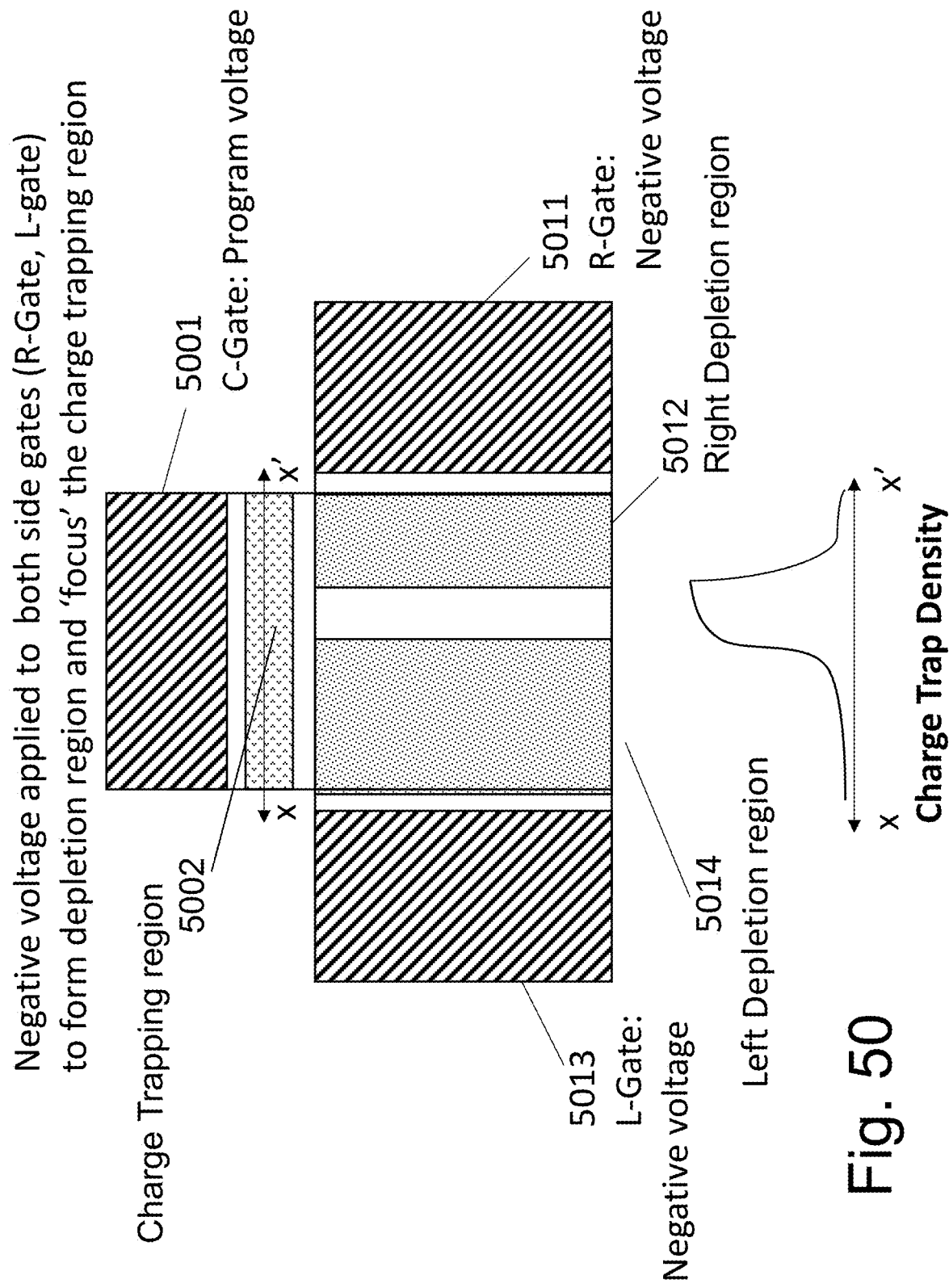
FIG. 50 is an example illustration of focusing the trapping region to a zone of charge trapping region.

The three gate control of the charge trap layers of 3D-NOR as illustrated in FIG. 46 could be used for distributed bits allocation rather than programming/erasing distinct sites, as illustrated in FIG. 50.

FIG. 50 illustrates the concept of utilizing the right 5011 and left gates 5013 to focus the trapping region to a zone of trapping region 5002 driven by the control gate 5001 high 'programming' voltage. The R-Gate voltage and the L-Gate voltage need to be below the voltage which forces charges into the charge trap layer (write) or loose the charges from the charge trap layer (erase). The negative voltage of the right gate depletes the channel region under its control 5012 while the negative voltage of the left gate depletes the channel region under its control 5014 to focus the region of charge trapping. Controlling the process could allow a scanning of the region within the channel for which charge could be available and accordingly allow forming a distribution of charges trapped at the trapping layer. This could be done by controlling the voltage of the side gates to form a scanning distribution of charges within the channel while control of the control gate 5001 programming voltage and the S/D charges forming current could control the amount of charges being trapped at the 'focus' zone 5002.

Figure 51:
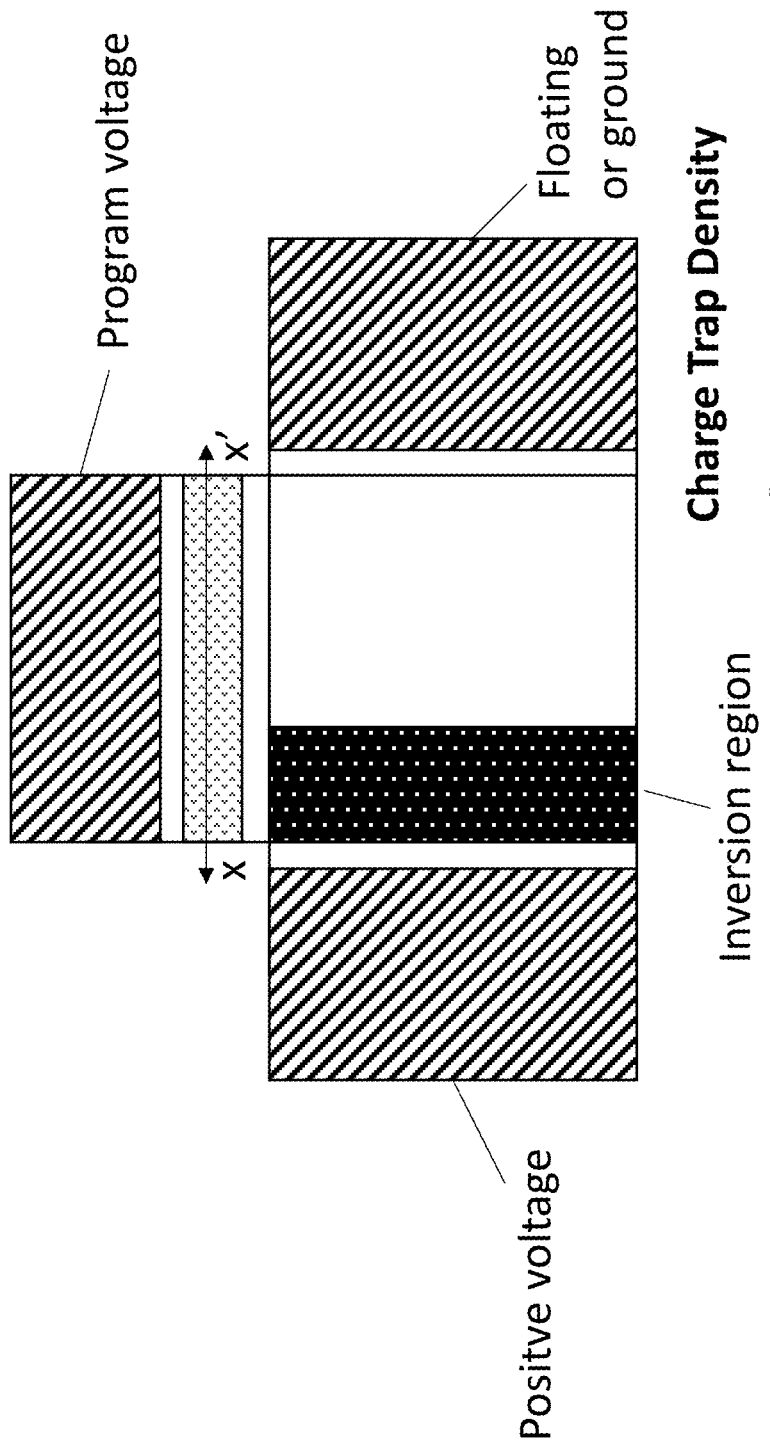
FIG. 51 is an additional example illustration of focusing the trapping region to a zone of charge trapping region.

FIG. 51 illustrates the use of positive voltage to form trapping 'focus.' Adding positive voltage to the R-Gate and L-Gate could be used to extend the width of the controlled regions within the channel.

Figure 52:
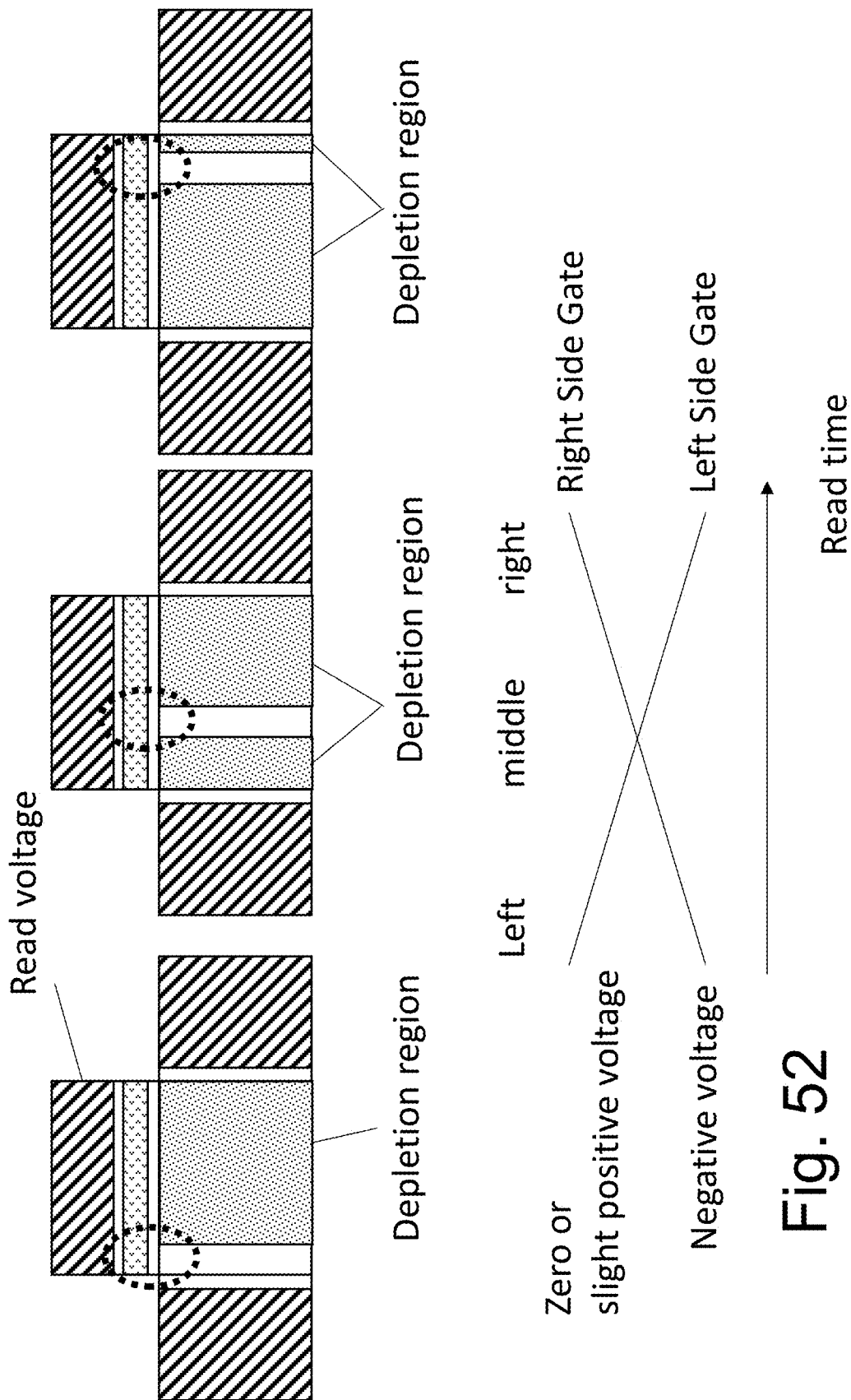
FIG. 52 is an example illustration of reading a zone of charge trapping region.

FIG. 52 illustrates the concept of using the scanning concept for reading. For reading, the R-Gate and the L-Gate could be controlled to form scanning similar to writing but the C-Gate voltage is kept below the voltage that drive charges in or out of the charge trap layer, and by monitoring the current through the channel by sensing the selected S/D lines and monitoring their current.

Figure 53:
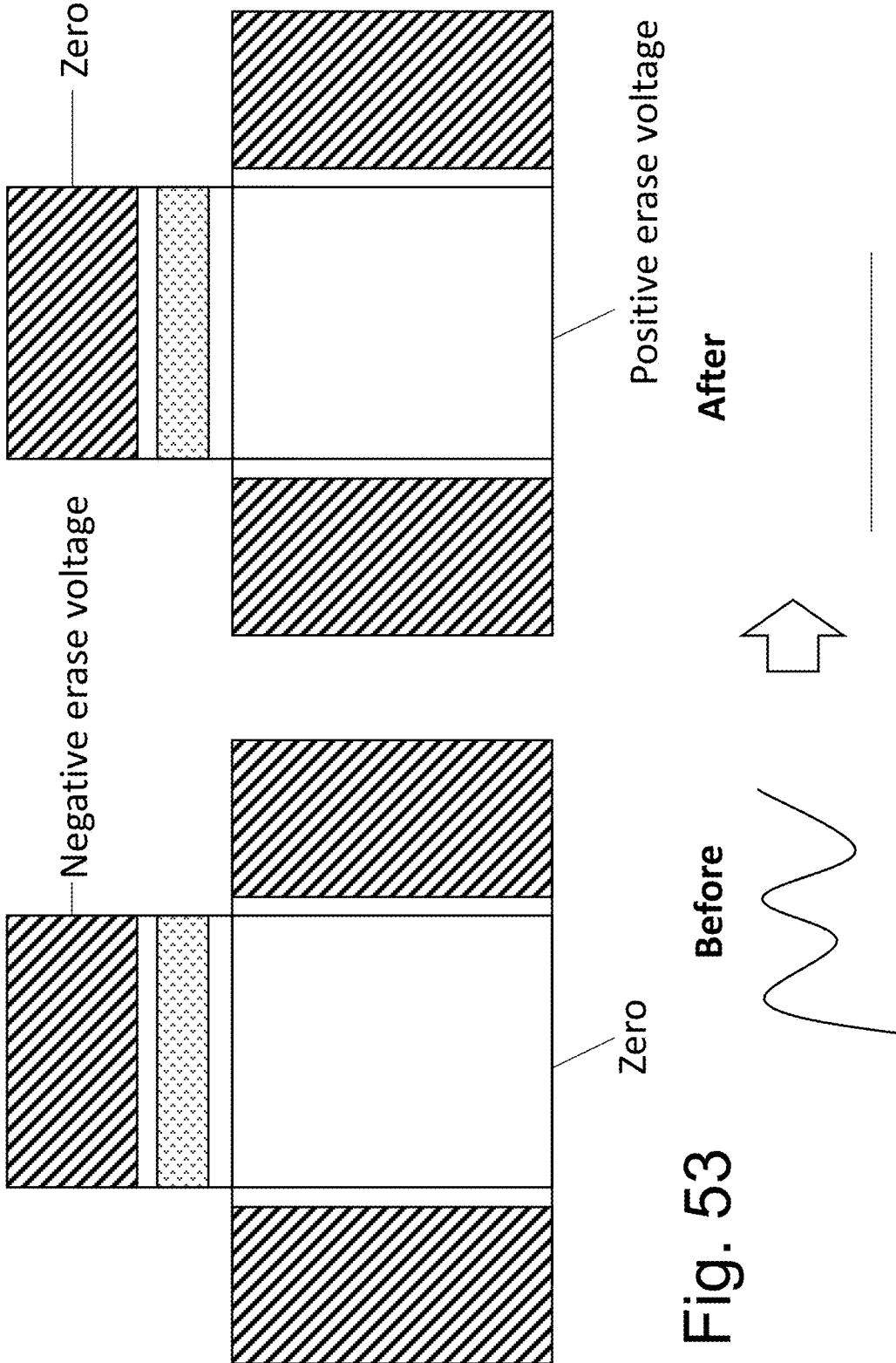
FIG. 53 is an example illustration of a block erase operation on a zone of charge trapping region.

FIG. 53 illustrates a block erase operation in which all the charges are being forced out from the respective trap zones.

This distributed form of storage could help reduce the sensitivity to local defect and increase the overall memory capacity.

For this distributed memory storage technique the Orthonormal basis signal processing techniques of linear algebra could be deployed. Quoting: Orthonormal Basis: A subset $\{v_1, \ldots, v_k\}$ of a vector space V, with the inner product $\langle,\rangle$, is called orthonormal if $\langle v_i, v_j \rangle = 0$ when $i \neq j$. That is, the vectors are mutually perpendicular. Moreover, they are all required to have length one: $\langle v_i, v_i \rangle = 1$.

There many such basis and in signal processing it has been extensively studied in the art. A subset of these are called wavelets has been described in an article by G. BEYLKIN titled: "ON THE REPRESENTATION OF OPERATORS IN BASES OF COMPACTLY SUPPORTED WAVELETS" published SIAM J. NUMER. ANAL. c 1992 Society for Industrial and Applied Mathematics Vol. 6, No. 6, pp. 1716-1740, December 1992 011, incorporated herein by reference.

With Orthonormal set of vectors every 'bit site' could be represented by one of these vectors. So for n bits we would have n vectors. Writing a bit would be like adding a vector to the charge trap surface by scanning along the channel and modulating the amount stored according to the vector. Reading would be the inverse which could be the effect of multiplying the stored values by the reading vector. Accordingly if the vector was stored the value of the reading would be '1' and if it was not than it would be '0'. The vector itself could be multiply by a scalar which would represent a multilevel per vector.

Additional information on wavelets and related decomposition and reconstruction algorithms may be found in "Fundamentals of Wavelets Theory, Algorithms, and Applications," Goswami, J., C., et al., $2^{nd}$ Ed., J Wiley & Sons, 2010, especially chapters 6 and 7, the entire book is incorporated herein by reference. Orthonormal wavelets such as, for example, of Shannon (sine radians sampling), Meyer (smoothing of Shannon), Battle-Lemarié, and Daubechics may be utilized depending on engineering choices and optimizations. Biorthogonal wavelets, for example, of Cohen, Daubechies, and Feaveau, may be useful depending on engineering choices and optimizations. Moreover, additional information on wavelets may be found in B. Vidakovic, et al., "Wavelets for Kids, A Tutorial Introduction," 1994 Duke University, incorporated herein by reference.

Figure 54A:
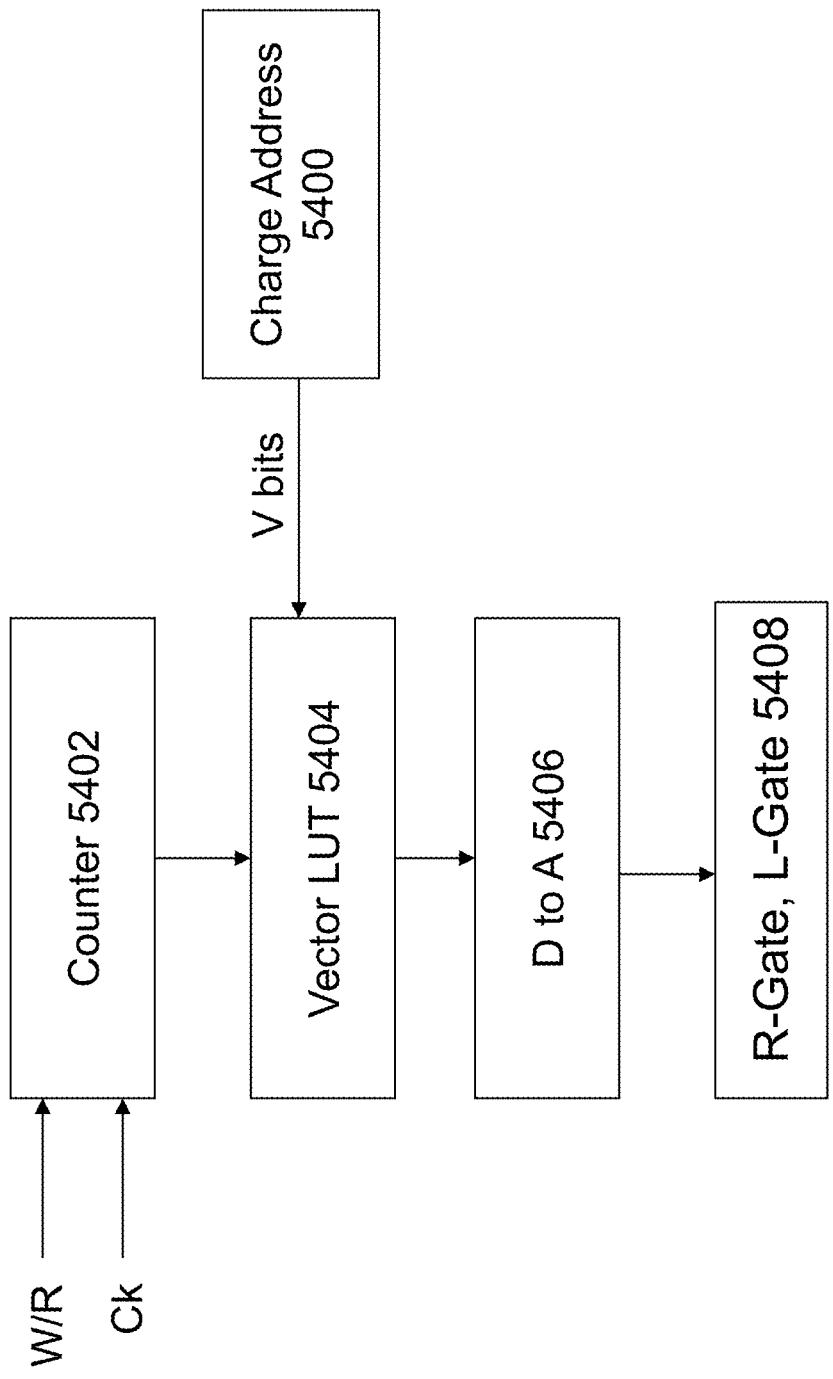
FIG. 54A-54B are example illustrations of block diagrams of circuits to generate signals.

FIG. 54A illustrates block diagram of optional circuits to generate the signal for such storage approach. A counter 5402 will start counting per each write pulse or read pulse. The counting bits would be inputted into a look-up-table (LUT) 5404 along with additional vector selection bits—V bits from the charge address 5400. The look-up-table 5404 would carry the full set of vectors of which would be selected by the inputted V bits. The counter would facilitate the scanning process by going along the vector address. Similar circuits could be used for the generator of each of the control signals for the R-Gate and L-Gate. The output of the LUT 5404 could be inputted to a digital to analog converter 5406. This circuit could be used for the read scanning signal generator and the write scanning signal generators. The signals 5408 for the R-Gate and L-Gate could be the same for read or write. Scalar multiplication could be achieved by the C-Gate and S/D signal, yet it could be alternatively achieved by controlling the scan time so by doubling the time about double the amount of charge could be trapped. Time control is less common as it impacts the memory access time.

Figure 54B:
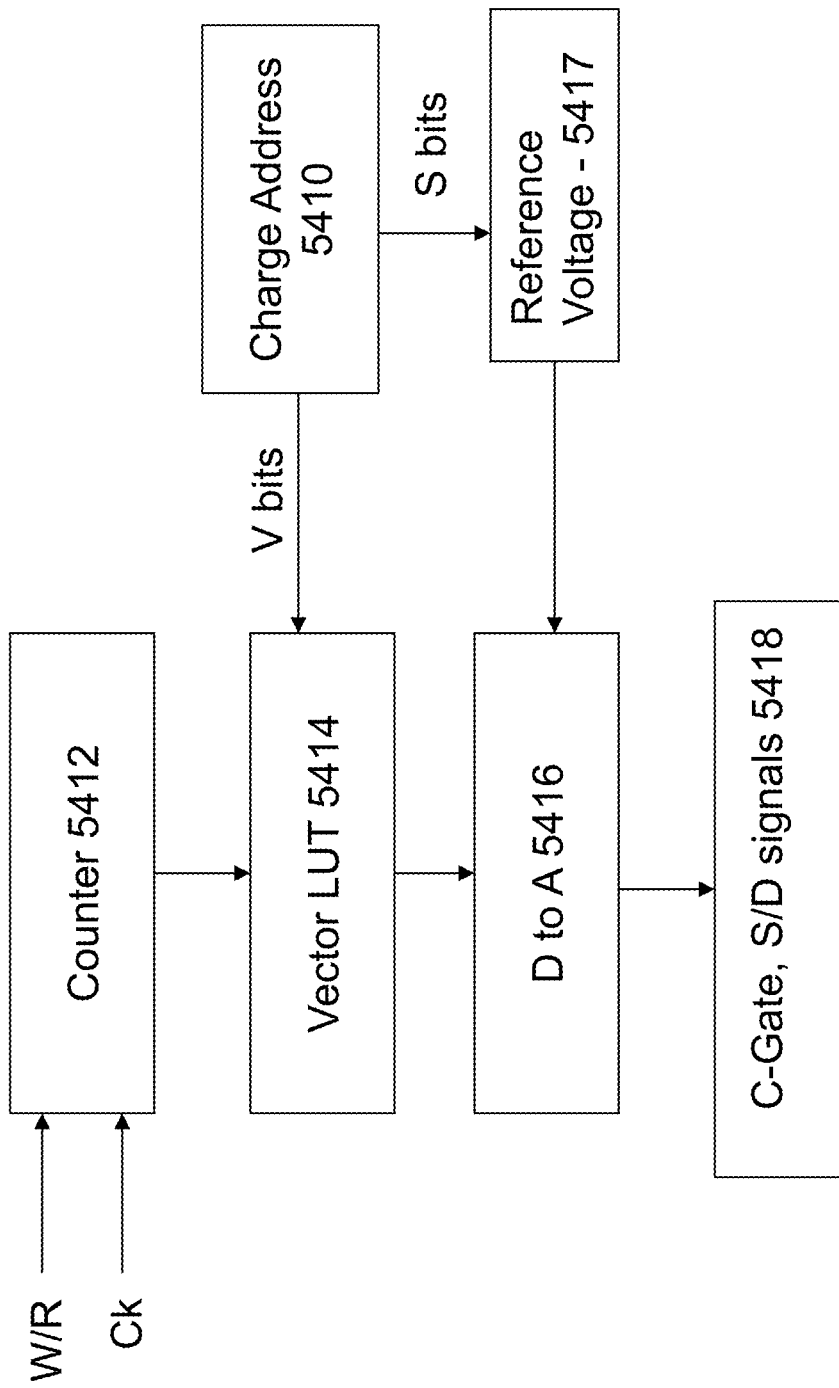

FIG. 54B illustrates block diagram of optional circuits to generate the signal for such storage approach. A counter 5412 will start counting per each write pulse or read pulse. The counting bits would be inputted into a look-up-table (LUT) 5414 along with additional vector selection bits—V bits from the charge address 5410. The look-up-table 5414 would carry the full set of vectors which would be selected by the inputted V bits. This is optional as the vector could be defined by the scanning process related to FIG. 54A, and accordingly the Vector LUT 5414 would become a fixed voltage or could incorporate the scalar multiplication currently illustrated by the reference voltage generator 5417. The counter 5412 would control the write and read operation during the scanning process. Similar circuits could be used for the generator of each of the control signal for the C-Gate and S/D lines. The output of the LUT 5414 could be inputted to a multiplying digital to analog converter 5416. The scalar could be represented by the level from the Reference voltage generator 5417 according to the S bits from the charge address 5410 could be provided to the D to A 5416. This circuit could be used for the read signal generator and the write signal generators. The signals 5418 would support the write operation with high positive voltage, the read operation with mid-level positive voltage and erase operation with a high negative voltage.

For the read additional circuits could be added for the S/D line with integrating analog to digital converter. Such structures could support multiple signal processing techniques to allow flexibility between storage density, access speed and device yield.

The memory HD-NOR memory fabric could be used to empower SoC products by providing high density NV memory and high speed DRAM memory fabric underneath the logic SoC circuits as presented in respect to FIG. 17A to FIG. 17E herein. Additional alternative is to use this fabric architecture for programmable logic and general logic. Such could be done by allocating some blocks for memory and others for logic, alternatively two structures could be used such as a first memory terrain don top of its logic terrain and finally user logic. This is leveraging the HD-NOR fabric for many uses.

The O/N/O stacks within the HD-NOR fabric could be designed independently; for example, the facet(s) related to the top gates and the facet(s) related to the side gates could be different in many ways. An ONO stack could include the same materials with different thicknesses or different materials. Some of such alternative O/N/O stack materials have been presented in a paper by Chun Zhao titled "Review on Non-Volatile Memory with High-k Dielectrics Flash for Generation Beyond 32 nm" published at Materials 2014, 7, 5117-5145; doi:10.3390/ma7075117, incorporated herein by reference. An O/N/O stack could include band gap engineering for better performance. Such band gap engineering has been described in papers such as by Dong Hua Li et al titled "Effects of Equivalent Oxide Thickness on Bandgap-Engineered SONOS Flash Memory" published at 2009 IEEE Nanotechnology Materials and Devices Conference Jun. 2-5, 2009, and by Hang-Ting Lue et al titled "BE-SONOS: A Bandgap Engineered SONOS with Excellent Performance and Reliability" published at IEDM 2005. And in patents such as U.S. Pat. Nos. 7,414,889, 7,512,016 and 7,839,696, all the forgoing references are incorporated herein by reference.

In the NOR architectures such as illustrated in FIG. 2A to FIG. 3D herein, the active O/N/O stack for the side gate is formed in-between the S/D lines. The flow as described will likely deposit the O/N/O material on substantially all exposed surfaces and not just on the desired facet and accordingly reducing the area for the side gates by two times the O/N/O thickness in each direction. In some applications it could be advantageous to form the side O/N/O stack extra thin. Such could result in shorter retention times but also with a shorter write and erase time. Such ultra-thin O/N/O is sometimes considered a DRAM (Dynamic Random Access Memory) alternative. Accordingly such HD-NOR memory could integrate multiple memory types in one device, for example, such as conventional NV (Non-Volatile) memory in the facets controlled by the top and bottom gates and faster memories with a shorter retention time in the facets controlled by the side gates. Such memories are presented in papers such as by H. Clement Wann and Chenming Hu titled "High-Endurance Ultra-Thin Tunnel Oxide in MONOS Device Structure for Dynamic Memory Application" published at IEEE ELECTRON DEVICE LETTERS, VOL. 16, NO. 11, November 1995, by Dong-Il Moon et al. titled "A Novel FinFET with High-Speed and Prolonged Retention for Dynamic Memory" published at IEEE ELECTRON DEVICE LETTERS, VOL. 35, No. 12, December 2014, and in U.S. Pat. Nos. 5,608,250, 8,329,535 and 9,025,386. Additional optional enhancement is to combine two level of memory forming structure in the gate stack such as presented by Daniel Schinke et al titled "Computing with Novel Floating-Gate Devices" published at IEEE Computer magazine February 2011, and also described by Daniel Johannes Schinke in 'A dissertation submitted to the Graduate Faculty of North Carolina State University' 2011, titled "Computing with Novel Floating Gate Devices"; and by Biplab Sarkar titled "Dual Floating Gate Unified Memory MOSFET With Simultaneous Dynamic and Non-Volatile Operation" published at IEEE ELECTRON DEVICE LETTERS, VOL. 35, NO. 1, January 2014, and by Yu-Chien Chiu, titled "Low Power 1T DRAM/NVM Versatile Memory Featuring Steep Sub-60-mV/decade Operation, Fast 20-ns Speed, and Robust 85° C.-Extrapolated 1016 Endurance" published at IEEE 2015 Symposium on VLSI Technology, all of the forgoing are incorporated herein by reference.

One such application could be a 3D IC system. In U.S. Pat. No. 7,960,242, incorporated herein by reference, in respect to FIG. 80 and related text and figures, a connectivity scheme has been presented to allow fine vertical connectivity while having misalignment between strata. By properly opening a via after wafer bonding and taking into account the strata misalignment. Such technique required a via process after wafer bonding and space compatible with the worst case potential misalignment in at least one direction. Using the programmable ILV fabric could enable a fine vertical connectivity without those limitations. This is illustrated in FIGS. 55A-55C.

Figures 55A, 55B:
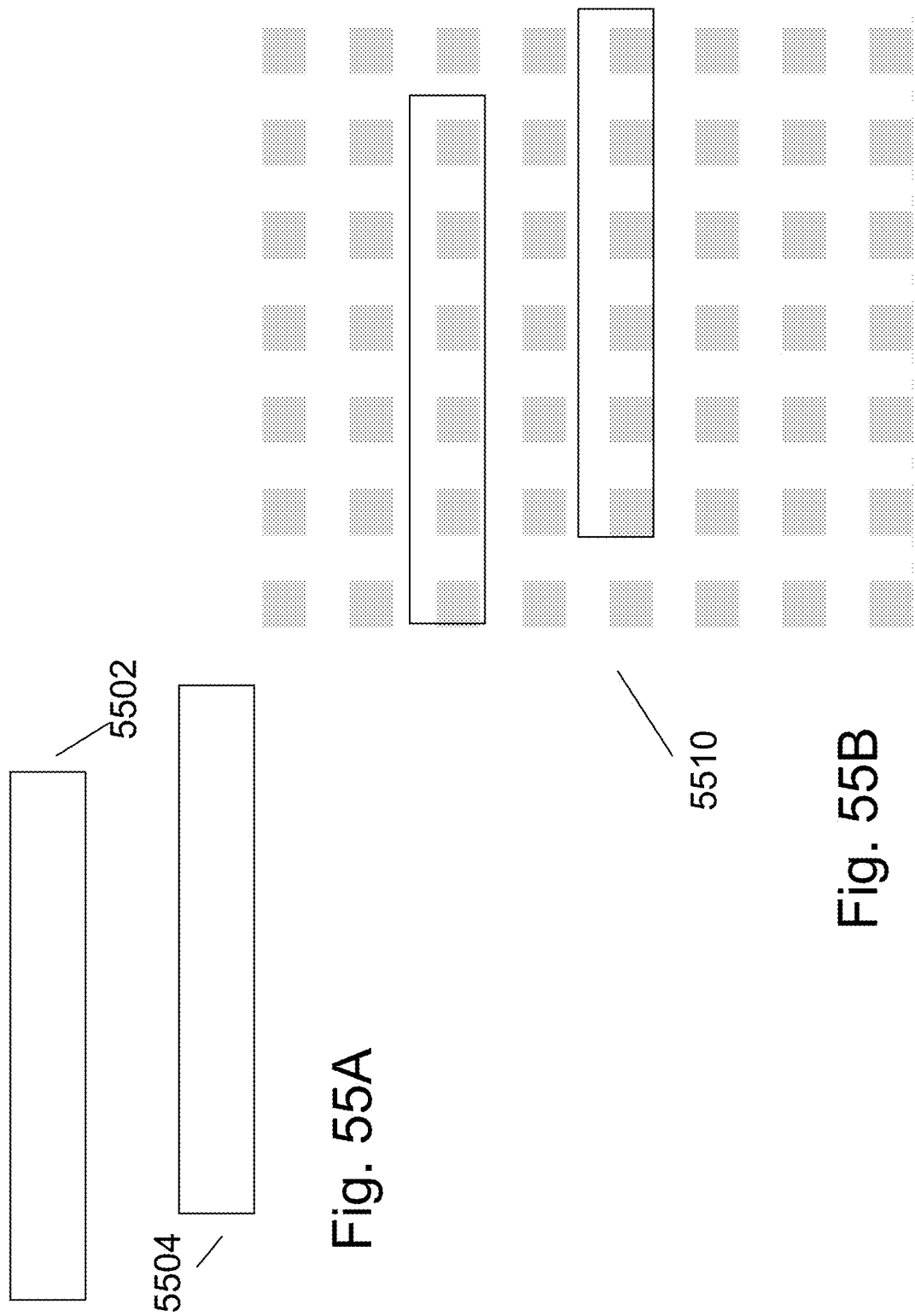

FIG. 55A illustrates two horizontal going strips 5502 and 5504 which could have a length compatible with the potential misalignment in the horizontal direction. These strips represent part of the connection bar at the lower stratum.

FIG. 55B illustrates overlaying the lower stratum with programmable ILV fabric 5510

FIG. 55C illustrates the connectivity portion after overlaying with the upper stratum. At the bottom of the upper stratum the corresponding vertical strips 5522 and 5524 would be connected by the programmable ILV fabric to the horizontal upper strips of the lower stratum. The vertical strip could have a length compatible with the worst case potential vertical misalignment. Accordingly the corresponding horizontal strip and vertical strip should have a crossing section which could be used by the programmable ILV fabric to form the vertical connectivity. Accordingly after bonding the via 5512 could be programmed to connect the horizontal strip 5502 to the vertical strip 5522 while the via 5514 could programmed to connect the horizontal strip 5504 to the vertical strip 5524 while the other via in contact with these strips could be program to an off-state.

The bonding of the programmable ILV on top of the lower stratum could use well-known in the art hybrid bonding techniques which combines oxide to oxide bonding together with metal to metal bonding so the bonding process would also form the connection between the ILV and the strips 5502, 5504.

Logic fabrics that are customized or programmed by lithography defined via or anti-fused via are well known in the industry, such as been presented by U.S. Pat. Nos. 4,197,555, 6,331,733, 6,580,289 or 8,384,426 all are incorporated herein by reference. These teach programming logic cells and then programming interconnection fabric. U.S. Pat. No. 4,197,555 as related to FIG. 7 suggests alternating the horizontal strips between under via strips and over via strips while reversing the order for the vertical strip. In such a scheme, horizontal strips are connected by via at the strips end side to extend the routing in the horizontal direction until a change of direction is needed for which a middle strip via could be used to change the direction to the vertical direction. In U.S. Pat. No. 6,331,733 teaches an alternative scheme in which short strips are connecting by via the edges of two long strips. Similar approaches have also been described in U.S. Pat. No. 8,384,426 such as illustrated in its FIG. 7. These two patents also teach additional longer tracks which periodically get connected to the short tracks. These and similar publications teach a via defined interconnect fabric and via defined programmable logics. These architectures could utilize the programmable ILV fabric 4700 for programmable connectivity fabric and programmable logic fabrics.

In a paper by Zvi Or-Bach et al titled "Modified ELTRAN®—A Game Changer for Monolithic 3D" published at IEEE S3S Conference 2015, incorporated herein by reference, techniques to construct a multi strata device were presented.

Figure 56A:
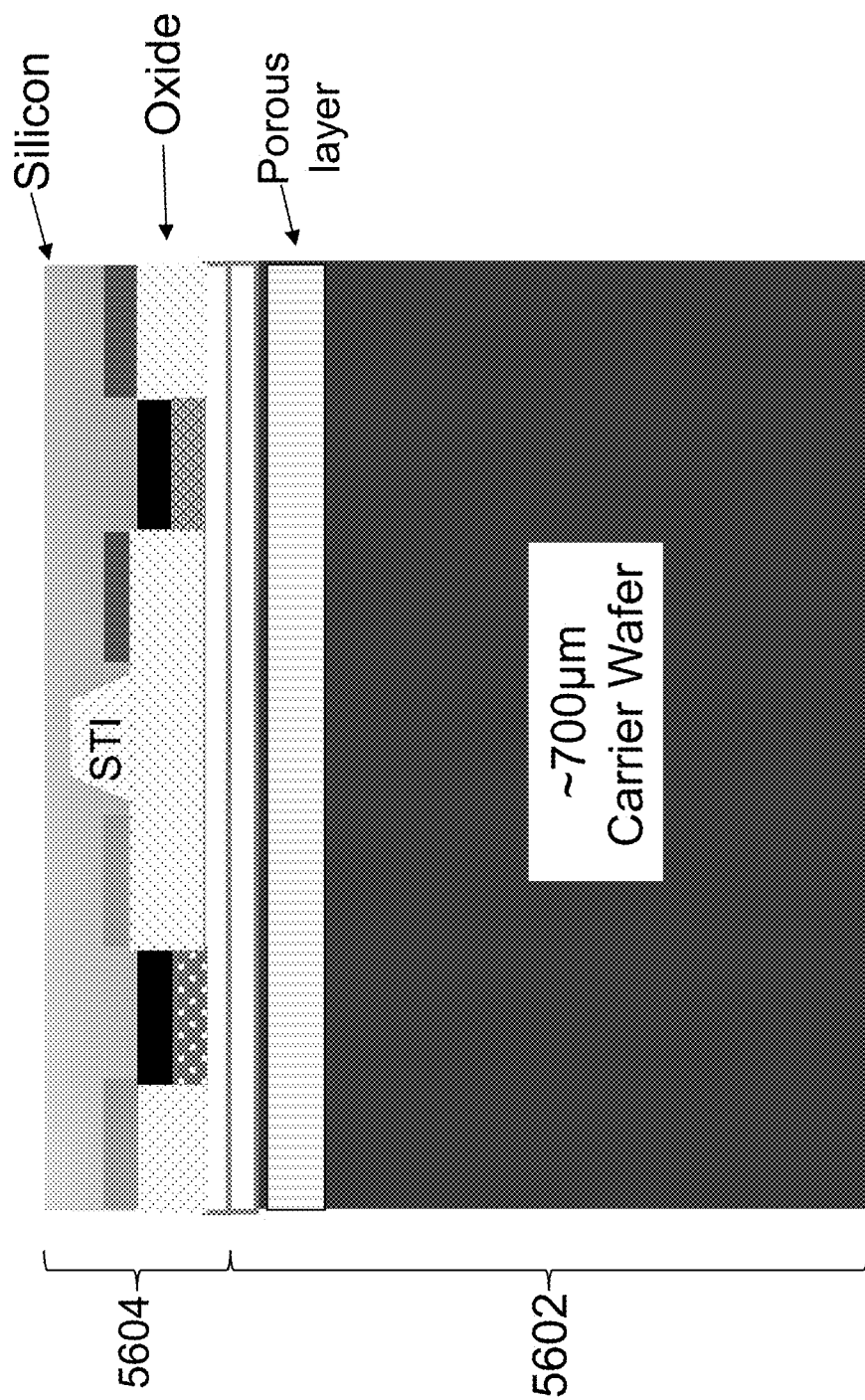
FIGS. 56A-56D are example illustrations of forming a multi strata device.

FIG. 56A illustrates a carrier wafer 5602 on which a first transistor stratum 5604 had been transferred.

Figure 56B:
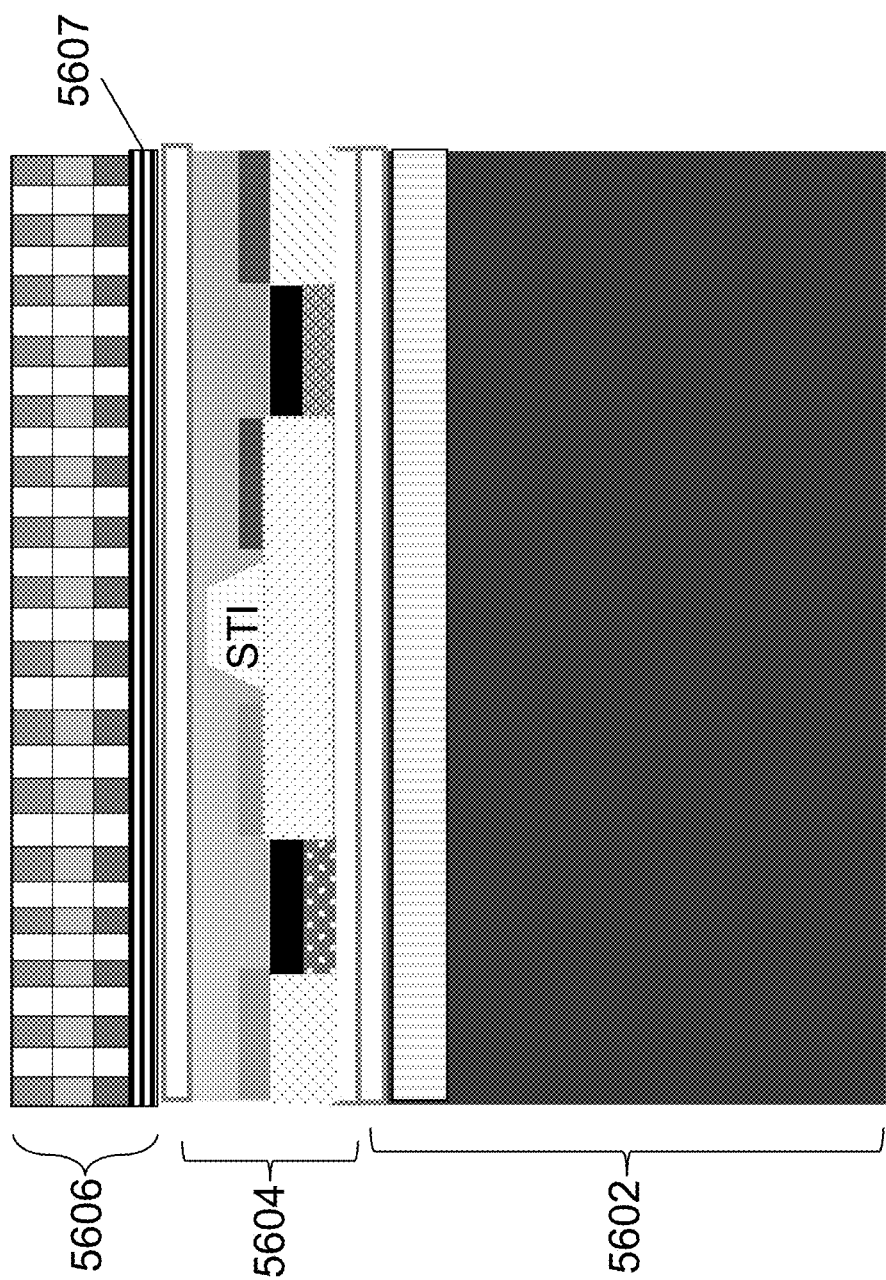

FIG. 56B illustrates a programmable ILV fabric 5606 with first layer of interconnect 5607 being bonded to the structure. As is true here and many other cases herein, drawings are not made to scale and even parts of the same drawings could be made in different scale for the various implementation/descriptions. This is especially true for the presented 3D system in which layers are bonded on top of each other could be the result of very different process lines with different process rules and dimensions. Accordingly the transistors in layer 5604 could be processed in far tighter dimensions or much looser dimensions than the drawing scale indicates. A specific 3D system could be constructed based on flows described herein with far different process rules than these drawings suggest. A 3D system design is done based on the functionality desired with respective consideration of cost, power, performance, and other parameters and engineering, design, and economic considerations.

Figure 56C:
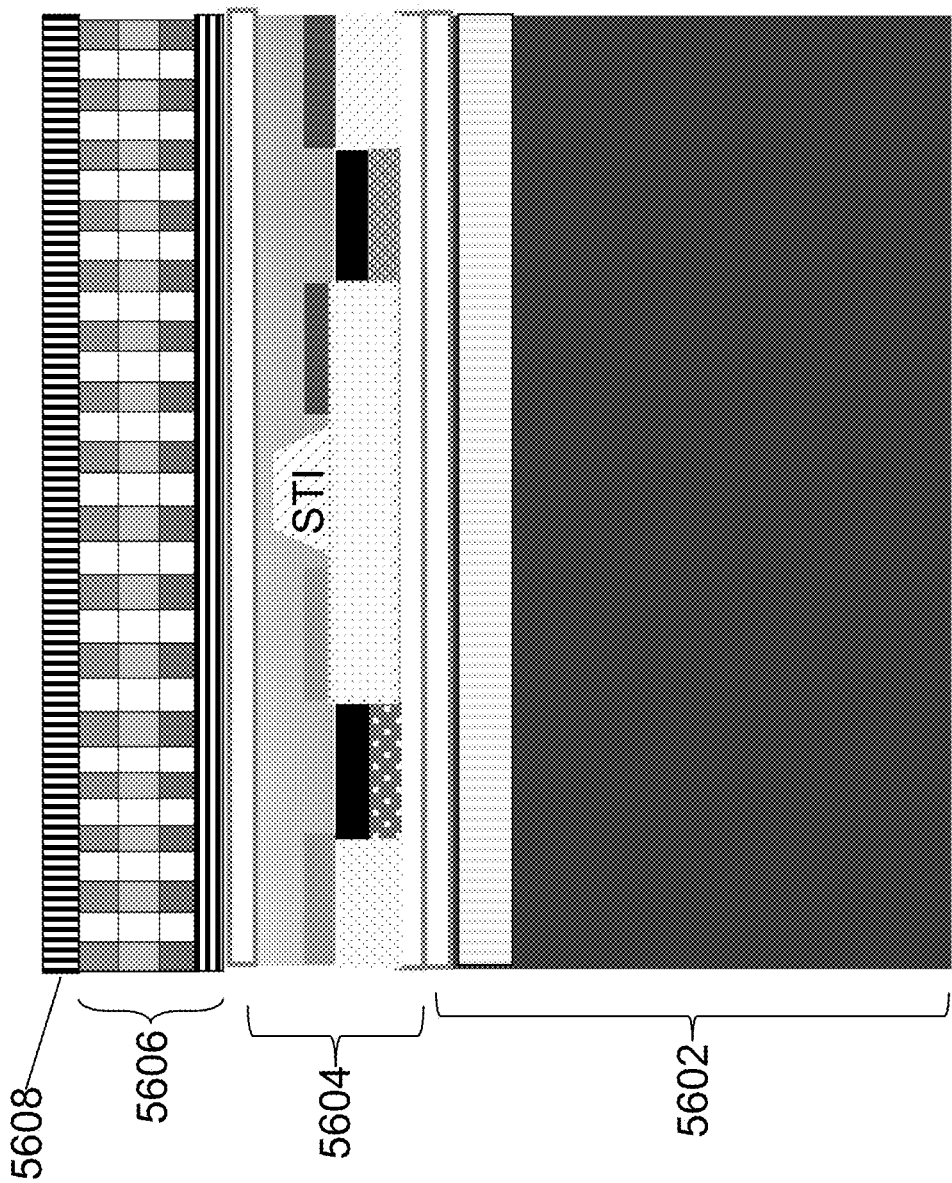

FIG. 56C illustrates adding an additional connectivity structure 5608 on the other side of programmable ILV fabric 5606 completing a programmable connectivity fabric which could utilize one of the known architectures for via defined connectivity structure.

Figure 56D:
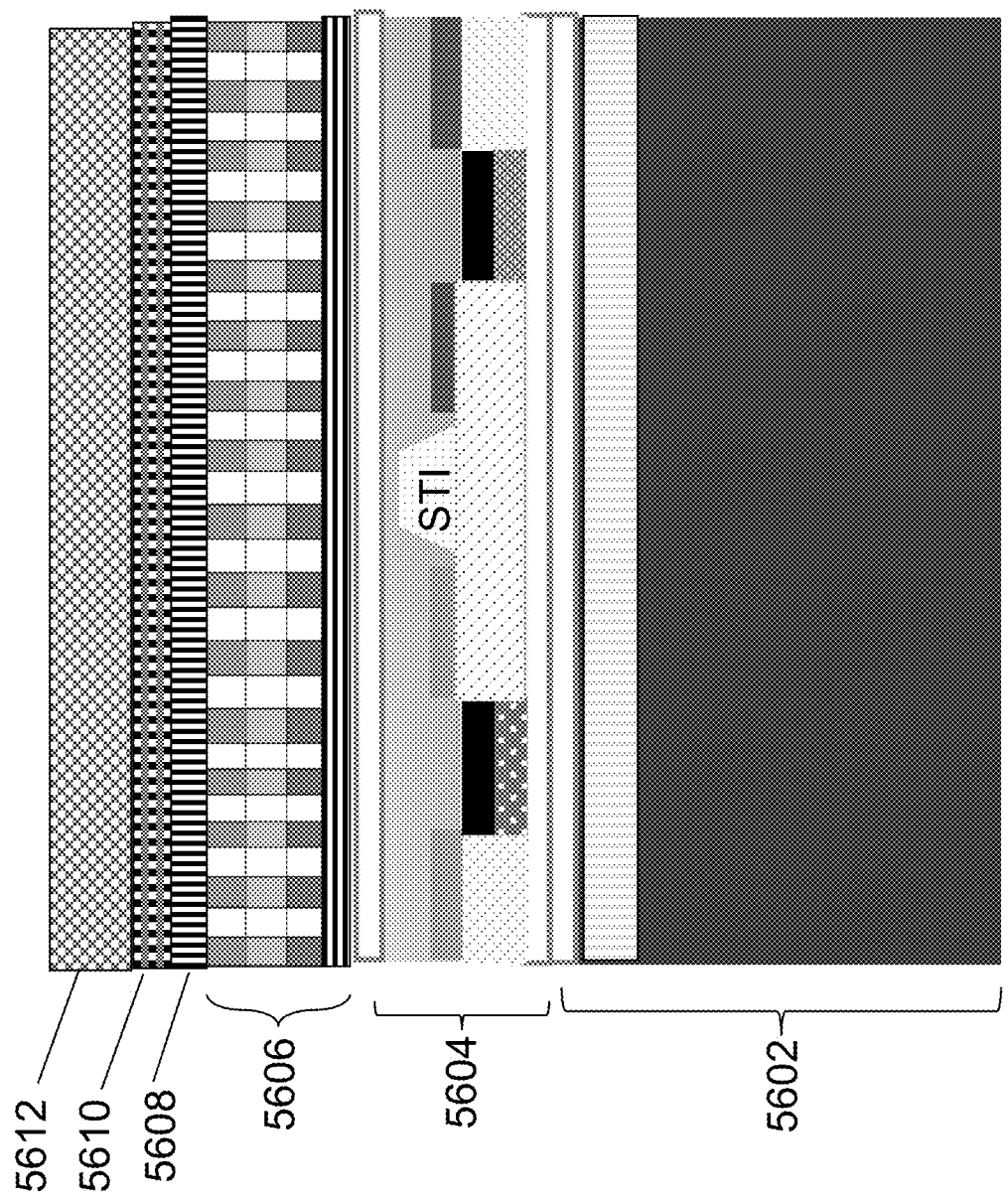

FIG. 56D illustrates an optional addition of long track connectivity layers 5610, and an optional addition of active layer 5612 which could provide re-buffering for the routing tracks and other functions, for example, such as I/O to external devices.

Substantially the entire structure could now be flipped and bonded onto a final carrier. And connections between the circuit fabric 5604 and the programmable connectivity fabric 5606, 5608, 5610, 5612 could be made in addition to interconnection to form the designed circuits using the 5604 stratum.

The structure of this NOR could be modified by changing the gate stack to construct a 3D-DRAM using the floating body technique. The Floating body of the 3D-DRAM or of the NOR Universal memory could be refreshed using the self-refresh described herein.

As a general note we described herein a memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some silicon control lines, improve speed and reduce variation by strengthening bit-lines and word-line with upper layer parallel running and periodically connected metal lines.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. The material used could be silicon or other alternative materials effective for semiconductor devices. Rather, the scope of the invention includes combinations and sub-combinations of the various features described hereinabove as well as modifications and variations which would occur to such skilled persons upon reading the foregoing description. Thus the invention is to be limited only by any appended claims.

We claim:

1. A 3D semiconductor device, the device comprising:
a first level comprising a first single crystal layer and a memory control circuit, said memory control circuit comprising a plurality of first transistors;
a first metal layer overlaying said first single crystal layer;
a second metal layer overlaying said first metal layer;
a plurality of second transistors disposed atop said second metal layer;
a third metal layer disposed atop said plurality of second transistors; and
a memory array comprising word-lines and memory cells, wherein said memory array comprises at least four memory mini arrays,
wherein at least one of said plurality of second transistors comprises a metal gate,
wherein each of said memory cells comprises at least one of said plurality of second transistors, and
wherein said memory control circuit comprises at least one digital to analog converter circuit, and
wherein said device comprises a hybrid bonding layer.

2. The 3D semiconductor device according to claim 1, further comprising:
a plurality of third transistors disposed atop said plurality of second transistors,
wherein at least one of said plurality of second transistors is self-aligned to at least one of said plurality of third transistors, being processed following a same lithography step.

3. The 3D semiconductor device according to claim 1, further comprising:
an upper level disposed atop said third metal layer,
wherein said upper level comprises a mono-crystalline silicon layer.

4. A 3D semiconductor device, the device comprising:
a first level comprising a single crystal layer and a memory control circuit, said memory control circuit comprising a plurality of first transistors;
a first metal layer overlaying said first single crystal layer;
a second metal layer overlaying said first metal layer;
a plurality of second transistors disposed atop said second metal layer;
a third metal layer disposed atop said plurality of second transistors;
a memory array comprising word-lines and memory cells,
wherein said memory array comprises at least four memory mini arrays,
wherein at least one of said plurality of second transistors comprises a metal gate,
wherein each of said memory cells comprises at least one of said plurality of second transistors, and
wherein said memory control circuit comprises at least one digital to analog converter circuit; and
an upper level disposed atop said third metal layer,
wherein said upper level comprises a mono-crystalline silicon layer.

5. The 3D semiconductor device according to claim 4, further comprising:
a plurality of third transistors disposed atop said plurality of second transistors,
wherein at least one of said plurality of second transistors is self-aligned to at least one of said plurality of third transistors, being processed following a same lithography step.

6. The 3D semiconductor device according to claim 4, wherein said device comprises a hybrid bonding layer.

7. A 3D semiconductor device, the device comprising:
a first level comprising a single crystal layer and a memory control circuit, said memory control circuit comprising a plurality of first transistors;
a first metal layer overlaying said first single crystal layer;
a second metal layer overlaying said first metal layer;
a plurality of second transistors disposed atop said second metal layer;
a third metal layer disposed atop said plurality of second transistors;
a memory array comprising word-lines and memory cells,
wherein said memory array comprises at least four memory mini arrays,
wherein at least one of said plurality of second transistors comprises a metal gate,
wherein each of said memory cells comprises at least one of said plurality of second transistors, and
wherein said memory control circuit comprises at least one cache memory circuit; and
a plurality of third transistors disposed atop said plurality of second transistors,
wherein at least one of said plurality of second transistors is self-aligned to at least one of said plurality of third transistors, being processed following a same lithography step.

8. The 3D semiconductor device according to claim 7, wherein said device comprises a hybrid bonding layer.

9. The 3D semiconductor device according to claim 7, further comprising:
an upper level disposed atop said third metal layer,
wherein said upper level comprises a mono-crystalline silicon layer.

10. A 3D semiconductor device, the device comprising:
a first level comprising a single crystal layer and a memory control circuit, said memory control circuit comprising a plurality of first transistors;
a first metal layer overlaying said first single crystal layer;
a second metal layer overlaying said first metal layer;
a plurality of second transistors disposed atop said second metal layer;
a third metal layer disposed atop said plurality of second transistors;
a memory array comprising word-lines and memory cells,
wherein said memory array comprises at least four memory mini arrays,
wherein at least one of said plurality of second transistors comprises a metal gate,
wherein each of said memory cells comprises at least one of said plurality of second transistors, and
wherein said memory control circuit comprises at least one cache memory circuit; and
an upper level disposed atop said third metal layer,
wherein said upper level comprises a mono-crystalline silicon layer.

11. The 3D semiconductor device according to claim 10, further comprising:
a plurality of third transistors disposed atop said plurality of second transistors,
wherein at least one of said plurality of second transistors is self-aligned to at least one of said plurality of third transistors, being processed following a same lithography step.

12. The 3D semiconductor device according to claim 10, wherein said device comprises a hybrid bonding layer.

13. A 3D semiconductor device, the device comprising:
a first level comprising a single crystal layer and a memory control circuit, said memory control circuit comprising a plurality of first transistors;
a first metal layer overlaying said first single crystal layer;
a second metal layer overlaying said first metal layer;
a plurality of second transistors disposed atop said second metal layer;
a third metal layer disposed atop said plurality of second transistors; and
a memory array comprising word-lines and memory cells,
wherein said memory array comprises at least four memory mini arrays,
wherein at least one of said plurality of second transistors comprises a metal gate, wherein each of said memory cells comprises at least one of said plurality of second transistors, wherein said memory control circuit comprises at least one cache memory circuit, and wherein said device comprises a hybrid bonding layer.

14. The 3D semiconductor device according to claim 13, further comprising:

a plurality of third transistors disposed atop said plurality of second transistors, wherein at least one of said plurality of second transistors is self-aligned to at least one of said plurality of third transistors, being processed following a same lithography step.

15. The 3D semiconductor device according to claim 13, further comprising:

an upper level disposed atop said third metal layer, wherein said upper level comprises a mono-crystalline silicon layer.

16. A 3D semiconductor device, the device comprising:

a first level comprising a single crystal layer and a memory control circuit, said memory control circuit comprising a plurality of first transistors;

a first metal layer overlaying said first single crystal layer;

a second metal layer overlaying said first metal layer;

a plurality of second transistors disposed atop said second metal layer;

a plurality of third transistors disposed atop said plurality of second transistors;

a third metal layer disposed atop said plurality of third transistors; and a memory array comprising word-lines, wherein said memory array comprises at least four memory mini arrays, wherein each of said at least four memory mini arrays comprises at least four rows by at least four columns of memory cells, wherein at least one of said plurality of second transistors comprises a metal gate, wherein each of said memory cells comprises at least one of said plurality of second transistors, wherein said memory control circuit comprises at least one logic counter circuit, and wherein said device comprises a hybrid bonding layer.

17. The 3D semiconductor device according to claim 16, further comprising:

an upper level disposed atop said third metal layer, wherein said upper level comprises a mono-crystalline silicon layer.

18. The 3D semiconductor device according to claim 16, further comprising:

a plurality of third transistors disposed atop said plurality of second transistors, wherein at least one of said plurality of second transistors is self-aligned to at least one of said plurality of third transistors, being processed following a same lithography step.

* * * * *